United States Patent
Yamaguchi et al.

(10) Patent No.: US 6,754,126 B2
(45) Date of Patent: Jun. 22, 2004

(54) SEMICONDUCTOR MEMORY

(75) Inventors: Shusaku Yamaguchi, Kawasaki (JP);
Toshiya Uchida, Kawasaki (JP);
Yoshimasa Yagishita, Kawasaki (JP);
Yoshihide Bando, Kawasaki (JP);
Masahiro Yada, Kawasaki (JP);
Masaki Okuda, Kawasaki (JP);
Hiroyuki Kobayashi, Kawasaki (JP);
Kota Hara, Kawasaki (JP); Shinya Fujioka, Kawasaki (JP); Waichiro Fujieda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 121 days.

(21) Appl. No.: 10/106,597

(22) Filed: Mar. 27, 2002

(65) Prior Publication Data
US 2003/0026161 A1 Feb. 6, 2003

(30) Foreign Application Priority Data

Aug. 3, 2001 (JP) .................................... 2001-236992
Nov. 30, 2001 (JP) .................................... 2001-367053

(51) Int. Cl.⁷ .............................................. G11C 7/00
(52) U.S. Cl. ................. 365/222; 365/230.03; 365/220; 365/236; 365/239
(58) Field of Search ........................ 365/222, 230.03, 365/220, 236, 239, 189.07, 63

(56) References Cited

U.S. PATENT DOCUMENTS

| | | | | |
|---|---|---|---|---|
| 4,766,573 A | | 8/1988 | Takemae | |
| 4,914,630 A | * | 4/1990 | Fujishima et al. | 365/189.04 |
| 4,933,907 A | * | 6/1990 | Kumanoya et al. | 365/222 |
| 5,475,645 A | * | 12/1995 | Wada | 365/222 |
| 5,963,497 A | * | 10/1999 | Holland | 365/222 |
| 5,999,474 A | * | 12/1999 | Leung et al. | 365/222 |
| 6,108,229 A | | 8/2000 | Shau | |

FOREIGN PATENT DOCUMENTS

| | | |
|---|---|---|
| EP | 1215678 | 7/2001 |
| EP | 1246194 | 11/2001 |
| JP | 2001-093277 | 4/2001 |

OTHER PUBLICATIONS

U.S. patent application No. 09/841,611, filed Apr. 26, 2001 (Co–Pending).
U.S. patent application No. 09/892,748, filed Jun. 28, 2001 (Co–Pending).

* cited by examiner

Primary Examiner—Son T. Dinh
(74) Attorney, Agent, or Firm—Arent Fox PLLC.

(57) ABSTRACT

A plurality of first memory blocks and a second memory block for reproducing data of the first memory blocks are formed. When a read command and a refresh command conflict with each other, a read control circuit accesses the first memory block according to the refresh command and reproduces read data by using the second memory block. When a write command and the refresh command conflict with each other, a write control circuit operates the memory block according to an order of command reception. Therefore, it is possible to perform refresh operation without being recognized by users. Namely, a user-friendly semiconductor memory can be provided.

56 Claims, 79 Drawing Sheets

| | | | Pin Name | | | | | | | |
|---|---|---|---|---|---|---|---|---|---|---|
| | Function | Symbol | /CS | FN | BA1-0 | A14-8 | A7 | A6 | A5-0 |
| First Command | Device Deselect | DESL | H | X | X | X | X | X | X |
| | Read (with Auto-close) | RDA | L | H | BA | UA | UA | UA | UA |
| | Write (with Auto-close) | WRA | L | L | BA | UA | UA | UA | UA |
| Second Command | Lower Address Latch — read | LAL | H | X | X | X | X | X | LA |
| | Lower Address Latch — write | | H | X | X | VW | X | X | LA |
| | Mode Register Set | MRS | L | X | L | L | TE | L | V |

| A3 | Burst Type BT |
|---|---|
| L | Sequential |
| H | Interleave |

| A2 | A1 | A0 | Burst Length BL |
|---|---|---|---|
| L | L | L | Reserved |
| L | L | H | 2 |
| L | H | L | 4 |
| L | H | H | Reserved |
| H | X | X | Reserved |

| A7 | Test Enable |
|---|---|
| L | Normal Mode |
| H | Test Mode |

Fig. 5

| Contents of Mode Register | | address | | Burst Count |
|---|---|---|---|---|
| BL | BT | A1 | A0 | |
| L (Burst Length =2) | | / | 0 | 0->1 |
| | | / | 1 | 1->0 |
| H (Burst Length =4) | L (Sequential) | 0 | 0 | 0->1->2->3 |
| | | 0 | 1 | 1->2->3->0 |
| | | 1 | 0 | 2->3->0->1 |
| | | 1 | 1 | 3->0->1->2 |
| | H (Interleave) | 0 | 0 | 0->1->2->3 |
| | | 0 | 1 | 1->0->3->2 |
| | | 1 | 0 | 2->3->0->1 |
| | | 1 | 1 | 3->2->1->0 |

Fig. 6

| BL | Function | D0 D1 D2 D3 | VWa0,VWb0,VWc0,VWd0 (A14, A12, A10, A8) | VWa1,VWb1,VWc1,VWd1 (A13, A11, A9, A7) |
|---|---|---|---|---|
| 2 | Mask All Words | ▨ □ | L | L |
| | Reserved | □ ▨ | H | L |
| | Write All Words | □ □ | L | H |
| | Write First One Word | □ ▨ | H | H |
| 4 | Mask All Words | ▨▨▨▨ | L | L |
| | Write All Words | □□□□ | H | L |
| | Write First Two Words | □□▨▨ | L | H |
| | Write First One Word | □▨▨▨ | H | H |

Fig. 7

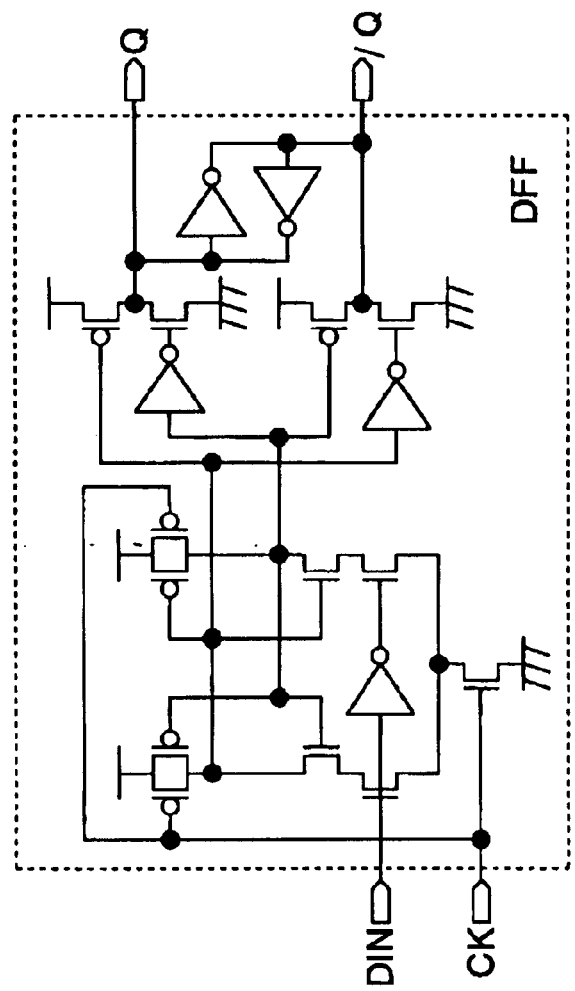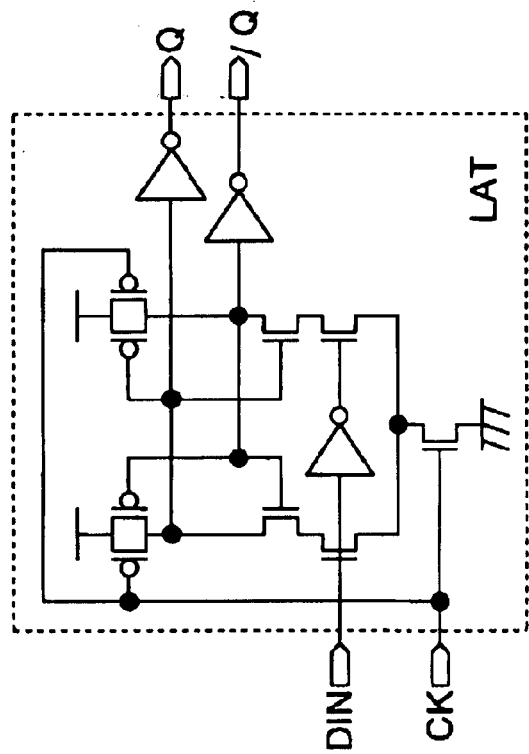
Fig. 11

| Parameters | Symbol | BL=2 | BL=4 |
|---|---|---|---|
| Random Read/Write Cycle Time (Applicable to same bank) | LRC | 4 | 4 |
| RDA/WRA to LAL Command Input Delay (Applicable to same bank) | LRCD | 0.5 | 0.5 |
| LAL to RDA/WRA Command Input Delay (Applicable to same bank) | LRAS | 3.5 | 3.5 |
| Random Bank Access Delay (Applicable to other bank) | LRBD | 1 | 2 |
| LAL following RDA to WRA Delay (Applicable to other bank) | LRWD | 2.5 | 4.5 |
| LAL following WRA to RDA Delay (Applicable to other bank) | LWRD | 0.5 | 0.5 |
| RDA Command to Access Delay | LRAC | 4 | 4 |
| WRA Command to Data-in Delay | LDIN | 3 | 2 |
| Mode Register SET Cycle Time | LRSC | 8 | 8 |
| DLL lock-on Time | LLOCK | 200 | 200 |
| /RST Low Input Hold for Chip Reset | LRST | 12 | 12 |

Unit : CLK

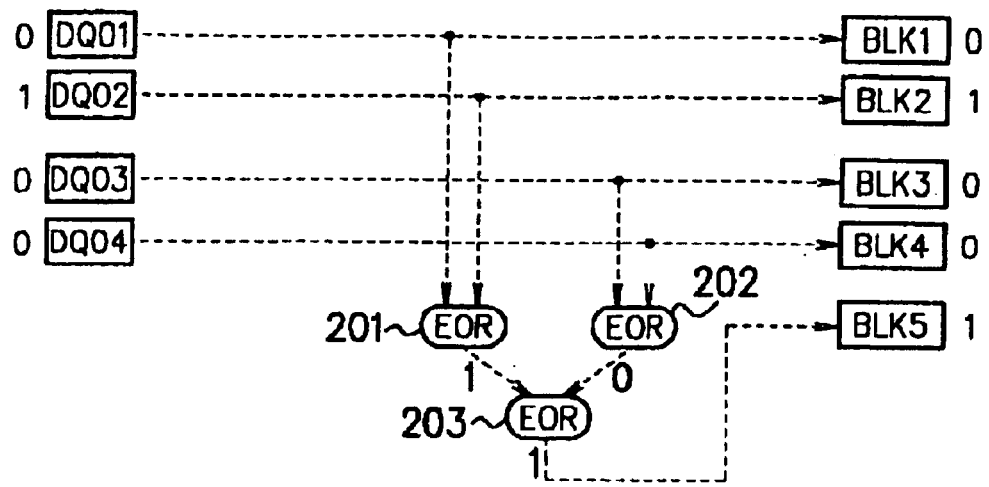
Fig. 69(A)
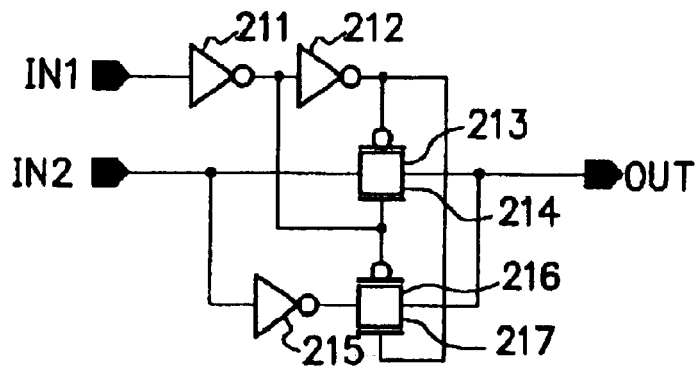
Fig. 69(B)
| INT1 | INT2 | OUT |
|------|------|-----|
| 0 | 0 | 0 |
| 1 | 0 | 1 |
| 0 | 1 | 1 |
| 1 | 1 | 0 |
Fig. 69(C)

SEMICONDUCTOR MEMORY

BACKGROUND OF THE INVENTION

1. Field of the Invention

The present invention relates to a dynamic RAM which requires regular refresh operation of memory cells. Particularly, the present invention relates to a technology to automatically perform the refresh operation in its interior without the need for a refresh request from the exterior.

2. Description of the Related Art

A DRAM is suitable to attain high integration because its memory cells can be structured small. However, the DRAM requires the refresh operation in order to hold data stored in the memory cells. It is necessary to perform the refresh operation regularly on each of the memory cells. When the refresh request is generated, the refresh operation should be performed while taking priority over read operation and write operation.

In a system on which the DRAM is mounted, for example, a memory controller which controls the DRAM supplies a refresh command to the DRAM while taking priority over a read command (or a write command), when the refresh request is generated from its own refresh timer.

Meanwhile, an SRAM does not require the refresh operation, contrary to the DRAM. However, since a number of elements constituting the one-bit cell is larger than that of the DRAM, it is disadvantageous to attain large capacity.

In other words, the refresh operation has to be performed when necessary as long as a DRAM (dynamic random access memory) memory core is used. An operation area being in refresh operation cannot be accessed. As a result of this, when the refresh operation and an access request come at the same time, the access should be suspended until the completion of the refresh operation.

If the DRAM is operated as the SRAM (static random access memory) to which the refresh request is not inputted from the exterior, the refresh request needs to be regularly generated in its interior. When an access request is supplied from the exterior at this point, since the requested access is performed after the refresh operation, performing an actually single access appears to take a time equivalent to performing two operations of the memory core.

In a conventional DRAM, there is a disadvantage that its control increases in complexity because the memory controller controls the refresh operation as well. Further, since it is impossible to perform the read operation and the write operation during the refresh operation, there is a disadvantage that a data transfer rate decreases as compared with the SRAM.

Meanwhile, in the SRAM, it is difficult to attain the large capacity as described above, and further, there is a disadvantage that its chip cost is highly expensive as compared with the DRAM because its memory cells are large.

SUMMARY OF THE INVENTION

It is an object of the present invention to provide a semiconductor memory having both large capacity of a DRAM and usability of an SRAM.

It is another object of the present invention to provide the semiconductor memory which promptly responds to a request for read operation from the exterior of the memory, and whose data transfer rate is high.

It is still another object of the present invention to perform an external access in an access time taken for a single operation of a memory core, even when a refresh operation and an external access request conflict with each other.

According to one of the aspects of the semiconductor memory of the present invention, the semiconductor memory comprises a plurality of first memory blocks for storing data and a second memory block for storing data to reproduce the data stored in the first memory blocks. For example, the second memory block stores a parity bit of the first memory blocks as data. A first command generator receives a command from the exterior of the memory and generates a read command or a write command for accessing the first memory blocks, according to the received command. A second command generator generates a second command for accessing the first memory blocks or the second memory block.

When the read command and the second command access the same first memory block, that is, when the read command and the second command conflict with each other, a read control circuit accesses the first memory block according to the second command. Further, in order to operate in accordance with the read command, the read control circuit reproduces read data, which should be originally read from the first memory blocks, by using the data stored in the second memory block and the other first memory blocks. Hence, read operation time is not extended even when the read command and the second command conflict with each other. Namely, generation of the second command does not affect the read operation.

When the write command and the second command access the same first memory, a write control circuit performs operations according to commands in order in which the commands have been received. For example, when generation of the second command comes earlier than supply of the write command, the write control circuit first accesses the first memory block according to the second command, and thereafter performs write operation. At this time, the write operation in the semiconductor memory delays than usual, but changing supply timings of an address, write data, and the like from the exterior is not necessary. Hence, the generation of the second command does not affect the write operation.

As described above, users of the semiconductor memory can perform the read operation and the write operation without recognizing the conflict between the second command generated inside the semiconductor memory and the read and write commands supplied by the users. This makes it possible to provide a user-friendly semiconductor memory.

According to another aspect of the semiconductor memory of the present invention, the first and second memory blocks are structured of volatile memory cells from which data disappears over time. The second command is a refresh command generated periodically for performing refresh operation of the memory cells. Therefore, the users can use the semiconductor memory without any recognition of the refresh. For example, applying the present invention to the DRAM makes a refresh controller unnecessary in a system on which the DRAM is mounted. In other words, the users can use the DRAM in much the same way as the SRAM.

According to another aspect of the semiconductor memory of the present invention, an external write cycle, as a minimum interval between supplies of the write command, is set to be longer than an internal write cycle as actual write operation time to the first and second memory blocks. A refresh cycle can be inserted without fail while the write command is supplied a plurality of times. Hence, it is possible to prevent the data held in the memory cells from being destroyed, even while the write command is supplied many times. As a way of example, in a semiconductor memory of a clock synchronous type, when the external write cycle is set to n clock cycles (n is an integer equal to or greater than 1), the internal write cycle is set to n–0.5 clock cycles. In this case, when the refresh cycle is 3.5 clock cycles, one refresh cycle can be inserted during seven write operations.

According to another aspect of the semiconductor memory of the present invention, when the internal write cycle is set to n–0.5 clock cycles, every time the write command or the refresh command is supplied, a cycle switching circuit alternately operates first and second cycle generators to operate in synchronization with a first edge and a second edge of an external clock, respectively. The first cycle generator generates a first timing signal for performing an internal operation cycle in synchronization with the first edge of the external clock. The second cycle generator generates a second timing signal for performing the internal operation cycle in synchronization with the second edge of the external clock. The two cycle generators are used alternately to perform the write operation or the refresh operation, by which facilitates the control of performing each operation.

According to another aspect of the semiconductor memory of the present invention, the write control circuit includes a state control circuit. The state control circuit sequentially holds next write commands supplied during write operation to perform a write operation corresponding to one of the supplied commands which is being held after completion of the write operation. Hence, even when the refresh operation is inserted during successive write operations, it is possible to reliably perform the write operation after the refresh operation.

As described above, setting the external write cycle to be longer than the internal write cycle can reduce a delay occurring from supply of the write command to start of the write operation, every time the write operation is performed. A difference between the external write cycle and the internal write cycle may be set such that the delay is resolved by the time when the next refresh command is supplied.

According to another aspect of the semiconductor memory of the present invention, when the read command is supplied to the first memory block in write operation or refresh operation, the read control circuit reproduces read data by using the data stored in the first memory blocks except for the first memory block in the operation, and the second memory block. This makes it possible to perform the read operation without a delay in the access time even when the read operation or the write operation, and the refresh operation conflict with each other inside the semiconductor memory.

According to another aspect of the semiconductor memory of the present invention, only one of the first and second memory blocks is refreshed in response to the refresh command. This enables secure reproduction of read data by using the other memory blocks even when the first memory block on which a read operation is to be performed is in refresh operation. In case where the second memory block is in refresh operation, data can be read directly from the first memory block corresponding to the read command.

According to another aspect of the semiconductor memory of the present invention, a refresh counter sequentially indicates on which of the first and second memory blocks a refresh operation is to be performed. Upon the supply of the read command to the memory block indicated by the refresh counter, the read control circuit reproduces read data by using the data stored in the second memory block, even though the refresh operation is not performed on the indicated memory block. Hence, even when a refresh request is generated immediately before or after the read command, the read control circuit can reproduce read data by using the other memory blocks. Determining in advance which of normal operation and reproduction operation is performed according to a value of the refresh counter makes it possible to facilitate the control of the read control circuit, and further to realize a simple circuit configuration.

According to another aspect of the semiconductor memory of the present invention, the semiconductor memory includes a plurality of data input/output terminals for inputting/outputting data. The first memory blocks are respectively formed corresponding to the data input/output terminals which are different from each other. Namely, in the read operation, all of the first memory blocks continuously operate to output the read data. When a refresh request is generated, unreadable data among read data outputted from the data input/output terminals due to the refresh operation is always only one bit. This allows secure reproduction of data stored in the first memory block being in refresh by using the other first memory blocks and the second memory block.

Meanwhile, in a case where the first memory blocks are formed corresponding to addresses, a single first memory block corresponds to a plurality of data input/output terminals. This requires an increase in capacity of the second memory block for reproducing read data. Further, the read control of the read control circuit becomes more complex.

According to another aspect of the semiconductor memory of the present invention, the semiconductor memory includes a plurality of memory groups composed of the first memory blocks and the second memory block. The refresh operation in response to the refresh command is performed on any of the first memory blocks or the second memory block in the plurality of memory groups. Namely, the read operation and the write operation are performed for every memory group, and the refresh operation is performed for the plurality of memory groups. This results in minimizing a necessary generation number of the refresh commands for refreshing all of the memory cells and in lengthening an generation interval of the refresh commands.

According to another aspect of the semiconductor memory of the present invention, the first and second memory blocks are arranged in a first direction in each of the memory groups. The memory groups are arranged in a second direction orthogonal to the first direction. The refresh operation in response to the refresh command is performed on the first or second memory blocks aligned in the second direction. Arranging the memory blocks simultaneously activated in read and write operations in the first direction and the memory blocks simultaneously activated in refresh operation in the second direction, for example, allows the plurality of memory groups to share sense amplifiers, decoders or, the like, and also allows reduction in chip size.

According to another aspect of the semiconductor memory of the present invention, column selecting switches, column decoders, word decoders, and sense amplifiers are arranged in the first direction, whereby these circuits can be shared by the plurality of memory groups, and the chip size can be reduced.

According to another aspect of the semiconductor memory of the present invention, a clock generator receives an external clock, and generates an internal clock as a synchronizing signal of an internal circuit. A first command receiver circuit receives the write command in synchronization with a first edge of the external clock. A second command receiver circuit receives the refresh command in synchronization with a second edge of the external clock. An arbiter determines an order in which the write command and the refresh command received in the first and second command receiver circuits are to be performed. Shifting receipts of the write command and the refresh command by at least half a clock or more makes it easier to determine the order of command receipt. Namely, the arbiter can be structured simply.

According to another aspect of the semiconductor memory of the present invention, a clock generator receives an external clock, and generates an internal clock as a synchronizing signal of an internal circuit. The first command generator receives commands in synchronization with a first edge and a second edge of the external clock, respectively, and generates the read command or the write command according to the received commands. For example, the first edge is an up edge and the second edge is a down edge subsequent to the up edge. Since the commands are respectively received in synchronization with the two adjacent edges, it is possible to shorten an interval between inputs of the commands and to shorten the access time.

According to another aspect of the semiconductor memory of the present invention, a clock generator receives an external clock, and generates an internal clock as a synchronizing signal of an internal circuit. A data input circuit successively inputs write data in synchronization with the external clock, in response to a single write command. A length of time for the first command generator to start receiving data from reception of the write command changes according to a burst length which is a number of times the write data is received corresponding to the single write command. Hence, it is possible to increase efficiency in use of data buses.

According to another aspect of the semiconductor memory of the present invention, the semiconductor memory includes a plurality of banks operating independently. Each of the banks includes the plurality of first memory blocks and the second memory block. A clock generator receives an external clock, and generates an internal clock as a synchronizing signal of an internal circuit. A data output circuit successively outputs read data in synchronization with the external clock, in response to a single read command. A data input circuit successively inputs write data in synchronization with the external clock, in response to a single write command. In sequentially accessing the banks which are different from each other, minimum intervals between supplies of the read command and the write command change according to a burst length as a number of times the read data is outputted corresponding to the single read command, and a number of times the write data is received corresponding to the single write command. Setting specifications for supplying the commands according to internal operation of the semiconductor memory enables a simple configuration of the control circuit for controlling the internal operation.

According to another aspect of the semiconductor memory of the present invention, the semiconductor memory includes 2m read data bus lines respectively formed corresponding to data input/output terminals. A data switching circuit determines to which of the read data bus lines read data from the memory block is transmitted. A parallel/serial conversion circuit converts parallel read data transmitted through the read data bus line into serial data. The burst length can be set to m or 2m (m is an integer equal to or greater than 1). The data switching circuit transmits the read data to the parallel/serial conversion circuit by using all of the 2m read data bus lines, when the burst length is set to 2m. Further, the data switching circuit transmits m pieces of the read data to the parallel/serial conversion circuit by using the m data bus lines alternately, when the burst length is set to m. Hence, it is possible to ease data transmission cycles of the data buses, especially when the burst length is m. As a result of this, the operation with a high clock frequency can be realized.

According to another aspect of the semiconductor memory of the present invention, the semiconductor memory includes 2m write data bus lines respectively formed corresponding to data input/output terminals. A data switching circuit determines to which of the write data bus lines write data supplied from the exterior is transmitted. A serial/parallel conversion circuit converts serial write data supplied from the exterior into parallel data to be outputted to the write data bus lines. The serial/parallel conversion circuit outputs 2m pieces of the converted parallel write data simultaneously to the 2m write data bus lines, when the burst length is set to 2m. The serial/parallel conversion circuit outputs m pieces of the converted parallel write data alternately to the m write data bus lines, when the burst length is set to m. Hence, it is possible to ease data transmission cycles of the data buses, especially when the burst length is m. As a result of this, the operation with a high clock frequency can be realized.

According to another aspect of the semiconductor memory of the present invention, a clock generator receives an external clock, and generates an internal clock as a synchronizing signal of an internal circuit. A data input circuit successively inputs write data in synchronization with the external clock, in response to a single write command. A data masking control circuit masks write operation on the memory blocks, for each Write data inputted in synchronization with the external clock. All of the write data supplied at the same timing is written or masked so that the data stored in the second memory block can be easily generated. Hence, the circuit for generating the data stored in the second memory block can be simplified.

According to another aspect of the semiconductor memory of the present invention. A data output circuit outputs read data from the memory blocks in synchronization with an internal data strobe signal generated from the internal clock. A data input circuit receives write data supplied from the exterior in synchronization with an external data strobe signal supplied from the exterior. A mode register determines whether the external and internal data strobe signals are inputted/outputted through the same terminal or respectively through different terminals. Hence, it is possible to respond to various needs of the users.

According to another aspect of the semiconductor memory of the present invention, a refresh counter indicates a memory cell on which a refresh operation is to be performed, and counts up with every refresh request. Lower bit(s) of the refresh counter correspond(s) to a bank address for selecting the bank. The refresh operation is performed for each bank. Reducing the number of the refresh control circuits to concurrently operate can further decrease a peak current during the refresh operation. Further, since the plurality of banks are refreshed alternately, generation intervals of the refresh requests can be shortened as compared with the case where the same bank is successively refreshed. Therefore, even with a low operating frequency, it is possible to satisfy a necessary period for refreshing all of the memory cells. In other words, the lower limit of an operating frequency can be set to a lower value.

According to another aspect of the semiconductor memory of the present invention, the semiconductor memory comprises a memory core including a plurality of memory blocks for distributing and storing a plurality of bit data corresponding to the same address, and a control circuit for controlling the memory core. The control circuit is able to control refresh operations of the plurality of memory blocks independently so as to perform refresh operations on one memory block and another memory block at different timings.

Independently performing the refresh operation on the plurality of memory blocks makes it possible to concurrently process an access request from the exterior and the refresh operation. That is, the refresh operation on a part of the memory blocks and an access to the other memory blocks from the exterior can be performed at the same timing. Thereby, the read operation can be realized within an access time taken for a single operation of the memory core. Namely, the read operation can be performed quickly.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 5 is an explanatory view showing states of signals for accepting first and second commands, according to the first embodiment;

FIG. 6 is an explanatory view showing an order of outputting data in read operation, according to the first embodiment;

FIG. 7 is an explanatory view showing the details of a variable write length, according to the first embodiment;

FIG. 11 are circuit diagrams showing the details of a latch circuit and a flip-flop circuit shown in FIG. 10;

FIG. 48 is an explanatory view showing AC specifications of the semiconductor memory, according to the first embodiment;

FIG. 66 is an explanatory view showing another structural example of the memory core;

FIGS. 69(A) to (C) are views of a write parity operational sequence;

DESCRIPTION OF THE PREFERRED EMBODIMENTS

Hereinafter, preferred embodiments of the present invention will be explained with reference to the drawings.

Figure 1:
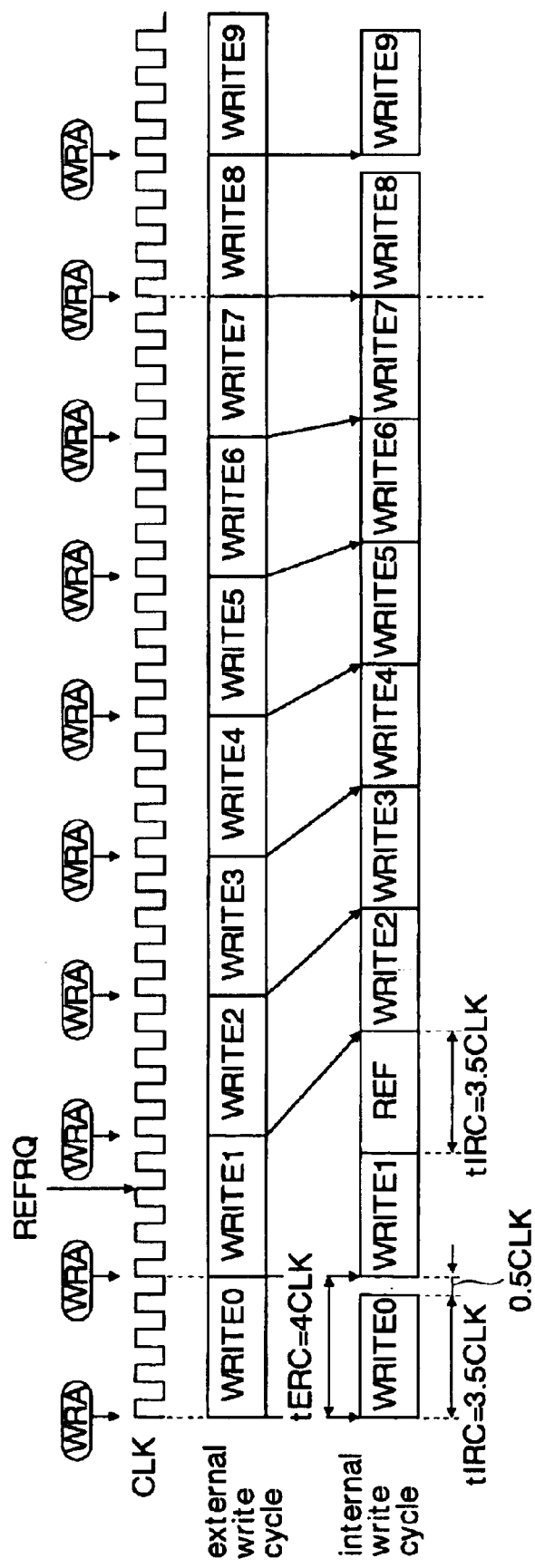
FIG. 1 is a timing chart showing a basic principle of write operation of the present invention.

FIG. 1 shows a basic principle of write operation of a semiconductor memory. According to the present invention, operation time of an internal circuit which is necessary to perform the write operation (internal write cycle tIRC) is designed so that it becomes shorter than a minimum interval between supply of write commands WRA which are supplied from the exterior (external write cycle tERC). For example, the external write cycle tERC is set to 4 clock cycles, and the internal write cycle tIRC is set to 3.5 clock cycles which is shorter than the external write cycle tERC by 0.5 clock. The accumulation of margins of 0.5 clock permits a refresh cycle to be inserted between a plurality of the write cycles.

In concrete, the internal write cycles which actually perform the write operation are 24.5 clock cycles, during the seven external write cycles (28 clock cycles). Namely, the margin of 3.5 clock cycles is generated while the write operations are performed for seven times. Refresh operation is performed by using this margin, whereby it is possible to perform the refresh operation without being recognized from the exterior. In general, when the internal write operations for n-times and the refresh operation for one time can be performed during the external write cycles for n-times, the refresh operation can be hidden from the exterior.

In the drawing, the first write operation WRITE0 is performed in synchronization with the write command WRA, and hence the margin of 0.5 clock is generated after the completion of the write operation. A refresh request REFRQ is generated while the next write operation WRITE1 is performed. The refresh request REFRQ is generated, for example, in synchronization with a falling edge of a clock signal CLK. The refresh operation waits for the completion of the write operation WRITE1 to be performed. Further, the write operation WRITE2 accompanying the second write command WRA waits for the completion of the refresh operation to be performed. Similarly, the third to seventh write operations WRITE3 to WRITE7 respectively wait for the completion of the immediately preceding write operations WRITE2 to WRITE6 to be performed.

In the write operation, it is not necessary for a system on which the semiconductor memory is mounted to recognize timing when write data is actually written into a memory cell. Hence, problems with the system do not occur even when the time from the write command WRA to the actual write operation changes as described above. Incidentally, when a read command is supplied to the memory cell before the data is written into the memory cell, a control circuit for outputting the write data before it is written into the memory cell as read data is necessary.

The write operation WRITE7 allows a lag between the external write cycle and the internal write cycle to be eliminated. The subsequent write operations WRITE8 to WRITE9 are respectively performed in synchronization with the write commands WRA.

Figure 2:
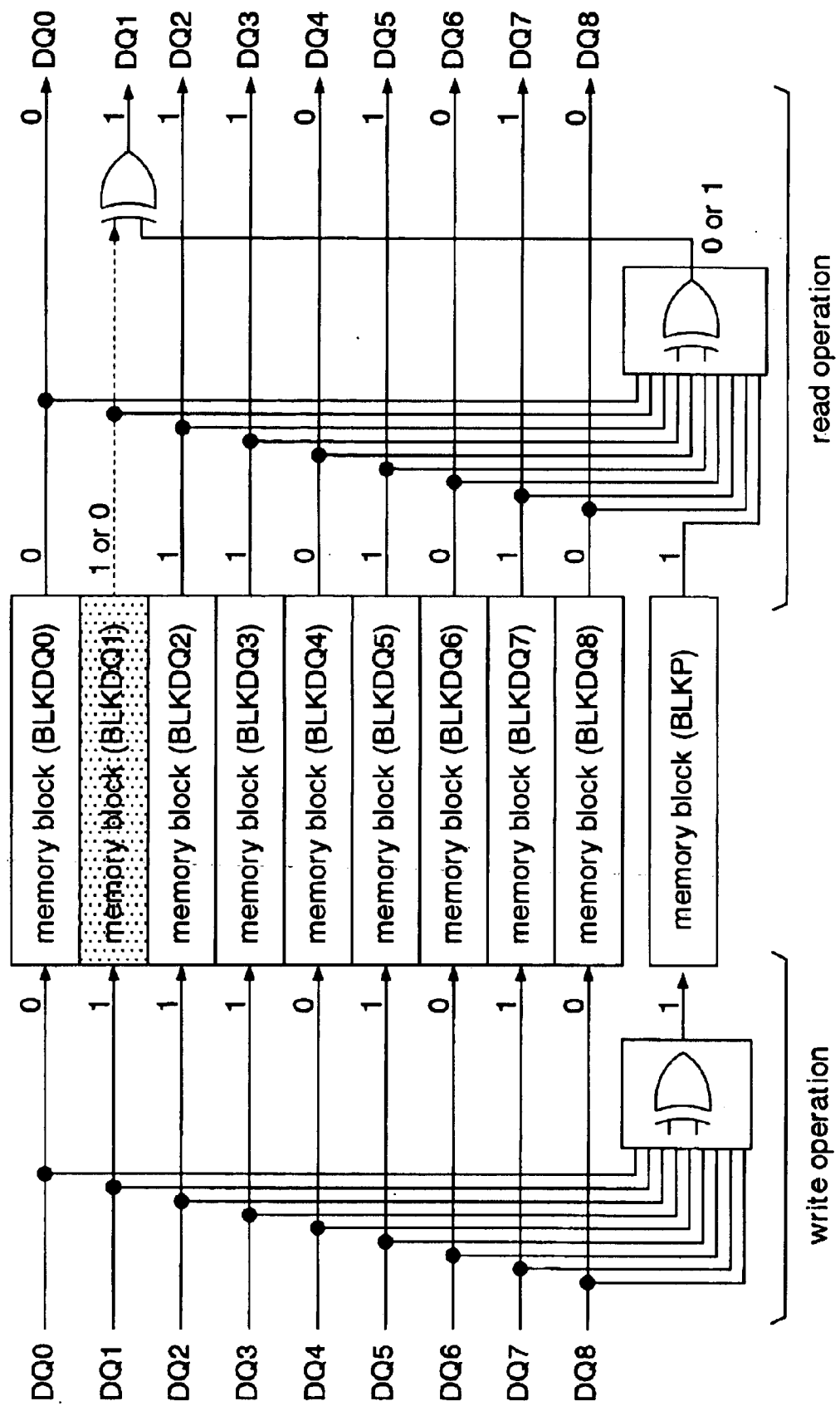
FIG. 2 is a block diagram showing a basic principle of read operation of the present invention.

FIG. 2 shows a basic principle of read operation of the semiconductor memory. The semiconductor memory includes, for example, nine data input/output terminals DQ0 to DQ8. According to the present invention, nine memory blocks BLKDQ0 to BLKDQ8 (first memory block) and a memory block BLKP (second memory block) for storing a parity bit of 9-bit write data DQ0 to DQ8 are formed corresponding to the data input/output terminals DQ0 to DQ8, respectively. Namely, the write data DQ0 to DQ8 and the parity bit constitute one code word. One refresh operation is performed in any of the memory blocks BLKDQ0 to BLKDQ8 and BLKP. The read operation cannot be performed due to the refresh operation in only one memory block, out of one code word. Therefore, the read data of the memory block performing the refresh operation can be easily reproduced only by the memory blocks except for the memory block performing the refresh operation.

As shown in the drawing, in the write operation, when the write data DQ0 to DQ8 are "011101010", "1" is written into the memory block BLKP so that the number of "1" becomes even (the example of an even parity). At this time, when the meshed memory block BLKDQ1 is in refresh operation, only the write operation of the memory block BLKDQ1 is performed by being shifted in time, as shown in FIG. 1.

In the read operation, when the memory block BLKDQ1 is in refresh operation, the read data from the memory blocks BLKDQ0, BLKDQ2 to BLKDQ8 and BLKP are subjected to an EOR operation. Further, the result of the EOR operation and the read data from the memory block BLKDQ1 which is in refresh operation are subjected to the EOR operation, and its result is outputted as the read data.

To be more precise, when the data from the memory block BLKDQ1 (it is not the original read data) is the same as the data held in the memory cell, the result of the first EOR operation becomes "0" without fail. Hence, the data from the memory block BLKDQ1 is outputted as it is by the next EOR operation.

Meanwhile, when the data from the memory block BLKDQ1 is the opposite to the data held in the memory cell, the result of the first EOR operation becomes "1" without fail. Hence, by the next EOR operation, the data from the memory block BLKDQ1 is inverted and outputted.

The read data from the memory blocks BLKDQ0 and BLKDQ2 to BLKDQ8 which are not performing the refresh operation are directly outputted without the EOR operation. The read data from the memory block BLKDQ1 which is in refresh operation is delayed by a delay time of an EOR gate, as compared with the read data from the memory blocks BLKDQ0 and BLKDQ2 to BLKDQ8. As a result of this, it is unlikely that an access time is substantially delayed.

Figure 3:
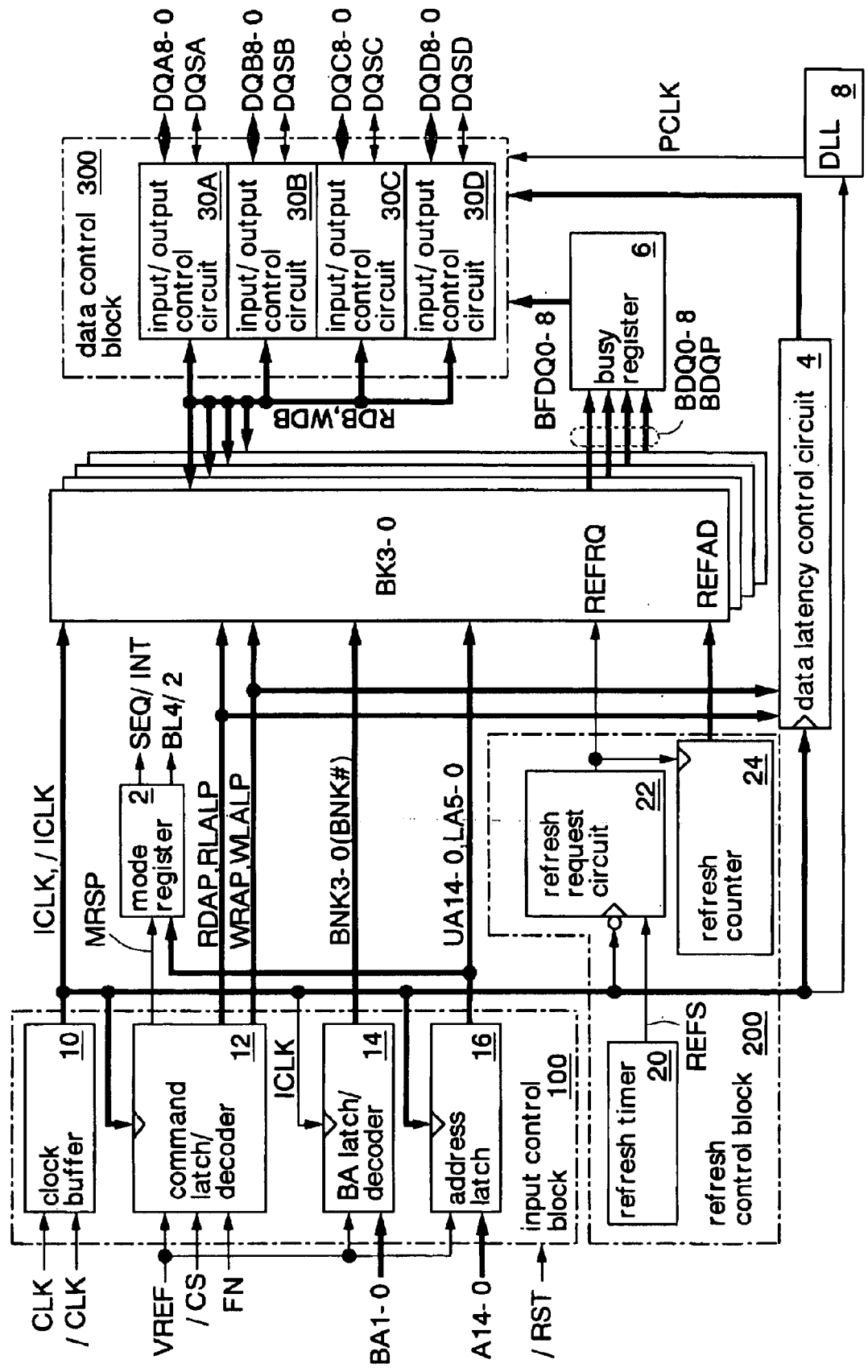
FIG. 3 is a block diagram showing a first embodiment.

FIG. 3 shows a first embodiment of the semiconductor memory according to the present invention. This semiconductor memory is formed on a silicon substrate as a DDR (Double Data Rate) semiconductor memory of a clock synchronous type, by using a CMOS process. The DDR is the interface which inputs/outputs data in synchronization with both of a rising edge and a falling edge of a clock signal (including a data strobe signal). The semiconductor memory includes an input control block 100, a refresh control block 200, a data control block 300, banks BK0 to BK3, a mode register 2, data latency control circuits 4, busy registers 6 and a DLL (Delayed Locked Loop) circuit 8.

The semiconductor memory includes input terminals for receiving clock signals CLK and /CLK (external clock), a reference voltage VREF, a chip selection signal /CS, a function signal FN, bank address signals BA1 to BA0, address signals A14 to A0 and a reset signal /RST from the exterior, and input/output terminals for inputting/outputting data signals DQA8 to DQA0, DQB8 to DQB0, DQC8 to DQC0 and DQD8 to DQD0 and data strobe signals DQSA, DQSB, DQSC and DQSD. Namely, the semiconductor memory includes the data input/output terminals of nine bits and the data strobe terminal for each of four data groups BYTEA, BYTEB, BYTEC and BYTED which will be described later. It should be mentioned that the symbols starting with "/" indicate the negative logic. Each of signal lines indicated by bold lines consists of a plurality of lines. Some of circuits to which the signal lines indicated by the bold lines are connected consist of a plurality of circuits corresponding to the respective signal lines.

The input control block 100 includes a clock buffer (clock generator) 10, a command latch/decoder (first command generator, first command receiver circuit) 12, a bank address latch/decoder 14 and an address latch 16. The details of the input control block 100 will be explained with reference to FIG. 10 to FIG. 12 which will be described later.

The refresh control block 200 includes a refresh timer (second command generator) 20, a refresh request circuit (second command receiver circuit) 22, and a refresh counter 24. The refresh timer 20 outputs a refresh start signal REFS (refresh command) at regular intervals. The refresh request circuit 22 receives the refresh start signal REFS, and outputs the received signal as the refresh request signal REFRQ (refresh command) in synchronization with a falling edge of an internal clock signal ICLK. The refresh counter 24 performs count operation in synchronization with a rising edge of the refresh request signal REFRQ, which are outputted as refresh addresses REFAD. The details of the refresh addresses REFAD will be explained with reference to FIG. 14 which will be described later.

The data control block 300 includes input/output control circuits 30A, 30B, 30C and 30D, each of which corresponds to the data groups BYTEA, BYTEB, BYTEC and BYTED. The details of the data control block 300 will be explained with reference to FIG. 27 to FIG. 42 which will be described later.

The mode register 2 receives a mode register command signal MRSP from the command latch/decoder 12, and a value is set according to the address signal. The mode register 2 outputs a burst type signal SEQ/INT, a burst length signal BL4/2 and the like to the internal circuit according to the contents of the register. The details of the mode register 2 will be explained with reference to FIG. 5 to FIG. 6 which will be described later.

The data latency control circuits 4 receive read command signals RDAP and RLALP and write command signals WRAP and WLALP from the command latch/decoder 12, and internal clock signals ICLK and /ICLK, and output control signals to the data control block 300.

The busy registers 6 receive busy signals BDQ0 to BDQ8 and BDQP from the banks BK0 to BK3, subject the received signals to an or operation for each bit number of the data input/output terminals, and output these as busy flag signals BFDQ0 to BFDQ8 (BFDQ#).

The DLL circuit 8 adjusts the phase of the internal clock signal ICLK and generates a phase adjusting clock signal PCLK. In the read operation, the input/output control circuits 30A, 30B, 30C and 30D of the data control block 300 respectively output the data strobe signals DQSA, DQSB, DQSC and DQSD in synchronization with the phase adjusting clock signal PCLK. Namely, the DLL circuit 8 is the circuit for allowing the data strobe signals DQSA, DQSB, DQSC and DQSD to be in phase with the clock signal CLK which is supplied from the exterior.

Each of the banks BK0 to BK3 includes a plurality of memory cores including memory cells of a DRAM. The details of the banks BK0 to BK3 will be explained with reference to FIG. 13 to FIG. 26 which will be described later.

Figure 4:
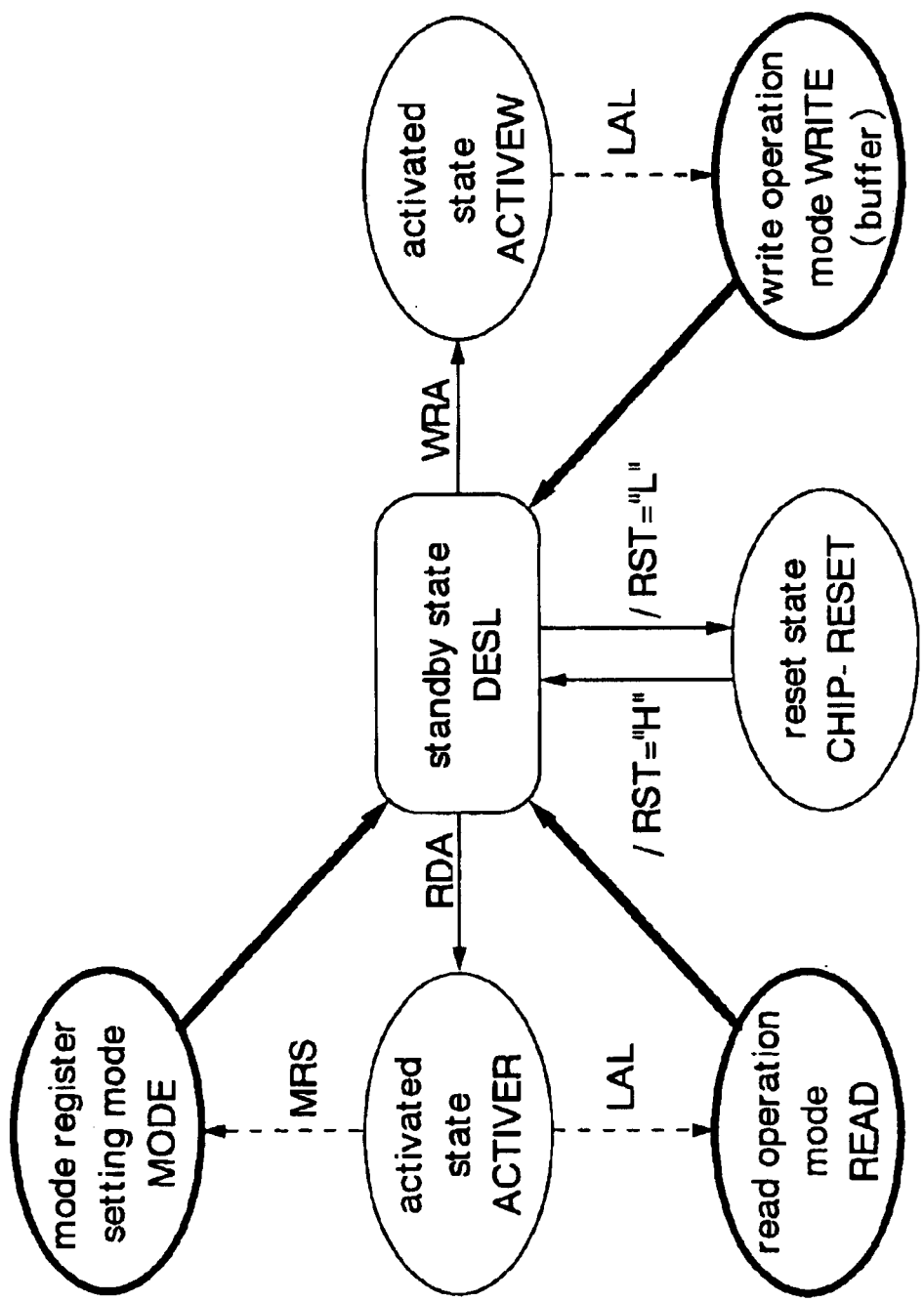
FIG. 4 is a state transition view of the semiconductor memory in response to input of commands, according to the first embodiment.

FIG. 4 is a state transition view of the semiconductor memory in response to the input of the commands. The semiconductor memory includes three operation modes indicated by ellipses of bold lines and four operation states indicated by ellipses of fine lines. The operation modes are a read operation mode READ, a write operation mode WRITE, and a mode register setting mode MODE. The operation states are a standby state DESL (Stand By), activated states ACTIVER and ACTIVEW, and a reset state CHIP-RESET. Since this semiconductor memory automatically performs the refresh operation without being recognized from the exterior, a refresh mode or a refresh command does not exist.

The respective operation modes and operation states shift when each of these receives a read command RDA, the write command WRA, a mode register setting command MRS, a lower address latch command LAL or a deselect command DESL, or when a reset terminal /RST receives a predetermined voltage. Arrows show the directions of the shift.

The RDA command, WRA command, MRS command, LAL command and DESL command are the commands determined by the chip selection signal /CS and the function signal FN. Out of the commands like these, the RDA command and the WRA command which are indicated by fine arrows are the first commands which can be accepted in the standby state DESL. The MRS command and the LAL command which are indicated by broken arrows are the second commands which can be accepted in the activated states ACTIVER and ACTIVEW. Namely, the second commands are the commands which can be accepted after the reception of the first commands. Hence, it is necessary to receive the first commands and to thereafter receive the second commands in order to shift to the read operation mode, write operation mode and mode register setting mode. Further, periods of the activated states ACTIVER and ACTIVEW are the periods after the reception of the first commands until the reception of the second commands.

Arrows indicated by bold solid lines mean returning to the standby state DESL automatically, irrespective of the commands from the exterior. Namely, after the read operation, write operation and setting operation of the mode register 2, the semiconductor memory shifts to the standby state DESL without being controlled from the exterior.

It should be noted that "buffer" in the write operation mode means that the semiconductor memory has a late writing function. The late writing function is the function of holding the write data temporarily in the buffer and writing the held write data into the memory cell in synchronization with the next write command. Due to the late writing function, it is possible to supply the write command WRA quickly after the read operation, and to improve a bus occupation rate of the data.

FIG. 5 shows states of the signals for accepting the first and second commands. In the drawing, a symbol "H" shows a high level, a symbol "L" shows a low level, a symbol "X" shows the high level or the low level arbitrarily, a symbol "BA" shows a bank address, and a symbol "UA" shows an upper address. Further, each of symbols "VW", "TE" and "V" shows a predetermined high level or low level. The first commands and the second commands are respectively received in synchronization with the successive rising edge and falling edge of the clock signal CLK.

The command latch/decoder 12 shown in FIG. 3 accepts the DESL command in synchronization with the rising edge of the clock signal CLK, when the chip selection signal /CS is at the high level. By receiving the DESL command, the state of the semiconductor memory becomes the standby state DESL again. Namely, the DESL command is the command for holding a non-selection state of the chip.

The command latch/decoder 12 accepts the RDA command in synchronization with the rising edge of the clock signal CLK, when the chip selection signal /CS is at the low level and the function signal FN is at the high level. Simultaneously with the acceptance of the RDA command, the bank address signals BA1 to BA0 and address signals A14 to A0 are accepted as the bank addresses BA and the upper addresses UA, respectively. By accepting the RDA command, the state of the semiconductor memory becomes the activated state ACTIVER in FIG. 4.

The command latch/decoder 12 accepts the WRA command in synchronization with the rising edge of the clock signal CLK, when the chip selection signal /CS is at the low level and the function signal FN is at the low level. Simultaneously with the acceptance of the WRA command, the bank address signals BA1 to BA0 and the address signals A14 to A0 are accepted as the bank addresses BA and the upper addresses UA, respectively. By accepting the WRA command, the state of the semiconductor memory becomes the activated state ACTIVEW in FIG. 4.

In the activated state ACTIVER, the command latch/decoder 12 accepts the LAL command in synchronization with the falling edge of the clock signal CLK, when the chip selection signal /CS is at the high level. Simultaneously with the acceptance of the LAL command, the address signals AS to A0 are accepted as the lower addresses LA. After the acceptance of the LAL command, the semiconductor memory performs the read operation and thereafter returns to the standby state DESL.

Figure 8:
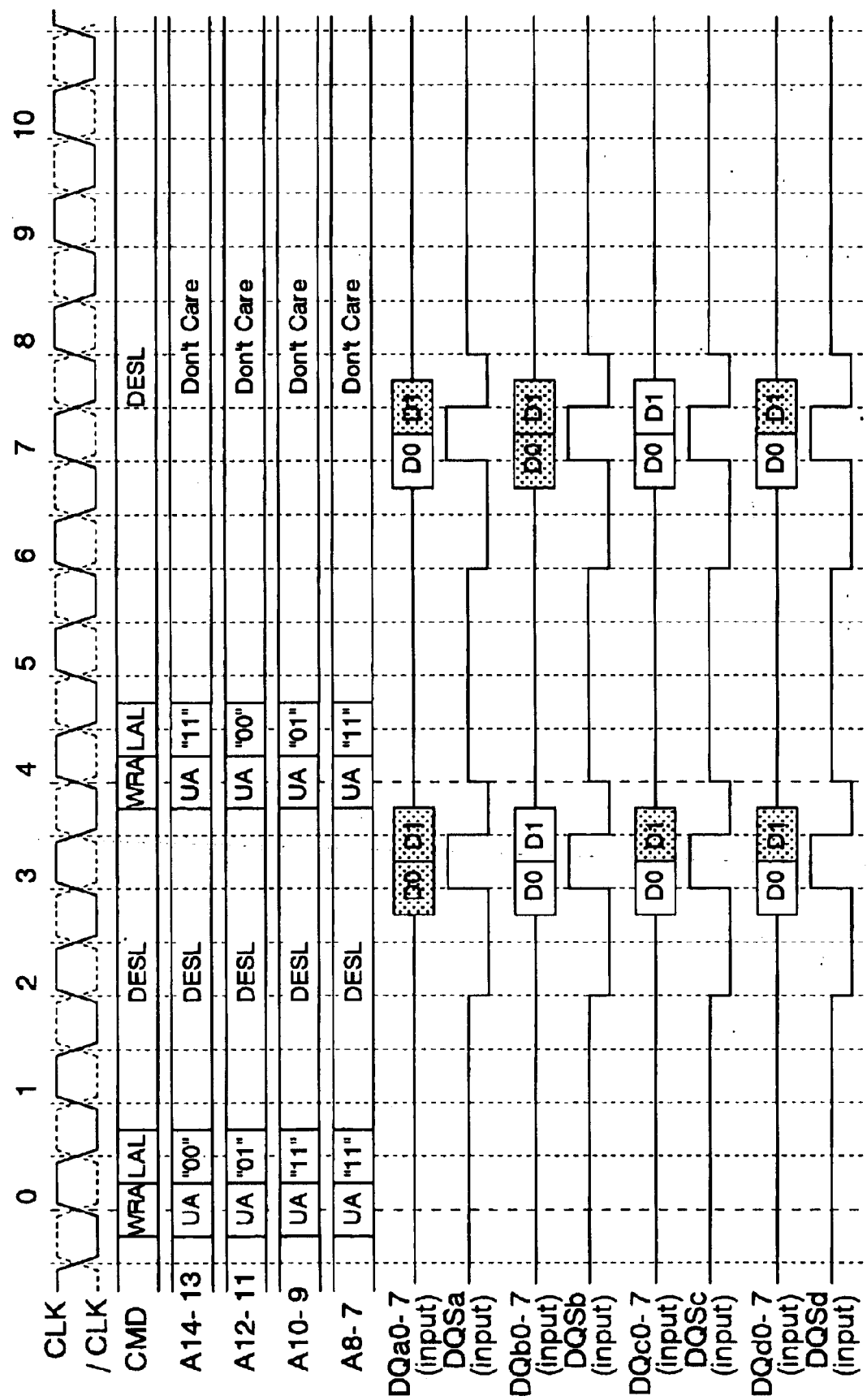
FIG. 8 is a timing chart showing write operation (BL=2) when the variable write length is changed.
Figure 9:
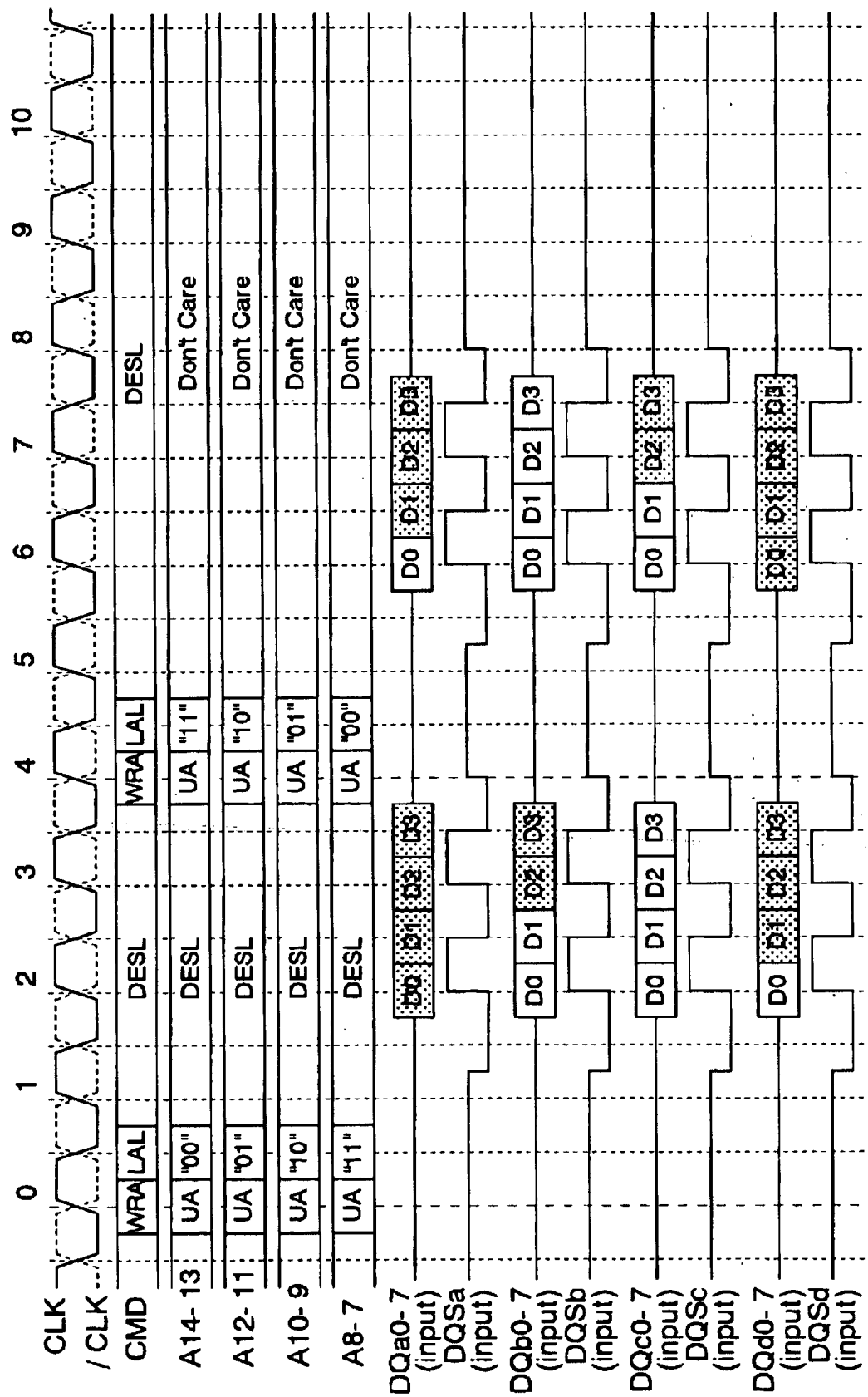
FIG. 9 is a timing chart showing write operation (BL=4) when the variable write length is changed.

In the activated state ACTIVEW, the command latch/decoder 12 accepts the LAL command in synchronization with the falling edge of the clock signal CLK, when the chip selection signal /CS is at the high level. Simultaneously with the acceptance of the LAL command, the address signals A14 to A7 and the address signals A5 to A0 are accepted as variable write lengths VW and the lower addresses LA, respectively. The variable write length VW is the bit for setting a mask of the write data, as shown in FIG. 7 to FIG. 9 which will be described later. After the acceptance of the LAL command, the semiconductor memory performs the write operation and thereafter returns to the standby state DESL. Thus, it is not only the LAL command that determines which of the read operation and the write operation is performed. In other words, the operation modes are narrowed down based on the first and second commands.

In the activated state ACTIVER, the command latch/decoder 12 accepts the MRS command in synchronization with the falling edge of the clock signal CLK, when the chip selection signal /CS is at the low level. Simultaneously with the acceptance of the MRS command, the address signals A7, A3 and A2 to A0 are accepted as a test enable bit TE, a burst type bit and burst length bits, respectively.

The test enable bit TE is the bit for setting the operation mode as either a normal mode or a test mode. When the test enable bit TE is at the low level, it is shifted to a normal operation mode, and when the test enable bit TE is at the high level, it is shifted to the test mode. The test mode is the mode which is used by a semiconductor fabricator during a fabrication process. Namely, when a user supplies the MRS command, the address A7 needs to be at the low level.

A burst type BT is the bit for setting an order in which the read data is output. When the burst type BT is at the low level, the read data are outputted in a sequential mode, and when the burst type BT is at the high level, the read data are outputted in an interleave mode. The details of the sequential mode and the interleave mode will be explained with reference to FIG. 6 which will be described later.

A burst length BL sets the number of successively outputting the read data by one read operation and the number of successively outputting the write data by one write operation. When the burst length bits are "001" in binary number, the burst length BL is set to "2", and when the burst length bits are "010" in binary number, the burst length BL is set to "4".

FIG. 6 shows an order in which the data is output in the read operation. "Burst Count" in the drawing shows the addresses of the read data to be outputted. When the burst length BL is "2", the two read data are successively outputted while being led by the address A0 which is supplied with the LAL command.

When the burst length BL is "4" and in the case of the sequential mode, the four read data are successively outputted while being led by the addresses A1 to A0 which are supplied with the LAL command. When the burst length BL is "4" and in the case of the interleave mode, the order in which the read data is to be outputted is the same as that of the sequential mode, when the address signals A1 to A0 which are supplied with the LAL command are "10" and "00". Meanwhile, when the address signals A1 to A0 are "01" and "11", the second and fourth addresses are replaced as compared with those of the sequential mode, and the read data are outputted.

FIG. 7 shows the details of the variable write length VW which is supplied to a data masking control circuit (not shown). The addresses A14 to A13 (Vwa0 to vWa1), A12 to A11 (VWb0 to VWb1), A10 to A9 (VWc0 to VWc1) and A8 to A7 (VWd0 to VWd1) for setting the variable write lengths VW are allocated to the data groups BYTEA, BYTEB, BYTEC and BYTED, respectively. Namely, the bits VW0 to VW1 of two bits determine which bit of the write data is masked. Write data D0, D1, D2 and D3 in the drawing show the write data supplied according to the burst length BL, and the meshed write data show that these are masked. The masked write data are not written into the memory cells.

In the case where the burst length BL is "2", the data masking control circuit masks all write data when the bits VW0 to VW1 are "00", writes all write data when the bits VW0 to VW1 are "10", and writes only the first one word when the bits VW0 to VW1 are "11". It should be mentioned that one word means the 9-bit write data DQ8 to DQ0 of the respective data groups BYTEA, BYTEB, BYTEC and BYTED.

In the case where the burst length BL is "4", the data masking control circuit masks all write data when the bits VW0 to VW1 are "00", writes all write data when the bits VW0 to VW1 are "01", writes only the first two words when the bits VW0 to VW1 are "10", and writes only the first one word when the bits VW0 to VW1 are "11".

FIG. 8 and FIG. 9 show the write operation when the variable write length VW is changed when the burst length BL is "2" and "4".

As shown in FIG. 8, the write command WRA and the lower address latch command LAL are supplied in synchronization with the zeroth rising edge and falling edge of the clock signal CLK, respectively. The addresses A14 to A13 (VWa0 to VWa1), A12 to A11 (VWb0 to VWb1), A10 to A9 (VWc0 to VWc1) and A8 to A7 (VWd0 to VWd1), which are supplied with the LAL command, are "00", "01", "11" and "11", respectively. The write data D0 and D1 are supplied to each of the data groups BYTEA, BYTEB, BYTEC and BYTED, in synchronization with the third rising edge and falling edge of the clock signal CLK. According to the addresses A14 to A7 supplied with the LAL command, the semiconductor memory masks the write data.

Similarly, the write command WRA and the lower address latch command LAL are supplied in synchronization with the fourth rising edge and falling edge of the clock signal CLK, respectively. The addresses A14 to A13 (VWa0 to VWa1), A12 to A11 (VWb1 to VWb1), A10 to A9 (VWc0 to VWc1) and A8 to A7 (VWd0 to VWd1), which are supplied with the LAL command, are "11", "00", "01" and "11", respectively. The write data D0 and D1 are supplied to each of the data groups BYTEA, BYTEB, BYTEC and BYTED, in synchronization with the seventh rising edge and falling edge of the clock signal CLK. According to the addresses A14 to A7 supplied with the LAL command, the semiconductor memory masks the write data.

As shown in FIG. 9, the write command WRA and the lower address latch command LAL are supplied in synchronization with the zeroth rising edge and falling edge of the clock signal CLK, respectively. The addresses A14 to A13 (VWa0 to VWa1), A12 to A11 (VWb0 to VWb1), A10 to A9 (VWc0 to VWc1) and A8 to A7 (VWd0 to VWd1), which are supplied with the LAL command, are "00", "01", "10" and "11", respectively. The write data D0, D1, D2 and D3 are supplied to each of the data groups BYTEA, BYTEB, BYTEC and BYTED, in synchronization with the second and third rising edges and falling edges of the clock signal CLK. According to the addresses A14 to A7 supplied with the LAL command, the semiconductor memory masks the write data.

Similarly, the write command WRA and the lower address latch command LAL are supplied in synchronization with the fourth rising edge and falling edge of the clock signal CLK, respectively. The addresses A14 to A13 (VWa0 to VWa1), A12 to A11 (VWb0 to VWb1), A10 to A9 (VWc0 to VWc1) and A8 to A7 (VWd0 to VWd1), which are supplied with the LAL command, are "11", "10", "01" and "00", respectively. The write data D0, D1, D2 and D3 are supplied to each of the data groups BYTEA, BYTEB, BYTEC and BYTED, in synchronization with the sixth and seventh rising edges and falling edges of the clock signal CLK. According to the addresses A14 to A7 supplied with the LAL command, the semiconductor memory masks the write data.

Figure 10:
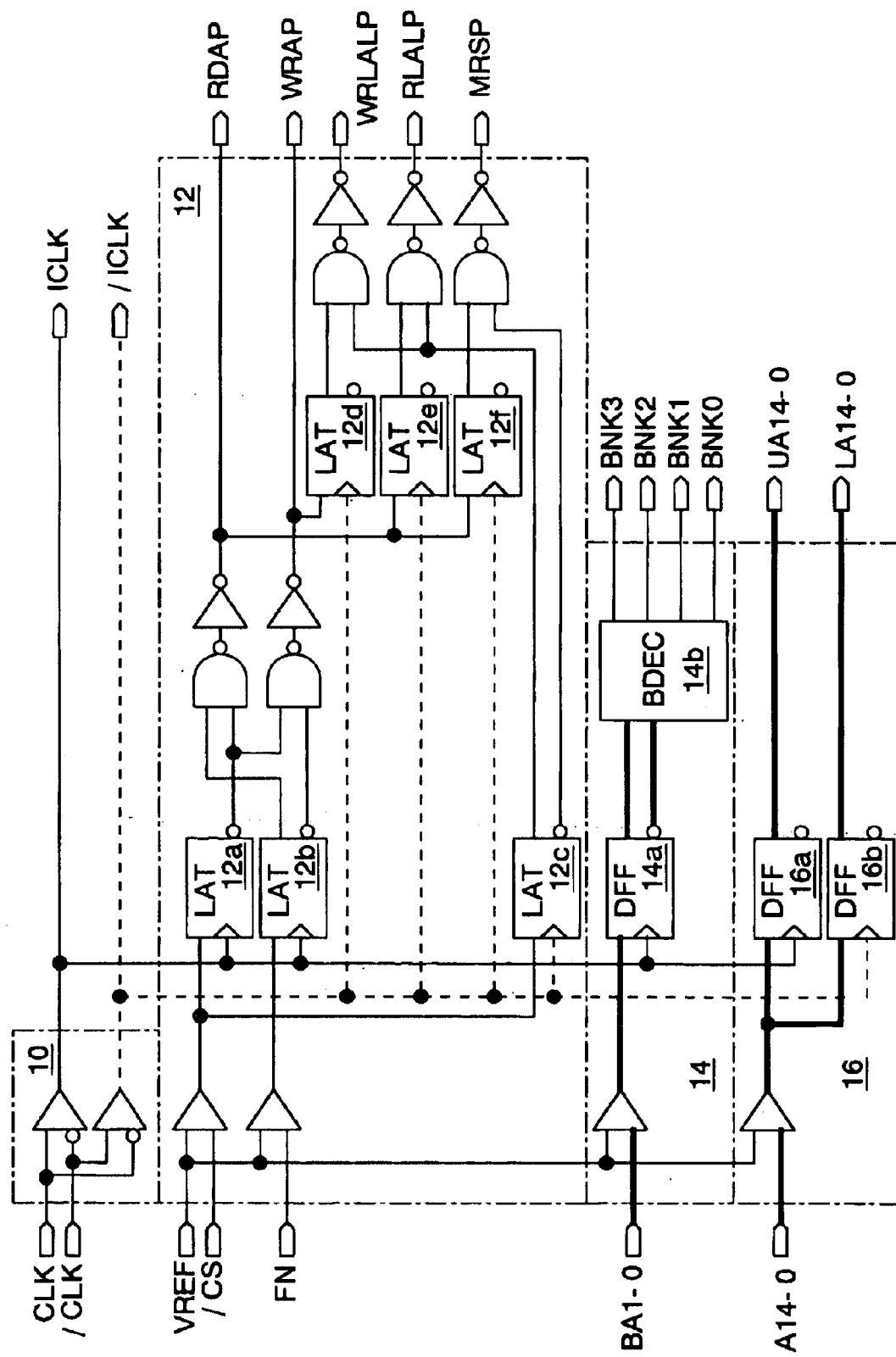
FIG. 10 is a circuit diagram showing the details of an input control block shown in FIG. 3.

FIG. 10 shows the details of the input control block 100 shown in FIG. 3. The clock buffer 10 includes two differential amplifiers for receiving the clock signals CLK and /CLK which are complementary to each other and for generating the internal clock signals ICLK and /ICLK which are complementary to each other. In the drawing, signal lines of the internal clock signal /ICLK are indicated by broken lines.

The command latch/decoder 12 includes differential amplifiers which respectively receive the chip selection signal /CS and the function signal FN, latch circuits 12a, 12b, 12c, 12d, 12e and 12f, and a decoding circuit (five AND circuits) which receives outputs from the latch circuits 12a to 12f and generates the read command signals RDAP and RLALP, the write command signals WRAP and WLALP and the mode register command signal MRSP.

The latch circuits 12a and 12b (first command receiver circuit) respectively accept the chip selection signal /CS and the function signal FN in synchronization with the rising edges of the internal clock signal ICLK, in order to judge the first commands shown in FIG. 5. The latch circuits 12c, 12d, 12e and 12f respectively accept the chip selection signal /CS, the write command signal WRAP and the read command signal RDAP in synchronization with the rising edges of the internal clock signal /ICLK (falling edges of the clock signal CLK), in order to judge the second commands shown in FIG. 5.

The decoding circuit (first command generator) receives the outputs from the latch circuits 12a to 12f and generates the command signals RDAP, RLALP, WRAP, WLALP and MRSP according to the logics in FIG. 5. The command signals RDAP and WRAP are respectively activated when the RDA command and the WRA command (both are the first commands) are supplied. The command signals RLALP and WLALP are respectively activated when the LAL command after the RDA command and the LAL command after the WRA command (both are the second commands) are supplied. The command signal MRSP is activated when the MRS command (second command) after the RDA command is supplied.

The bank address latch/decoder 14 includes a differential amplifier for receiving the bank address signals BA1 to BA0, a flip-flop circuit 14a and a bank decoder 14b. The flip-flop circuit 14a accepts the bank address signals BA1 to BA0 in synchronization with the rising edges of the internal clock signal ICLK. The bank decoder 14b activates any of bank signals BNK3 to BNK0, according to an output from the flip-flop circuit 14a.

The address latch 16 includes flip-flop circuits 16a and 16b which operate in synchronization with the rising edges of the internal clock signals ICLK and /ICLK, respectively. The flip-flop circuit 16a corresponds to the first commands in FIG. 5, and outputs the address signals A14 to A0, which are supplied with the RDA command and the WRA command, as upper address signals UA14 to UA0. The flip-flop circuit 16b corresponds to the second commands in FIG. 5, and outputs the address signals A14 to A0, which are supplied with the LAL command and the MRS command, as lower address signals LA14 to LA0.

FIG. 11 shows the details of each of the latch circuits 12a to 12f (LAT) and each of the flip-flop circuits 14a, 16a and 16b (DFF) shown in FIG. 10.

The latch circuit LAT includes two CMOS inverters whose inputs and outputs are connected to each other, nMOS transistors which are arranged between the CMOS inverters and a ground line and receive an input signal D and its inverting signal, respectively, and a pMOS transistor and an nMOS transistor which are controlled by a clock signal CK and activate the latch circuit LAT.

The latch circuit LAT is activated in synchronization with the rising edge of the clock signal CK, and outputs output signals Q and /Q which are complementary to each other, according to a level of the input signal D being received at this time. The latch circuit LAT turns both of the output signals Q and /Q into the low level when the clock signal CK is at the low level.

The flip-flop circuit DFF is structured by adding tri-state buffers and latches to the outputs of the latch circuit LAT. In accepting the input signal D at the low level and at the high level, the tri-state buffer on the upper side of the drawing outputs the low level and the high level, respectively, and the tri-state buffer on the lower side of the drawing outputs the high level and the low level, respectively. When the clock signal CK is at the low level, both of the tri-state buffers turn off the outputs. At this time, the data held in the latches are outputted as the output signals Q and /Q.

Figure 12:
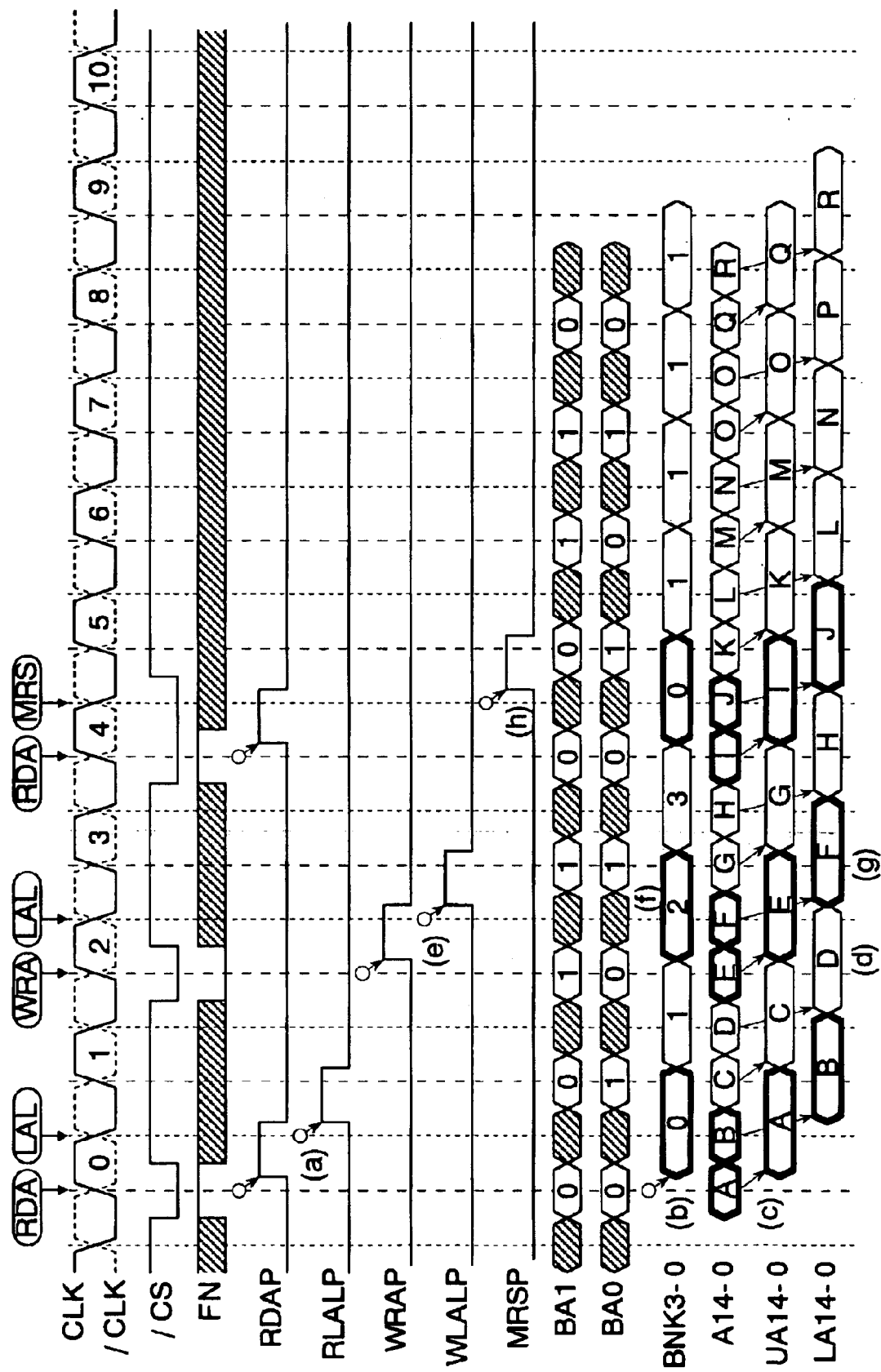
FIG. 12 is a timing chart showing the operation of the input control block shown in FIG. 3.

FIG. 12 shows the operation of the input control block 100 shown in FIG. 3. In this example, the case where the read command RDA, the lower address latch command LAL, the write command WRA, the lower address latch command LAL, the read command RDA and the mode register setting command MRS are sequentially supplied will be explained.

First, the RDA command and the LAL command are supplied in synchronization with the zeroth rising edge and falling edge of the clock signal CLK. The command latch/decoder 12 shown in FIG. 10 activates the read command signals RDAP and RLALP, according to the RDA command and the LAL command, respectively (FIG. 12(a)). The bank latch/decoder 14 accepts the bank address signals BA1 to BA0 (=00) in synchronization with the rising edge of the clock signal CLK, and activates the bank signal BNK0 (FIG. 12(b)). The address latch 16 accepts the address signals A14 to A0 (=A, B) in synchronization with the rising edge and the falling edge of the clock signal CLK, respectively, and outputs these as the address signals UA14 to UA0 and the address signals LA14 to LA0 (FIG. 12(c)).

The latch circuits LAT and the flip-flop circuits DFF shown in FIG. 10 operate at all times in synchronization with the clock signal CLK or /CLK. Hence, the bank address signals BA (=01) and the address signals A14 to A0 (=C, D) are accepted in synchronization with the first rising edge and falling edge of the clock signal (FIG. 12(d)). However, the addresses like these are not effective. The addresses indicated by bold lines in the drawing are the effective addresses.

Next, the WRA command and the LAL command are supplied in synchronization with the second rising edge and falling edge of the clock signal CLK. The command latch/decoder 12 shown in FIG. 10 activates the write command signals WRAP and WLALP, according to the WRA command and the LAL command, respectively (FIG. 12(e)). The bank latch/decoder 14 accepts the bank address signals BA1 to BA0 (=10) in synchronization with the rising edge of the clock signal CLK, and activates the bank signal BNK2 (FIG. 12(f)). The address latch 16 accepts the address signals A14 to A0 (=E, F) in synchronization with the rising edge and falling edge of the clock signal CLK, respectively, and outputs these as the address signals UA14 to UA0 and the address signals LA14 to LA0 (FIG. 12(g)).

Next, the RDA command and the MRS command are supplied in synchronization with the fourth rising edge and falling edge of the clock signal CLK. The command latch/decoder 12 shown in FIG. 10 activates the read command signal RDAP and the mode register command signal MRSP, according to the RDA command and the MRS command, respectively (FIG. 12(h)). Further, similarly to the above, the bank addresses BA and the address signals A14 to A0 are accepted.

Figure 13:
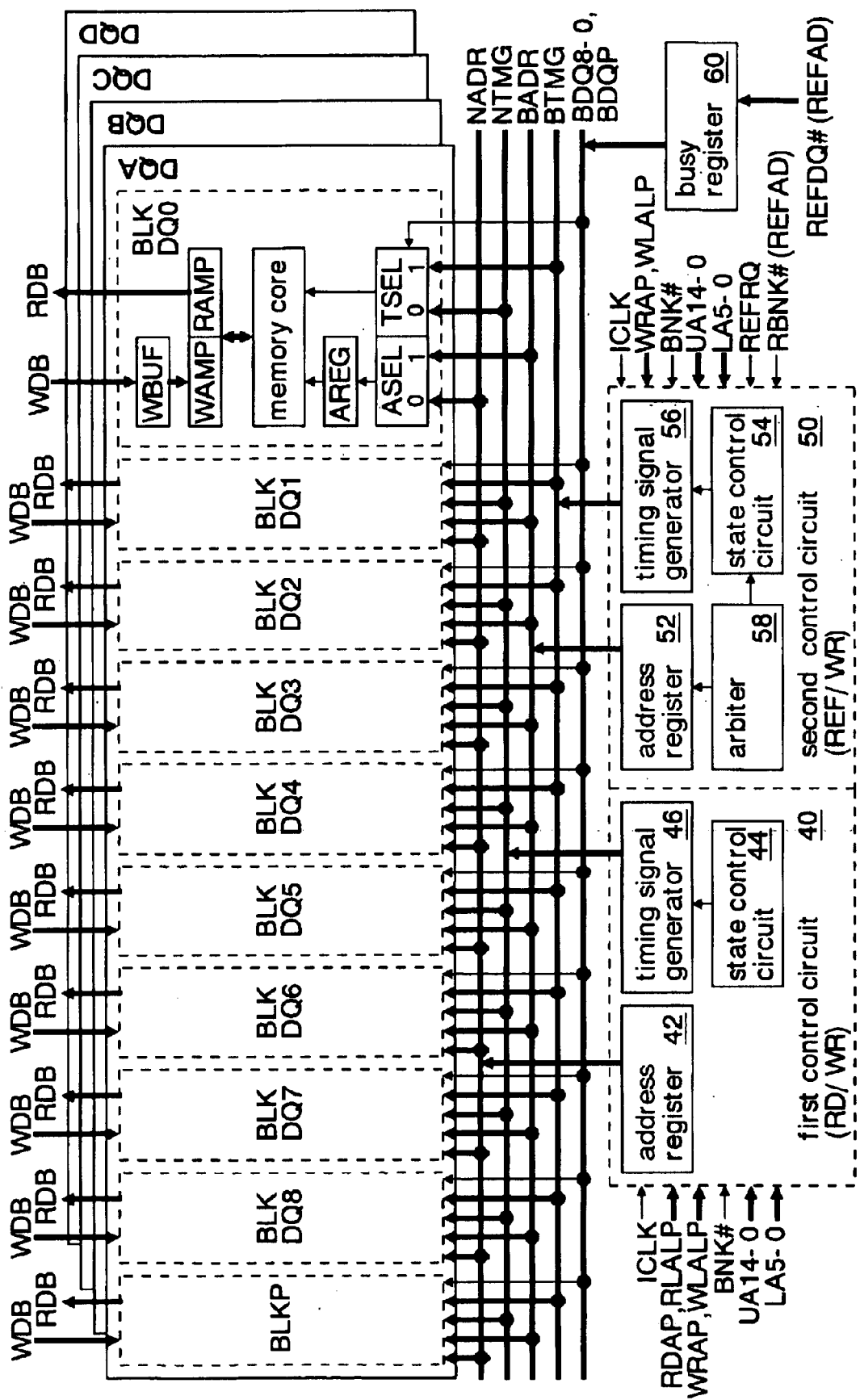
FIG. 13 is a block diagram showing the details of a bank.

FIG. 13 shows the details of the banks BK0 to BK3. In this drawing, any of the banks BK0 to BK3 is shown. Each of the banks BK0 to BK3 includes large memory blocks DQA, DQB, DQC and DQD which correspond to the data groups BYTEA, BYTEB, BYTEC and BYTED, a first control circuit 40, a second control circuit 50 and a busy register 60. Each of the memory blocks DQA, DQB, DQC and DQD includes the small memory blocks BLKDQ0 to BLKDQ8 and BLKP which correspond to the data input/output terminals DQ0 to DQ8 and the parity bit, respectively, as shown in FIG. 2. The memory blocks BLKDQ0 to BLKDQ8 operate as the first memory block and the memory block BLKP operates as the second memory block.

The first control circuit 40 (read control circuit) controls the read operation and the write operation. The second control circuit 50 (write control circuit) controls the refresh operation and the write operation. Namely, the read operation is performed by the control of the first control circuit 40 at all times, and the refresh operation is performed by the control of the second control circuit 50 at all times. Further, the write operation on the memory blocks BLKDQ0 to BLKDQ8 and BLKP which has a possibility of competing with the refresh is performed by the control of the second control circuit 50, and the write operation WR to the memory blocks BLKDQ0 to BLKDQ8 and BLKP which do not have the possibility of competing with the refresh is performed by the control of the first control circuit 40.

The first control circuit 40 includes an address register 42, a state control circuit 44 and a timing signal generator 46. The second control circuit 50 includes an address register 52, a state control circuit 54, a timing signal generator 56 and an arbiter 58.

In the first control circuit 40, the address register 42 accepts the address signals UA14 to UA0 and LA5 to LA0, and outputs the accepted signals to address buses NADR. The state control circuit 44 receives the read command signal RDAP and the write command signal WRAP, and generates a reference timing signal in synchronization with the internal clock signal ICLK. The timing signal generator 46 generates timing signals for operating the memory blocks BLKDQ0 to BLKDQ8 and BLKP in synchronization with the reference timing signal, and outputs these to timing signal buses NTMG.

In the second control circuit 50, the arbiter 58 determines to which the priority is given, the write command WRA from the exterior or the refresh request REFRQ being periodically generated inside, and outputs its result to the address register 52 and the state control circuit 54. Based on the output from the arbiter 58, the address register 52 outputs the address signals UA14 to UA0, LA5 to LA0 or the refresh address signal REFAD to address buses BADR. Based on the output from the arbiter 58, the state control circuit 54 generates a reference timing signal which synchronizes with the internal clock signal ICLK. Based on the reference timing signal, the timing signal generator 56 generates timing signals for operating the memory blocks BLKDQ0 to BLKDQ8 and BLKP, and outputs these to timing signal buses BTMG.

The busy register 60 holds the busy signals BDQ# (BDQ0 to BDQ8, BDQP) which are the decoded refresh block numbers REFDQ# of the refresh addresses REFAD outputted from the refresh counter 24 in FIG. 3. The busy register 60 outputs the busy signals BDQ0 to BDQ8 and BDQP to the memory blocks BLKDQ0 to BLKDQ8 and BLKP, respectively. Any busy signal BDQ# is activated (high level) in the respective banks BK0 to BK3.

Each of the memory blocks BLKDQ0 to BLKDQ8 and BLKP includes selectors ASEL and TSEL, an address register AREG, a memory core, a read amplifier RAMP, a write amplifier WAMP and a write buffer WBUF. The selectors ASEL and TSEL of each of the memory blocks BLKDQ0 to BLKDQ8 and BLKP respectively operate according to the busy signals BDQ0 to BDQ8 and BDQP (BDQ#). When the busy signal BDQ# is at the high level, the selectors ASEL and TSEL select the signals supplied to terminals "1" in the drawing, and when the busy signal BDQ# is at the low level, these select the signals supplied to terminals "0" in the drawing. Namely, the memory block (any of BLKDQ0 to BLKDQ8 and BLKP) corresponding to the high-level busy signal BDQ# is controlled by the second control circuit 50 to perform the refresh operation or the write operation. The memory blocks corresponding to the low-level busy signal BDQ# are controlled by the first control circuit 40 to perform the read operation or the write operation.

The read amplifier RAMP amplifies the read data read from the memory core, and outputs these to read data bus lines RDB. The write amplifier WAMP outputs the write data supplied from write data bus lines WDB through the write buffer WBUF to the memory core.

Figure 14:
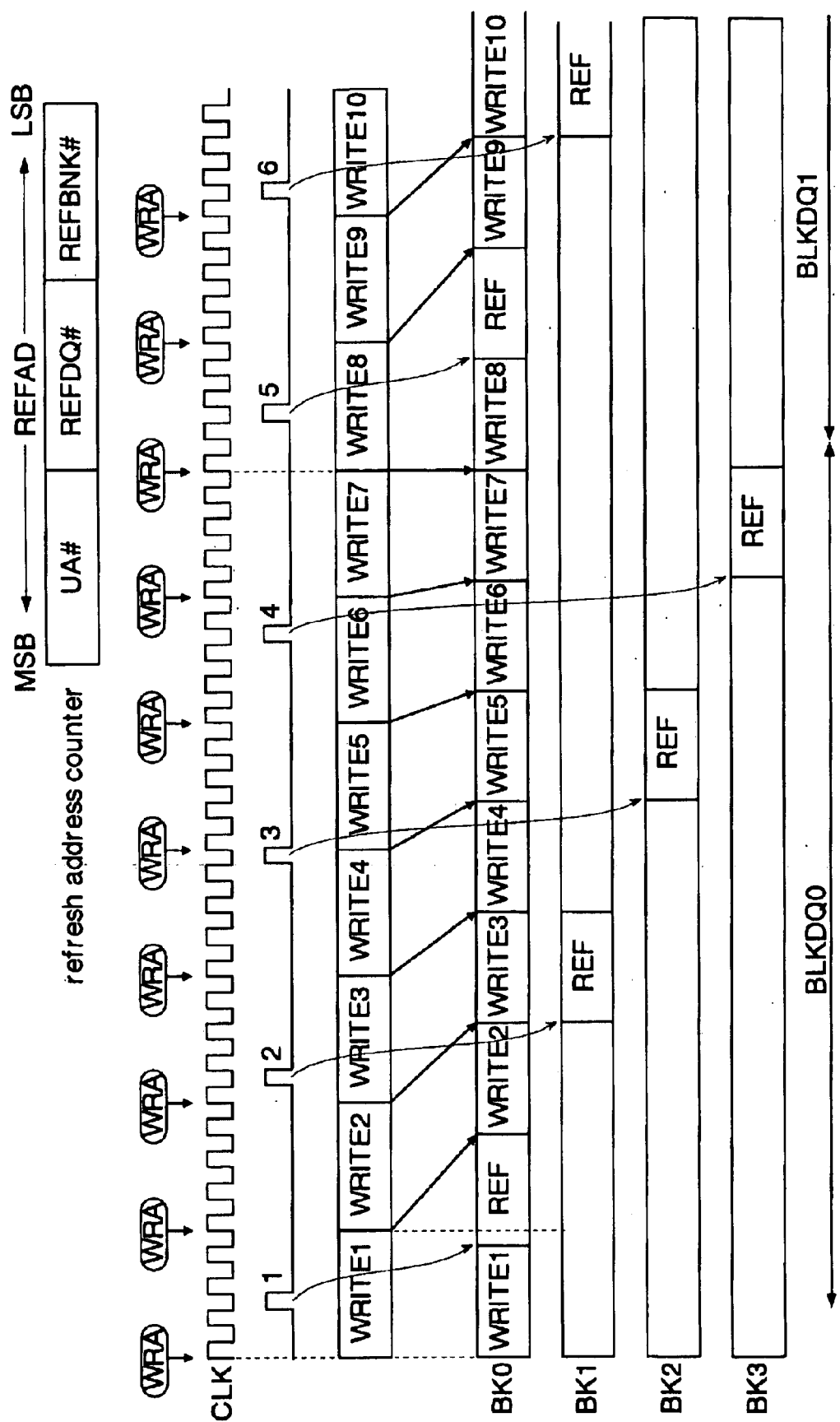
FIG. 14 is a timing chart showing the operation and the outline of refresh operation of a refresh counter shown in FIG. 3.

FIG. 14 shows the operation and the outline of the refresh operation of the refresh counter 24 shown in FIG. 3. The refresh bank number REFBNK# (any of BK0 to BK3), the refresh block number REFDQ# (any of BLKDQ0 to BLKDQ8 and BLKP) and the upper address UA# are allocated in order from a lower bit to the refresh counter 24. When the refresh request REFRQ is generated, first, the banks BK0 to BK3 sequentially switch to be refreshed, next, the memory blocks BLKDQ0 to BLKDQ8 and BLKP sequentially switch, and further, the upper addresses UA switch. Since the refresh block number REFDQ# (10 possible ways) cannot be expressed by the nth power of two, the refresh counter 24 is controlled so that it shows the DQ block BLKDQ0 after showing the memory block BLKP. In the example shown in the drawing, the memory blocks BLKDQ0 in the banks BK0 to BK3 are sequentially refreshed by the first to fourth refresh requests REFRQ, and the memory blocks BLKDQ1 in the banks BK0 to BK1 are sequentially refreshed by the fifth to sixth refresh requests REFRQ.

As described above, in the respective banks BK0 to BK3, one refresh operation is performed during the seven external write cycles (28 clock cycles) so as not to accumulate two or more write commands WRA. Since the banks BK on which the refresh operation is to be performed are switched with every refresh request REFRQ, an interval between generation of the refresh requests REFRQ can be made seven clock cycles, as shown in the drawing. Since the interval between generation of the refresh requests REFRQ can be shortened, it is possible to refresh all of the memory cells in a short time. Even when the frequency of the clock signal CLK is low, it is possible to sufficiently satisfy the period (refresh time tREF, in general) which is necessary for refreshing all memory cells. In other words, it is possible to set a lower limit of an operating frequency to become lower.

Figure 15:
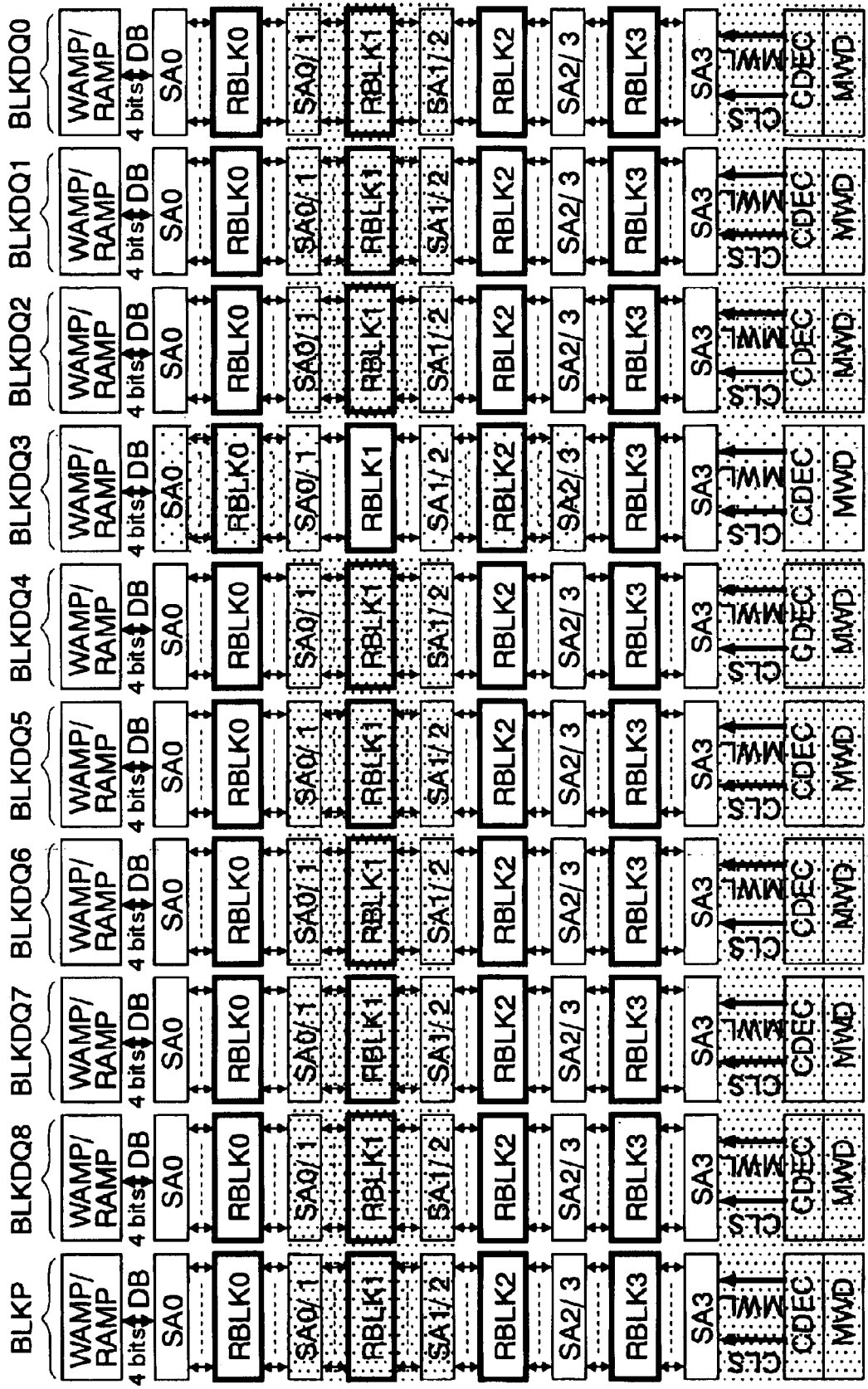
FIG. 15 is a block diagram showing the details of memory blocks shown in FIG. 13.

FIG. 15 shows the details of the memory blocks BLKDQ0 to BLKDQ8 and BLKP. Namely, it shows any of the memory blocks DQA, DQB, DQC and DQD of FIG. 13. Each memory block includes four row blocks RBLK0 to RBLK3 which are arranged in a longitudinal direction in the drawing (second direction), sense amplifiers SA0, SA0/1, SA1/2, SA2/3 and SA3 which are arranged on both sides of the row blocks RBLK like these, the write amplifier WAMP and the read amplifier RAMP which are arranged above the sense amplifier SA0, and a column decoder CDEC and a main word decoder MWD which are arranged underneath the sense amplifier SA3.

The sense amplifiers SA0, SA0/1, SA1/2, SA2/3 and SA3, the column decoders CDEC and the main word decoders MWD are respectively arranged in a horizontal direction in the drawing (first direction). The sense amplifiers SA0/1, SA1/2 and SA2/3 are shared by the row blocks RBLK (memory groups) on both sides thereof. The column decoder CDEC outputs a column selecting signal CLS and the main word decoder MWD outputs a main word line signal MWL. The column decoder CDEC and the main word decoder MWD are shared by the row blocks RBLK0 to RBLK3 corresponding to the memory blocks BLKDQ0 to BLKDQ8 and BLKP which are aligned in the longitudinal direction (second direction) in the drawing. Since the sense amplifiers SA, the column decoder CDEC and the main word decoder MWD are shared, it is possible to reduce a chip size.

The row blocks RBLK in the first direction (blocks whose last numbers are the same) constitute a memory group. Namely, the memory group is structured by the memory blocks BLKDQ to BLKDQ8 and BLKP which are arranged in the first direction.

This drawing shows the state in which the busy signal BDQ3 is activated. Namely, the memory block BLKDQ3 is controlled by the second control circuit 50 shown in FIG. 13 and other memory blocks BLKDQ0 to BLKDQ2, BLKDQ4 to BLKDQ8 and BLKP are controlled by the first control circuit 40. When the refresh request circuit 22 shown in FIG. 3 generates the refresh request REFRQ and the refresh address REFAD of the refresh counter 24 shows this bank, light meshed areas in FIG. 15 operate to perform the refresh operation. Further, when a plurality of the write commands WRA are successively supplied and the refresh operation and the write operation conflict with each other, the write operations are performed by being shifted gradually in time, as explained with reference to FIG. 1.

When the read command RDA is supplied, the read operation of the memory block BLKDQ3 is not performed. The read data of the memory block BLKDQ3 (data input/output terminals DQ3A, DQ3B, DQ3C and DQ3D) is reproduced by using the read data of other memory blocks BLKDQ0 to BLKDQ2, BLKDQ4 to BLKDQ8 and BLKP as explained with reference to FIG. 2. For example, when the read command RDA is supplied to the row block RBLK1, dark meshed areas operate.

Figure 16:
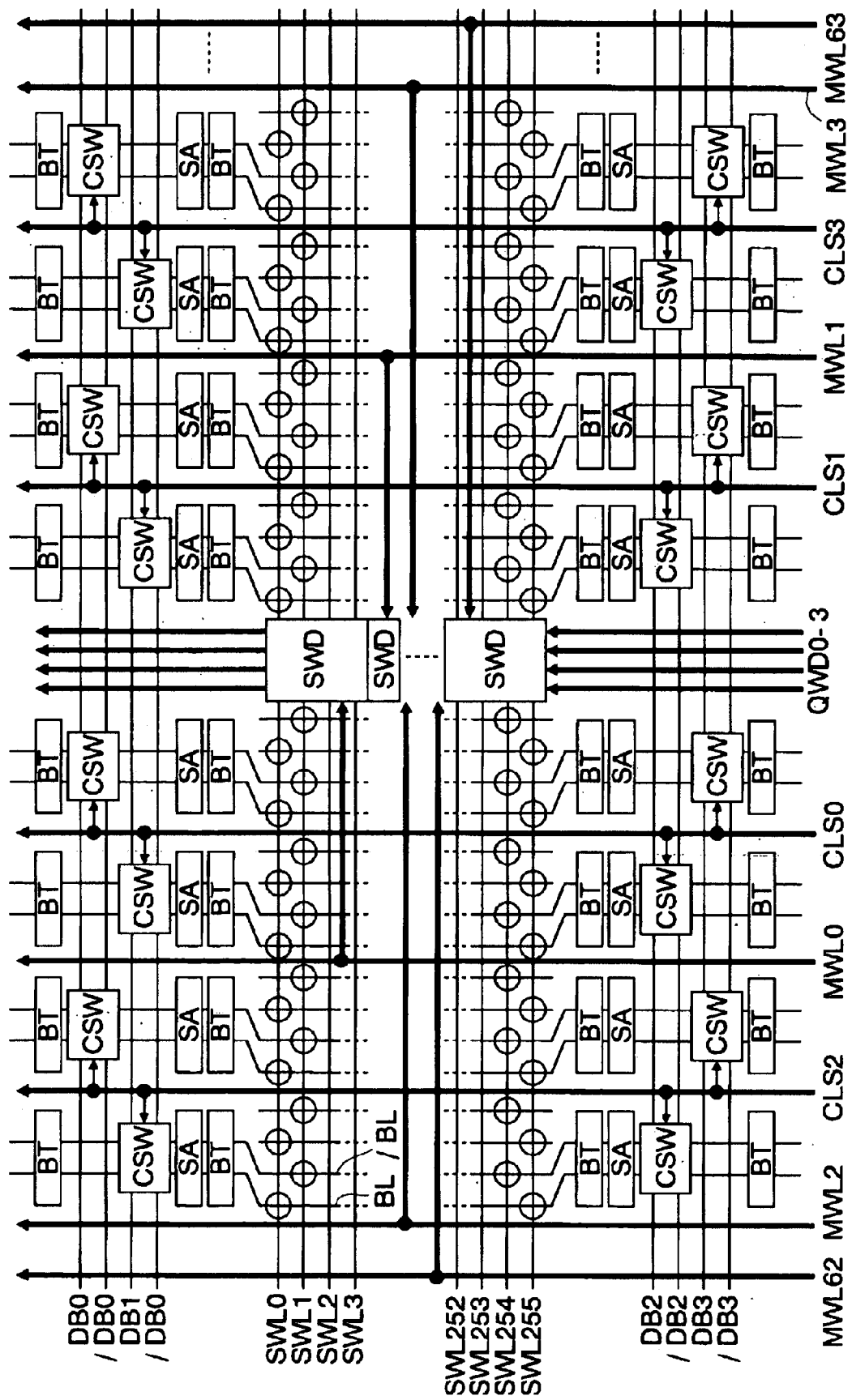
FIG. 16 is a block diagram showing the details of a row block RBLK shown in FIG. 15.

FIG. 16 shows the details of the row block RBLK shown in FIG. 15. In the drawing, circles show the memory cells. The memory cells are connected to bit lines BL (or /BL) and sub word lines SWL. The bit lines BL and /BL transmit the data to the memory cells. The sub word lines SWL control connections between storage nodes of the memory cells and the bit lines. The sense amplifiers SA and the bit lines BL and /BL are connected by block selecting switches BT. The sense amplifiers amplify the data on the bit lines. The bit lines BL and /BL and data bus lines DB and /DB (DB0 to DB3, /DB0 to /DB3) are connected by column selecting switches CSW. FIG. 16 corresponds to one data input/output terminal DQA (or DQB, DQC, DQD). Hence, four data are inputted/outputted in parallel through the data bus lines DB and /DB by one read operation or write operation. Each sub word decoder SWD selects one sub word line SWL according to the signals supplied to the main word lines MWL and 1/4 word lines QWD0 to QWD3. Namely, the word lines have a hierarchical structure.

In this embodiment, four pairs of the data bus lines DB0 to DB3 and /DB0 to /DB3 which are complementary to each other are wired in a horizontal direction in the drawing (first direction), by using a first wiring layer formed of aluminum, copper, titanium or the like. 256 sub word lines SWL0 to SWL255 are wired in the horizontal direction in the drawing (first direction), by using a first polysilicon layer. 64 main word lines MWL0 to MWL63 and 64 column selecting lines CLS0 to CLS63 are wired in a longitudinal direction in the drawing (second direction), by using a second wiring layer whose resistance is the lowest. The second wiring layer is formed of aluminum, copper, titanium or the like. The main word lines MWL0 to MWL63 which are wired by using the second wiring layer are connected to the first wiring layer via through holes on the memory cells. The main word lines MWL0 to MWL63 which are wired by using the first wiring layer in a direction orthogonal to the column selecting lines CLS are connected to the sub word decoders SWD. The bit lines BL and /BL are wired in the longitudinal direction in the drawing (second direction) by using a second polysilicon layer.

Figure 17:
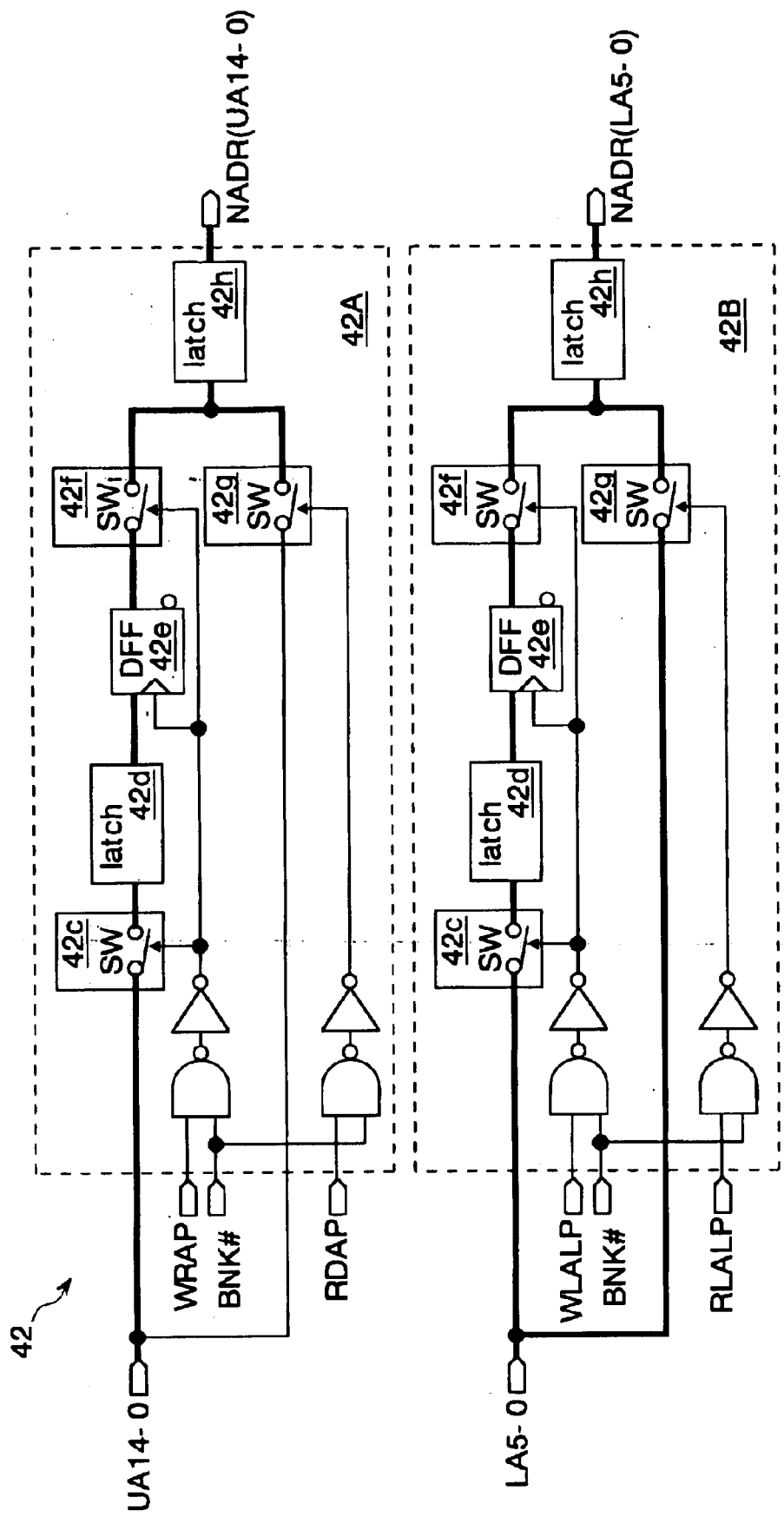
FIG. 17 is a circuit diagram showing the details of an address register in a first control circuit shown in FIG. 13.

FIG. 17 shows the details of the address register 42 in the first control circuit 40 shown in FIG. 13. The address register 42 includes a register 42A which holds the upper address signals UA14 to UA0 supplied with the first commands and a register 42B which holds the lower address signals LA5 to LA0 supplied with the second commands. Both of the registers 42A and 42B operate when its own bank is selected, that is, when the bank signal BNK# is activated.

The register 42A includes a switch 42c, a latch 42d, a flip-flop 42e and a switch 42f which operate in synchronization with the write command signal WRAP and are connected in serial, a switch 42g which operates in synchronization with the read command signal RDAP, and a latch 42h which receives outputs from the switches 42f and 42g.

In the register 42A, the switch 42c turns on when the write command WRA is supplied and the write command signal WRAP is activated, and the upper address signals UA14 to UA0 are held in the latch 42d. At the same time, the address signals UA14 to UA0 which are previously held in the latch 42d are accepted in the flip-flop circuit 42e and outputted through the switch 42f and the latch 42h to the address buses NADR (UA14 to UA0). Namely, this semiconductor memory has the so-called late writing function which is the function of writing the write data supplied with the write command WRA into the memory cells in synchronization with the next write command WRA. It should be noted that, although not particularly shown in FIG. 13, each of the banks BK0 to BK3 includes a data register for holding the data signal corresponding to the previous write command.

Moreover, the switch 42g turns on when the read command RDA is supplied and the read command signal RDAP is activated, and the upper address signals UA14 to UA0 are outputted through the latch 42h to the address buses NADR.

The register 42B is the same circuit as the register 42A. A switch 42c of the register 42B receives the lower address signals LA5 to LA0. The switch 42c, a latch 42d, a flip-flop 42e and a switch 42f of the register 42B operate in synchronization with the write command signal WLALP corresponding to the second command. A switch 42g of the register 42B operates in synchronization with the read command signal RLALP corresponding to the second command. An output of a latch 42h of the register 42B is connected to address buses NADR (LA5 to LA0).

Figure 18:
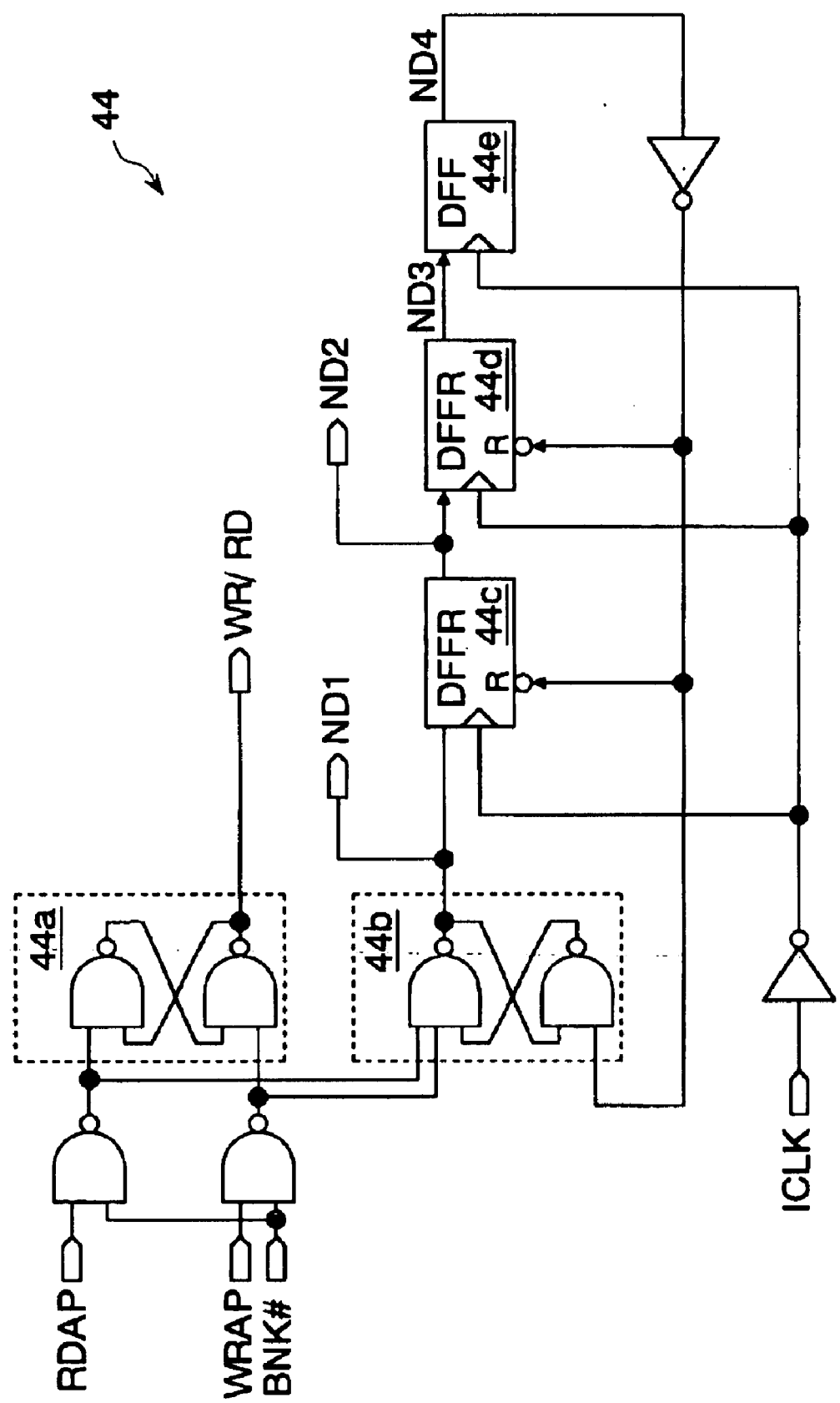
FIG. 18 is a circuit diagram showing the details of a state control circuit in the first control circuit shown in FIG. 13.

FIG. 18 shows the details of the state control circuit 44 in the first control circuit 40 shown in FIG. 13. The state control circuit 44 includes RS flip-flops 44a and 44b, D flip-flop circuits 44c and 44d with reset terminals, and a D flip-flop circuit 44e.

One input of the RS flip-flop 44a receives NAND logic of the read command signal RDAP and the bank signal BNK#, and the other input thereof receives NAND logic of the write command signal WRAP and the bank signal BNK#. Further, the RS flip-flop 44a turns a read/write control signal WR/RD into the low level in response to the activation of the read command signal RDAP, and turns the read/write control signal WR/RD into the high level in response to the activation of the write command signal WRAP.

One input of the RS flip-flop 44b receives NAND logic of the read command signal RDAP and the bank signal BNK# and NAND logic of the write command signal WRAP and the bank signal BNK#, and the other input thereof receives inverting logic of an output of the D flip-flop circuit 44e. The RS flip-flop 44b turns a node ND1 into the high level in response to the activation of the read command signal RDAP or the write command signal WRAP, and turns the node ND1 into the low level in response to the high level of a node ND4.

The RS flip-flop 44b and the D flip-flop circuits 44c, 44d and 44e are connected in series. The reset terminals of the D flip-flop circuits 44c and 44d receive the inverting logic of the output of the D flip-flop circuit 44e. The D flip-flop circuits 44c, 44d and 44e accept the signals in synchronization with the falling edges of the internal clock signal ICLK, and output the accepted signals to nodes ND2, ND3 and ND4, respectively.

Figure 19:
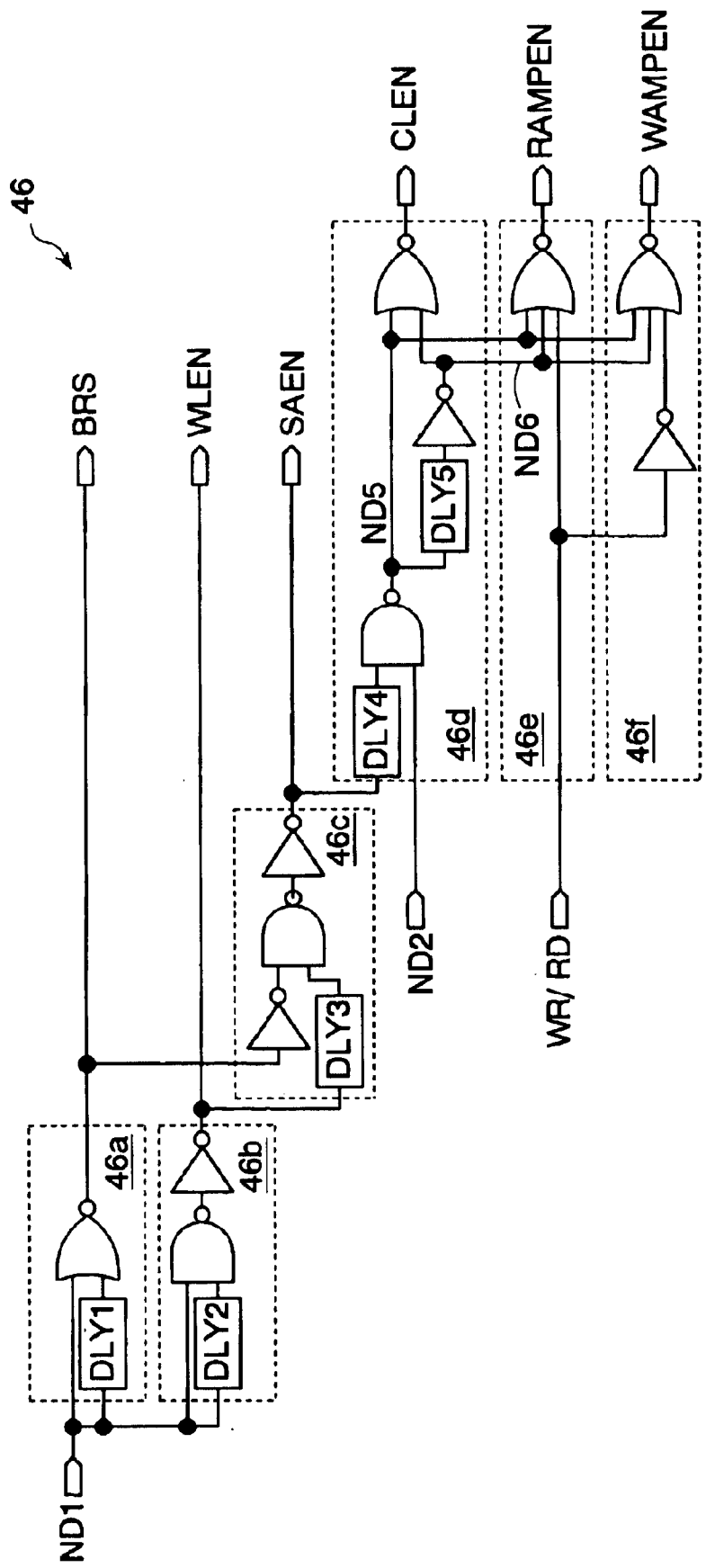
FIG. 19 is a circuit diagram showing the details of a timing signal generator in the first control circuit shown in FIG. 13.

FIG. 19 shows the details of the timing signal generator 46 in the first control circuit 40 shown in FIG. 13. The timing signal generator 46 includes a BRS generator 46a for generating a bit-line short signal BRS, a WLEN generator 46b for generating a word-line enable signal WLEN, an SAEN generator 46c for generating a sense amplifier enable signal SAEN, a CLEN generator 46d for generating a column-line enable signal CLEN, an RAMPEN generator 46e for generating a read amplifier enable signal RAMPEN, and a WAMPEN generator 46f for generating a write amplifier enable signal WAMPEN.

The BRS generator 46a includes a delay circuit DLY1 and a Nor gate. The delay circuit DLY1 delays a signal which is transmitted from the state control circuit 44 shown in FIG. 18 through the node ND1 (ND1 signal) by a delay time DLY1. The Nor gate receives the ND1 signal and an output from the delay circuit DLY1, and generates the bit-line short signal BRS.

The WLEN generator 46b includes a delay circuit DLY2 and an AND circuit. The delay circuit DLY2 delays the ND1 signal by a delay time DLY2. The AND circuit receives the ND1 signal and an output from the delay circuit DLY2, and generates the word-line enable signal WLEN.

The SAEN generator 46c includes a delay circuit DLY3 and an AND circuit. The delay circuit DLY3 delays the word-line enable signal WLEN by a delay time DLY3. The AND circuit receives an output from the delay circuit DLY3 and an inverting signal of the bit-line short signal BRS, and generates the sense amplifier enable signal SAEN.

The CLEN generator 46d includes a delay circuit DLY4, a NAND gate, a delay circuit DLY5 and a Nor gate. The delay circuit DLY4 delays the sense amplifier enable signal SAEN by a delay time DLY4. The NAND gate receives a signal transmitted from the state control circuit 44 through the node ND2 (ND2 signal) and an output from the delay circuit DLY4, and outputs an ND5 signal to a node ND5. The delay circuit DLY5 delays the ND5 signal by a delay time DLY5. The Nor gate receives the ND5 signal and a signal which is an inverted output of the delay circuit DLY5, and generates the column-line enable signal CLEN.

The RAMPEN generator 46e receives the ND5 signal, the signal which is the inverted output of the delay circuit DLY5, and the read/write control signal WR/RD at its Nor gate, and generates the read amplifier enable signal RAMPEN.

The WAMPEN generator 46f receives the ND5 signal, the signal which is the inverted output of the delay circuit DLY5, and an inverting signal of the read/write control signal WR/RD at its Nor gate, and generates the write amplifier enable signal WAMPEN.

Figure 20:
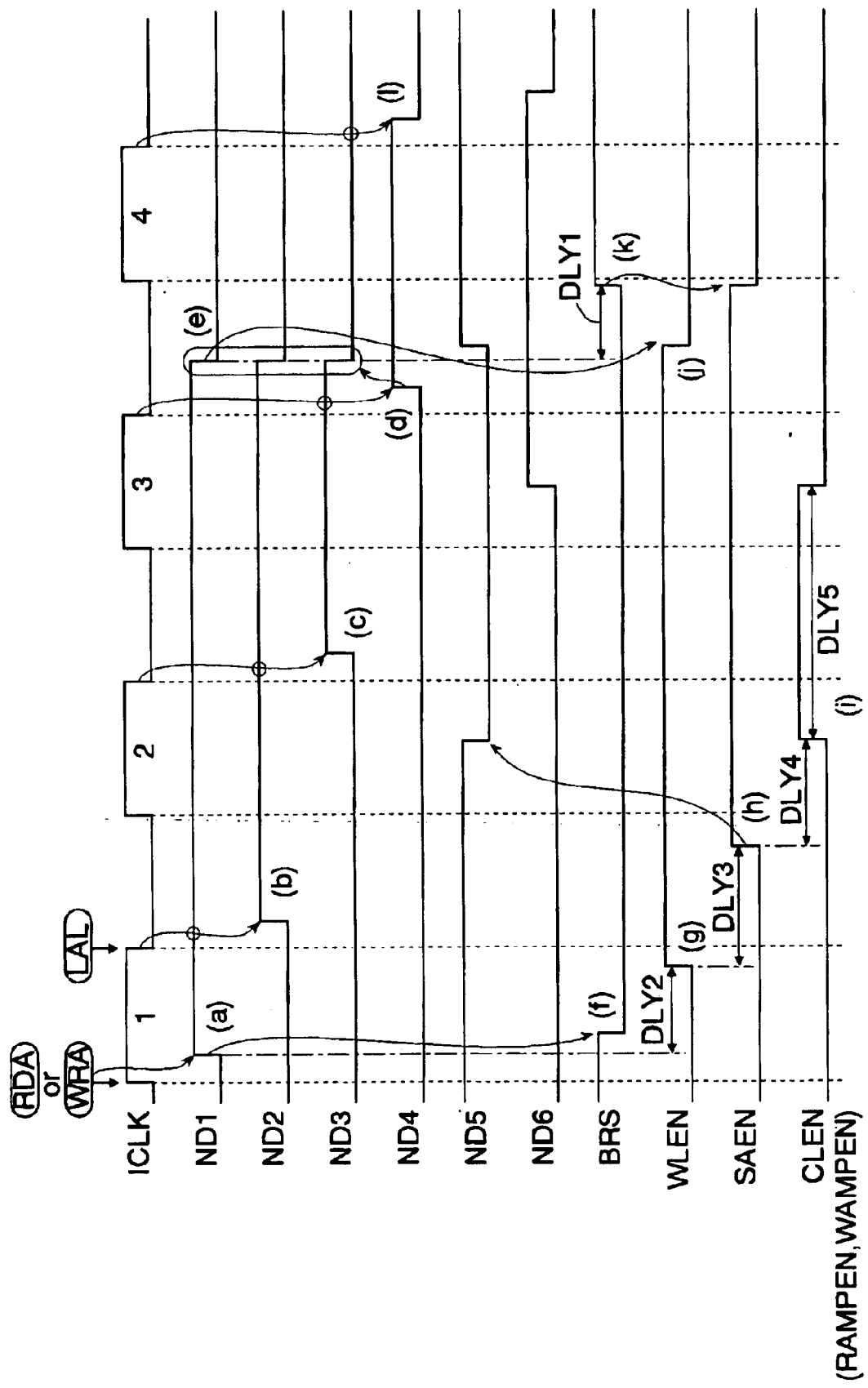
FIG. 20 is a timing chart showing the operation of the first control circuit shown in FIG. 13.

FIG. 20 shows the operation of the first control circuit 40 shown in FIG. 13. In this example, the read command RDA or the write command WRA is supplied in synchronization with the first rising edge of the clock signal, and the lower address latch command LAL is supplied in synchronization with the first falling edge of the clock signal.

The state control circuit 44 shown in FIG. 18 generates the ND1 signal, ND2 signal, ND3 signal and ND4 signal in synchronization with the first rising edge and falling edge of the clock signal CLK and the second and third falling edges of the clock signal CLK, respectively (FIG. 20(a), (b), (c) and (d)). In response to the activation of the ND4 signal, the ND1 signal, ND2 signal and ND3 signal are inactivated (FIG. 20(e)).

The timing signal generator 46 shown in FIG. 19 turns the bit-line short signal BRS into the low level in synchronization with the rising edge of the ND1 signal (FIG. 20(f)), and activates the word-line enable signal WLEN after the delay time DLY2 from the rising edge of the ND1 signal (FIG. 20(g)). The timing signal generator 46 activates the sense amplifier enable signal SAEN after the delay time DLY3 from the activation of the word-line enable signal WLEN (FIG. 20(h)), and activates the column-line enable signal CLEN, the read amplifier enable signal RAMPEN and the write amplifier enable signal WAMPEN after the delay time DLY4 from the activation of the sense amplifier enable signal SAEN (FIG. 20(i)). The column-line enable signal CLEN, the read amplifier enable signal RAMPEN and the write amplifier enable signal WAMPEN are activated only for a period corresponding to the delay time DLY5.

The word-line enable signal WLEN is inactivated in synchronization with the falling edge of the ND1 signal (FIG. 20(j)). The bit-line short signal BRS and the sense amplifier enable signal SAEN are inactivated after the delay time DLY1 from the falling edge of the ND1 signal (FIG. 20(k)). After the ND3 signal turns to the low level, the ND4 signal turns to the low level in synchronization with the falling edge of the internal clock signal ICLK (FIG. 20(l)).

Figure 21:
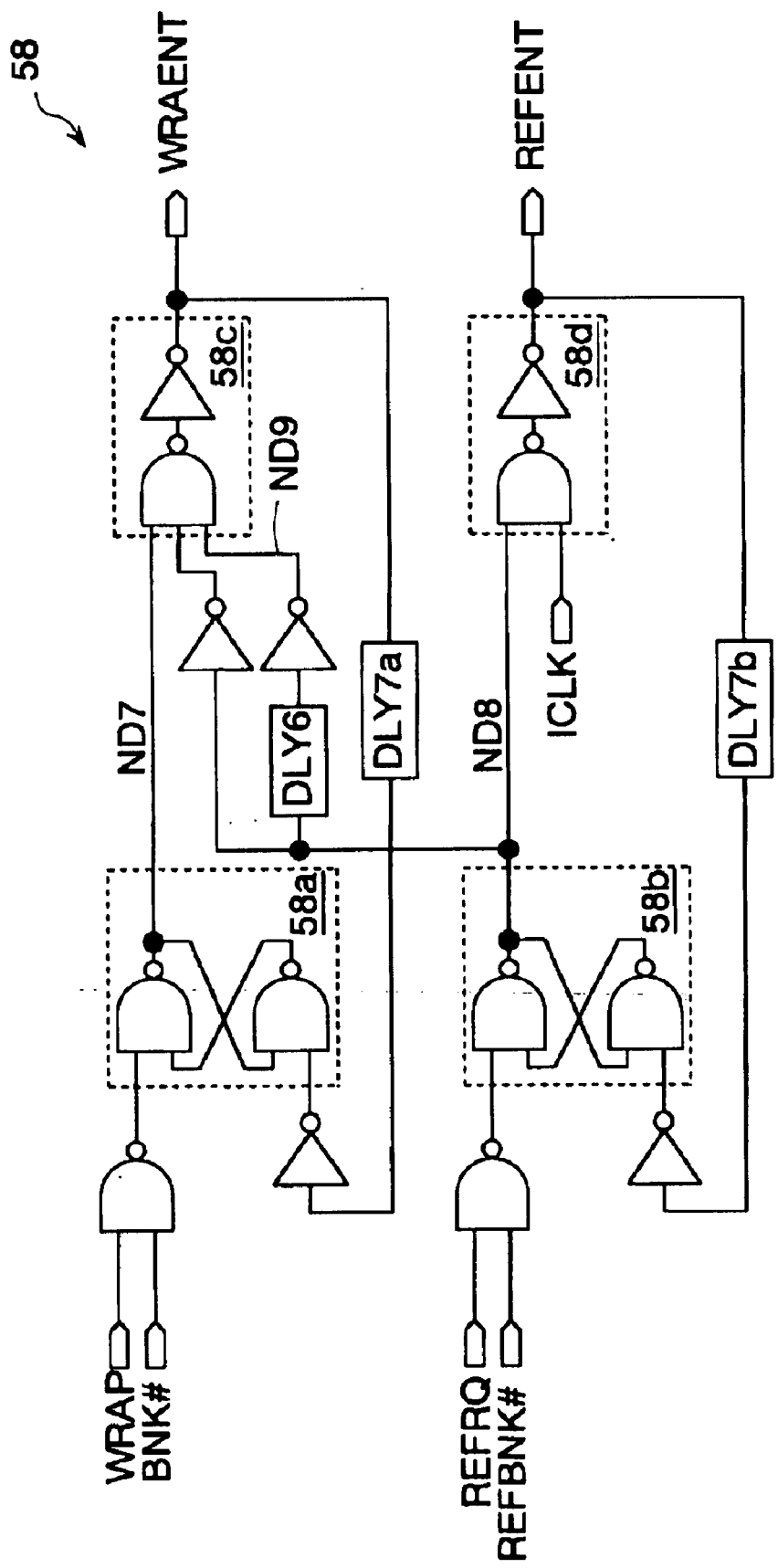
FIG. 21 is a circuit diagram showing the details of an arbiter in a second control circuit shown in FIG. 13.

FIG. 21 shows the details of the arbiter 58 in the second control circuit 50 shown in FIG. 13. The arbiter 58 includes RS flip-flops 58a and 58b, a delay circuit DLY6, two delay circuits DLY7a and DLY7b and AND circuits 58c and 58d.

One input of the RS flip-flop 58a receives NAND logic of the write command signal WRAP and the bank signal BNK#, and the other input thereof receives a signal which is a write entry signal WRAENT being delayed by the delay circuit DLY7a and inverted. The RS flip-flop 58a turns a node ND7 into the low level in response to the activation of the write entry signal WRAENT, and turns the node ND7 into the high level in response to the activation of the write command signal WRAP.

One input of the RS flip-flop 58b receives NAND logic of the refresh request signal REFRQ and the bank signal REFBNK#, and the other input thereof receives a signal which is a refresh entry signal REFENT being delayed by the delay circuit DLY7b and inverted. The RS flip-flop 58b turns a node ND8 into the high level in response to the activation of the refresh request signal REFRQ, and turns the node ND8 into the low level in response to the activation of the refresh entry signal REFENT.

The AND circuit 58c receives a signal transmitting through ND7 (ND7 signal), an inverting signal of a signal transmitting through ND8 (ND8 signal), and a signal which is the ND8 signal being delayed in the delay circuit DLY6 and inverted, and outputs the write entry signal WRAENT.

The AND circuit 58d receives the ND8 signal and the internal clock signal ICLK, and outputs the refresh entry signal REFENT.

Figure 22:
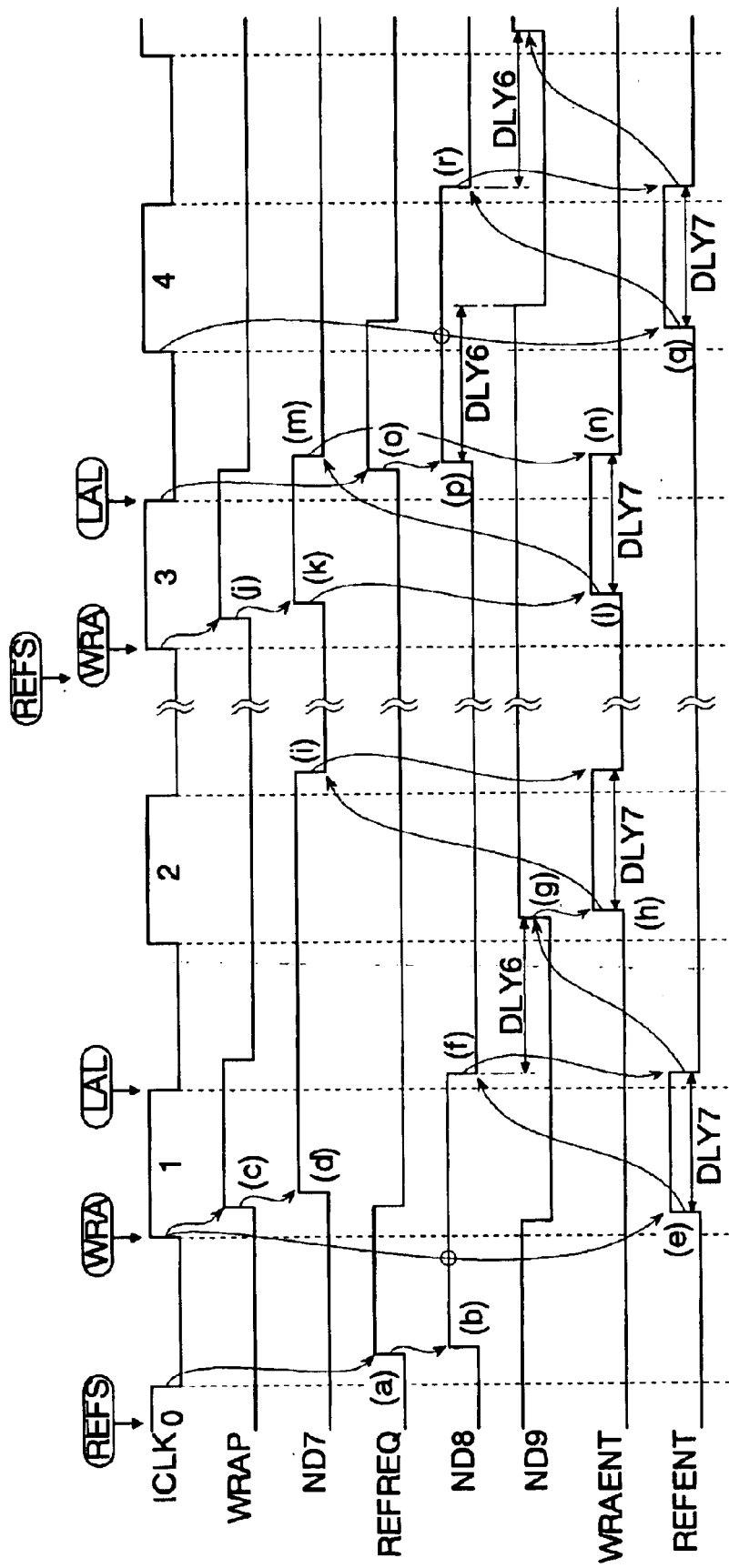
FIG. 22 is a timing chart showing the operation of the arbiter shown in FIG. 21.

FIG. 22 shows the operation of the arbiter 58 shown in FIG. 21. As already explained with reference to FIG. 3, the refresh request circuit 22 activates the refresh request signal REFRQ in synchronization with the falling edge of the internal clock signal ICLK. Hence, when, for example, the refresh timer 20 generates the refresh start signal REFS immediately before the supply of the write command WRA, the refresh request signal REFRQ is accepted in synchronization with the falling edge of the internal clock signal ICLK after the acceptance of the write command WRA. Thus, since the write command WRA and the refresh request REFRQ are shifted from each other by half a clock or more at all times, it is possible to determine the priority by the simple arbiter 58.

First, the refresh start signal REFS is generated before the zeroth falling edge of the internal clock signal ICLK. The refresh request circuit 22 activates the refresh request signal REFRQ in synchronization with the zeroth falling edge of the internal clock signal ICLK (FIG. 22(a)). The arbiter 58 shown in FIG. 21 turns the ND8 signal into the high level in response to the refresh request signal REFRQ (FIG. 22(b)).

Next, the write command WRA is supplied in synchronization with the first rising edge of the internal clock signal ICLK, and the write command signal WRAP is activated (FIG. 22(c)). In response to the write command signal WRAP, the arbiter 58 turns the ND7 signal into the high level (FIG. 22(d)). At this time, since the ND8 signal is at the high level, the AND circuit 58c of the arbiter 58 is inactivated. Therefore, the write entry signal WRAENT is not activated.

The AND circuit 58d of the arbiter 58 activates the refresh entry signal REFENT in synchronization with the rising edge of the internal clock signal ICLK (FIG. 22(e)). The RS flip-flop 58b is reset after a delay time DLY7b from the activation of the refresh entry signal REFENT, and the ND8 signal turns to the low level (FIG. 22(f)). Namely, the refresh entry signal REFENT is activated only for a period corresponding to the delay time DLY7b. Then, the refresh operation is performed before the write operation.

An ND9 signal which is supplied to the AND circuit 58c turns to the high level after a delay time DLY6 from the change of the ND8 signal to the low level (FIG. 22(g)). As a result of this, the AND circuit 58c is activated and the write entry signal WRAENT is activated (FIG. 22(h)). The RS flip-flop 58a is reset after a delay time DLY7a from the activation of the write entry signal WRAENT, and the ND7 signal turns to the low level (FIG. 22(i)). Namely, the write entry signal WRAENT is activated only for a period corresponding to the delay time DLY7a. Then, the write operation is performed after the refresh operation.

Next, the write command WRA is supplied in synchronization with the third rising edge of the internal clock signal ICLK, the write command signal WRAP is activated (FIG. 22(j)), and the ND7 signal is activated (FIG. 22(k)). At this time, since the ND8 signal is at the low level, the AND circuit 58c activates the write entry signal WRAENT in synchronization with the ND7 signal (FIG. 22(l)). Then, the write operation is performed before the refresh operation. The RS flip-flop 58a is reset after the delay time DLY7a from the activation of the write entry signal WRAENT, the ND7 signal turns to the low level (FIG. 22(m)), and the write entry signal WRAENT is inactivated (FIG. 22(n)).

The refresh request signal REFRQ is activated in synchronization with the third falling edge of the internal clock signal ICLK (FIG. 22(o)), and the ND8 signal turns to the high level (FIG. 22(p)). The refresh entry signal REFENT is activated in synchronization with the fourth rising edge of the internal clock signal ICLK (FIG. 22(q)). Then, the refresh operation is performed after the write operation. The ND8 signal turns to the low level after the delay time DLY7b from the activation of the refresh entry signal REFENT (FIG. 22(r)), and the refresh entry signal REFENT is inactivated (FIG. 22(s)).

Figure 23:
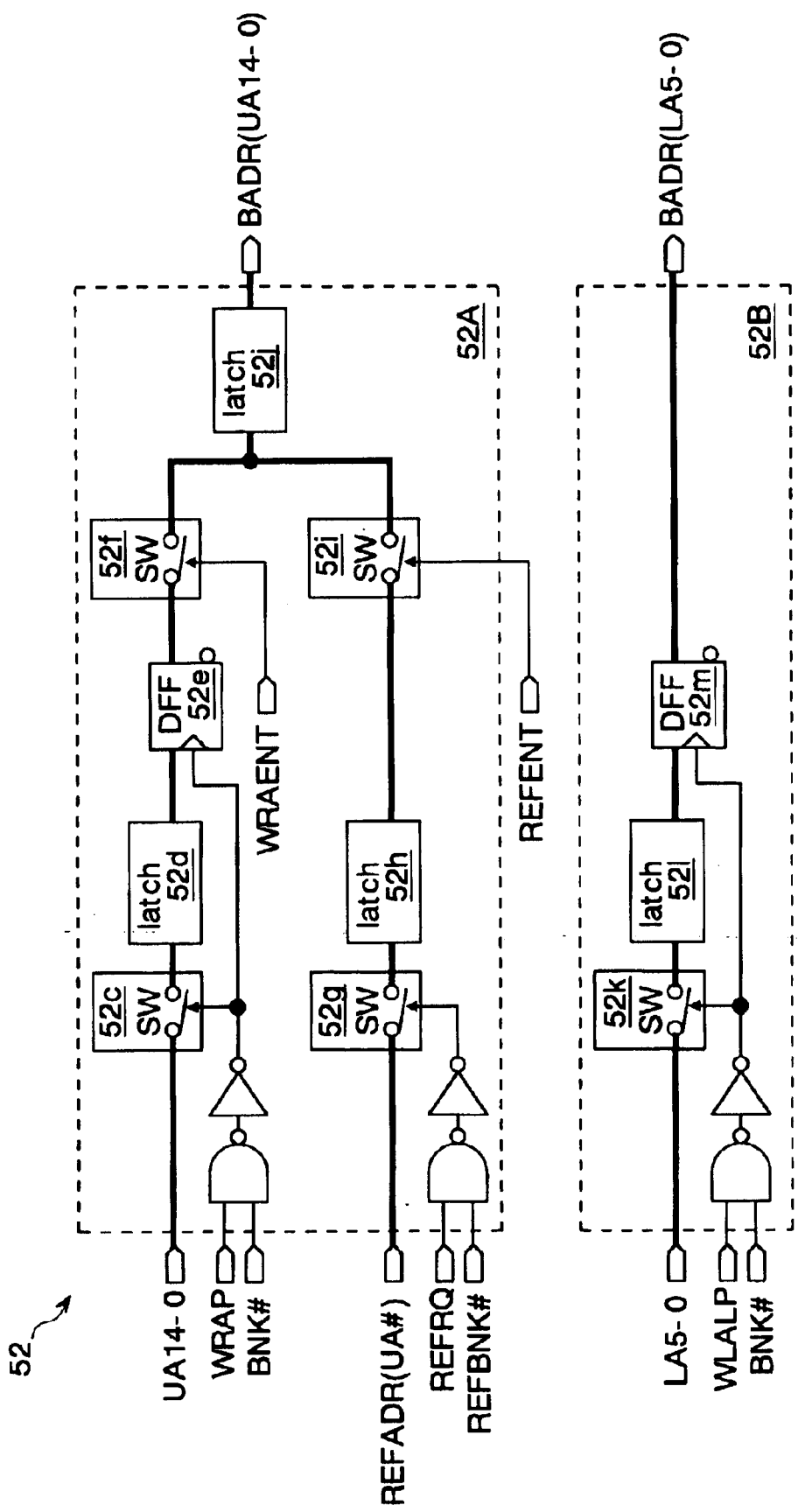
FIG. 23 is a circuit diagram showing the details of an address register in the second control circuit shown in FIG. 13.

FIG. 23 shows the details of the address register 52 in the second control circuit 50 shown in FIG. 13. The address register 52 includes a register 52A which holds the upper address signals UA14 to UA0 supplied with the write command WRA and the refresh addresses REFADR, and a register 52B which holds the lower address signals LA5 to LA0 supplied with the lower address latch command LAL after the write command WRA. Both of the registers 52A and 52B operate when its own bank is selected, that is, when the bank signal BNK# or the refresh bank number REFBNK# is activated.

The register 52A includes a switch 52c, a latch 52d and a flip-flop 52e which operate in synchronization with the write command signal WRAP and are connected in series, a switch 52f which operates in synchronization with the write entry signal WRAENT, a switch 52g and a latch 52h which operate in synchronization with the refresh request signal REFRQ and are connected in series, a switch 52i which operates in synchronization with the refresh entry signal REFENT, and a latch 52j which receives outputs from the switches 52f and 52i.

The circuit structure of the switch 52c, the latch 52d, the flip-flop 52e and the switch 52f is the same as that of the switch 42c, the latch 42d, the flip-flop 42e and the switch 42f of the register 42A shown in FIG. 17. Namely, the late writing function is realized by the circuit like this. In FIG. 17, the write addresses UA14 to UA0 are outputted to the address buses NADR in synchronization with the write command signal WRAP, but in the register 52A, the write addresses UA14 to UA0 are outputted to the address buses BADR in synchronization with the write entry signal WRAENT.

Moreover, the switch 52g turns on in synchronization with the refresh request signal REFRQ, and transmits the upper addresses UA#, out of the refresh address signals REFADR, to the latch 52h. The switch 52i transmits the upper addresses UA# which are held in the latch to the latch 52j in synchronization with the refresh entry signal REFENT. The latch 52j outputs the upper addresses transmitted from the switch 52f or 52i to the address buses BADR (UA14 to UA0).

The register 52B includes a switch 52k, a latch 52l and a flip-flop 52m which are connected in series. The switch 52k, the latch 52l and the flip-flop 52m operate in synchronization with the write command signal WLALP corresponding to the second command. The switch 52k receives the lower address signals LA5 to LA0. The output of the flip-flop 52m is connected to the address buses BADR (LA5 to LA0).

Figure 24:
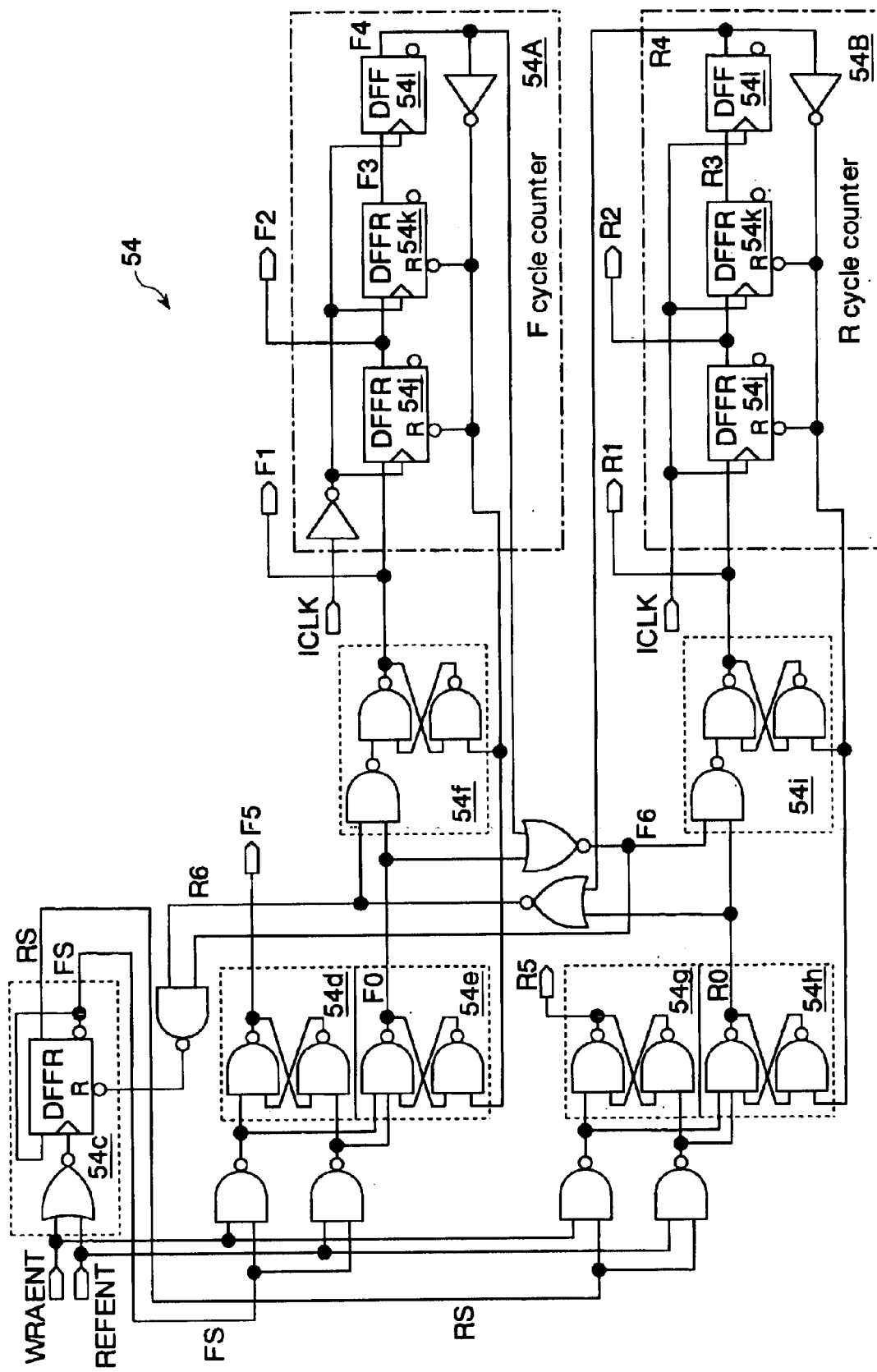
FIG. 24 is a circuit diagram showing the details of a state control circuit in the second control circuit shown in FIG. 13.

FIG. 24 shows the details of the state control circuit 54 in the second control circuit 50 shown in FIG. 13. The state control circuit 54 includes an F cycle counter (second cycle generator) 54A which operates in synchronization with the falling edge of the internal clock signal ICLK (second edge), an R cycle counter (first cycle generator) 54B which operates in synchronization with the rising edge of the internal clock signal ICLK (first edge), a switching circuit 54c (cycle switching circuit) for operating these cycle counters 54A and 54B alternately, and RS flip-flops 54d, 54e, 54f, 54g, 54h and 54i. In the drawing, signals outputted to nodes R1 and R2 correspond to first timing signals, and signals outputted to nodes F1 and F2 correspond to second timing signals.

The switching circuit 54c inverts the levels of selecting signals RS and FS which are complementary to each other, in synchronization with the falling edges of the write entry signal WRAENT and the refresh entry signal REFENT. The RS flip-flops 54d, 54e and 54f are the circuits corresponding to the F cycle counter 54A. The RS flip-flop 54d is activated when the selecting signal FS is at the high level, to set an output node F5 in synchronization with the write entry signal WRAENT (high level), and reset the output node F5 in synchronization with the refresh entry signal REFENT (low level). The RS flip-flop 54e sets an output node F0 (F0 signal) in synchronization with the write entry signal WRAENT and the refresh entry signal REFENT (high level), and resets the output node F0 in response to the high level of an output node F4 (F4 signal) of the F cycle counter 54A (low level). The RS flip-flop 54f is activated when a node R6 (R6 signal) from the R cycle counter 54B side is at the high level, to set an output node F1 (F1 signal) in response to the activation of the F0 signal (high level), and reset the output node F1 in response to the high level of the F4 signal (low level).

The RS flip-flops 54g, 54h and 54i are the circuits corresponding to the R cycle counter 54B. The RS flip-flops 54g, 54h and 54i are the same as the RS flip-flops 54d, 54e and 54f, except that these operate when the selecting signal RS is at the high level.

The F cycle counter 54A includes flip-flop circuits 54j and 54k having reset terminals, and a flip-flop circuit 54l which are connected in series. The flip-flop circuits 54j, 54k and 54l sequentially accept the F1 signal in synchronization with the falling edges of the internal clock signal ICLK. The circuit structure of the R cycle counter 54B is the same as that of the F cycle counter 54A except that the R1 signal is supplied thereto.

Figure 25:
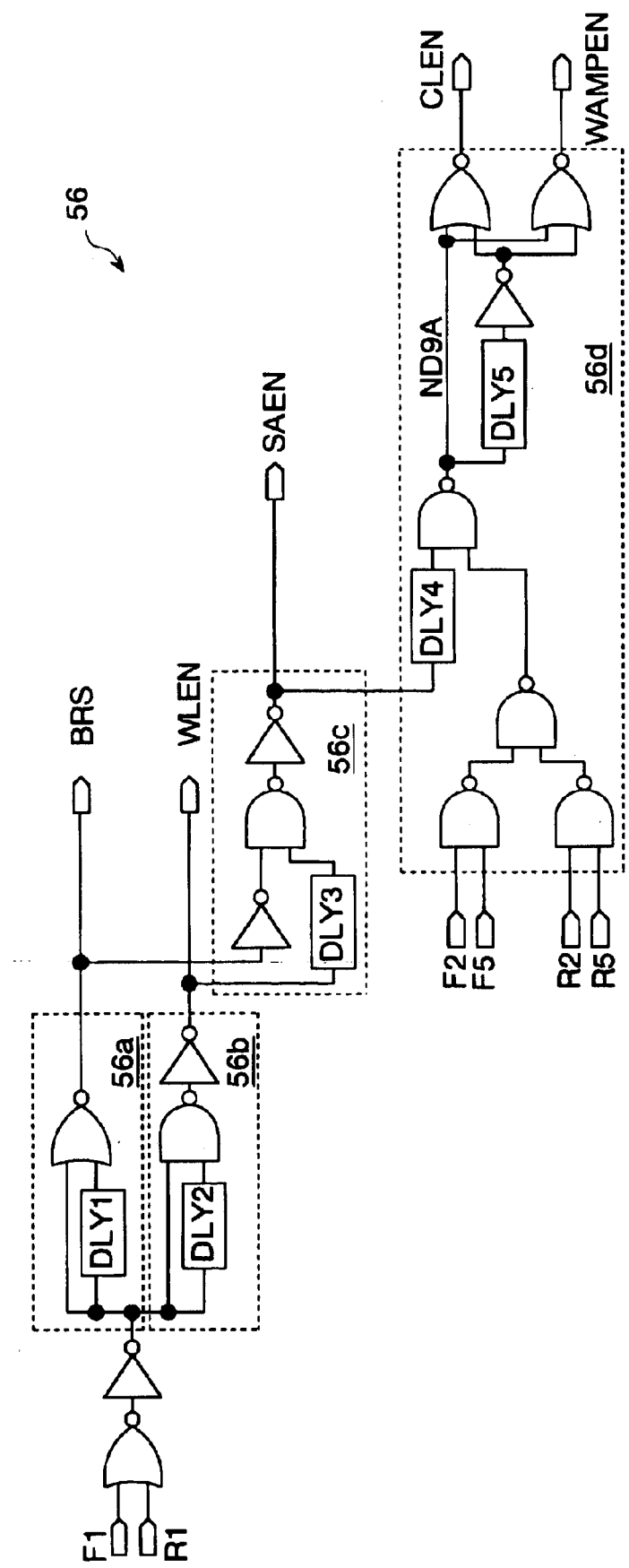
FIG. 25 is a circuit diagram showing the details of a timing signal generator in the second control circuit shown in FIG. 13.

FIG. 25 shows the details of the timing signal generator 56 in the second control circuit 50 shown in FIG. 13. The timing signal generator 56 includes a BRS generator 56a for generating a bit-line short signal BRS, a WLEN generator 56b for generating a word-line enable signal WLEN, an SAEN generator 56c for generating a sense amplifier enable signal SAEN, and a generator 56d for generating a column-line enable signal CLEN and a write amplifier enable signal WAMPEN.

The BRS generator 56a includes a delay circuit DLY1 and a Nor gate. The delay circuit DLY1 delays the F1 signal or the R1 signal from the state control circuit 54 shown in FIG. 24 by a delay time DLY1. The Nor gate receives the F1 signal or the R1 signal and an output from the delay circuit DLY1, and generates the bit-line short signal BRS.

The WLEN generator 56b includes a delay circuit DLY2 and an AND circuit. The delay circuit DLY2 delays the F1 signal or the R1 signal by a delay time DLY2. The AND circuit receives the F1 signal or the R1 signal and an output from the delay circuit DLY2, and generates the word-line enable signal WLEN.

The SAEN generator 56c includes a delay circuit DLY3 and an AND circuit. The delay circuit DLY3 delays the word-line enable signal WLEN by a delay time DLY3. The AND circuit receives an output from the delay circuit DLY3 and an inverting signal of the bit-line short signal BRS, and generates the sense amplifier enable signal SAEN.

The generator 56d includes a delay circuit DLY4, a NAND gate, a delay circuit DLY5 and two Nor gates. The delay circuit DLY4 delays the sense amplifier enable signal SAEN by a delay time DLY4. The NAND gate receives AND logic of an F2 signal and an F5 signal or AND logic of the R2 signal and the RS signal and an output from the delay circuit DLY4, and outputs an ND9A signal to a node ND9A. The delay circuit DLY5 delays the ND9A signal by a delay time DLY5. The Nor gate receives the ND9A signal and a signal which is an inverted output of the delay circuit DLY5, and generates the column-line enable signal CLEN and the write amplifier enable signal WAMPEN, respectively.

Figure 26:
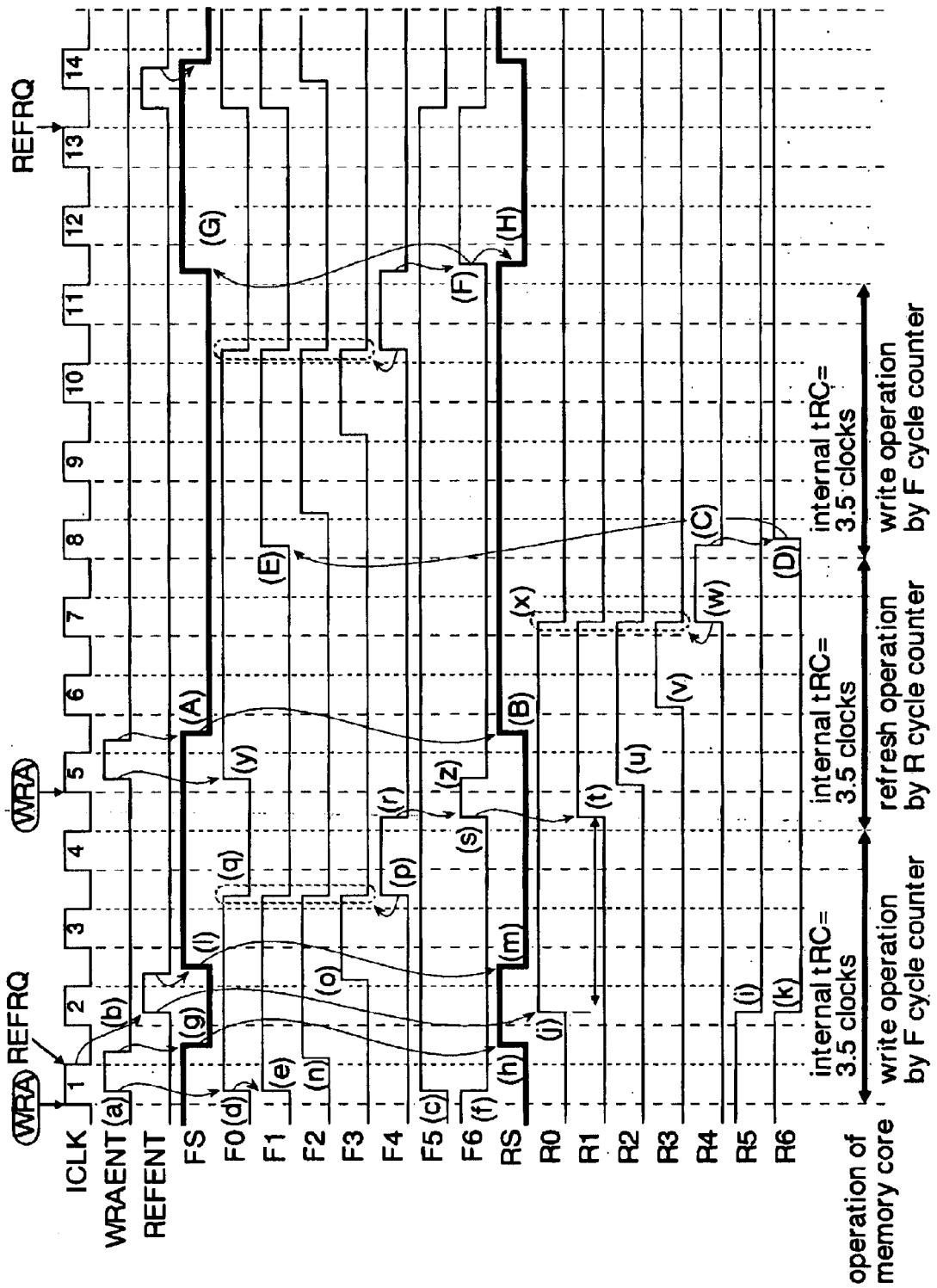
FIG. 26 is a timing chart showing the operation of the state control circuit shown in FIG. 24.

FIG. 26 shows the operation of the state control circuit 54 shown in FIG. 24. In this example, the cases where the refresh request REFRQ is generated immediately after the reception of the write command WRA and where the write command WRA and the refresh request REFRQ are respectively supplied independently will be explained. In the first state of the timing chart, the selecting signals FS and RS have turned into the high level and the low level, respectively. Hence, the RS flip-flops 54d and 54e are activated and the RS flip-flops 54g and 54h are inactivated.

First, the write command WRA and the refresh request REFRQ are supplied in synchronization with the first rising edge and falling edge of the internal clock signal ICLK. The arbiter 58 shown in FIG. 21 sequentially activates the write entry signal WRAENT and the refresh entry signal REFENT as described above (FIG. 26(a) and (b)).

Since the selecting signal F5 is at the high level, the RS flip-flops 54d and 54e shown in FIG. 24 activate the F5 signal and the F0 signal, respectively, in synchronization with the activation of the write entry signal WRAENT (FIG. 26(c) and (d)). Since the R6 signal is at the high level, the RS flip-flop 54f activates the F1 signal in synchronization with the activation of the F0 signal (FIG. 26(e)). Further, in response to the activation of the F0 signal, the F6 signal turns to the low level (FIG. 26(f)).

Next, the switching circuit 54c operates in synchronization with the inactivation of the write entry signal WRAENT, and the selecting signals F5 and RS turn into the low level and the high level, respectively (FIG. 26(g) and (h)). In response to the low level of the selecting signal F5, the RS flip-flops 54d and 54e are inactivated. In response to the high level of the selecting signal RS, the RS flip-flops 54g and 54h are activated.

The RS flip-flops 54g and 54h activate the RS signal and the R0 signal, respectively, in synchronization with the activation of the refresh entry signal REFENT (FIG. 26(i) and (j)). At this time, the RS flip-flop 54i does not operate since the F6 signal is at the low level. In response to the activation of the R0 signal, the R6 signal turns to the low level (FIG. 26(k)). Next, the switching circuit 54c operates in synchronization with the inactivation of the refresh entry signal REFENT, and the selecting signals F5 and RS turn into the high level and the low level, respectively (FIG. 26(l) and (m)).

The F cycle counter 54A receives the F1 signal to operate, and sequentially activates the F2, F3 and F4 signals in synchronization with the first to third falling edges of the internal clock signal ICLK (FIG. 26(*n*), (*o*) and (*p*)). In response to the activation of the F4 signal, the RS flip-flop 54*f* and the flip-flop circuits 54*j* and 54*k* of the F cycle counter 54A are reset (FIG. 26(*q*)).

Since the F3 signal turns to the low level, the flip-flop circuit 54*l* is reset and the F4 signal turns to the low level in synchronization with the fourth falling edge of the internal clock signal ICLK (FIG. 26(*r*)). The F6 signal changes to the high level in response to the low level of the F4 signal (FIG. 26(*s*)). The RS flip-flop 54*i* is set and the R1 signal turns to the high level, in response to the high level of the F6 signal (FIG. 26(*t*)).

The R cycle counter 54B receives the R1 signal to operate, and sequentially activates the R2, R3 and R4 signals in synchronization with the fifth to seventh rising edges of the internal clock signal ICLK (FIGS. 26(*u*), (*v*) and (*w*)). In response to the activation of the F4 signal, the RS flip-flop 54*i* and the flip-flop circuits 54*j* and 54*k* of the R cycle counter 54B are reset (FIG. 26(*x*)).

Incidentally, the F1 and R1 signals and the F2 and R2 signals are the signals corresponding to the ND1 signal and the ND2 signal which are outputted from the state control circuit 44 of the first control circuit 40 shown in FIG. 18. The timing signal generator 56 of the second control circuit 50 shown in FIG. 25 and the timing signal generator 46 of the first control circuit 40 shown in FIG. 19 use the same delay circuits DLY1 to DLY5 and basic circuit structures are the same. Hence, relative timings between the F1 and R1 signals and the F2 and R2 signals, and the bit-line short signal BRS, word-line enable signal WLEN, sense amplifier enable signal SAEN, column-line enable signal CLEN and write amplifier enable signal WAMPEN of the timing signal generator 56 are the same as those of the timing signal generator 46.

As a result of this, the write operation by using the F cycle counter 54A is performed during a period of 3.5 clocks from the first rising edge of the internal clock signal ICLK to the fourth falling edge of the internal clock signal ICLK. The refresh operation by using the R cycle counter 54B is performed during a period of 3.5 clocks from the fourth falling edge of the internal clock signal ICLK to the eighth rising edge of the internal clock signal ICLK.

Moreover, the next write command WRA is supplied in synchronization with the fifth rising edge of the internal clock signal ICLK. At this time, since the F5 signal has turned into the high level, the RS flip-flops 54*d* and 54*e* operate to change the F0 and F6 signals to the high level and the low level, respectively (FIGS. 26(*y*) and (*z*)). Next, the selecting signals F5 and RS turn into the low level and the high level, respectively, in synchronization with the inactivation of the write entry signal WRAENT (FIG. 26(A) and (B)).

The R6 signal holds the low level while the refresh operation is performed. Hence, the RS flip-flop 54*f* is inactivated and the F cycle counter 54A does not operate. The R4 signal is inactivated in synchronization with the eighth rising edge of the internal clock signal ICLK (FIG. 26(C)), and the R6 signal turns to the high level (FIG. 26(D)).

The RS flip-flop 54*f* operates in response to the high level of the R6 signal, and activates the F1 signal (FIG. 26(E)).

Thereafter, the F cycle counter 54A operates to activate the F2, F3 and F4 signals and perform the write operation, similarly to the above. After the completion of the write operation, the F6 signal turns to the high level (FIG. 26(F)). The switching circuit 54*c* is reset by the F6 and R6 signals which are at the high level to change the F5 signal and the RS signal to the high level and the low level, respectively (FIG. 26(G) and (H)).

Next, the refresh request REFRQ is generated in synchronization with the thirteenth falling edge of the internal clock signal ICLK. At this time, since the F5 signal has turned into the high level, the refresh operation is performed by using the F cycle counter 54A. Thus, the switching circuit 54*c* switches between the cycle counters 54A and 54B to be operated alternately according to the write entry signal WRAENT or the refresh entry signal REFENT. Since the two cycle counters 54A and 54B are used alternately to perform the write operation or the refresh operation, it is possible to facilitate the control for performing the respective operations and constitute the control circuit simply.

Figure 27:
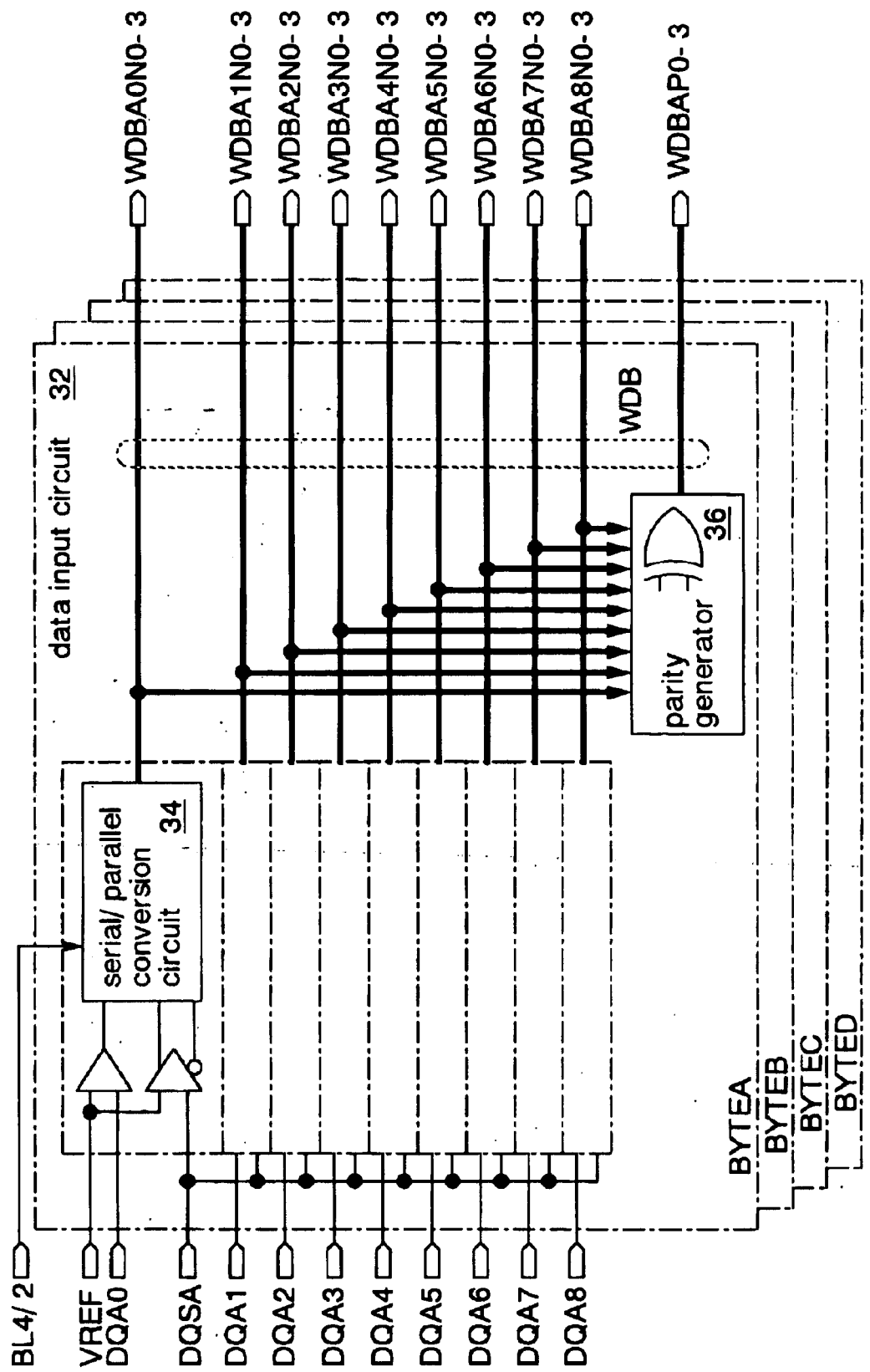
FIG. 27 is a block diagram showing the details of a data input circuit in an input/output control circuit shown in FIG. 3.

FIG. 27 shows the details of a data input circuit 32 in each of the input/output control circuits 30A, 30B, 30C and 30D shown in FIG. 3. The data input circuit 32 is formed for each of the data groups BYTEA, BYTEB, BYTEC and BYTED. The data input circuit 32 of the data group BYTEA will be explained.

The data input circuit 32 includes input buffers for receiving the data input/output terminals DQA0 to DQA8, an input buffer for receiving the data strobe signal DQSA, serial/parallel conversion circuits 34 corresponding respectively to the data input/output terminals DQA0 to DQA8, and four parity generators 36 (read control circuit) for generating parity bits of four parallel data outputted from the respective serial/parallel conversion circuits 34. For example, the serial/parallel conversion circuit 34 corresponding to the data input/output terminal DQA0 is connected to data bus lines WDBAON3 to WDBAON0. The parity generators 36 output the generated four parity bits to data bus lines WDBAP3 to WDBAP0. The data which are transmitted through the data bus lines WDB are respectively written into the memory blocks BLKDQ0 to BLKDQ8 and BLKP, as shown in FIG. 2.

Figure 28:
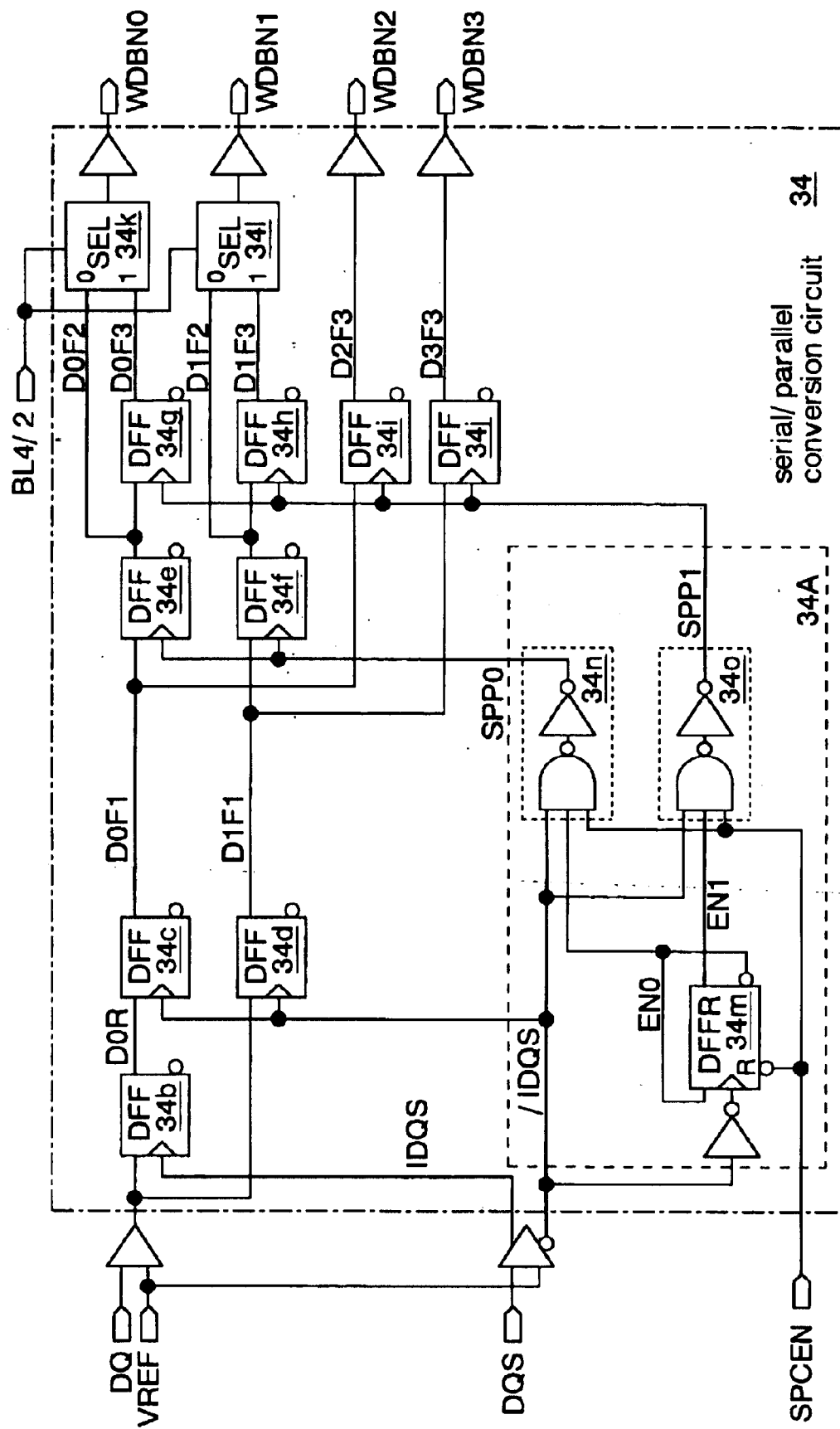
FIG. 28 is a circuit diagram showing the details of a serial/parallel conversion circuit in FIG. 27.

FIG. 28 shows the details of the serial/parallel conversion circuit 34 in FIG. 27. The serial/parallel conversion circuit 34 includes a serial/parallel control circuit 34A, D flip-flop circuits 34*b* to 34*j* and selectors 34*k* and 34*l*. The serial/parallel control circuit 34A includes a D flip-flop circuit 34*m* and AND circuits 34*n* and 34*o*.

In the serial/parallel control circuit 34A, the D flip-flop circuit 34*m* inverts the levels of enable signals EN0 and EN1 which are complementary to each other, in synchronization with the falling edges of an internal data strobe signal /IDQS (rising edges of the data strobe signal DQS). The D flip-flop circuit 34*m* is reset when it receives a serial/parallel enable signal SPCEN at the low level, and changes the enable signals EN0 and EN1 to the high level and the low level, respectively. The AND circuit 34*n* is activated when the enable signal EN0 and the serial/parallel enable signal SPCEN are at the high level, and generates a pulse signal SPP0 which synchronizes with the internal data strobe signal /IDQS. The AND circuit 34*o* is activated when the enable signal EN1 and the serial/parallel enable signal SPCEN are at the high level, and generates a pulse signal SPP1 which synchronizes with the internal data strobe signal /IDQS.

The D flip-flop circuit 34*b* accepts the input/output data signal DQ in synchronization with the rising edge of the internal data strobe signal IDQS, and outputs the accepted signal as a data signal D0R. The D flip-flop circuits 34*c* and 34*d* accept the data signals D0R and DQ in synchronization with the rising edges of the internal data strobe signal /IDQS, respectively, and output the accepted signals as data signals D0F1 and D1F1. The D flip-flop circuits 34e and 34f accept the data signals D0F1 and D1F1 in synchronization with the rising edges of the pulse signal SPP0, respectively, and output the accepted signals as data signals D0F2 and D1F2. The D flip-flop circuits 34g, 34h, 34i and 34j accept the data signals D0F2, D1F2, D0F1 and D1F1 in synchronization with the rising edges of the pulse signal SPP1, respectively, and output the accepted signals as data signals D0F3, D1F3, D2F3 and D3F3. The data signals D2F3 and D3F3 which are outputted from the D flip-flop circuits 34i and 34j are outputted to data bus lines WDBN2 and WDBN3 through buffers, respectively.

The selectors 34k and 34l output the data signals which are supplied to input terminals "0" to data bus lines WDBN0 and WDBN1 through buffers when the burst length signal BL4/2 is at the low level, and output the data signals which are supplied to input terminals "1" to the data bus lines WDBN0 and WDBN1 through the buffers when the burst length signal BL4/2 is at the high level.

Figure 29:
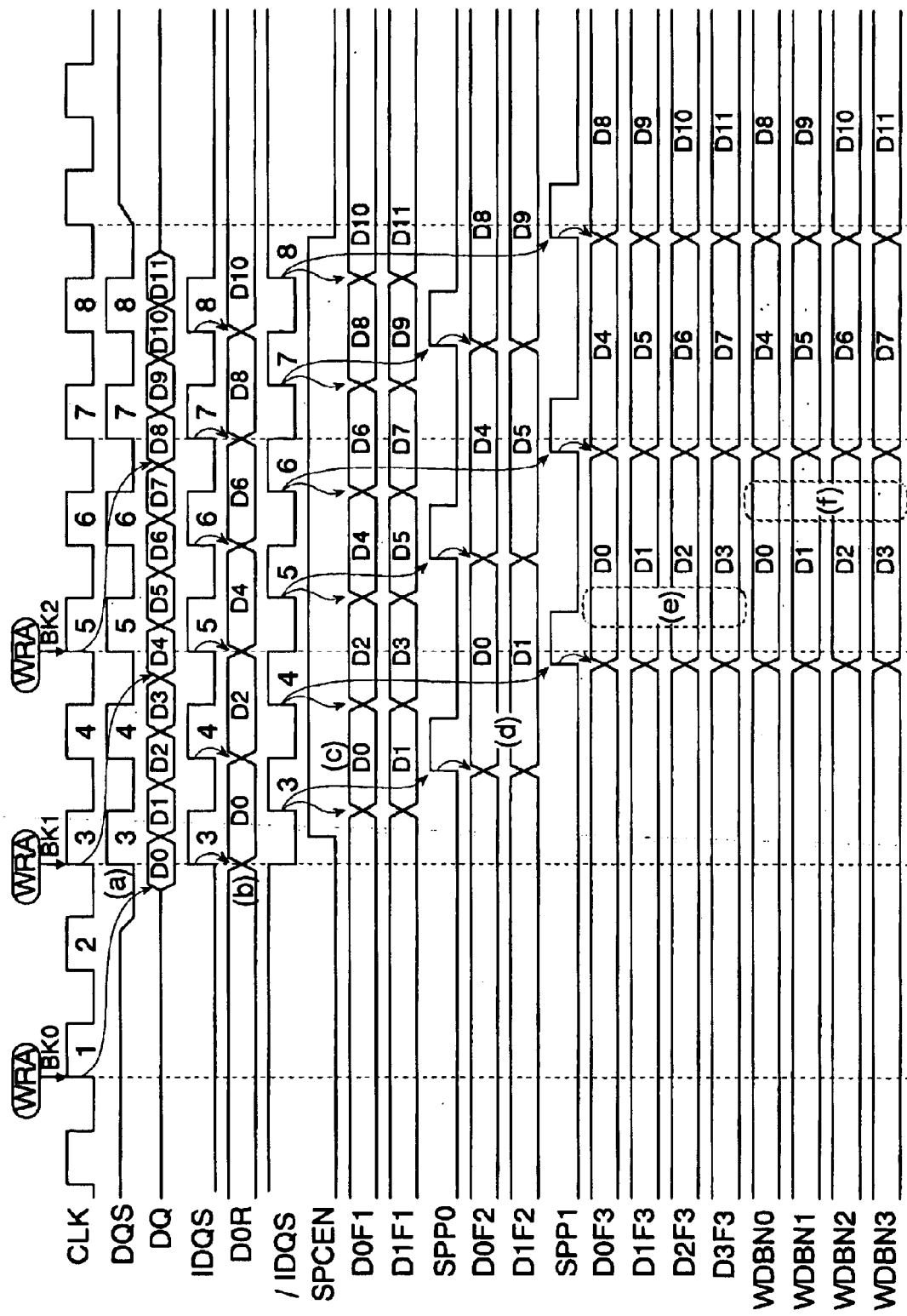
FIG. 29 is a timing chart showing the operation of the serial/parallel control circuit shown in FIG. 28 (burst length="4")

FIG. 29 shows the operation of the serial/parallel control circuit 34 shown in FIG. 28 (burst length="4"). In this example, the write commands WRA are sequentially supplied to the banks BK0, BK1 and BK2. When the burst length is "4", the burst length signal BL4/2 has turned into the high level. Further, when the burst length is "4", a minimum interval between supply of the write commands WRA to a plurality of the banks BK is two clocks. After the supply of the write command WRA, the four write data signals are successively supplied in synchronization with the second (third CLK) and subsequent rising edges and falling edges of the data strobe signal DQS. It should be mentioned that the data strobe signal DQS is supplied from a system which allows the semiconductor memory to perform the write operation.

First, the write command WRA to the bank BK0 is supplied in synchronization with the first rising edge of the clock signal CLK. Next, data signals D0, D1, D2 and D3 are sequentially supplied in synchronization with the third and fourth rising edges and falling edges of the data strobe signal DQS (FIG. 29(a)).

The D flip-flop circuit 34b shown in FIG. 28 accepts the data signals D0 and D2 in synchronization with the third and fourth rising edges of the internal data strobe signal IDQS, and outputs these as the data signals DOR (FIG. 29(b)). The D flip-flop circuits 34c and 34d accept the data signals D0 to D3 in synchronization with the third and fourth rising edges of the internal data strobe signal /IDQS, and output these as the data signals D0F1 and D1F1 (FIG. 29(c)).

The D flip-flop circuits 34e and 34f accept the data signals D0 and D1 in synchronization with the rising edge of the pulse signal SPP0, and output these as the data signals D0F2 and D1F2 (FIG. 29(d)). The D flip-flop circuits 34g, 34h, 34i and 34j accept the data signals D0 to D3 in synchronization with the rising edge of the pulse signal SPP1, and output these as the data signals D0F3, D1F3, D2F3 and D3F3 (FIG. 29(e)). As a result of this, the serial write data signals D0 to D3 are converted into parallel data.

Since the burst length signal BL4/2 is at the high level, the selectors 34k and 34l select the data signals D0F3 and D1F3. Then, the data signals D0 to D3 which are accepted in the D flip-flop circuits 34g, 34h, 34i and 34j are outputted to the data bus lines WDBN0 to WDNB3 through the buffers (FIG. 29(f)). The data signals D0 to D3 which are outputted to the data bus lines WDBN0 to WDBN3 are supplied to the write amplifiers WAMP of the bank BK0.

Similarly to the above, the write commands WRA to the banks BK1 to BK2 are also converted from serial to parallel, and the converted data signals are outputted to the data bus lines WDBN0 to WDBN3.

Figure 30:
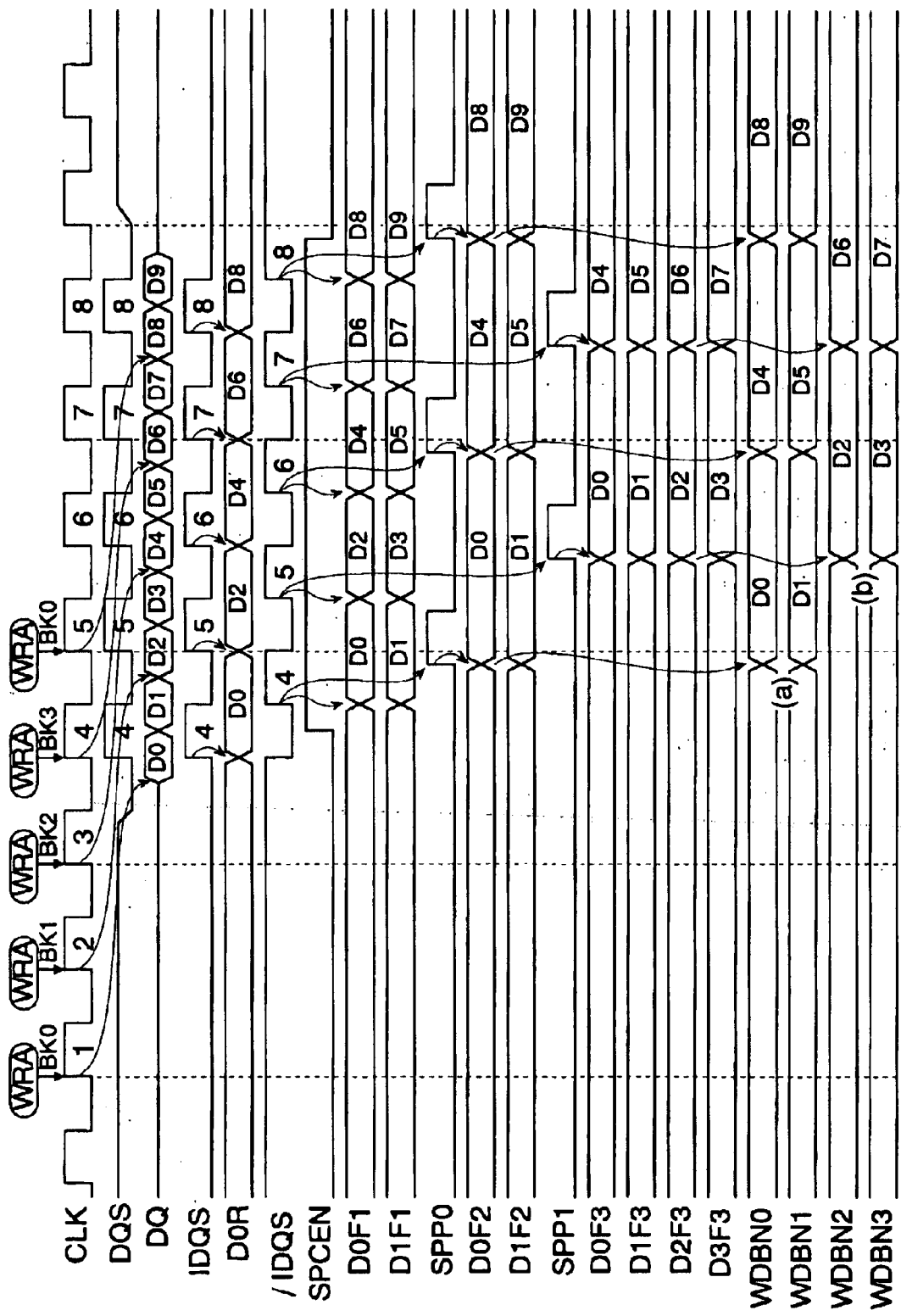
FIG. 30 is a timing chart showing the operation of the serial/parallel control circuit shown in FIG. 28 (burst length="2")

FIG. 30 shows the operation of the serial/parallel control circuit 34 shown in FIG. 28 (burst length="2"). In this example, the write commands WRA are sequentially supplied to the banks BK0 to BK3. When the burst length is "2", the burst length signal BL4/2 has turned into the low level. Further, when the burst length is "2", the minimum interval between supply of the write commands WRA to a plurality of the banks BK is one clock. After the supply of the write command WRA, the two write data signals are successively supplied in synchronization with the third (fourth CLK) and subsequent rising edges and falling edges of the data strobe signal DQS.

The operation until the D flip-flop circuits 34g, 34h, 34i and 34j output the data signals D0F3, D1F3, D2F3 and D3F3 is the same as that shown in FIG. 29, and hence explanations thereof are omitted. In this example, since the burst length signal BL4/2 is at the low level, the selectors 34k and 34l select the data signals D0F2 and D1F2. Hence, the data signals D0 to D1 which are outputted from the D flip-flop circuits 34e and 34f are outputted to the data bus lines WDBN0 to WDBN1 first (FIG. 30(a)). The data signals D0 to D1 outputted to the data bus lines WDBN0 to WDBN1 are supplied to the write amplifiers WAMP of the bank BK0. Thereafter, the data signals D2 to D3 which are accepted in the D flip-flop circuits 34i and 34j are outputted to the data bus lines WDBN2 to WDBN3 (FIG. 30(b)). The data signals D2 to D3 which are outputted to the data bus lines WDBN2 to WDBN3 are supplied to the write amplifiers WAMP of the bank BK1.

Similarly to the above, the write commands WRA to the banks BK2 to BK3 and BK0 are also converted from serial to parallel, and the converted data signals are respectively outputted to the data bus lines WDBN0 to WDBN1 or WDBN2 to WDBN3.

Figure 31:
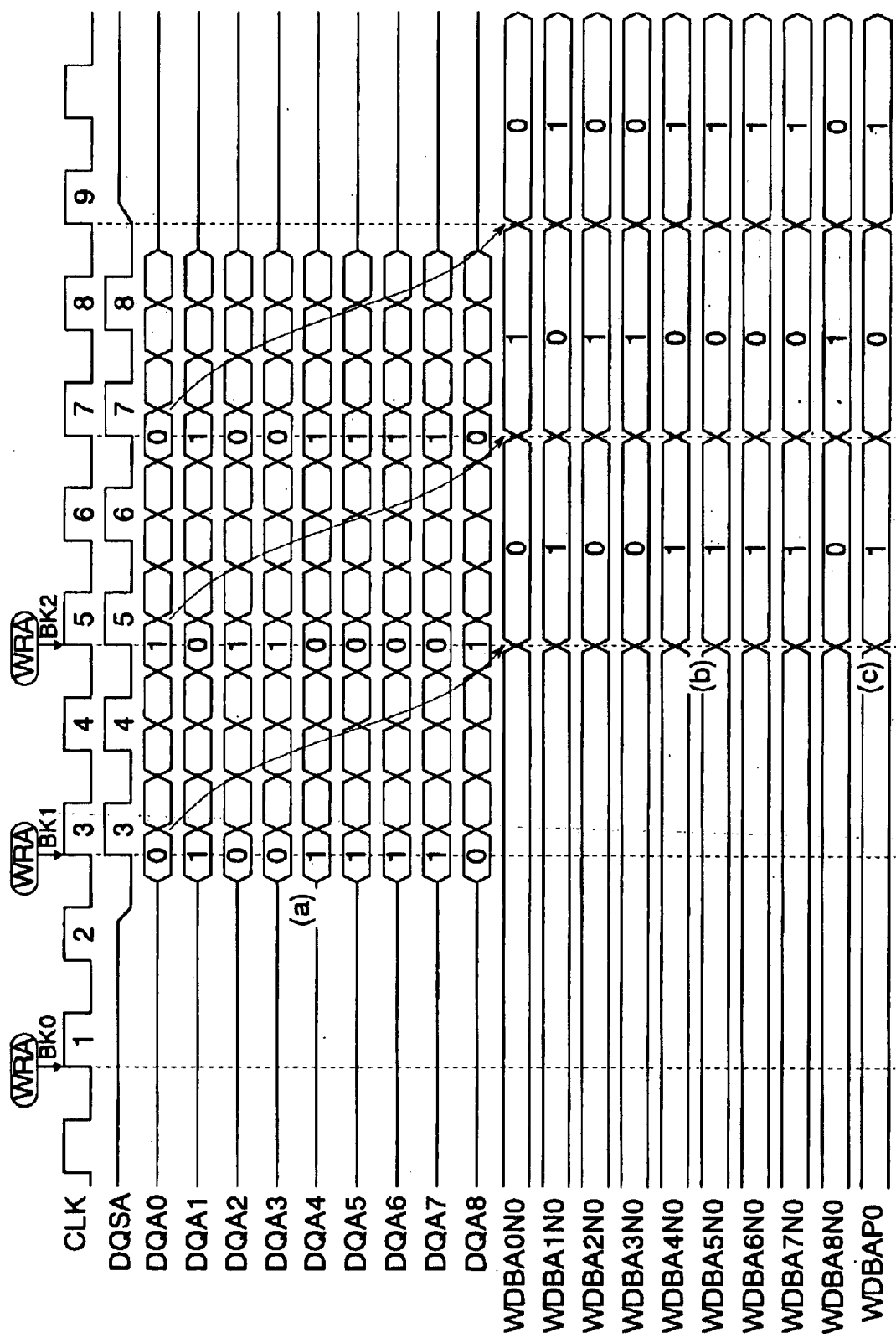
FIG. 31 is a timing chart showing the operation of the data input circuit shown in FIG. 27.

FIG. 31 shows the operation of the data input circuit 32 shown in FIG. 27. In this example, the operation when the burst length is "4" is shown, and the write command WRA is supplied every two clocks.

First, the write command WRA to the bank BK0 is supplied, and the 9-bit data signals which correspond to the data group BYTEA are supplied in synchronization with the third and subsequent edges of the data strobe signal DQS (FIG. 31(a)). Although not particularly shown in the drawing, the data signals corresponding to the data groups BYTEB to BYTED are supplied at the same time. For example, the data signals "010011110" which are supplied in synchronization with the third rising edge of the data strobe signal DQS are outputted to the data bus lines WDBA0N0 to WDBA8N0 in synchronization with the fifth rising edge of the data strobe signal DQS (FIG. 31(b)). The parity generator 36 shown in FIG. 27 finds an even parity bit "1" of the data signals "010011110", and output it to the data bus line WDBAP0 (FIG. 31(c)).

The data signals and the parity bits of the data like these, which are supplied in synchronization with the third falling edge of the data strobe signal DQS and the fourth rising edge and falling edge of the data strobe signal DQS, are also outputted to the data bus lines in synchronization with the fifth rising edge of the data strobe signal DQS (not shown in the drawing). Similarly to the above, the write data signals corresponding to the write commands WRA to the banks BK1 to BK2 are also converted from serial to parallel and respectively outputted to the data bus lines, in synchronization with the seventh and ninth rising edges of the data strobe signal DQS.

Figure 32:
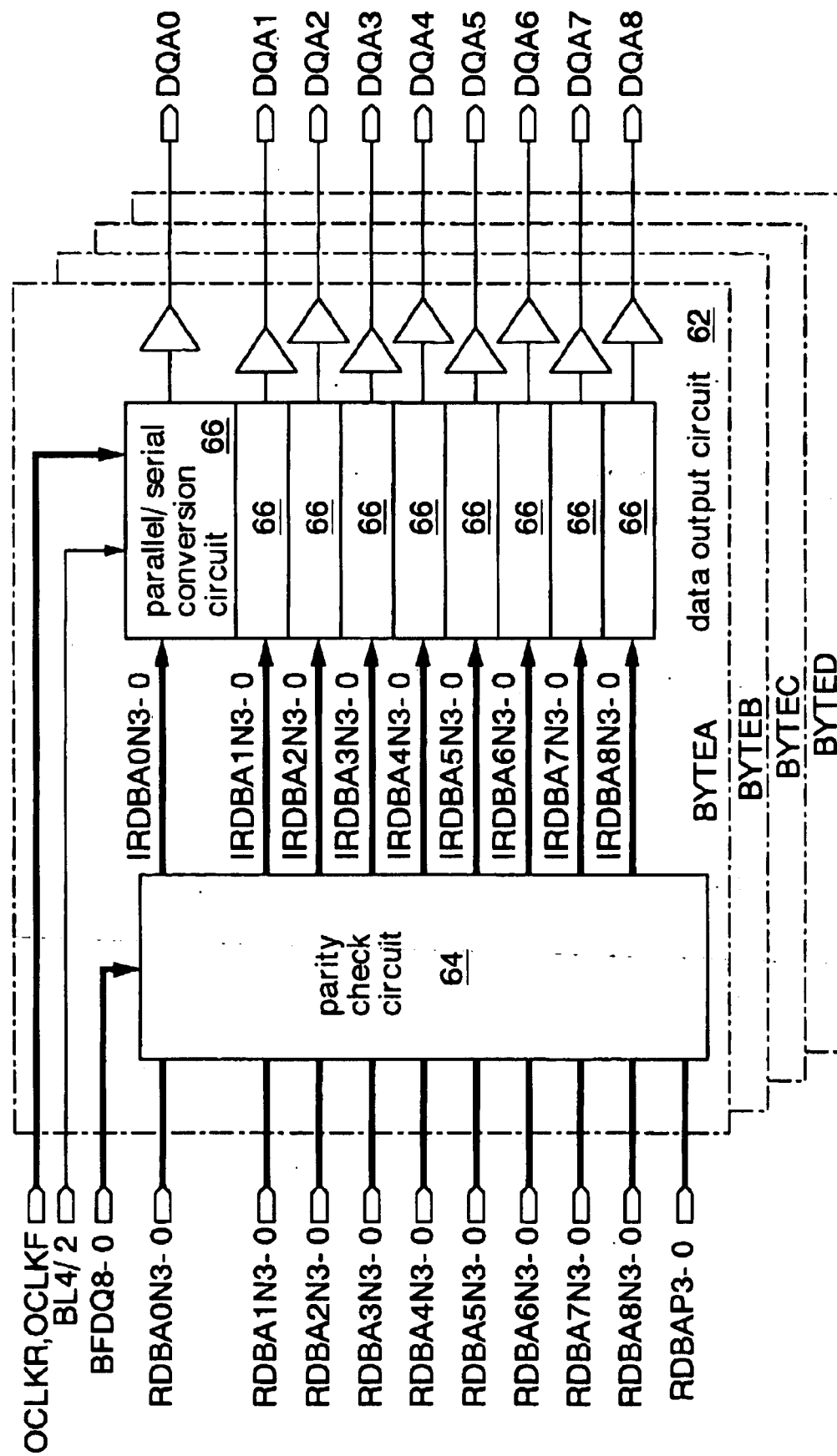
FIG. 32 is a block diagram showing the details of a data output circuit in the input/output control circuit shown in FIG. 3.

FIG. 32 shows the details of a data output circuit 62 in each of the input/output control circuits 30A, 30B, 30C and 30D shown in FIG. 3. The data output circuit 62 is formed for each of the data groups BYTEA, BYTEB, BYTEC and BYTED. The data output circuit 62 of the data group BYTEA will be explained.

The data output circuit 62 includes parity check circuits 64 for converting the read data supplied from the data bus lines RDB into correct data, parallel/serial conversion circuits 66 for converting the parallel data, which are outputted from the parity check circuits 64 and corresponding to the respective data input/output terminals DQ, into serial data, respectively, and output buffers for outputting the serial data to the exterior.

Figure 33:
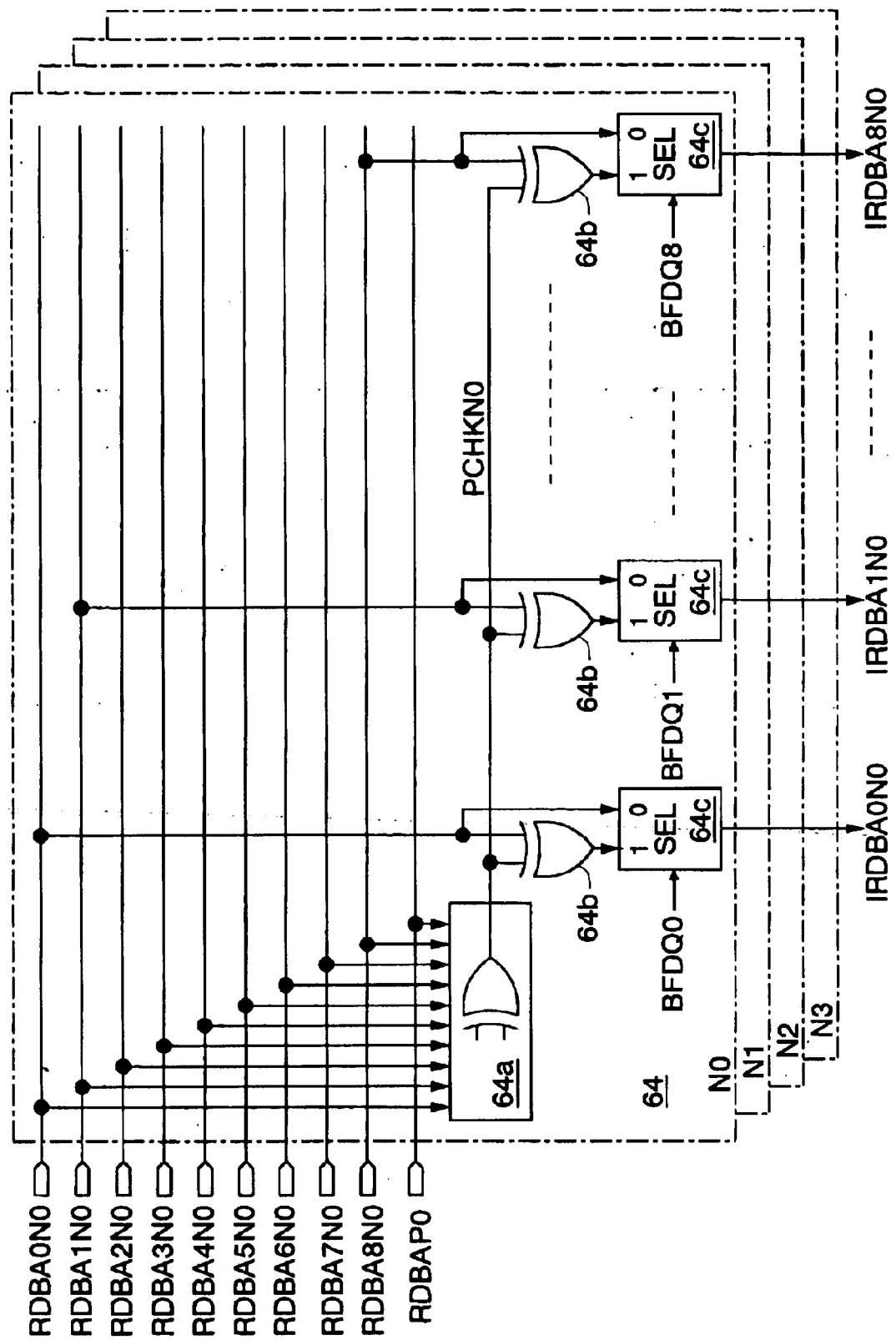
FIG. 33 is a circuit diagram showing the details of a parity check circuit shown in FIG. 32.

FIG. 33 shows the details of the parity check circuit 64 shown in FIG. 32. The parity check circuit 64 is formed for each of the serial data N0 to N3. The parity check circuit 64 corresponding to the first data will be explained.

The parity check circuit 64 includes an EOR circuit 64a, and EOR circuits 64b and selectors 64c which are formed corresponding to the data input/output terminals DQ0 to DQ8, respectively. The EOR circuit 64a operates exclusive or of the read data which are read from the memory blocks BLKDQ0 to BLKDQ8 and BLKP and transmitted through the data bus lines RDBA0N0 to RDBA8N0 and RDBAP0, and outputs the result of the operation as a parity check signal PCHKN0. Each of the EOR circuits 64b operates the exclusive or of the parity check signal PCHKN0 and the read data. Each of the selectors 64c selects the data outputted from the EOR circuit 64b when the busy flag signal BFDQ0 (or BFDQ1 to BFDQ8) is at the high level, selects the read data when the busy flag signal BFDQ0 (or BFDQ1 to BFDQ8) is at the low level, and outputs the selected data to internal data bus lines IRDBA0N0 to IRDBA8N0, respectively. The basic operation of the parity check circuit 64 is the same as that explained with reference to FIG. 2.

Incidentally, when the memory block BLKP is in refresh, all of the busy flag signals BFDQ0 to BFDQ8 are turned into the low level. Hence, all read data are directly outputted from the corresponding memory blocks BLKDQ0 to BLKDQ8.

Figure 34:
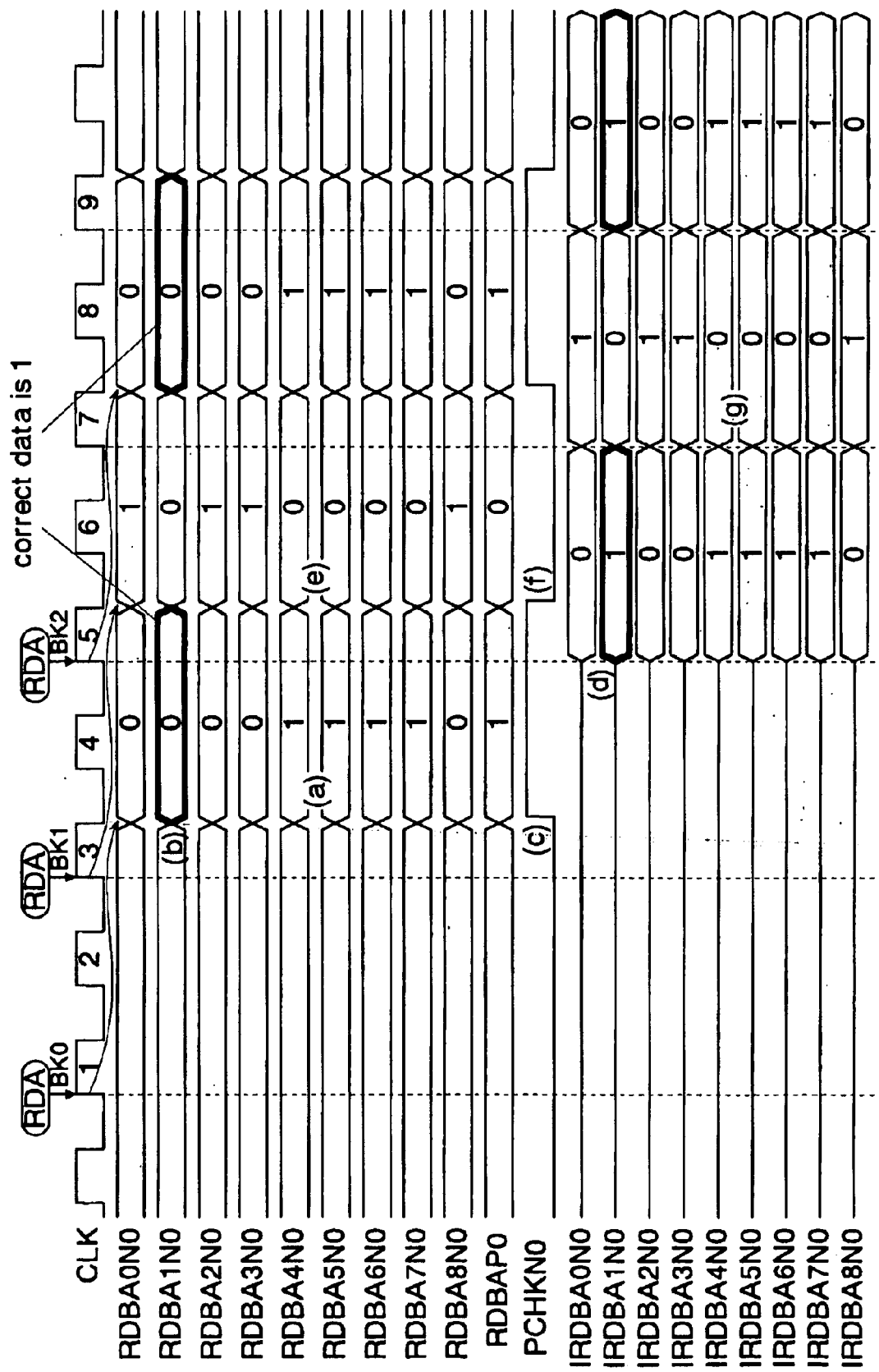
FIG. 34 is a timing chart showing the operation of the parity check circuit shown in FIG. 33 (burst length="4")

FIG. 34 shows the operation of the parity check circuit 64 shown in FIG. 33 (burst length="4"). In this example, the case where the read commands RDA are sequentially supplied to the banks BK0 to BK2 will be explained.

First, the read command RDA to the bank BK0 is supplied in synchronization with the first clock signal CLK. The read data "0000111101" from the memory blocks BLKDQ0 to BLKDQ8 and BLKP are outputted to the data bus lines RDBA0N0 to RDBA8N0 and RDBAP0 in the third clock cycle (FIG. 34(a)). At this time, since the memory block BLKDQ1 of the bank BK0 is in refresh operation, the correct read data is not outputted to the data bus line RDBA1N0 (FIG. 34(b)).

The EOR circuit 64a shown in FIG. 33 changes the parity check signal PCHKN0 to the high level because the number of "1" in the read data is odd (FIG. 34(c)). The EOR circuit 64b which receives the wrong data "0" on the data bus line RDBA1N0 receives the parity check signal PCHKN0 at the high level and outputs the high level.

Since the memory block BLKDQ1 is in refresh operation, only the busy flag signal BFDQ1 has turned into the high level. Hence, the selector 64c which receives the busy flag signal BFDQ1 selects an output of the EOR circuit 64b and outputs data "1" (FIG. 34(d)). Other selectors 64c output the read data on the data bus lines RDBA0N0 and RDBA2N0 to RDBA8N0 directly to the data bus lines IRDBA0N0 to IRDBA8N0. As a result of this, the data in the memory block BLKDQ1 which is in refresh operation and cannot perform the read operation is reproduced by using the read data of other memory blocks BLKDQ0, BLKDQ2 to BLKDQ8 and BLKP.

The read command RDA to the bank BK1 is supplied in synchronization with the third clock signal CLK. The read data "1011000010" from the memory blocks BLKDQ0 to BLKDQ8 and BLKP are outputted to the data bus lines RDBA0N0 to RDBA8N0 and RDBAP0 in the fifth clock cycle (FIG. 34(e)). At this time, the bank BK1 is not performing the refresh operation. Therefore, the correct read data are outputted to the data bus lines RDBA0N0 to RDBA8N0 and RDBAP0.

The EOR circuit 64a changes the parity check signal PCHKN0 to the low level because the number of "1" in the read data is even (FIG. 34(f)). Since the bank BK1 is not performing the refresh operation, all of the busy signals BDQ0 to BDQ8 have turned into the low level. All of the selectors 64c output the read data on the data bus lines RDBA0N0 to RDBA8N0 directly to the data bus lines IRDBA0N0 to IRDBA8N0 (FIG. 34(g)).

Figure 35:
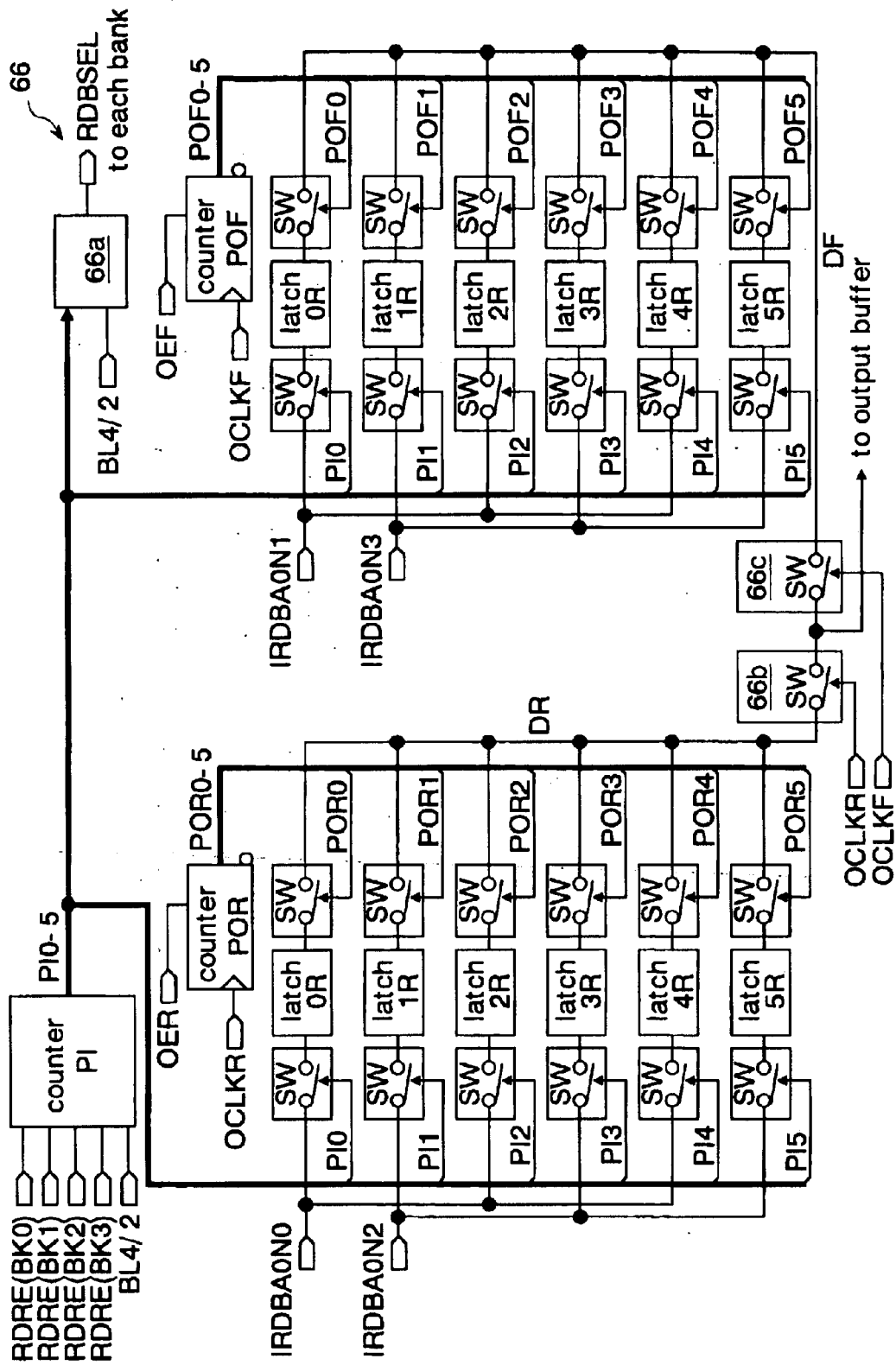
FIG. 35 is a circuit diagram showing the details of a parallel/serial conversion circuit shown in FIG. 32.

FIG. 35 shows the details of the parallel/serial conversion circuit 66 shown in FIG. 32. The parallel/serial conversion circuit 66 is formed for each of the data input/output terminals DQA0 to DQA8, DQB0 to DQB8, DQC0 to DQC8 and DQD0 to DQD8. The parallel/serial conversion circuit 66 of the data input/output terminal DQA0 will be explained.

The parallel/serial conversion circuit 66 includes counters PI, POR and POF, a read data bus selector 66a, twelve pairs of switch circuits each consisting of an input switch, a latch (0R to 5R, 0F to 5F) and an output switch which are connected in series, and switches 66b and 66c. Three pairs of the switch circuits are formed for each of the internal data bus lines IRDBA0N0 to IRDBA0N3.

The counter PI receives read bus enable signals RDRE of the respective banks BK0 to BK3 and the burst length signal BL4/2, and outputs input counter signals PI0 to PI5. The counter POR outputs output counter signals POR0 to POR5 in synchronization with an output clock signal OCLKR whose phase is the same as that of the clock signal CLK, when an output enable signal OER is activated.

The counter POF outputs output counter signals POF0 to POF5 in synchronization with an output clock signal OCLKF whose phase is opposite to that of the clock signal CLK, when an output enable signal OEF is activated.

When the burst length signal BL4/2 is at the low level, that is, when the burst length is set to "2", the read data bus selector 66a outputs a data bus selecting signal RDBSEL in synchronization with the rising edge of the input counter signal PI0 to PI5.

The switch circuits including the latches 0R to 5R respectively accept the data when the input counter signals PI0 to PI5 are at the high level, and output the accepted data to a data bus line DR when the output counter signals POR0 to POR5 are at the high level. The switch circuits including the latches 0F to 5F respectively accept the data when the input counter signals PI0 to PI5 are at the high level, and output the accepted data to a data bus line DF when the output counter signals POF0 to POF5 are at the high level.

The switch 66b turns on in synchronization with the output clock signal OCLKR, and connects the data bus line DR to the output buffer. The switch 66c turns on in synchronization with the output clock signal OCLKF, and connects the data bus line DF to the output buffer.

Figure 36:
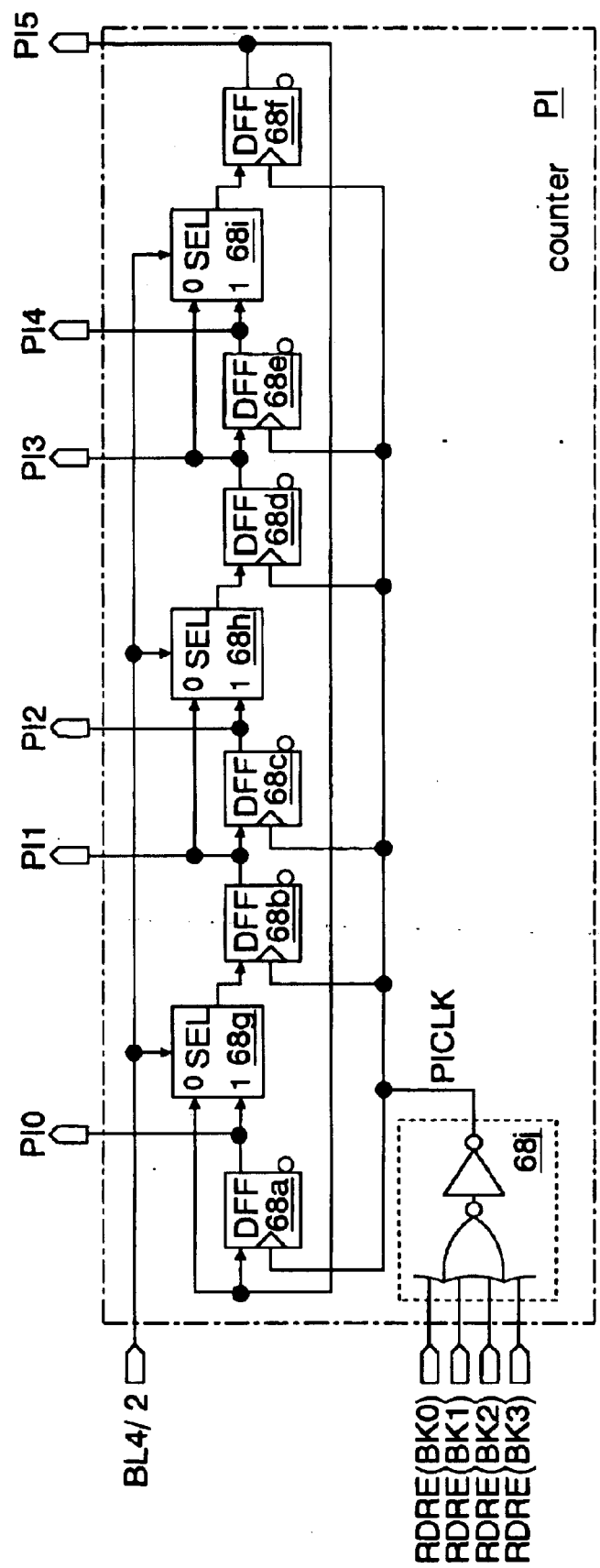
FIG. 36 is a circuit diagram showing the details of a counter Pl shown in FIG. 35.

FIG. 36 shows the details of the counter PI shown in FIG. 35. The counter PI includes D flip-flop circuits 68a, 68b, 68c, 68d, 68e and 68f which are connected in series, selectors 68g, 68h and 68i which are arranged between the D flip-flop circuits like these, and an or circuit 68j.

The or circuit 68j outputs a clock signal PICLK in synchronization with the read bus enable signals RDRE. The selectors 68g to 68i select the signals supplied to the input terminals "0" and "1" when the burst length signal BL4/2 is at the low level and at the high level, respectively.

The D flip-flop circuits 68a to 68f operate as a shift register when the burst length signal BL4/2 is at the high level (burst length BL="4") and sequentially output the input counter signals PI0 to PI5 in synchronization with the rising edges of the clock signal PICLK. Further, the D flip-flop circuits 68a and 68b, D flip-flop circuits 68c and 68d, and D flip-flop circuits 68e and 68f receive the same input signals to operate when the burst length signal BL4/2 is at the low level (burst length BL="2").

Figure 37:
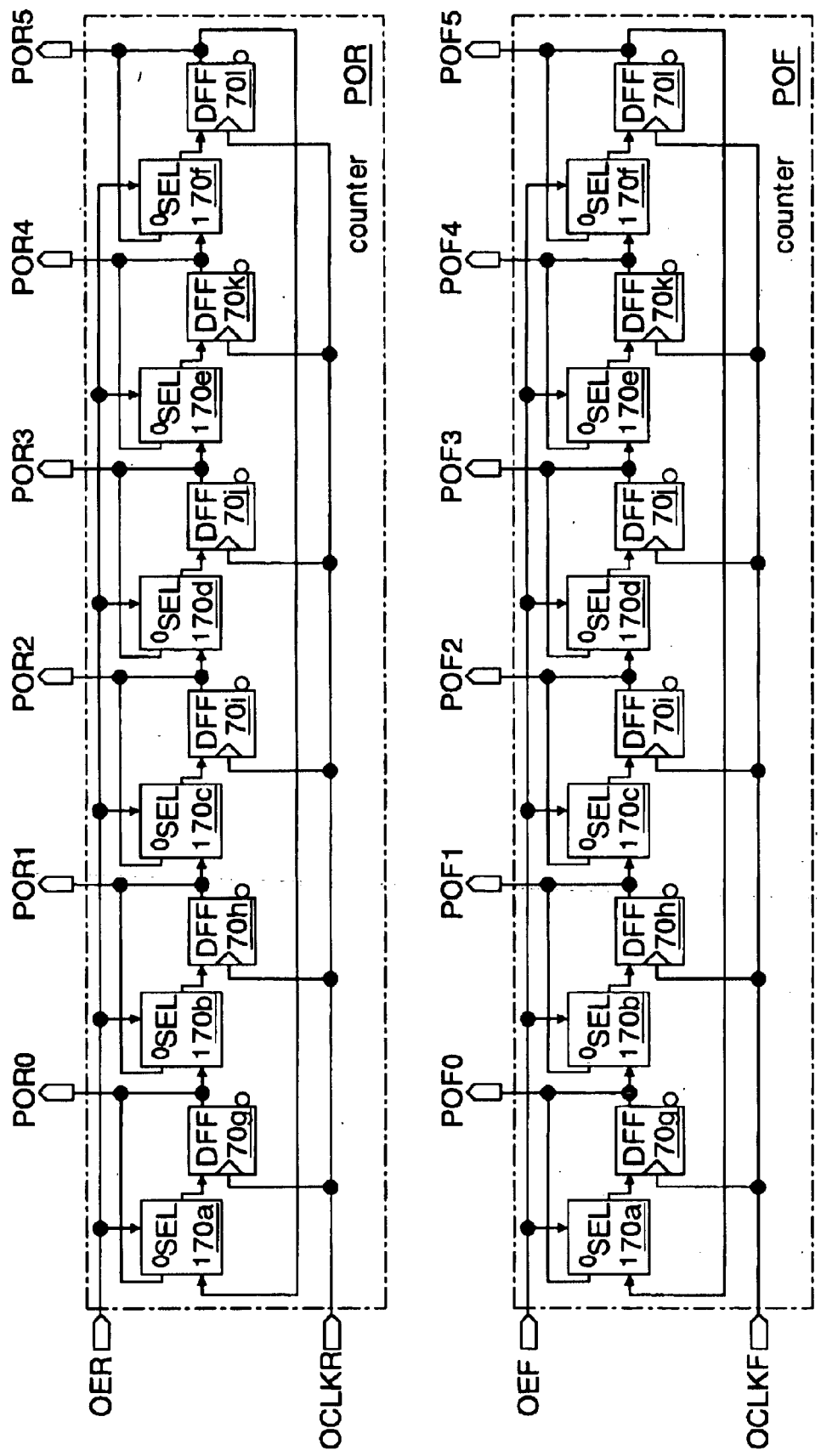
FIG. 37 are circuit diagrams showing the details of counters POR and POF shown in FIG. 35.

FIG. 37 shows the details of the counters POR and POF shown in FIG. 35. Since the circuit structures of the counters POR and POF are the same, only the counter POR will be explained. The counter POR is structured by connecting selectors 70a, 70b, 70c, 70d, 70e and 70f and D flip-flop circuits 70g, 70h, 70i, 70j, 70k and 70l alternately.

The selectors 70a to 70f select the signals supplied to input terminals "0" and "1" when the output enable signal OER is at the low level and at the high level, respectively. The D flip-flop circuits 70g to 70l operate as a shift register when the output enable signal OER is at the high level, and sequentially output the output counter signals POR0 to POR5 in synchronization with the rising edges of the output clock signal OCLKR. Further, outputs from the D flip-flop circuits 70g to 70l are fed back to these own inputs when the output enable signal OER is at the low level. Namely, the D flip-flop circuits 70g to 70l are turned into idle states.

Figure 38:
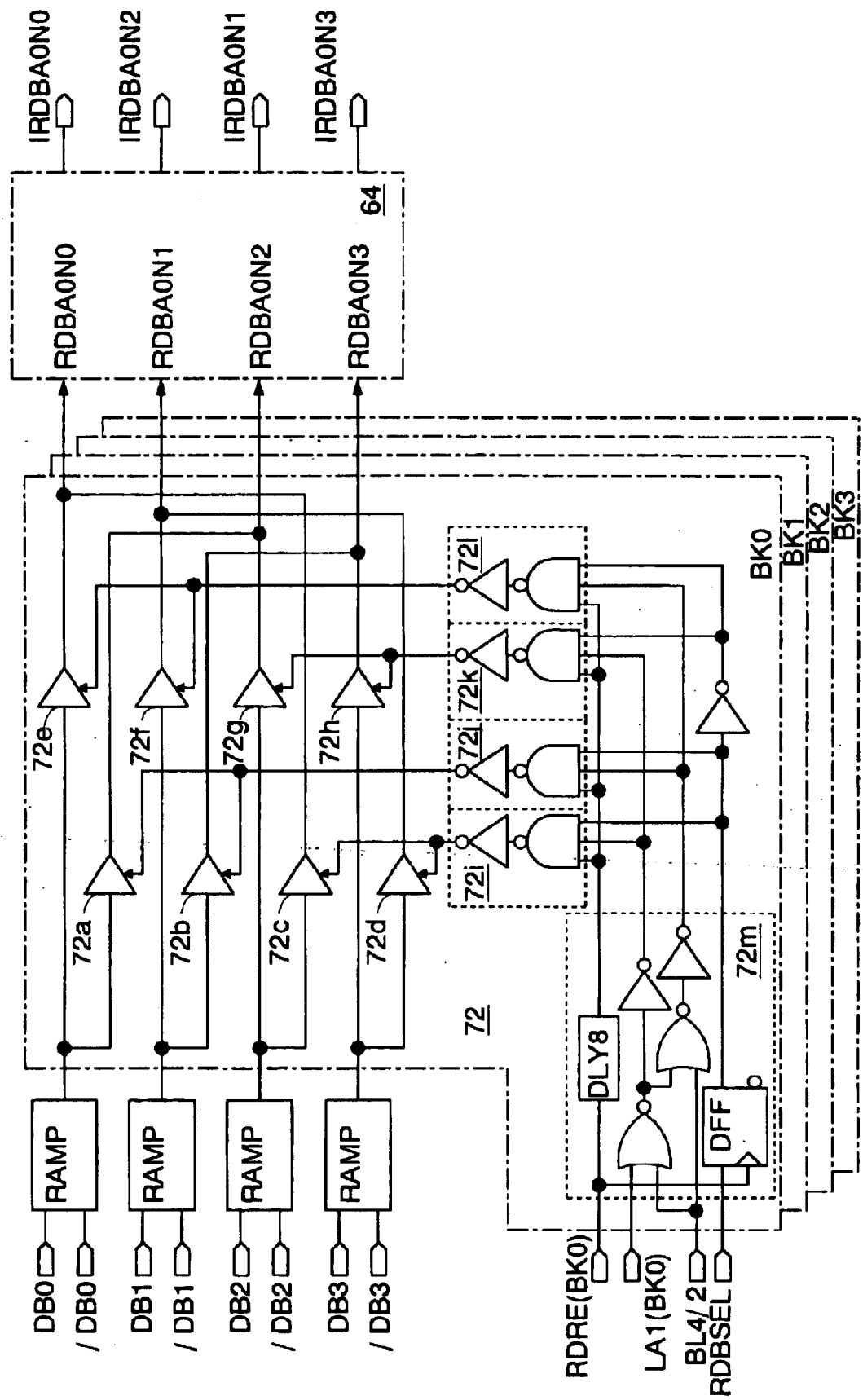
FIG. 38 is a circuit diagram showing the details of a data switching circuit in the bank shown in FIG. 3.

FIG. 38 shows the details of a data switching circuit 72 in each of the banks shown in FIG. 3. The data switching circuit 72 is the circuit for determining which of data bus lines RDBN0 to RDBN3 (IRDBN0 to IRDBN3) is used in transmitting the read data outputted from the read amplifiers RAMP to the parallel/serial conversion circuits 66.

The data switching circuit 72 includes eight tri-state buffers 72a, 72b, 72c, 72d, 72e, 72f, 72g and 72h which output the read data from the read amplifiers RAMP to any of the data bus lines RDBN0 to RDBN3, AND circuits 72i, 72j, 72k and 72l which control the tri-state buffers 72a to 72h, and a control circuit 72m which inputs signals to the AND circuits 72i to 72l.

The control circuit 72m includes a delay circuit DLY8 which delays the read bus enable signal RDRE and generates a timing signal for operating the AND circuits 72i to 72l, logic gates which determine which of the AND circuits 72i to 72l are operated according to the lower address signal LA1 and the burst length signal BL4/2, and a D flip-flop circuit which operates the AND circuits 72i and 72j and the AND circuits 72k and 72l alternately when the burst length is set to "2".

In the aforementioned data switching circuit 72, when the burst length is set to "4", the AND circuits 72k and 72l operate and the tri-state buffers 72e, 72f, 72g and 72h turn on. Namely, the read data which are outputted through the data bus lines DB0 to DB3 (/DB0 to /DB3) are respectively transmitted to the data bus lines RDBN0 to RDBN3.

When the burst length is set to "2", the AND circuits 72i to 72l to be operated differ according to the lower address signal LA1. When the lower address LA1 is "0", the AND circuits 72l and 72j operate sequentially. At this time, the tri-state buffers 72e and 72f turn on first, and then, the tri-state buffers 72a and 72b turn on. When the lower address LA1 is "1", the AND circuits 72k and 72i operate sequentially. At this time, the tri-state buffers 72g and 72h turn on first, and then, the tri-state buffers 72c and 72d turn on.

Figure 39:
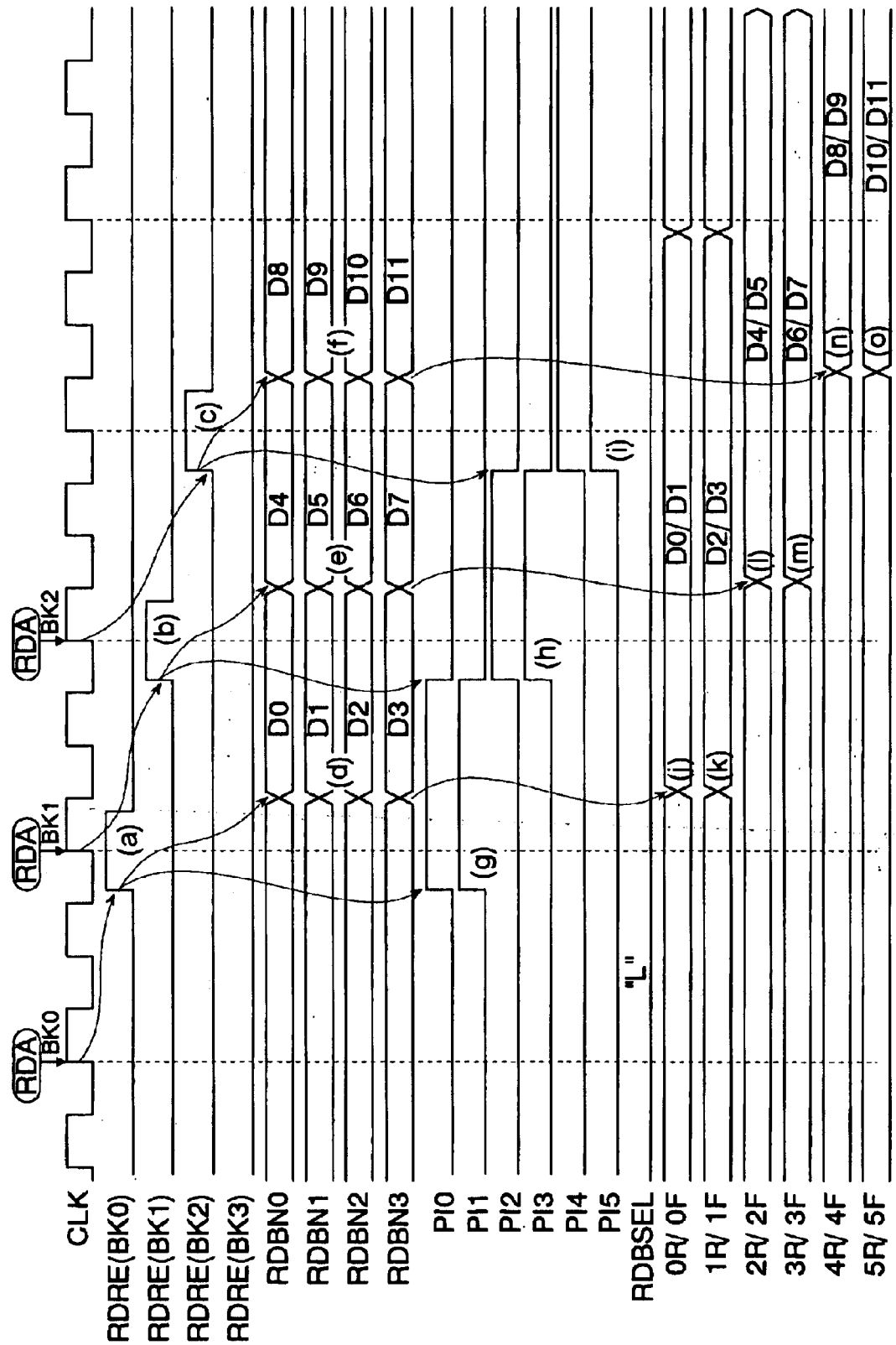
FIG. 39 is a timing chart showing the operation of the parallel/serial conversion circuit shown in FIG. 35 (burst length="4")
Figure 40:
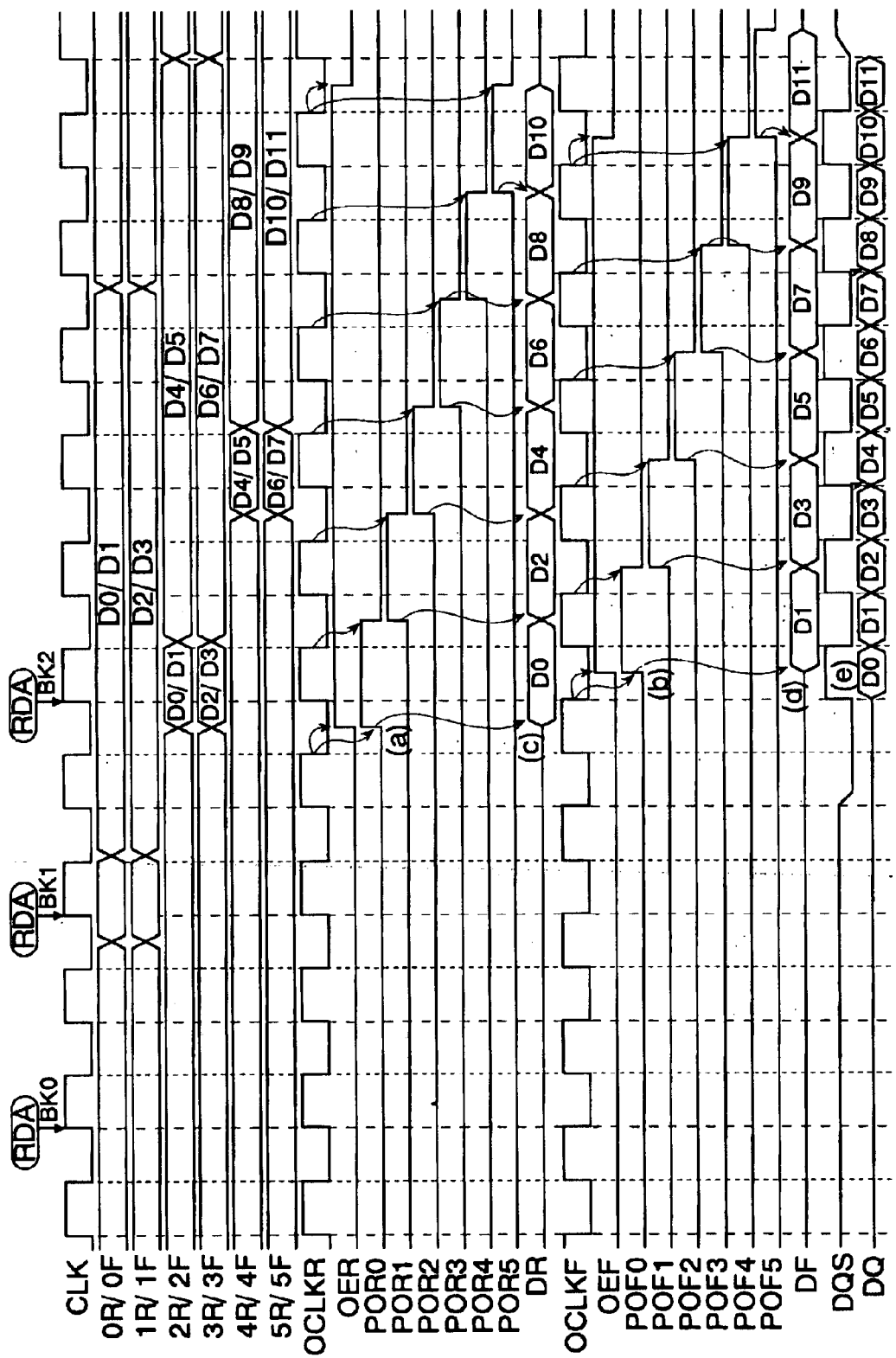
FIG. 40 is a timing chart showing the operation of the parallel/serial conversion circuit shown in FIG. 35 (burst length="4")

FIG. 39 and FIG. 40 show the operation of the parallel/serial conversion circuit 66 shown in FIG. 35 (burst length= "4"). In this example, the read commands RDA are sequentially supplied to the banks BK0, BK1 and BK2. FIG. 39 shows the operation until the read data are latched by the latches 0R to 5R, and FIG. 40 shows the operation until the latched data are outputted. Incidentally, in this example, the operation of one data input/output terminal (for example, DQA0) in one data group (for example, BYTEA) will be explained.

First, as shown in FIG. 39, the read bus enable signals RDRE of the respective banks BK0 to BK2 are sequentially activated according to the read commands RDA (FIG. 39(a), (b) and (c)), and read data D0 to D3, D4 to D7 and D8 to D11 are outputted to the data bus lines RDBN0 to RDBN3 (FIG. 39(d), (e) and (f)).

The counter PI shown in FIG. 36 receives the read bus enable signals RDRE and the burst length signal BL4/2 at the high level, and activates the counter signals PI0 to PI1, PI2 to PI3 and PI4 to PI5 sequentially (FIG. 39(g), (h) and (i)). The latches 0R and 0F of the parallel/serial conversion circuit 66 respectively latch the read data D0 and D1 while the counter signal PI0 is at the high level (FIG. 39(j)). The latches 1R and 1F respectively latch the read data D2 and D3 while the counter signal PI1 is at the high level (FIG. 39(k)).

The latches 2R and 2F respectively latch the read data D4 and D5 while the counter signal PI2 is at the high level (FIG. 39(l)). The latches 3R and 3F respectively latch the read data D6 and D7 while the counter signal PI3 is at the high level (FIG. 39(m)). The latches 4R and 4F respectively latch the read data D8 and D9 while the counter signal PI4 is at the high level (FIG. 39(n)). The latches 5R and 5F respectively latch the read data D10 and D11 while the counter signal PI5 is at the high level (FIG. 39(o)).

As shown in FIG. 40, the counter POR shown in FIG. 35 activates the counter signals POR0 to POR5 sequentially in synchronization with the output clock signal OCLKR, while the output enable signal OER is at the high level (FIG. 40(a)). The counter POF activates the counter signals POF0 to POF5 sequentially in synchronization with the output clock signal OCLKF, while the output enable signal OEF is at the high level (FIG. 40(b)).

Next, in response to the activation of the counter signals POR0 to POR5, the data D0, D2, D4, D6, D8 and D10 which are held in the latches 0R to 5R are sequentially outputted to the data bus line DR (FIG. 40(c)). Similarly, in response to the activation of the counter signals POF0 to POF5, the data D1, D3, D5, D7, D9 and D11 which are held in the latches 0F to 5F are sequentially outputted to the data bus line DF (FIG. 40(d)). The data D0 to D11 which are outputted to the data bus lines DR and DF are transmitted to the output buffer alternately in synchronization with the output clock signals OCLKR and OCLKF, and outputted from the data input/output terminal DQ in synchronization with the rising edges and falling edges of the data strobe signal DQS (FIG. 40(e)).

Figure 41:
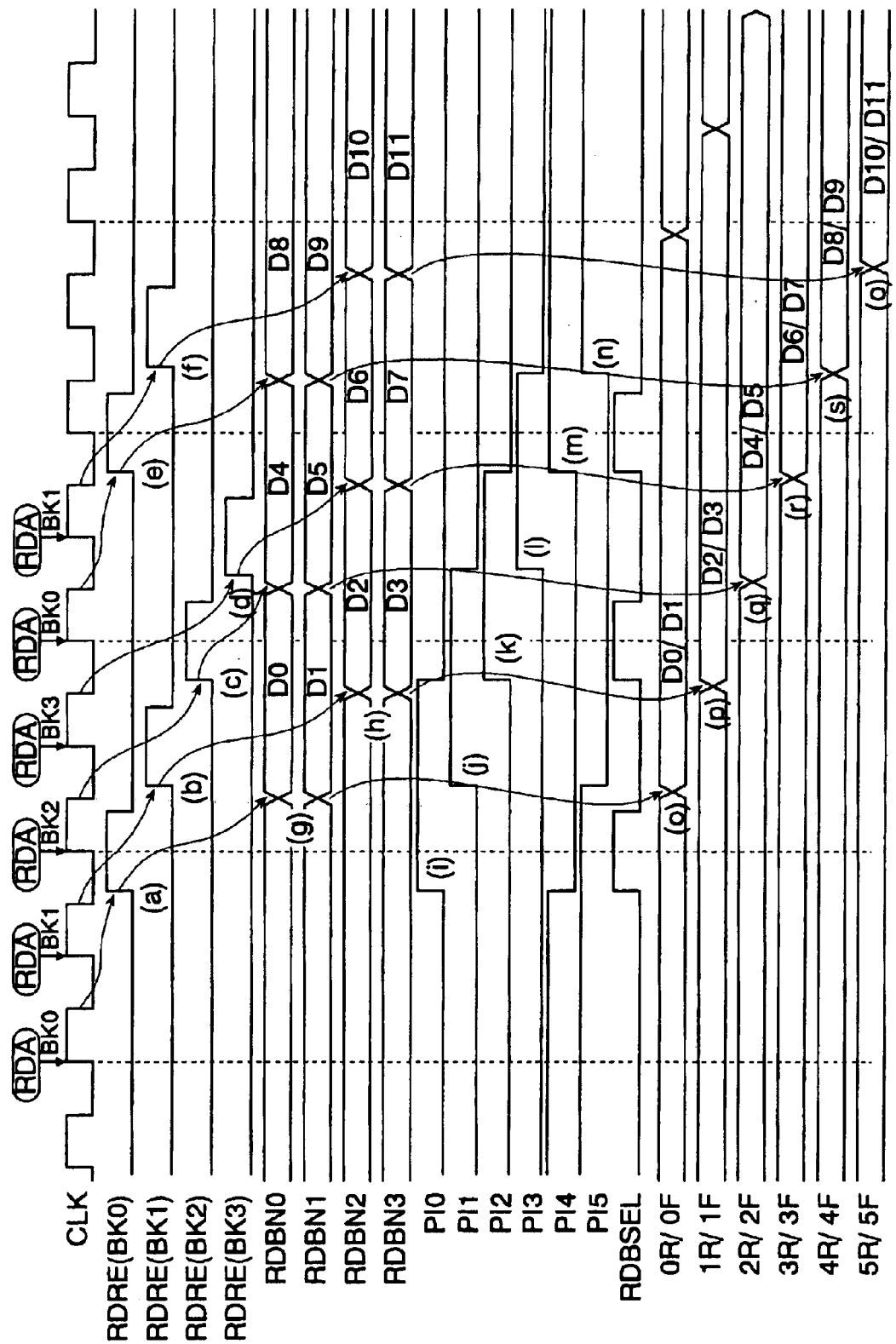
FIG. 41 is a timing chart showing the operation of the parallel/serial conversion circuit shown in FIG. 35 (burst length="2")
Figure 42:
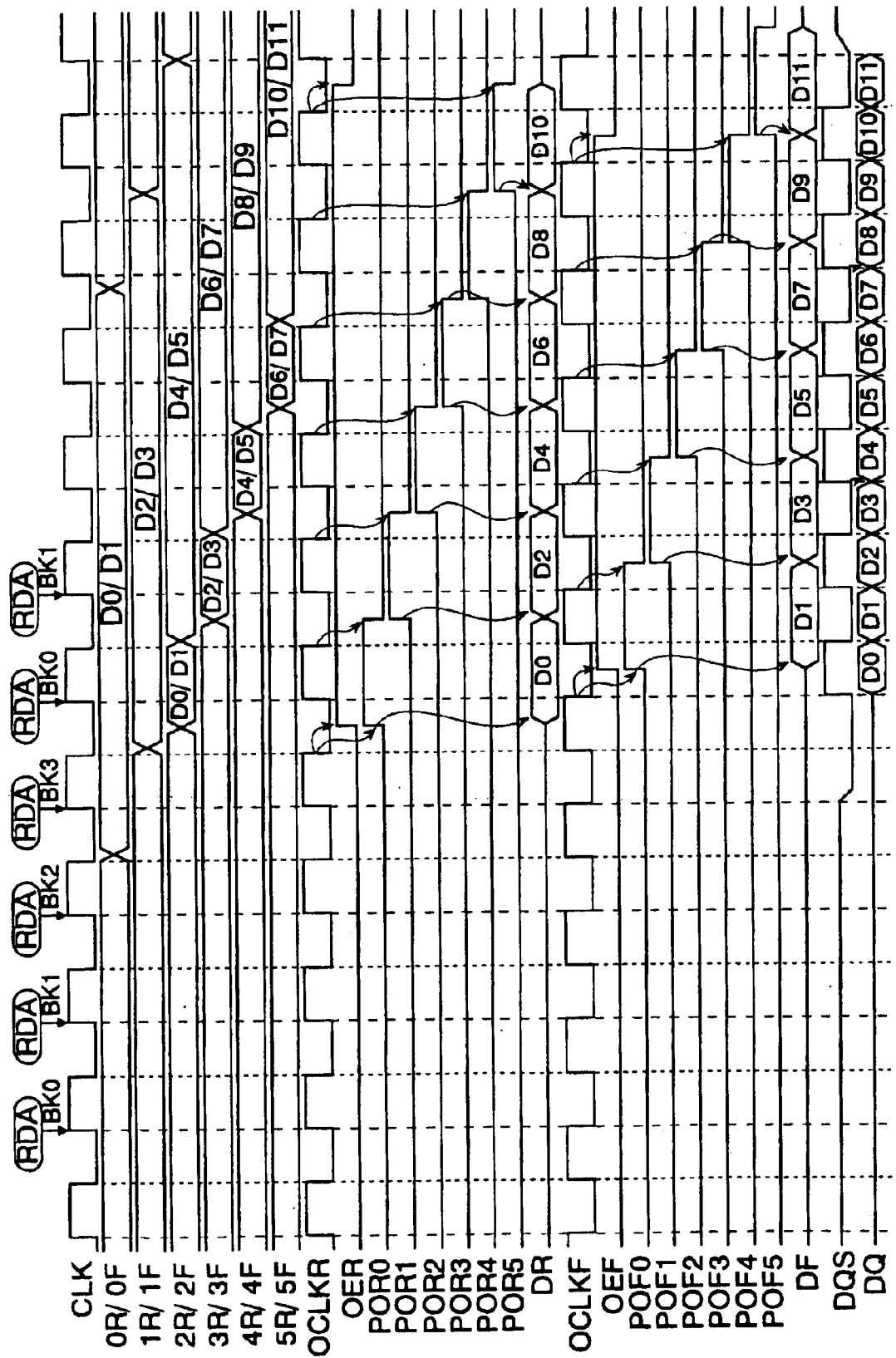
FIG. 42 is a timing chart showing the operation of the parallel/serial conversion circuit shown in FIG. 35 (burst length="2")

FIG. 41 and FIG. 42 show the operation of the parallel/serial conversion circuit 66 shown in FIG. 35 (burst length= "2"). In this example, the read commands RDA are sequentially supplied to the banks BK0 to BK3. FIG. 41 shows the operation until the read data are latched by the latches 0R to 5R, and FIG. 42 shows the operation until the latched data are outputted. Incidentally, in this example, the operation of one data input/output terminal (for example, DQA0) in one data group (for example, BYTEA) will be explained.

First, as shown in FIG. 41, the read bus enable signals RDRE of the respective banks BK0 to BK3 are sequentially activated according to the read commands RDA (FIG. 41(*a*) to (*f*)). In this example, the lower address signal LA1 which is supplied first is "0". Hence, the data switching circuit 72 shown in FIG. 38 sequentially operates the tri-state buffers 72*e* and 72*f* and the tri-state buffers 72*a* and 72*b*, outputs the read data D0 to D1, D4 to D5 and D8 to D9 to the data bus lines RDBN0 to RDBN1, and outputs the read data D2 to D3, D6 to D7 and D10 to D11 to the data bus lines RDBN2 to RDBN3 (FIG. 41(*g*) and (*h*)).

The counter PI shown in FIG. 36 receives the read bus enable signals RDRE and the burst length signal BL4/2 at the low level, and activates the counter signals PI0 to PI5 sequentially (FIG. 41(*i*) to (*n*)). The latches 0R and 0F of the parallel/serial conversion circuit 66 respectively latch the read data D0 and D1 while the counter signal PI0 is at the high level (FIG. 41(*o*)). The latches 1R and 1F respectively latch the read data D2 and D3 while the counter signal PI1 is at the high level (FIG. 41(*p*)).

The latches 2R and 2F respectively latch the read data D4 and D5 while the counter signal PI2 is at the high level (FIG. 41(*q*)). The latches 3R and 3F respectively latch the read data D6 and D7 while the counter signal PI3 is at the high level (FIG. 41(*r*)). The latches 4R and 4F respectively latch the read data D8 and D9 while the counter signal PI4 is at the high level (FIG. 41(*s*)). The latches 5R and 5F respectively latch the read data D10 and D11 while the counter signal PI5 is at the high level (FIG. 41(*t*)).

As shown in FIG. 42, the counter signals POR0 to POR5 and POF0 to POF5 are sequentially activated in synchronization with the output clock signals OCLKR and OCLKF, and are sequentially outputted from the data input/output terminal DQ in synchronization with the rising edges and falling edges of the data strobe signal DQS, similarly to the above-described FIG. 40.

Hereinafter, the operation of the semiconductor memory according to this embodiment will be explained.

Figure 43:
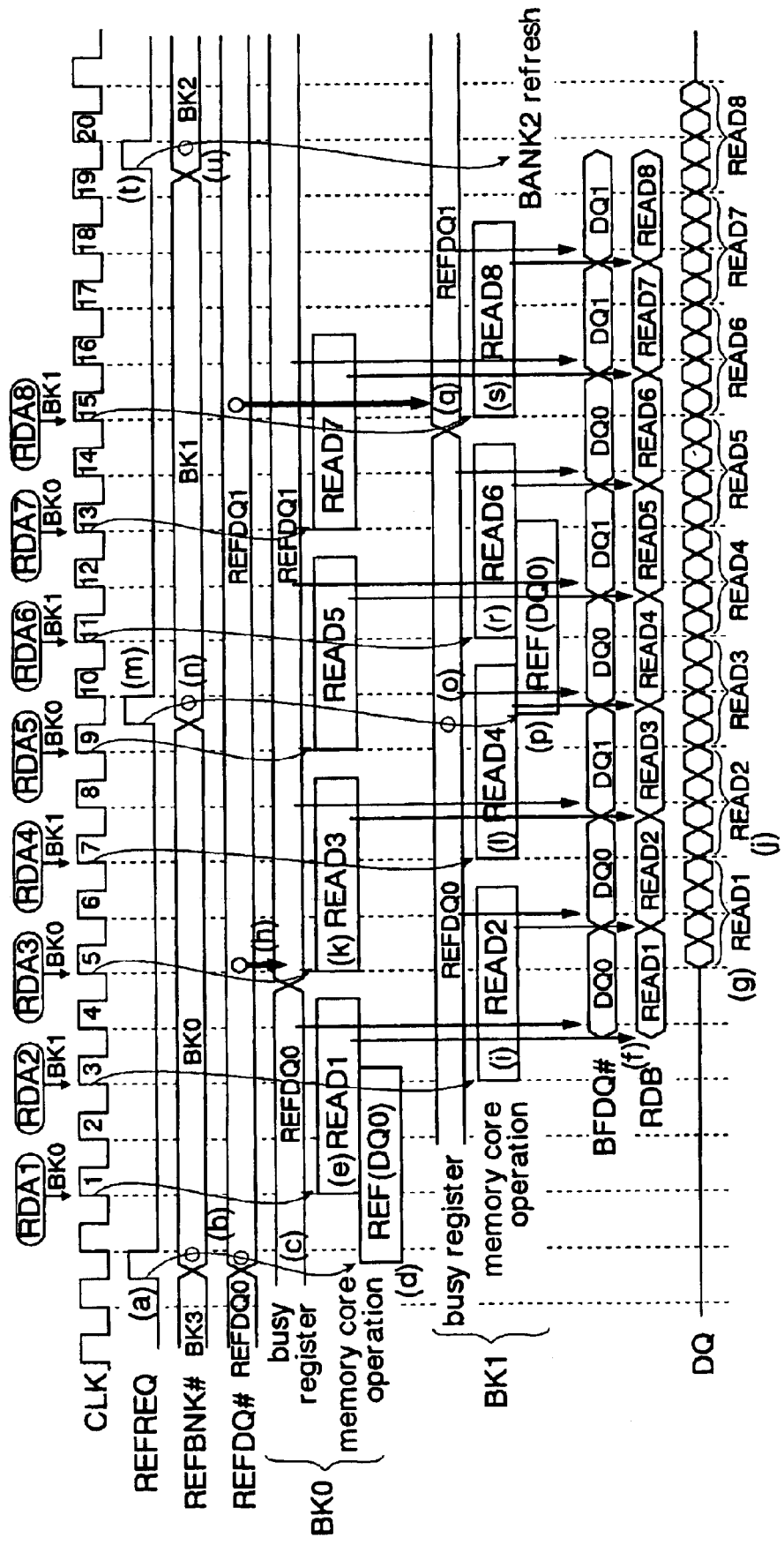
FIG. 43 is a timing chart showing an example of the read operation according to the first embodiment.

FIG. 43 shows the operation in the case where the refresh request REFRQ is generated while the read operations (burst length="4") of the banks BK0 to BK1 are being performed successively. The refresh request circuit 22 shown in FIG. 3 activates the refresh request signal REFRQ in synchronization with the falling edge of the clock signal CLK (FIG. 43(*a*)). The refresh counter 24 receives the refresh request signal REFRQ to count up. In this example, the refresh bank number REFBNK# and the refresh block number REFDQ# are switched to the bank BK0 and the memory block BLKDQ1, respectively (FIG. 43(*b*)).

The second control circuit of the bank BK0 (FIG. 13) operates in response to the refresh request signal REFRQ, and outputs the upper address UA of the refresh address and the timing signal for controlling the memory core to the address bus BADR and the timing signal bus BTMG. At this time, the busy register 60 in the bank BK0 holds the memory block BLKDQ0 as the refresh block number REFDQ# (FIG. 43(*c*)). The bank BK0 receives the activated busy signal BDQ0 from the busy register 60 and refreshes the memory block BLKDQ0 (FIG. 43(*d*)).

Next, the read commands RDA1 to RDA8 to the banks BK0 to BK1 are successively supplied in synchronization with the first and subsequent rising edges of the clock signal CLK. In response to the read command RDA1, the bank BK0 performs the read operation READ1 of the memory blocks BLKDQ1 to BLKDQ8 and BLKP corresponding to the inactivated busy signals BDQ# (FIG. 43(*e*)). The read operation READ1 is performed in parallel with the refresh operation of the memory block BLKDQ0.

The parity check circuit 64 shown in FIG. 33 receives the read data and the busy flag signal BFDQ0 at the high level (FIG. 43(*f*)). Then, the data held in the memory block BLKDQ0 is generated from the read data of the memory blocks BLKDQ1 to BLKDQ8 and BLKP. The parallel/serial conversion circuit 66 shown in FIG. 35 converts the read data READ1 and the like from parallel to serial, and outputs these in synchronization with the data strobe signal DQS corresponding to the fifth and subsequent clock signal CLK (FIG. 43(*g*)). The busy resister 60 of the bank BK0 (FIG. 13) accepts the busy signal REFDQ1 outputted from the refresh counter 24 (FIG. 3) after the completion of the read operation READ1 (FIG. 43(*h*)).

Meanwhile, the bank BK1 performs the read operation READ2 of the memory blocks BLKDQ1 to BLKDQ8 and BLKP corresponding to the inactivated busy signals BDQ# (FIG. 43(*i*)). Then, similarly to the above-described bank BK0, the data held in the memory block BLKDQ0 is generated from the read data of the memory blocks BLKDQ1 to BLKDQ8 and BLKP. The read data are outputted in synchronization with the data strobe signal DQS corresponding to the seventh and subsequent clock signal CLK (FIG. 43(*j*)).

Thereafter, the read operations READ3 and READ4 corresponding to the read commands RDA3 to RDA4 are performed (FIG. 43(*k*) and (*l*)). The next refresh request REFRQ is generated immediately after the read command RDA5 is supplied (FIG. 43(*m*)). In response to the refresh request signal REFRQ, the refresh counter 24 switches the refresh bank number REFBNK# to the bank BK1 (FIG. 43(*n*)).

The busy register 60 in the bank BK1 (FIG. 13) holds the memory block BLKDQ0 as the refresh block number REFDQ# (FIG. 43(*o*)). Hence, the bank BK1 receives the activated busy signal BDQ0 from the busy register 60 and refreshes the memory block BLKDQ0 (FIG. 43(*p*)). The refresh operation of the bank BK1 is performed in parallel with the read operations READ4 and READ6. The busy resister 60 of the bank BK1 accepts the busy signal REFDQ1 outputted from the refresh counter 24 (FIG. 3) after the completion of the read operation READ6 (FIG. 43(*q*)).

Thereafter, the read operations READ7 and READ8 corresponding to the read commands RDA7 to RDA8 are performed (FIG. 43(*r*) and (*s*)). Further, the next refresh request REFRQ is generated (FIG. 43(*t*)). In response to the refresh request signal REFRQ, the refresh counter 24 switches the refresh bank number REFBNK# to the bank BK2 (FIG. 43(*u*)).

Figure 44:
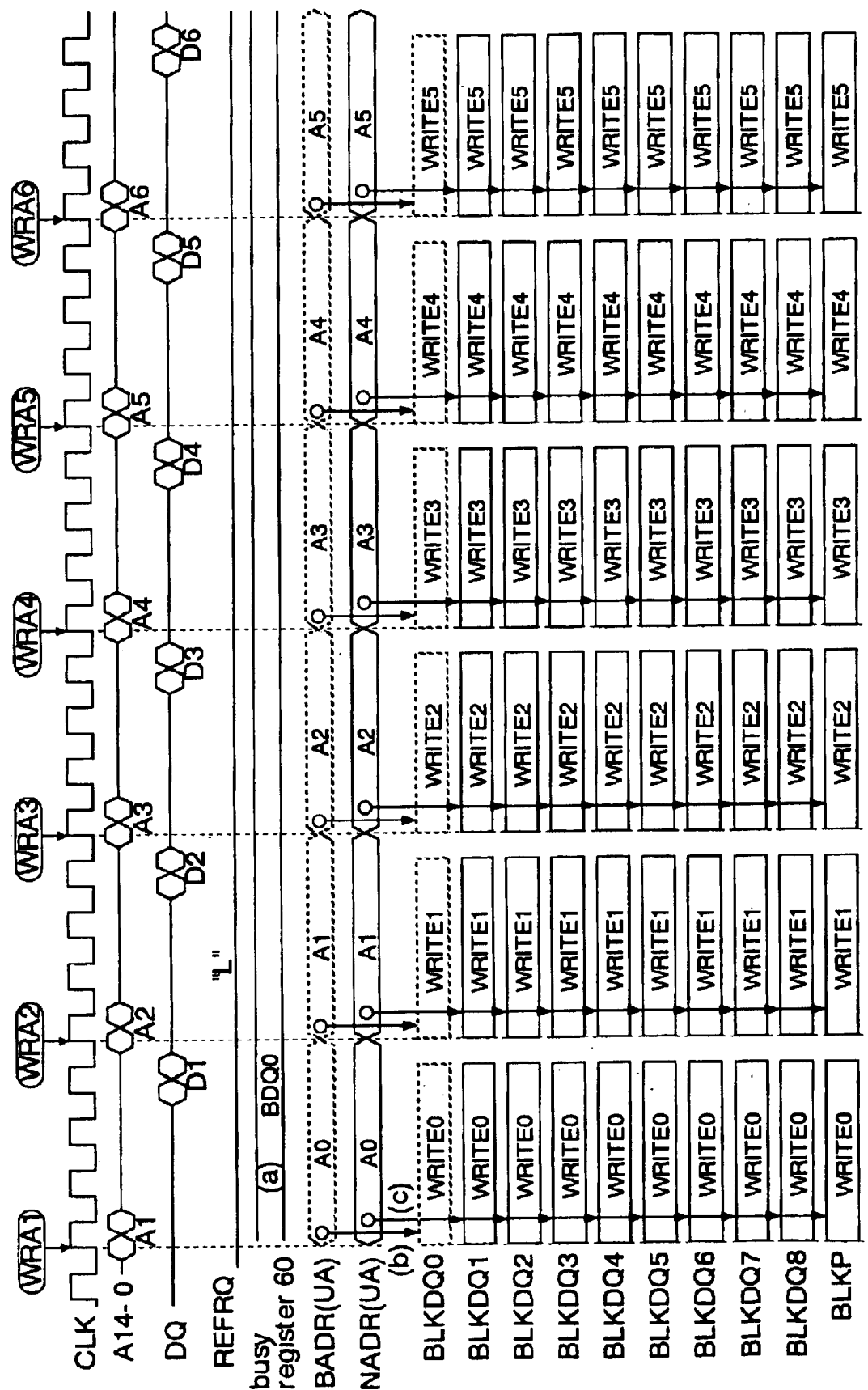
FIG. 44 is a timing chart showing an example of the write operation according to the first embodiment.

FIG. 44 shows the operation when the write commands WRA are successively supplied to the same bank (burst length="2"). In this example, the refresh request REFRQ is not generated and the busy register 60 (FIG. 13) activates the busy signal BDQ0 (FIG. 44(*a*)). In the drawing, frames indicated by broken lines show the operation by the second control circuit 50 shown in FIG. 13.

First, the write command WRA1 is supplied in synchronization with the first rising edge of the clock signal CLK. In response to the activation of the busy signal BDQ0, the selectors ASEL and TSEL of the memory block BLKDQ0 select the address bus BADR and the timing signal bus BTMG. In response to the inactivation of the busy signals BDQ1 to BDQ8 and BDQP, the memory blocks BLKDQ1 to BLKDQ8 and BLKP select the address bus NADR and the timing signal bus NTMG. As a result of this, the write operation on the memory block BLKDQ0 is performed by the signal transmitting through the address bus BADR and the timing signal bus BTMG (FIG. 44(b)). The write operations to the memory blocks BLKDQ1 to BLKDQ8 and BLKP are performed by the signal transmitting through the address bus NADR and the timing signal bus NTMG (FIG. 44(c)). Namely, the write operation corresponding to the activated busy signal BDQ0 is performed by the second control circuit 50 shown in FIG. 13, and the write operations corresponding to other busy signals BDQ1 to BDQ8 and BDQP are performed by the first control circuit 40.

Incidentally, since the semiconductor memory of this embodiment adopts the late writing function, the late write operations WRITE0 (write address A0) corresponding to the previous write command WRA are performed in response to the write command WRA1. The write address A1 and the write data D1 which are supplied corresponding to the write command WRA1 are held in the address register (FIG. 17 and FIG. 23) and the data register. Thereafter, the late write operations WRITE1 to WRITE5 are performed in response to the write commands WRA2 to WRA6, similarly to the above.

Figure 45:
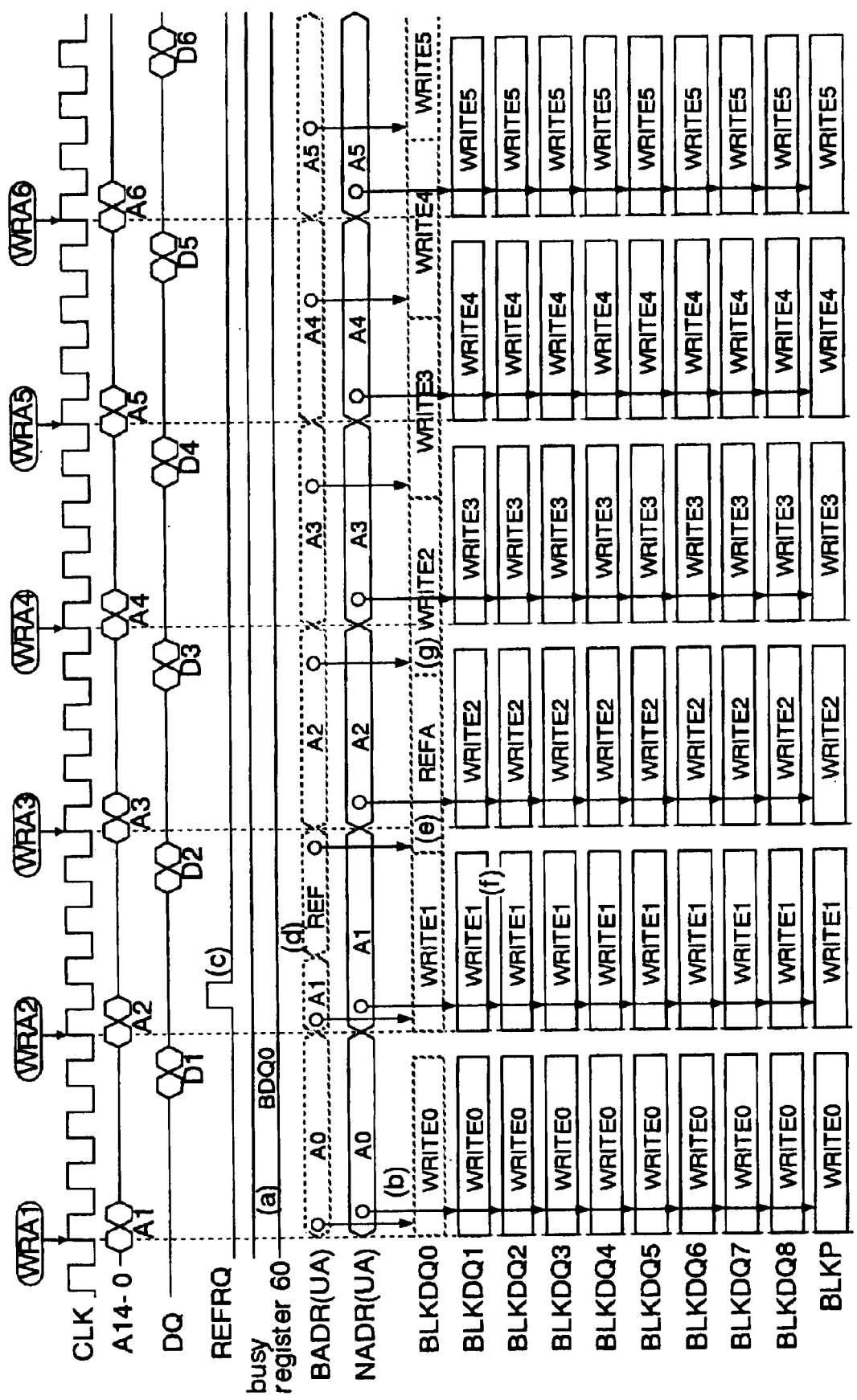
FIG. 45 is a timing chart showing an example of the write operation according to the first embodiment.
Figure 46:
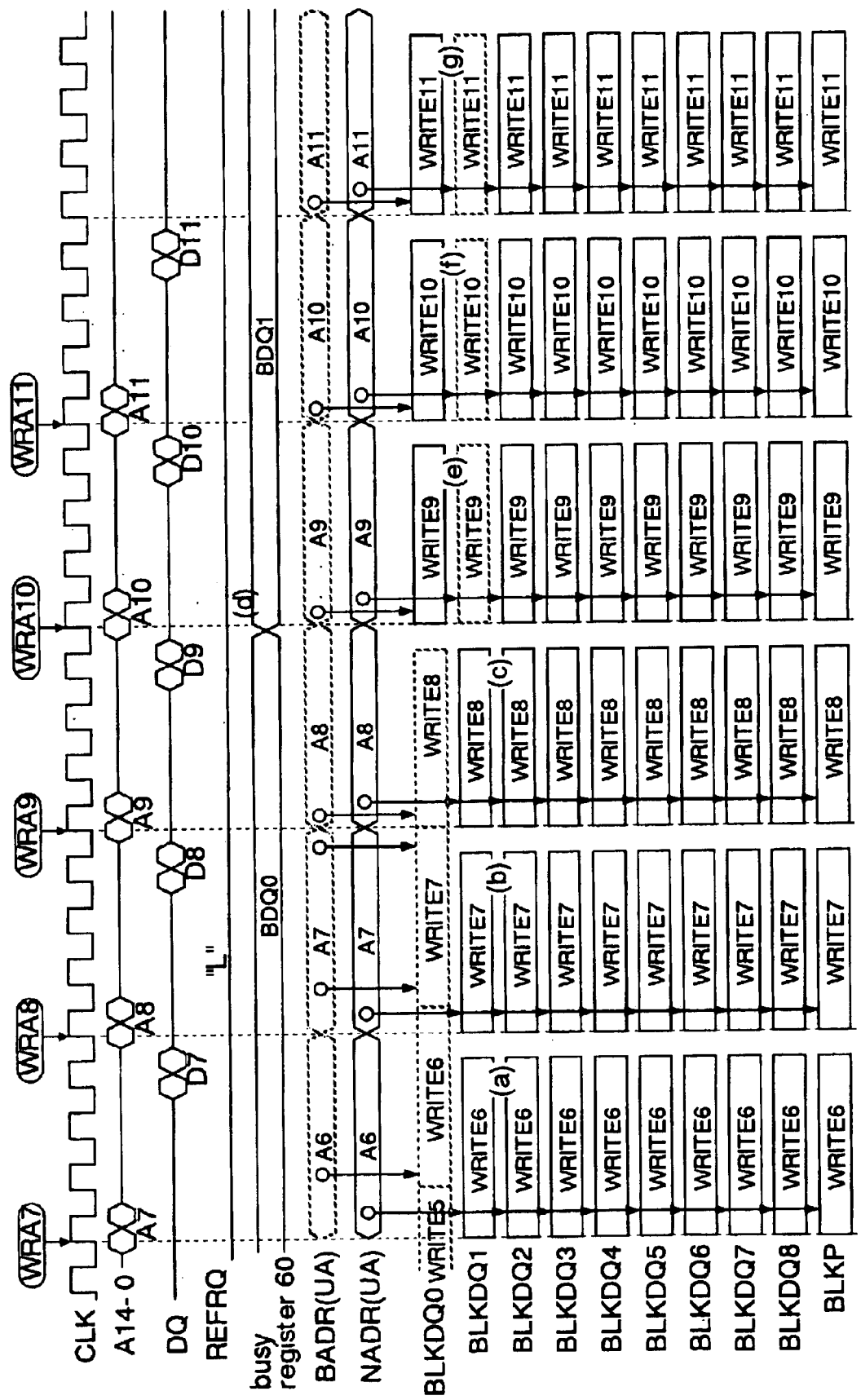
FIG. 46 is a timing chart showing an example of the write operation according to the first embodiment.

FIG. 45 and FIG. 46 show the operation in the case where the refresh request REFRQ is generated when the write commands WRA1 to WRA11 are successively supplied to the same bank (burst length="2"). In this example, the busy signal BDQ0 is activated (FIG. 45(a)).

First, the late write operations WRITE0 in response to the write command WRA1 are performed similarly to FIG. 44 (FIG. 45(b)). Next, the write command WRA2 is supplied and the late write operations WRITE1 are performed. While the write operations WRITE1 are being performed, the refresh request REFRQ is generated (FIG. 45(c)).

In response to the activation of the refresh request REFRQ and the refresh entry signal REFENT, the address register 52 shown in FIG. 23 outputs the refresh address REF to the address bus BADR (FIG. 45(d)). After the completion of the write operation WRITE1, the second control circuit 50 which controls the memory block BLKDQ0 performs the refresh operation REFA as shown in FIG. 26 (FIG. 45(e)). The refresh operation REFA is performed by using, for example, the R cycle counter 54B shown in FIG. 24. Similarly to the above-described FIG. 44, the late write operations WRITE1 are performed in the memory blocks BLKDQ1 to BLKDQ8 and BLKP (FIG. 45(f)).

When the refresh operation REFA of the memory block BLKDQ0 is completed, the next write command WRA3 is supplied. Hence, the second control circuit 50 performs the late write operation WRITE2 following the refresh operation REFA (FIG. 45(g)). Namely, when the write command WRA and the refresh request REFRQ conflict with each other, the second control circuit 50 performs the refresh operation or the write operation according to the order of the reception. The first control circuit 40 performs the write operations to other memory blocks BLKDQ1 to BLKDQ8 and BLKP in synchronization with the write command WRA3. In this embodiment, the external write cycle tERC is set to 4 clock cycles, and the internal write cycle tIRC is set to 3.5 clock cycles which is shorter than the external write cycle tERC by 0.5 clock, similarly to the basic principle explained with reference to FIG. 1. Hence, the lag between the write operation of the memory block BLKDQ0 and the write operations of other memory blocks BLKDQ1 to BLKDQ8 and BLKP is gradually reduced.

In FIG. 46, the late write operations WRITE6 to WRITE8 are performed corresponding to the write commands WRA7 to WRA9 (FIG. 46(a), (b) and (c)). The write operation WRITE8 of the memory block BLKDQ0 corresponding to the write command WRA9 is performed at the same timing with those of the write operations WRITE8 of other memory blocks BLKDQ1 to BLKDQ8 and BLKP.

The busy register 60 shown in FIG. 13 inactivates the busy signal BDQ0 and activates the busy signal BDQ1 when all of the memory blocks BLKDQ0 to BLKDQ8 and BLKP are not operating (FIG. 46(d)). Hence, the write operations WRITE9 to WRITE11 of the memory block BLKDQ1 are performed by the second control circuit 50 and the write operations WRITE9 to WRITE11 of other memory blocks BLKDQ0, BLKDQ2 to BLKDQ8 and BLKP are performed by the first control circuit 40 (FIG. 46(e), (f) and (g)).

Figure 47:
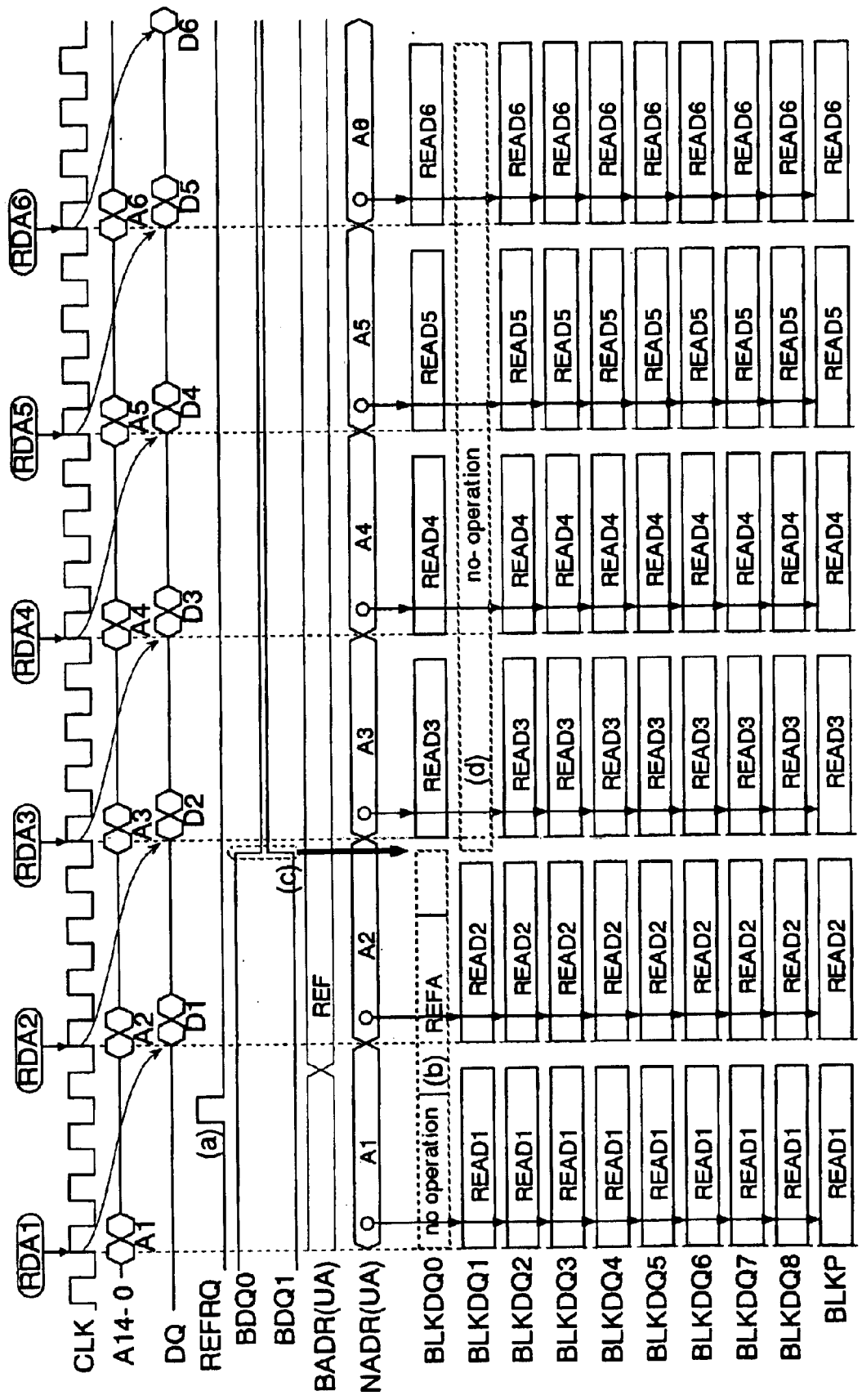
FIG. 47 is a timing chart showing an example of the read operation according to the first embodiment.

FIG. 47 shows the operation in the case where the refresh request REFRQ is generated when the read commands RDA1 to RDA6 are successively supplied to the same bank (burst length="2"). In this example, the busy signal BDQ0 is activated before the refresh request REFRQ is generated (FIG. 47(a)). Detailed explanations of the operations which are the same as those of FIG. 43 will be omitted.

First, the read command RDA1 is supplied and the read operations READ1 are performed. In the read operation, only the first control circuit 40 shown in FIG. 13 operates, and the second control circuit 50 does not operate. Therefore, the memory block BLKDQ0 corresponding to the busy signal BDQ0 does not operate. The read data from the memory block BLKDQ0 is generated from the read data of other memory blocks BLKDQ1 to BLKDQ8 and BLKP.

When the refresh request REFRQ is generated during the read operation READ1, the second control circuit 50 operates and the refresh operation REFA of the memory block BLKDQ0 corresponding to the busy signal BDQ0 is performed (FIG. 47(b)). During the refresh operation REFA, the next read command RDA2 is supplied and the read operations READ2 of the memory blocks BLKDQ1 to BLKDQ8 and BLKP are performed.

After performing the refresh operation REFA, the busy register 60 shown in FIG. 13 waits for the operations of all memory blocks BLKDQ0 to BLKDQ8 and BLKP to be completed to inactivate the busy signal BDQ0 and activate the busy signal BDQ1 (FIG. 47(c)). In response to the activation of the busy signal BDQ1, the memory block which does not perform the read operation switches from BLKDQ0 to BLKDQ1 (FIG. 47(d)). Then, the memory blocks BLKDQ0, BLKDQ2 to BLKDQ8 and BLKP are operated and the read operations READ3 to READ6 corresponding to the read commands RDA3 to RDA6 are performed.

FIG. 48 shows representative AC specifications to users of the semiconductor memory according to this embodiment. It is distinctive in that LRBD (Random Bank Access Delay), LRWD (LAL following RDA to WRA Delay) and LDIN (WRA Command to Data-in Delay) change according to the burst length BL. Due to the specifications like these, it is possible to use the data input/output terminal DQ efficiently irrespective of the burst length, and hence a data transfer rate can be improved.

LLOCK (DLL lock-on Time) is the number of the clock cycles until the phase adjusting clock signal PCLK which is outputted from the DLL circuit 8 shown in FIG. 3 is stabilized, in turning the power on and the like. LRST (/RST Low Input Hold for Chip Reset) is the number of the clock cycles required until the chip selection signal /CS is activated after releasing the reset signal /RST. LRSC (Mode Register SET Cycle Time) is the number of the clock cycles required until the value is actually set in the mode register 2, after the mode register setting command MRS.

FIG. 49 to FIG. 60 show concrete examples of the AC specifications shown in FIG. 48.

Figure 49:
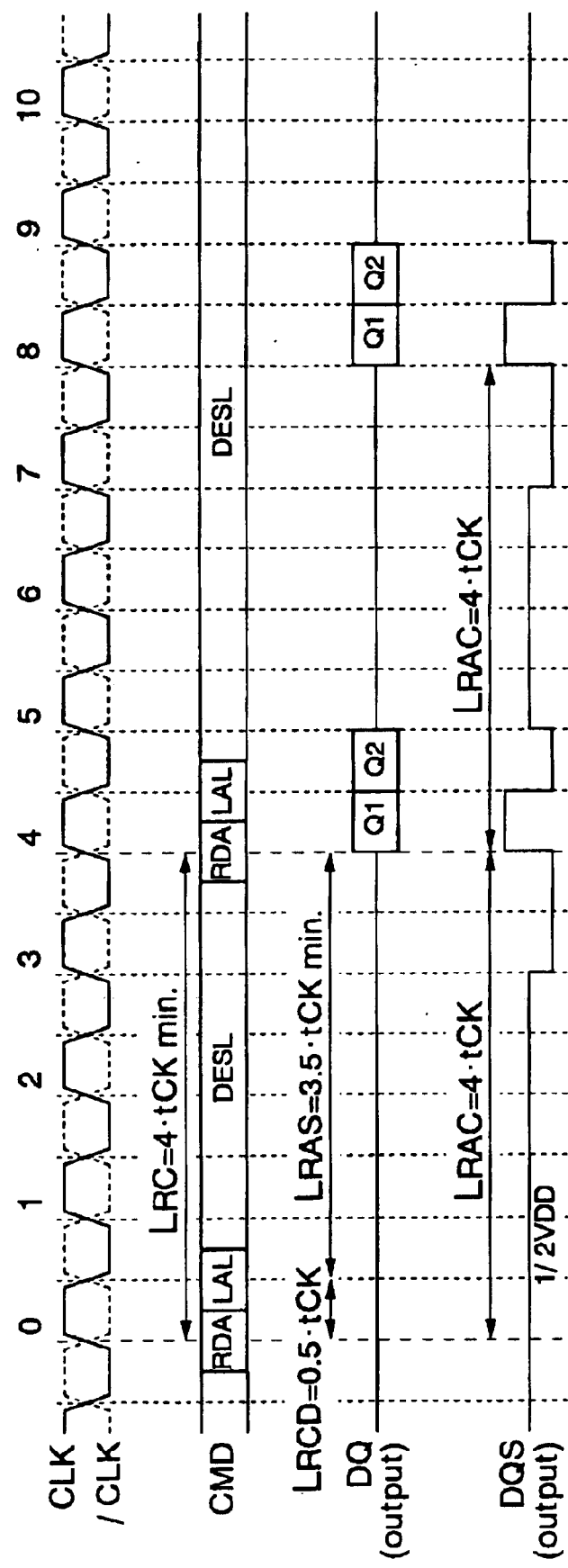
FIG. 49 is a timing chart showing an example of the read operation from the same bank BK (burst length="2")
Figure 50:
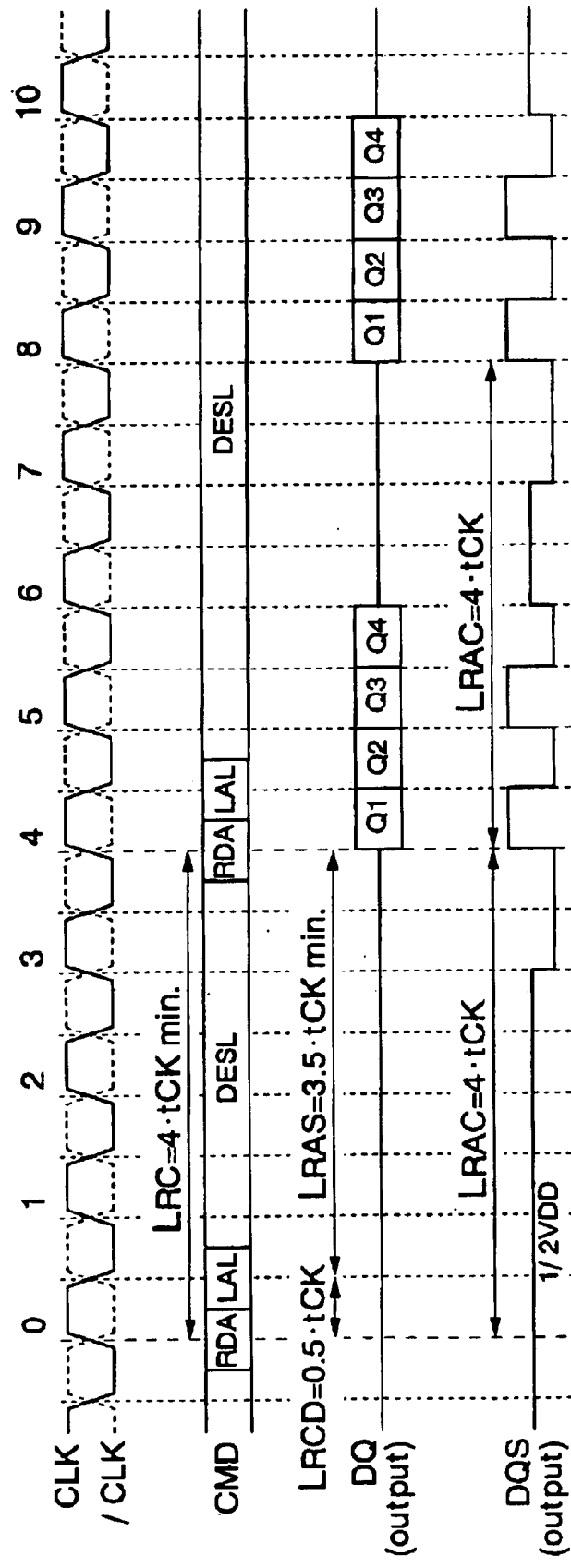
FIG. 50 is a timing chart showing an example of the read operation from the same bank BK (burst length="4")

FIG. 49 shows the example of the read operation from the same bank BK (burst length="2"). FIG. 50 shows the example of the read operation from the same bank BK (burst length="4"). The interval between supply of the read commands RDA is defined by LRC (Random Read/Write Cycle Time). The delay from the read command RDA to the lower address latch command LAL is defined by LRCD (RDA/WRA to LAL Command Input Delay). The delay from the lower address latch command LAL to the next read command RDA is defined by LRAS (LAL to RDA/WRA Command Input Delay). The delay from the read command RDA to the output of the first data is defined by LRAC (RDA Command to Access Delay).

Figure 51:
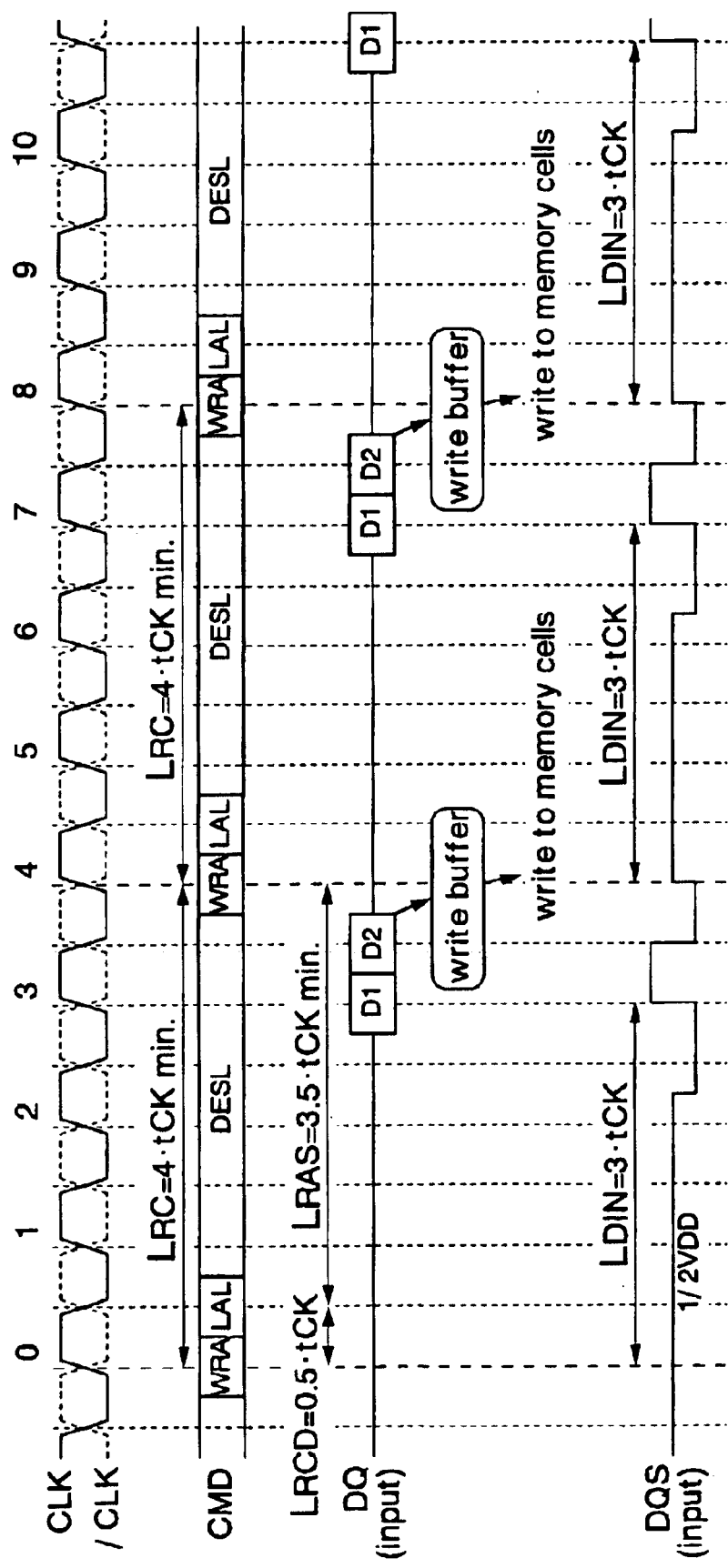
FIG. 51 is a timing chart showing an example of the write operation on the same bank BK (burst length="2")
Figure 52:
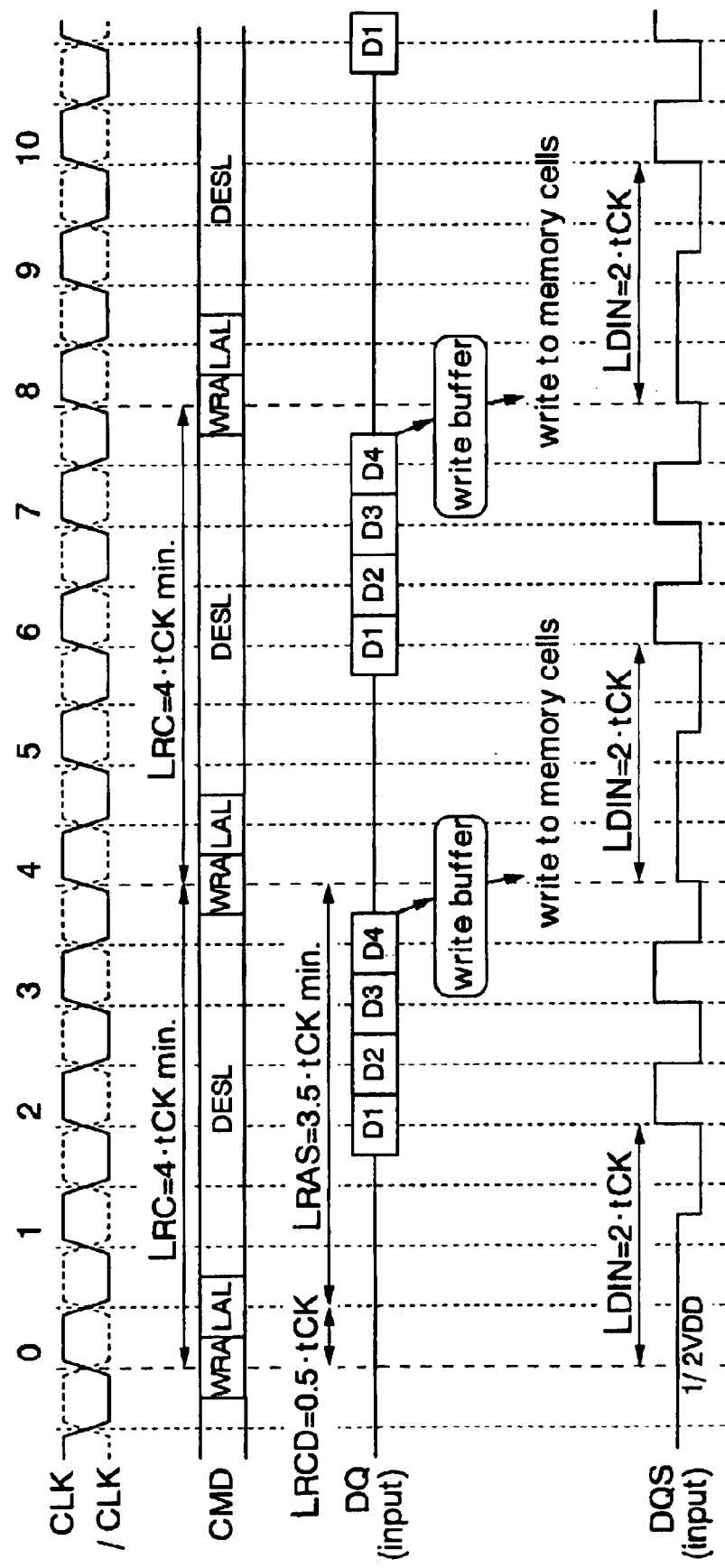
FIG. 52 is a timing chart showing an example of the write operation on the same bank BK (burst length="4")

FIG. 51 shows the example of the write operations to the same bank BK (burst length="2"). FIG. 52 shows the example of the write operations to the same bank BK (burst length="4"). The interval between supply of the write commands WRA is defined by the LRC. The delay from the write command WRA to the lower address latch command LAL is defined by the LRCD. The delay from the lower address latch command LAL to the next write command WRA is defined by the LRAS. The delay from the write command WRA to the input of the data is defined by LDIN (WRA Command to Data-in Delay). When the burst length BL is "2" and "4", the LDIN is three clock cycles and two clock cycles, respectively. In the write operation, the late writing operation is performed as described above.

Figure 53:
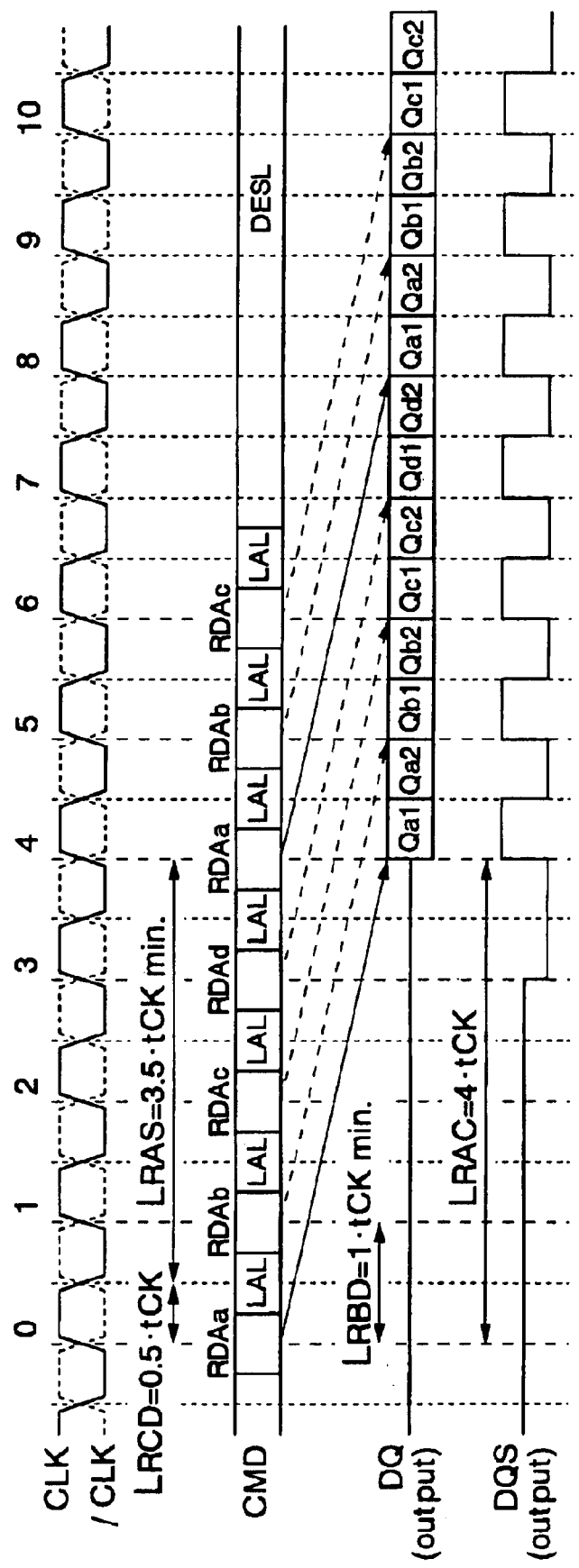
FIG. 53 is a timing chart showing an example of the read operations from a plurality of the banks BK (burst length="2")
Figure 54:
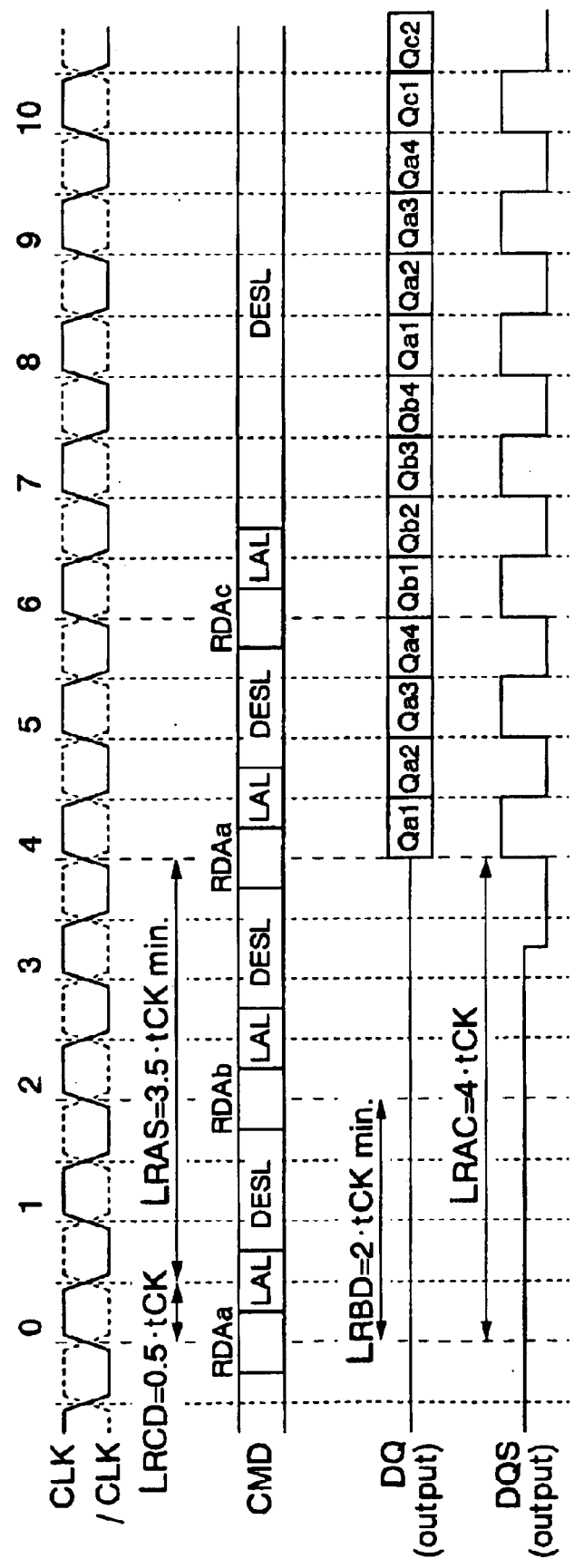
FIG. 54 is a timing chart showing an example of the read operations from a plurality of the banks BK (burst length="4")

FIG. 53 shows the example of the read operations from a plurality of the banks BK (burst length="2"). FIG. 54 shows the example of the read operations from a plurality of the banks BK (burst length="4"). The LRCD, LRAS and LRAC are the same as those shown in FIG. 49 and FIG. 50. The interval between supply of the read commands RDA to the different banks BK is defined by LRBD (Random Bank Access Delay). When the burst length BL is "2" and "4", the LRBD is one clock cycle at the minimum and two clock cycles at the minimum, respectively.

Figure 55:
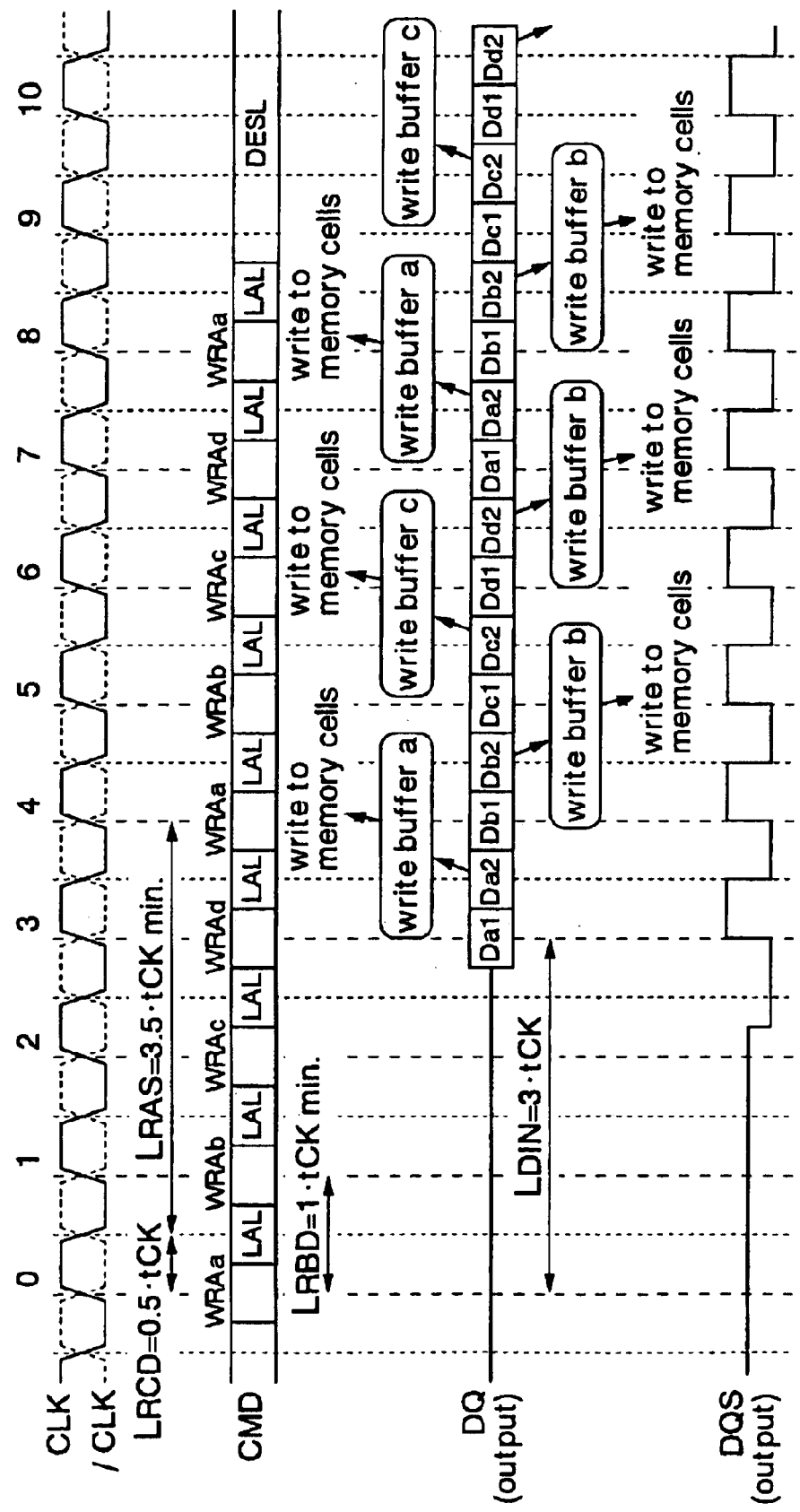
FIG. 55 is a timing chart showing an example of the write operations to a plurality of the banks BK (burst length="2")
Figure 56:
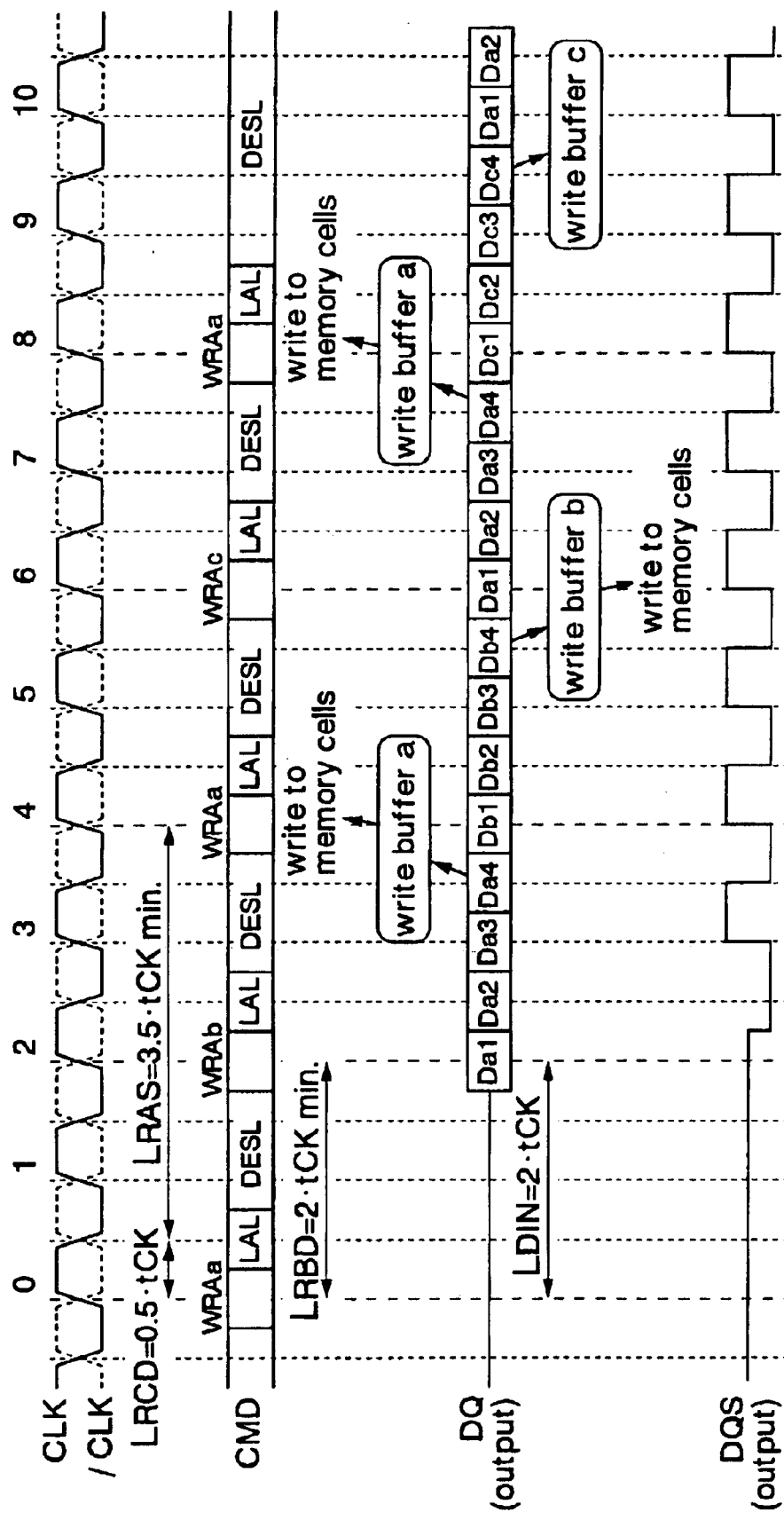
FIG. 56 is a timing chart showing an example of the write operations to a plurality of the banks BK (burst length="4")

FIG. 55 shows the example of the write operations to a plurality of the banks BK (burst length="2"). FIG. 56 shows the example of the write operations to a plurality of the banks BK (burst length="4"). The LRCD, LRAS and LDIN are the same as those shown in FIG. 51 and FIG. 52. The interval between supply of the write commands WRA to the different banks BK is defined by the LRBD. Similarly to the read operations, when the burst length BL is "2" and "4", the LRBD is one clock cycle at the minimum and two clock cycles at the minimum, respectively.

Figure 57:
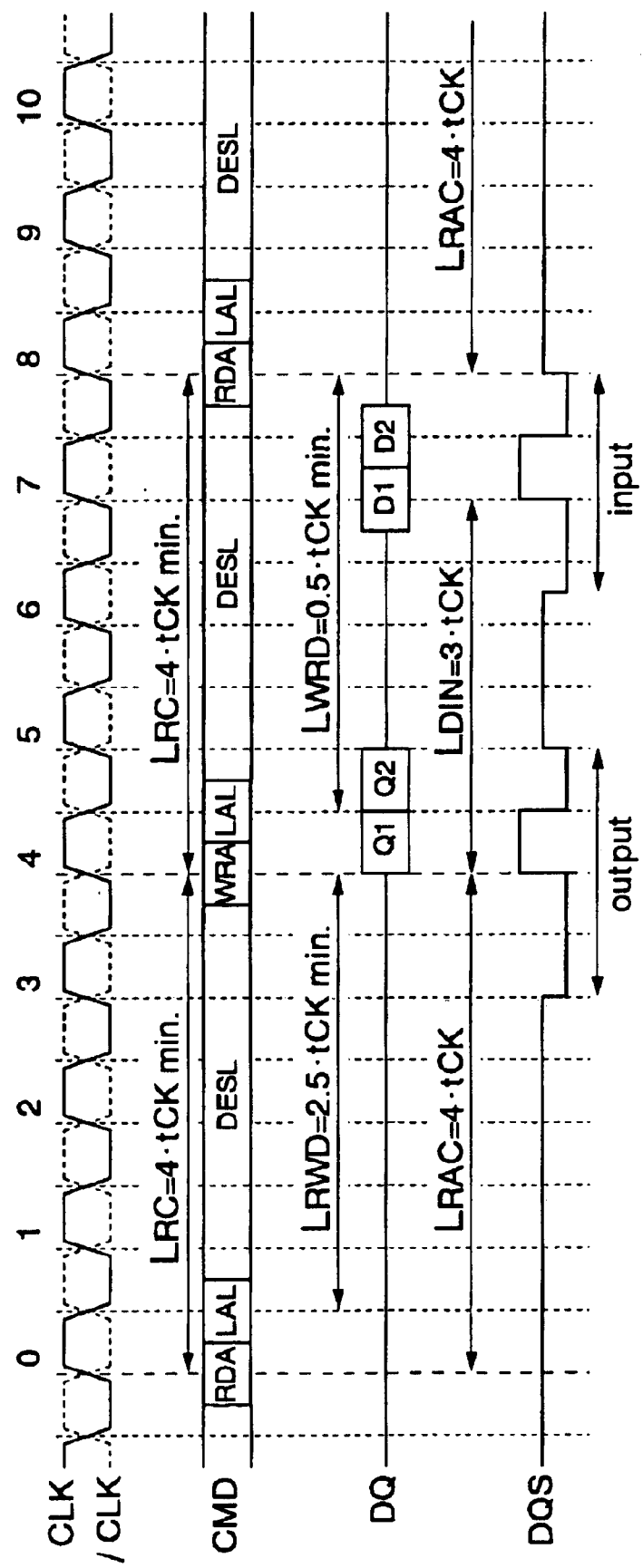
FIG. 57 is a timing chart showing an example of the read operation and the write operation from/to the same bank BK (burst length="2")
Figure 58:
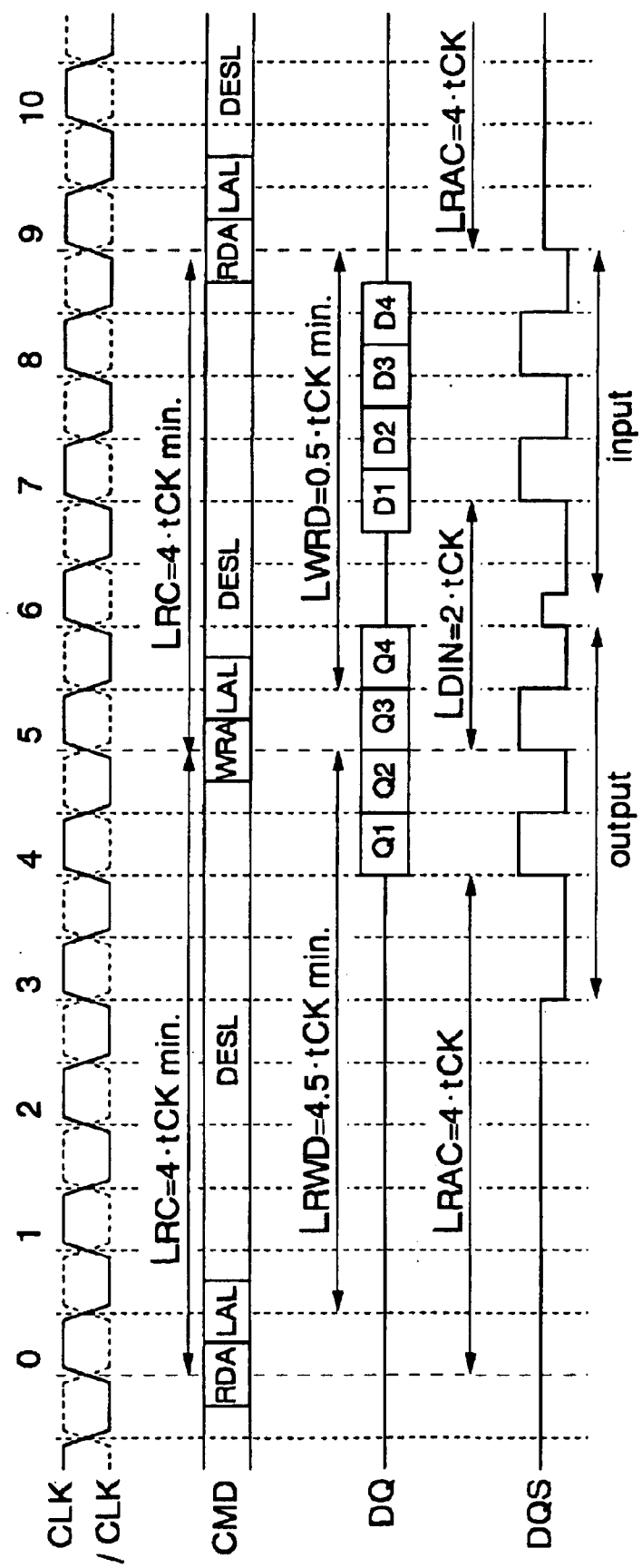
FIG. 58 is a timing chart showing an example of the read operation and the write operation from/to the same bank BK (burst length="4")

FIG. 57 shows the example of the read operation and the write operation from/to the same bank BK (burst length="2"). FIG. 58 shows the example of the read operation and the write operation from/to the same bank BK (burst length="4"). The LRC, LRAC and LDIN are the same as those shown in FIG. 49 to FIG. 52. The delay from the lower address latch command LAL after the read command RDA to the next write command WRA is defined by LRWD (LAL following RDA to WRA Delay). When the burst length BL is "2" and "4", the LRWD is 2.5 clock cycles at the minimum and 4.5 clock cycles at the minimum, respectively. The delay from the lower address latch command LAL after the write command WRA to the next read command RDA is defined by LWRD (LAL following WRA to RDA Delay).

Figure 59:
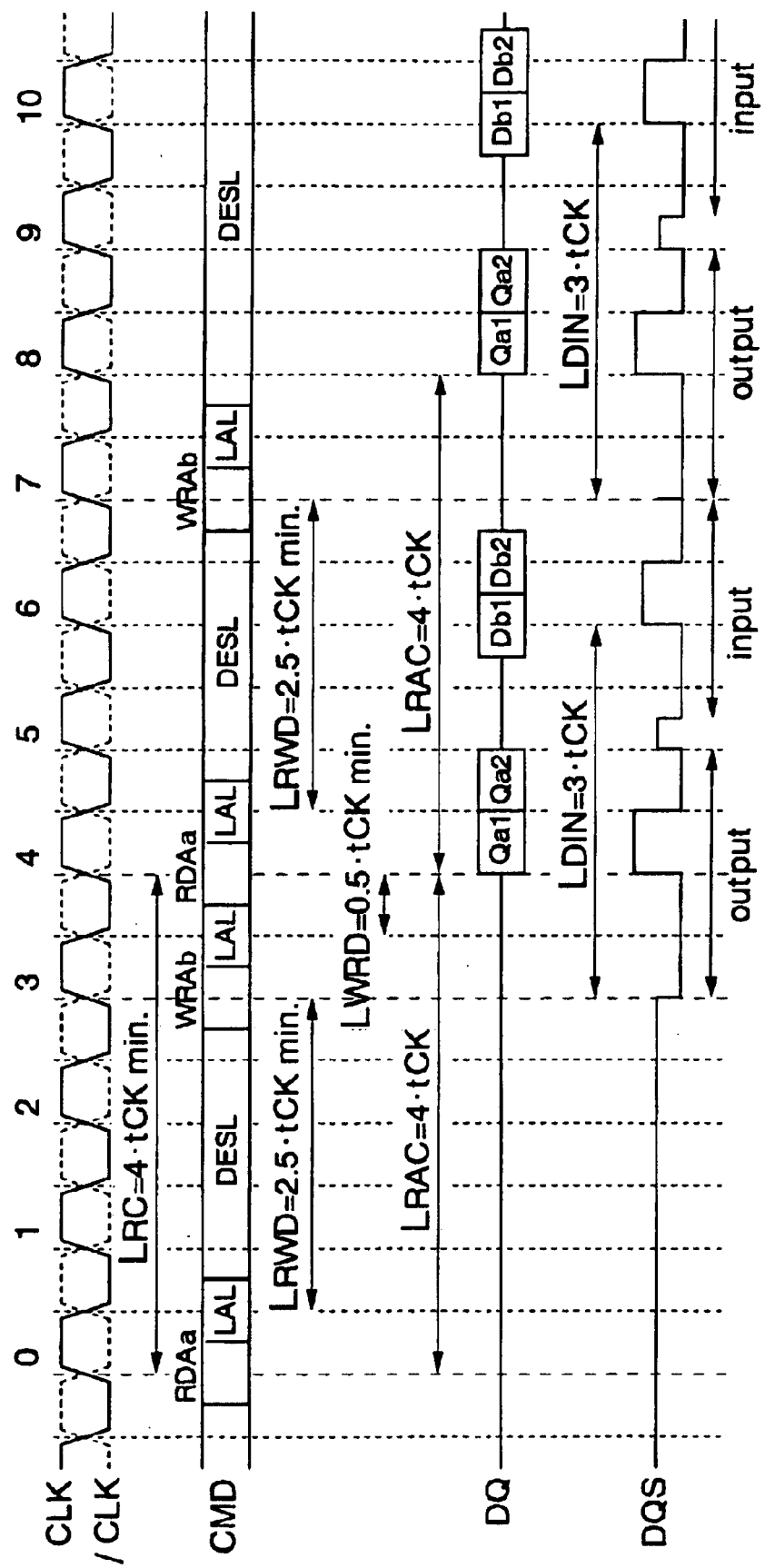
FIG. 59 is a timing chart showing an example of the read operation and write operation from/to a plurality of the banks BK (burst length="2")
Figure 60:
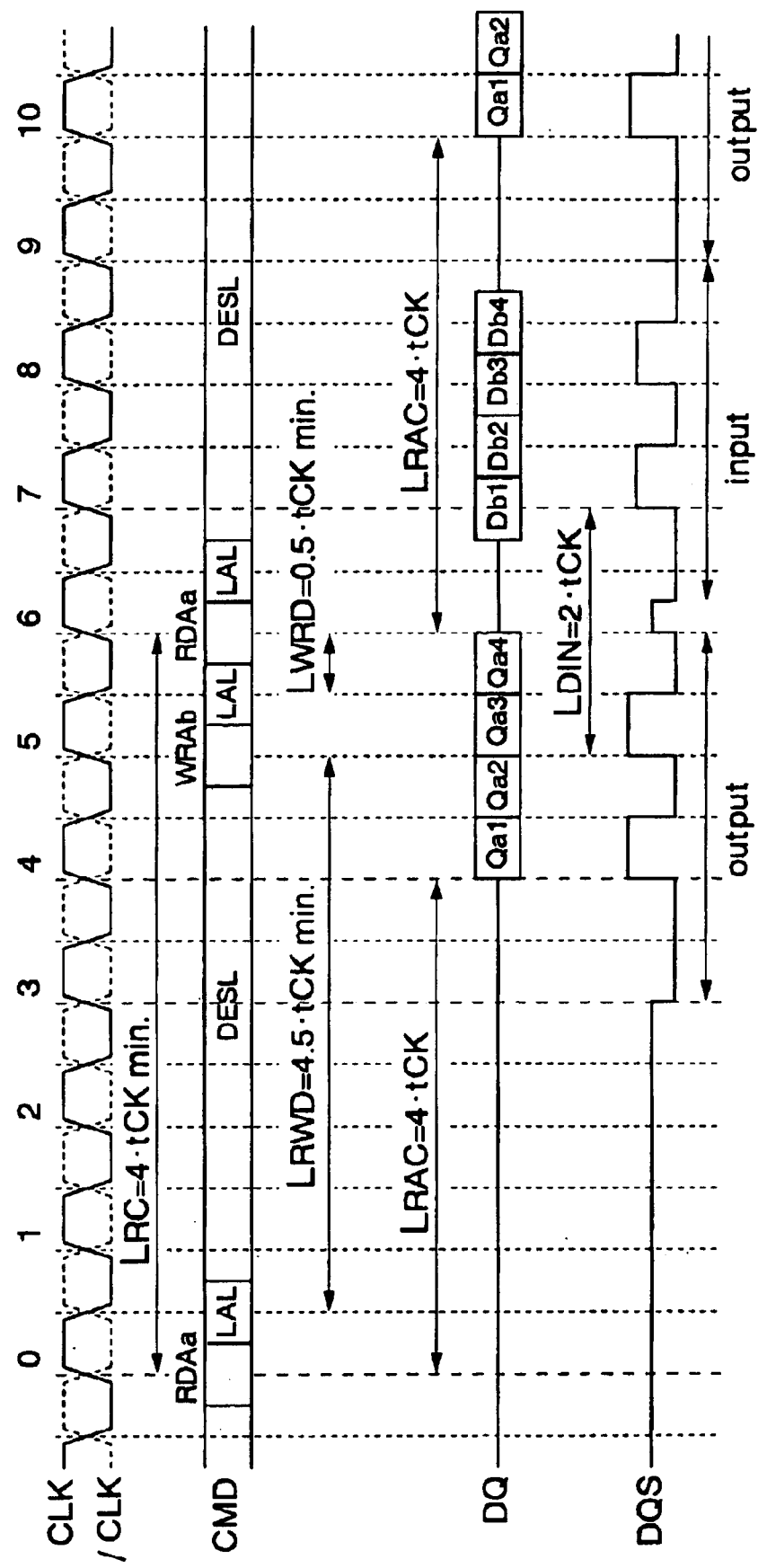
FIG. 60 is a timing chart showing an example of the read operation and write operation from/to a plurality of the banks BK (burst length="4")

FIG. 59 shows the example of the read operation and write operation from/to a plurality of the banks BK (burst length="2"). FIG. 60 shows the example of the read operation and write operation from/to a plurality of the banks BK (burst length="4").

As described above, according to this embodiment, the first control circuit 40 and the parity check circuit 64 reproduce the read data by using the data of other memory blocks (for example, BLKDQ1 to BLKDQ8) and the data of the memory block BLKP in which the parity bit of the write data is stored, instead of the memory block which is in refresh (for example, BLKDQ0). Hence, even when the read command RDA and the refresh request REFRQ conflict with each other, it is possible to output the read data without delaying the access time. As a result of this, even in reproducing the read data, it is possible to respond to the read command RDA quickly, and to output the read data at a high data transfer rate.

When the write command WRA and the refresh request REFRQ conflict with each other, the arbiter 58 of the second control circuit 50 sequentially performs the write operation or the refresh operation according to the order of the reception. Further, the external write cycle tERC which is the minimum interval between supply of the write commands WRA is set to be longer than the internal write cycle tIRC which is the actual time of the write operation on the memory blocks BLKDQ0 to BLKDQ8 and BLKP. For this reason, the refresh cycle can be inserted without fail while the write command WRA is supplied for a plurality of times, and hence it is possible to prevent the data held in the memory cells from being destroyed.

Therefore, the users using the semiconductor memory can perform the read operation and the write operation without recognizing the competition between the refresh request REFRQ which is generated inside the semiconductor memory and the read command RDA and the write command WRA which are supplied by the users. When, for example, the present invention is applied to a DRAM, a refresh controller becomes unnecessary on a system on which the DRAM is mounted. As a result of this, the users can use the DRAM in much the same way as an SRAM. Namely, by hiding the refresh operation, it is possible to provide the semiconductor memory with both of a large capacity of the DRAM and operability of the SRAM.

The memory blocks BLKDQ0 to BLKDQ8 are respectively formed corresponding to the data input/output terminals, and only one of the memory blocks is allowed to be operated concurrently in response to the refresh request REFRQ. Namely, in the read operation, all memory blocks BLKDQ0 to BLKDQ8 operate at all times to output the read data. When the refresh request is generated, the data which cannot be read due to the refresh operation is only one bit out of the read data outputted from the data input/output terminals, at all times. Hence, the data stored in the memory block performing the refresh can be reproduced without fail by using other memory blocks.

The first control circuit 40 does not perform the read operation from the memory block indicated by the refresh counter (BLKDQ0, for example), and reproduces the read data by using other memory blocks (BLKDQ1 to BLKDQ8 and BLKP, for example), even when the refresh request REFRQ is not generated. Hence, it is possible to facilitate the control of the first control circuit 40 and to simplify its circuit structure.

The memory groups are arranged in the second direction orthogonal to the first direction which is the aligning direction of the memory blocks, and the refresh operation in response to the refresh request REFRQ is performed on the memory block aligned in the second direction. Namely, the read operation and the write operation are performed for each memory group, and the refresh operation is performed for a plurality of the memory groups at the same time. Hence, it is possible to minimize the generation number of the refresh requests REFRQ which are necessary for refreshing all memory cells, and to lengthen the interval between generation of the refresh requests REFRQ.

Since the sense amplifiers SA are arranged in the disposing direction of the memory blocks in the memory groups (first direction), it is possible to share these by a plurality of the memory groups and to reduce the chip size. Similarly, since the column decoders CDEC and the main word decoders MWD are arranged in the disposing direction of the memory blocks in the memory groups (first direction), it is possible to share these by a plurality of the memory groups and to reduce the chip size.

The write command WRA is received in synchronization with the rising edge of the clock signal CLK, and the refresh request REFRQ is received in synchronization with the falling edge of the clock signal CLK. Hence, the arbiter 58 can receive the write command WRA and the refresh request REFRQ while being shifted from each other by at least half a clock or more, and easily judge the order of arrival. Namely, the arbiter 58 can be structured simply.

The command latch/decoder 12 receives the first command and second command in synchronization with the successive rising edge and falling edge of the clock signal CLK, respectively, and generates the read command signals RDAP and RLALP or the write command signals WRAP and WLALP based on the two commands. Since the commands are respectively received in synchronization with the adjacent two edges of the clock signal CLK, it is possible to shorten an interval between inputs of the commands and to shorten the access time.

The F cycle counter 54A which operates in synchronization with the rising edge of the internal clock signal ICLK and the R cycle counter 54B which operates in synchronization with the falling edge of the internal clock signal ICLK are formed inside the state control circuit 54, and the cycle counters 54A and 54B are operated alternately every time the write command or the refresh command is supplied. Since the write operation or the refresh operation is performed by using the two cycle counters 54A and 54B alternately, it is possible to facilitate the control for performing the respective operations.

The RS flip-flops 54e and 54h which sequentially hold the write command WRA and the refresh request REFRQ are formed in the state control circuit 54. Hence, even when the refresh request REFRQ is generated while the write command WRA is supplied successively for the plural times, it is possible to perform the write operation and the refresh operation without fail. Further, the write operations in response to a plurality of the write commands WRA which are supplied after the refresh operation can be also performed without fail. Since the RS flip-flops 54e and 54h hold the write command WRA after the refresh operation alternately, the delays from the supply of the write commands WRA until the starts of the write operations are reduced every time the write operation is performed.

The time LDIN from the reception of the write command WRA by the command latch/decoder 12 until the start of the reception of the write data is changed according to the burst length. Hence, it is possible to improve efficiency of data bus utilization, and to improve the data transfer rate.

When the different banks BK are sequentially operated, the minimum intervals LRBD, LRWD and RWRD between supply of the read commands RDA and the write commands WRA are changed according to the burst length. Since the specifications of supplying the commands are set according to internal operation of the semiconductor memory, it is possible to simply structure the control circuit for controlling the internal operation.

When the burst length BL is set to "2", the data switching circuit 72 of each of the banks BK transmits the read data read from the memory blocks BLKDQ0 to BLKDQ8 and BLKP to the parallel/serial conversion circuit 66, by using the two read data bus lines out of the four read data bus lines alternately. Hence, it is possible to ease data transmission cycles of the read data bus lines. As a result of this, the operation with a high clock frequency is made possible.

Similarly, when the burst length BL is set to "2", the serial/parallel conversion circuit 34 outputs the write data which are converted to parallel to the two write data bus lines out of the four write data bus lines alternately. Hence, it is possible to ease the data transmission cycles of the write data bus lines. As a result of this, the operation with the high clock frequency is made possible.

By the variable write length bit VW, it is possible to mask the write data by each write data which is inputted in synchronization with each edge of the data strobe signal DQS. Since the mask can be set by the write data supplied simultaneously, the reproducing operation of the read data can be realized by the simple control circuit.

The lower bit of the refresh counter 24 is made to correspond to the bank address BA (refresh bank number REFBNK#) for selecting the bank BK so that the refresh operation is performed for each bank BK. Hence, the refresh control circuits to be operated at the same time are reduced, and a peak current during the refresh operation can be reduced. Further, since a plurality of the banks BK are refreshed alternately, it is possible to shorten the interval between generation of the refresh requests, as compared with the case where the same bank BK is successively refreshed. Therefore, even when the operating frequency is low, it is possible to sufficiently satisfy the period which is necessary for refreshing all memory cells. In other words, it is possible to set the lower limit of an operating frequency to become lower.

Figure 61:
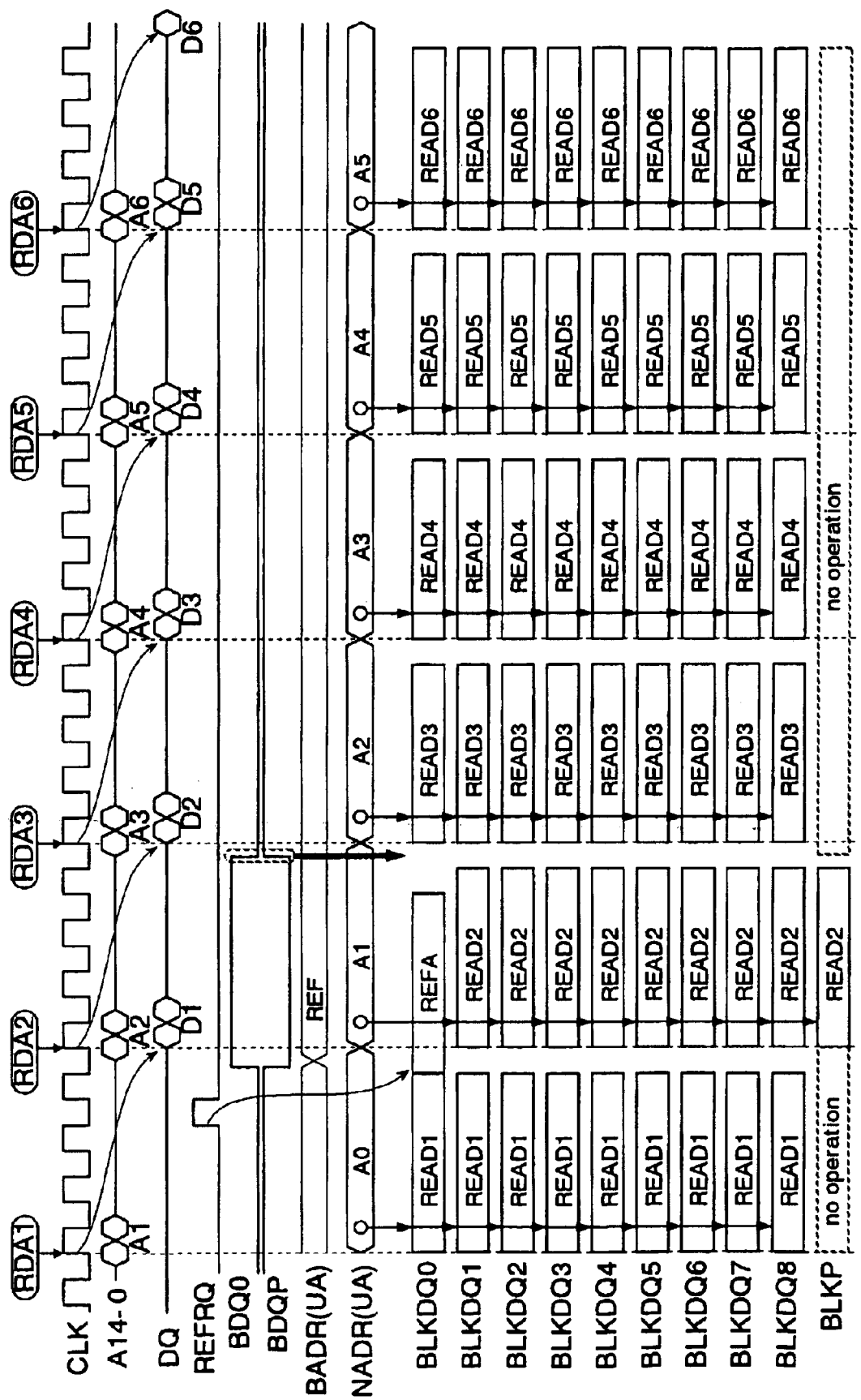
FIG. 61 is a timing chart showing read operation according to a second embodiment.

FIG. 61 shows a second embodiment of the semiconductor memory according to the present invention. The same numerals and symbols are given to the same elements as those of the first embodiment, and detailed explanations thereof are omitted.

According to this embodiment, read data of a memory block BLKDQ which performs refresh operation is generated by using a memory block BLKP, only when the refresh operation is performed, that is, only when the refresh operation and read operation conflict with each other. In other words, when a refresh request REFRQ is not generated, the data are directly read from memory blocks BLKDQ0 to BLKDQ8. In order to realize the operation like this, the busy register 60 of the first embodiment (FIG. 13) may be changed to a circuit for switching between busy signals BDQ0 to BDQ8 according to the refresh request signal REFRQ. The rest of the structure is the same as that of the first embodiment. The same effects as those of the above-described first embodiment can be obtained in this embodiment as well.

Figure 62:
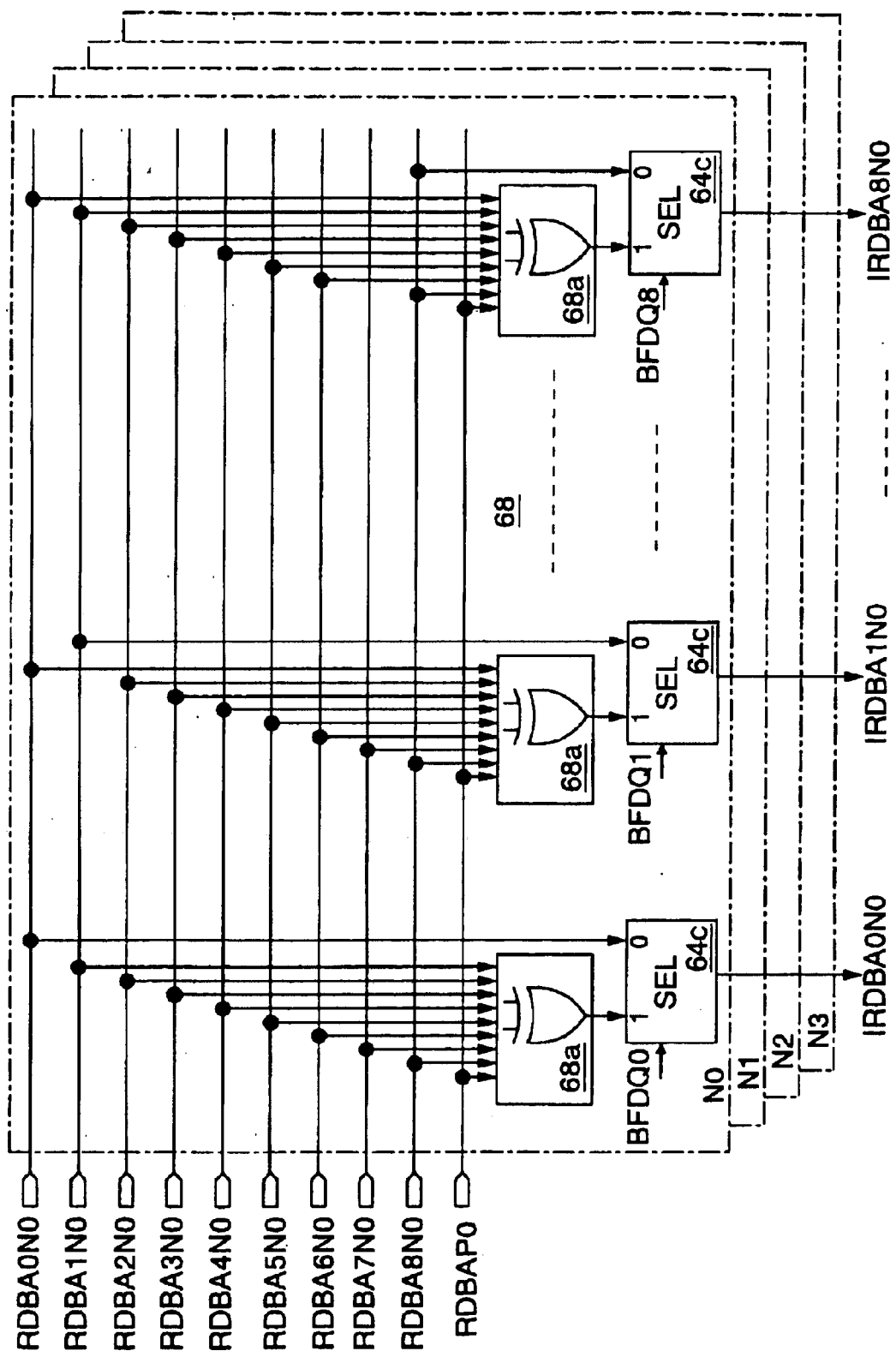
FIG. 62 is a circuit diagram showing the details of a parity check circuit according to a third embodiment.

FIG. 62 shows a third embodiment of the semiconductor memory according to the present invention. The same numerals and symbols are given to the same elements as those of the first embodiment, and detailed explanations thereof are omitted.

According to this embodiment, a parity check circuit 68 is formed instead of the parity check circuit 64 of the first embodiment (FIG. 33). The rest of the structure is the same as that of the first embodiment.

The parity check circuit 68 includes EOR circuits 68a which operate an exclusive or of 9-bit read data except for a data bus line RDB corresponding to a data input/output terminal DQ, and selectors 64c. Each selector 64c connects an output of the EOR circuit 68a to an internal data bus line IRDB when a busy signal BDQ is activated, and connects a data bus line RDB to the internal data bus line IRDB when the busy signal BDQ is inactivated.

In the parity check circuit 68, since a memory block BLKDQ corresponding to the activated busy signal BDQ has a possibility of performing refresh operation, the read data is generated by using a memory block BLKP (parity bit). Since memory blocks BLKDQ corresponding to the inactivated busy signals BDQ do not operate the refresh operation, the data are directly read. According to this embodiment, the same effects as those of the above-described first embodiment can be obtained as well.

Figure 63:
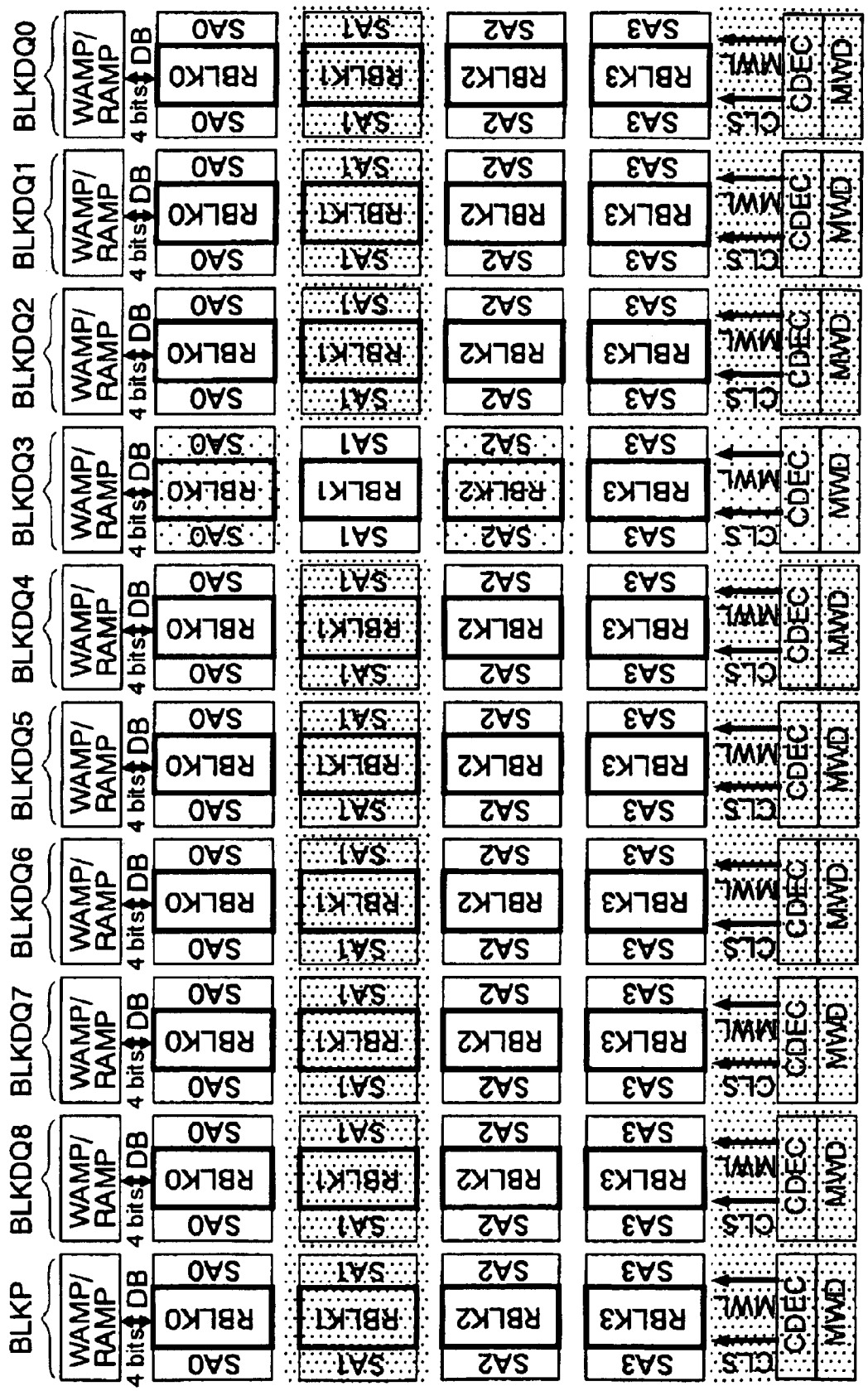
FIG. 63 is a block diagram showing the details of a memory block according to a fourth embodiment.
Figure 64:
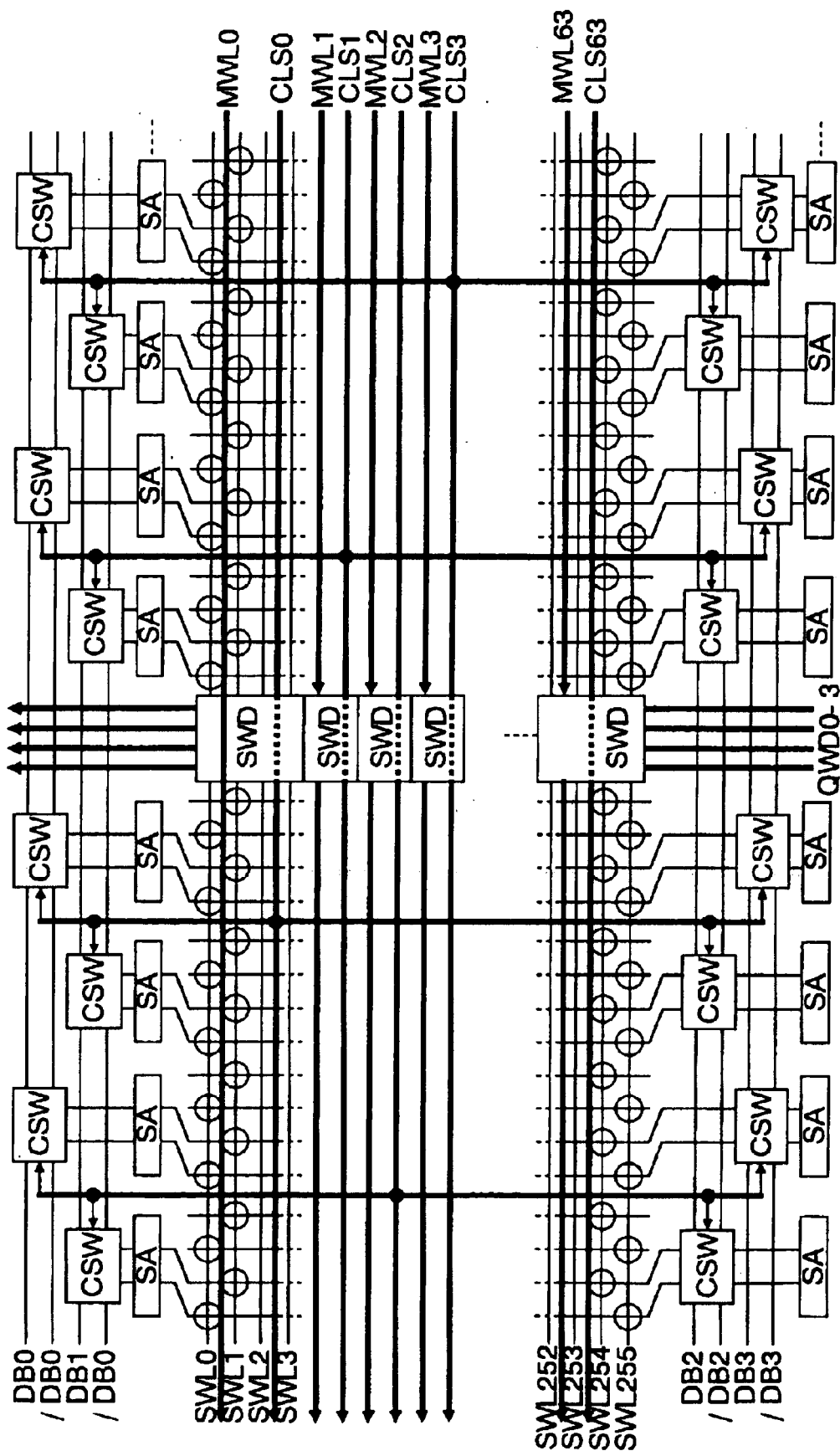
FIG. 64 is a block diagram showing the details of a row block according to the fourth embodiment.

FIG. 63 and FIG. 64 show a fourth embodiment of the semiconductor memory according to the present invention. The same numerals and symbols are given to the same elements as those of the first embodiment, and detailed explanations thereof are omitted.

According to this embodiment, a layout of a memory core is different from that of the first embodiment. The rest of the structure is the same as that of the first embodiment. Row blocks RBLK0 to RBLK3 and sense amplifiers SA0 to SA3 in respective memory blocks BLKDQ0 to BLKDQ8 and BLKP are arranged while being rotated by 90 degrees as compared with those of the first embodiment. Further, the sense amplifiers SA0 to SA3 are arranged on the borders between the memory blocks BLKDQ0 to BLKDQ8 and BLKP, and hence these are not shared.

Column decoders CDEC and main word decoders MWD are arranged in a horizontal direction in the drawing (first direction), similarly to the first embodiment. Areas which are activated during read operation and write operation (dark meshed areas in the drawing) and areas which are activated in refresh operation and the write operation (light meshed areas in the drawing) are the same as those of the first embodiment.

FIG. 64 shows the details of the row block RBLK shown in FIG. 63. FIG. 64 shows a state in which FIG. 63 is rotated by 90 degrees. Namely, a horizontal direction in the drawing is the second direction and a longitudinal direction in the drawing is the first direction. Column selecting switches CSW and the sense amplifiers SA are arranged in the second direction.

According to this embodiment, wiring directions of main word lines MWL and column selecting lines CLS are different from those of the first embodiment. Namely, the main word lines MWL and the column selecting lines CLS are wired in the second direction which is the disposing direction of the sense amplifiers SA.

Since the main word lines MWL are aligned in the disposing direction of sub word decoders SWD, these are directly connected to the sub word decoders SWD by using only a second wiring layer. The wiring direction of the column selecting lines CLS is the same as the disposing direction of the column selecting switches CSW. Hence, the column selecting lines CLS are wired along the main word lines MWL by using the second wiring layer, and thereafter connected to a first wiring layer via through holes on memory cells, and connected to the column selecting switches CSW. The rest of the structure is the same as that of the first embodiment (FIG. 16). The same effects as those of the above-described first embodiment can be obtained in this embodiment as well.

Figure 65:
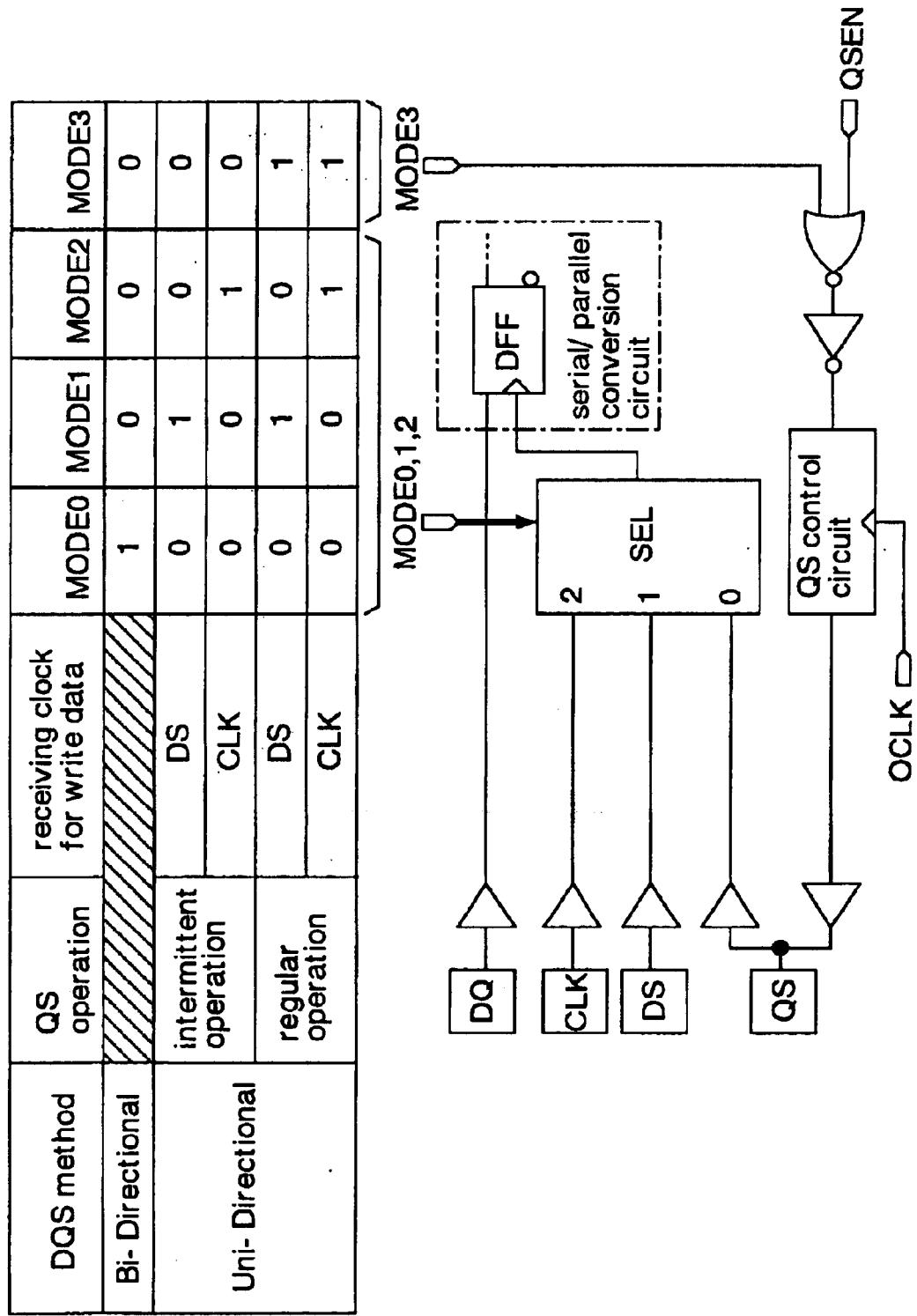
FIG. 65 is an explanatory view showing the outline of a fifth embodiment.

FIG. 65 shows a fifth embodiment of the semiconductor memory according to the present invention. According to this embodiment, it is possible to select a synchronizing signal for inputting/outputting data according to a set value of a mode register. When a MODE0 bit of the mode register is "1", a DQS method is set to "Bi-Directional". At this time, a selector SEL selects a QS terminal, and write data is accepted in synchronization with a data strobe signal QS inputted from the QS terminal. Further, the read data is outputted in synchronization with the data strobe signal QS outputted from the QS terminal. The data strobe signal QS is an output enable signal QSEN being synchronized with an output clock signal OCLK whose phase is adjusted by a not-shown DLL circuit. Namely, in the "Bi-Directional" mode, bi-directional signals are supplied to one data strobe terminal, similarly to the above-described first embodiment.

When the MODE0 bit of the mode register is "0", the DQS method is set to "Uni-Directional". At this time, the QS terminal is a terminal exclusively for outputting the data strobe signal for the read data. As to the data strobe signal for the write data, the clock signal CLK is used when a bit MODE2 is "1", and a data strobe signal DS supplied from a DS terminal is used when the MODE1 bit is "1". The clock signal CLK and the data strobe signal DS are selected by the selector SEL which receives the MODE1 bit and the MODE2 bit. Further, a serial/parallel conversion circuit operates according to the selected signal.

When a MODE3 bit is "1", the QS control circuit receives the high level at all times, and hence the data strobe signal QS which synchronizes to the output clock signal OCLK is outputted even when the read operation is not being performed.

The same effects as those of the first embodiment can be obtained in this embodiment as well. Further, the method of the data strobe signal (DQS method) can be changed according to a system on which the semiconductor memory is mounted. The DQS method can be easily changed by the setting of the mode register. Hence, it is possible to respond to various needs of the users.

Figure 66:
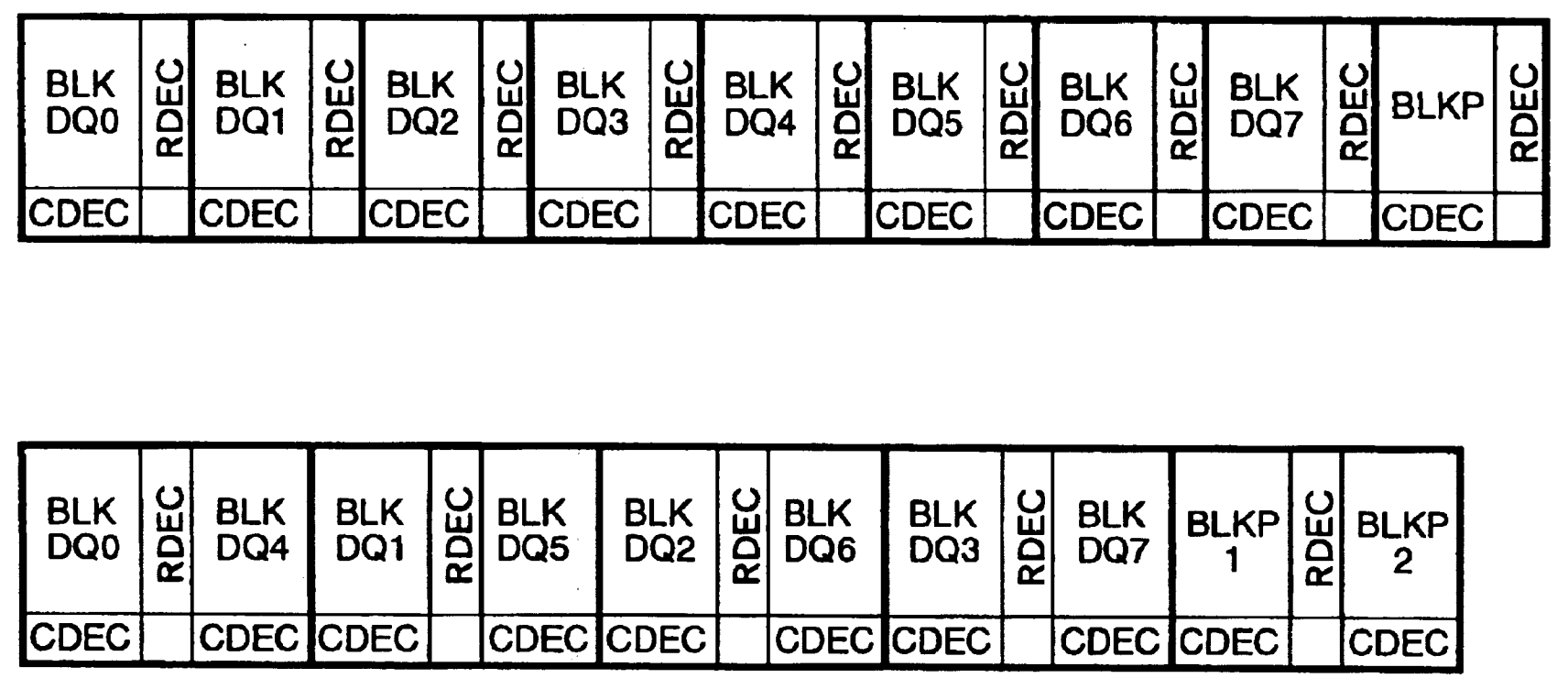

Incidentally, according to the above-described first embodiment, the example of forming the row decoder RDEC for each of the memory blocks BLKDQ0 to BLKDQ8 and the memory block BLKP for holding the parity bit of the memory blocks BLKDQ0 to BLKDQ8 like these, as shown on the upper side of FIG. 66, is explained. (In FIG. 66, eight memory blocks BLKDQ0 to BLKDQ7 are shown for comparison.)

The present invention is not limited to this embodiment. For example, when the data input/output terminals are eight bits, one row decoder RDEC may be formed for each pair of the memory blocks BLKDQ0 and BLKDQ4, BLKDQ1 and BLKDQ5, BLKDQ2 and BLKDQ6 and BLKDQ3 and BLKDQ7, and two memory blocks BLKP1 and BLKP2 which respectively hold the parity bits of the memory blocks BLKDQ0 to BLKDQ3 and BLKDQ4 to BLKDQ7 may be formed, as shown on the lower side of FIG. 66. In this case, since the row decoder RDEC can be shared by the two memory blocks, it is possible to reduce the number of the row decoders from nine to five. As a result of this, it is possible to reduce the size of the memory core.

Figure 67:
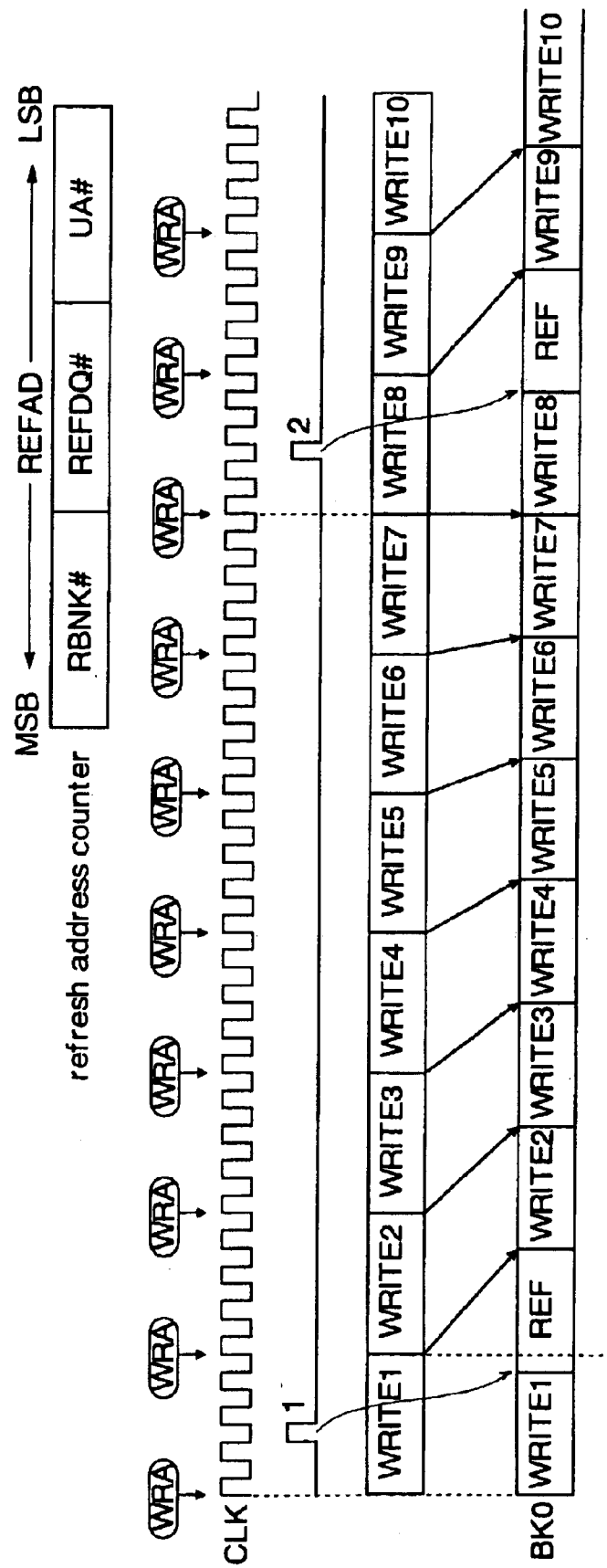
FIG. 67 is an explanatory view showing another structural example of the refresh counter.

In the above-described first embodiment, as shown in FIG. 14, the example of allocating the bits of the refresh counter 24 to the refresh bank number REFBNK#, refresh block number REFDQ# and upper address UA# in order from the lower bit is explained. The present invention is not limited to this embodiment. For example, as shown in FIG. 67, the bits of the refresh counter 24 may be allocated to the upper address UA#, refresh block number REFDQ# and refresh bank number REFBNK# in order from the lower bit. In this case, it is necessary to quadruple the interval between generation of the refresh requests REFRQ as compared with that of the first embodiment.

In the above-described first embodiment, the example of setting the external write cycle tERC as the four clock cycles is explained. The present invention is not limited to this embodiment. The external write cycle tERC may be set according to the operating frequency (clock cycle) and architecture of the internal circuit.

In the above-described first embodiment, the example of applying the present invention to the semiconductor memory of the DDR type is explained. The present invention is not limited to this embodiment. For example, the present invention may be applied to a semiconductor memory of an SDR (Single Data Rate) type having an interface synchronizing with the rising edge of the clock signal.

In the above-described first embodiment, the example of applying the present invention to the semiconductor memory having a plurality of the banks BK0 to BK3 is explained. The present invention is not limited to this embodiment. For example, the present invention may be applied to a semiconductor memory in which banks are not formed.

In the above-described first embodiment, the example of applying the present invention to the semiconductor memory having a plurality of the data groups BYTEA to BYTED is explained. The present invention is not limited to this embodiment. For example, the present invention may be applied to the semiconductor memory having eight-bit data input/output terminals.

Figure 68:
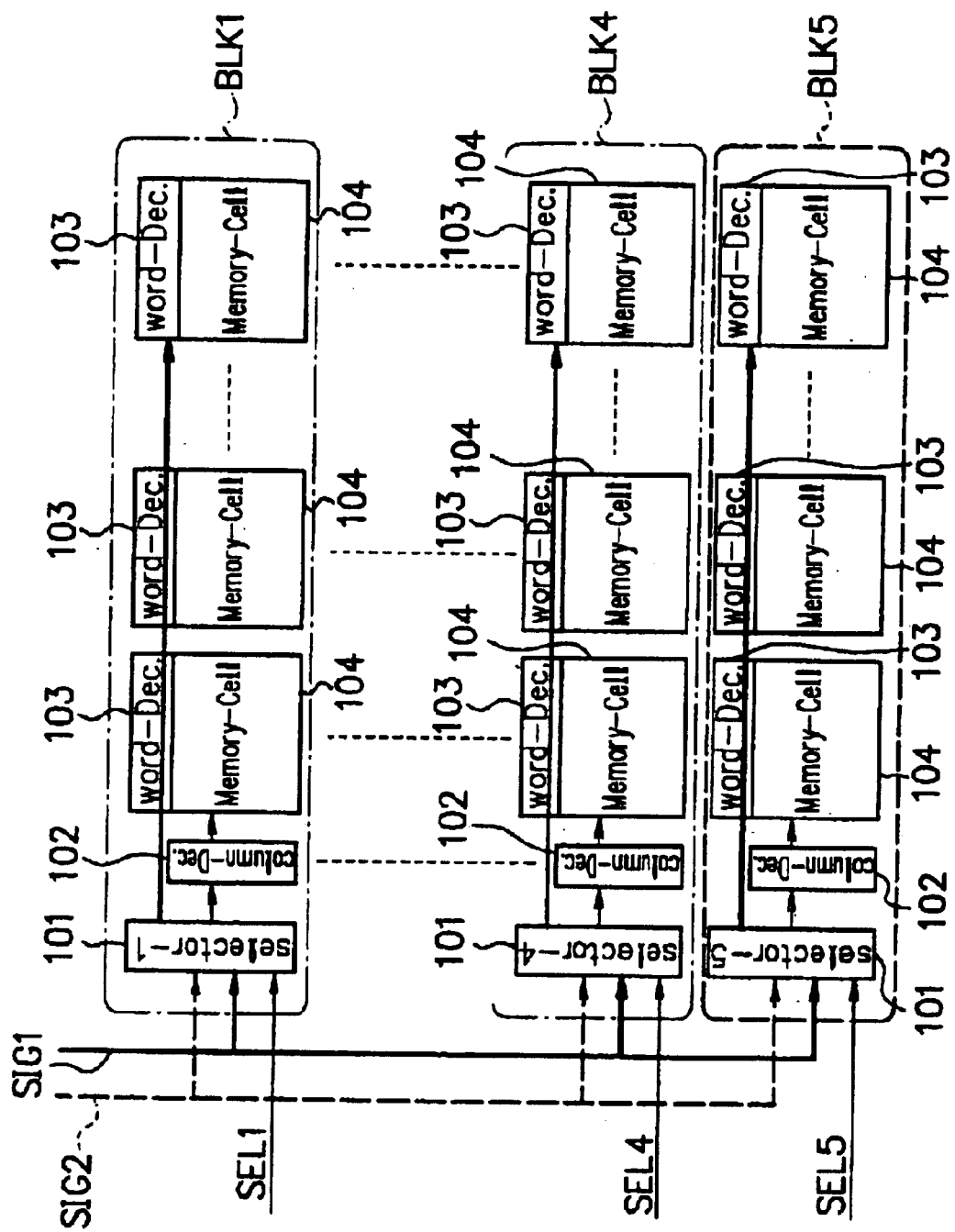
FIG. 68 is a schematic view of a memory core of a sixth embodiment.

FIG. 68 shows a schematic view of a memory core according to a sixth embodiment of the semiconductor memory of the present invention.

A plurality of bit data at the same address is distributed and stored in a plurality of memory blocks (first memory blocks) BLK1 to BLK4 (hereinafter referred to as blocks BLK1 to BLK4) of the memory core. For example, sixteen bits can be stored at the same address and four bits can be stored in each of the four blocks BLK1 to BLK4. The blocks BLK1 to BLK4 are memory cell arrays for storing external data. Each of the blocks BLK1 to BLK4 includes memory cells 104, word decoders 103, a column decoder 102, and a selector 101 for an input signal. Each of the blocks BLK1 to BLK4 can be further divided into a plurality of pairs of the word decoder 103 and the memory cell 104.

A memory block (second memory block) BLK5 is a memory cell array for storing an operational result of a plurality of the bit data having the same address. The details of an operational method will be explained later with reference to FIGS. 69(A) to (C). Similarly to the blocks BLK1 to BLK4, the block BLK5 also includes memory cells 104, word decoders 103, a column decoder 102, and a selector 101 for an input signal.

There are two groups of control signals, first control signals SIG1 and second control signals SIG2, which are respectively inputted to the selectors 101 of the blocks BLK1 to BLK5. Selecting signals SEL1 to SEL5 are inputted to the respective selectors 101. When each of the selecting signals SEL1 to SEL5 is at a low level, an output of the selector 101 becomes the first control signals SIG 1, and when each of the selecting signals SEL1 to SEL5 is at a high level, an output of the selector 101 becomes the second control signals SIG2. The selecting signals SEL1 to SEL5 are signals independent of one another.

Each of the control signals SIG1 and SIG2 includes a write request signal, a read request signal, an address, data, and the like. For example, the write request signal and the read request signal are expressed as a chip enable signal and a write enable signal.

The word decoder 103 identifies a row address according to an address supplied from the selector 101. The column decoder 102 identifies a column address according to an address supplied from the selector 101. The memory cell 104 can write/read data to/from the identified row address and the column address.

Under normal conditions, the second control signals SIG2 are inactivated, and only the first control signals SIG1 control the memory core. In normal read operation, the selecting signals SEL1 to SEL4 and the selecting signal SEL5 are at low level and high level, respectively, and the block BLK5 is inactivated. In normal write operation, all of the selecting signals SEL1 to SEL5 are at low level, and the write operation is performed on all of the blocks BLK1 to BLK5.

In performing refresh operation, each of the blocks BLK1 to BLK5 is refreshed in turn on a block basis, and only the selecting signal corresponding to the refreshed block goes to high level. The refresh operation is performed according to the second control signals SIG2, and the refresh operation is performed only on the block whose selecting signal is at the high level.

Moreover, when a write signal other than the refresh is supplied to the second control signals SIG2 which are asynchronous with the first control signals SIG1, only the block whose selecting signal is at the high level operates according to the second control signals SIG2, and the other blocks operate according to the first control signals.

According to this embodiment, there are a plurality of groups of control signals for activating and controlling the respective blocks. The selector 101 can select the group of the control signals for each block. Further, it is possible to activate the plurality of blocks by the control signals supplied at the same timing or different timings, and to control the respective blocks so that activation timings and/or activation times are different from one another.

FIG. 69(A) shows a write parity operational sequence in data write.

The example of writing one-bit data DQ01 to DQ04 respectively to the blocks BLK1 to BLK4 will be explained. The write data DQ01 to DQ04 inputted from the exterior is written into the blocks BLK1 to BLK4, respectively.

The data DQ01 and DQ02 are inputted to an exclusive-or circuit 201 to operate exclusive or and output the resultant. The data DQ03 and DQ04 are inputted to an exclusive-or circuit 202 to operate exclusive or and output the resultant. An output of the exclusive-or circuit 201 and an output of the exclusive-or circuit 202 are inputted to an exclusive-or circuit 203 to operate exclusive or and output the resultant. An output of the exclusive-or circuit 203 is written into the block BLK5. The exclusive-or circuits 201, 202 and 203 operate as a first operational circuit.

FIG. 69(B) shows a circuit diagram of each of the exclusive-or circuits 201 to 203. A first input signal IN1 is inputted to a logical NOT circuit (inverter) 211. An input of an inverter 212 is connected to an output of the inverter 211. A second input signal IN2 is inputted to an inverter 215. A gate of a p-channel MOS transistor 213 is connected to an output of the inverter 212, a source thereof is connected to a line of the second input signal IN2, and a drain thereof is connected to a line of an output signal OUT. A gate of an n-channel MOS transistor 214 is connected to the output of the inverter 211, a drain thereof is connected to the line of the second input signal IN2, and a source thereof is connected to the line of the output signal OUT. A gate of a p-channel MOS transistor 216 is connected to the output of the inverter 211, a source thereof is connected to an output of the inverter 215, and a drain thereof is connected to the line of the output signal OUT. A gate of an n-channel MOS transistor 217 is connected to the output of the inverter 212, a drain thereof is connected to the output of the inverter 215, and a source thereof is connected to the line of the output signal OUT.

FIG. 69(C) shows a truth-value table of the exclusive-or circuit shown in FIG. 69(B). The output signal OUT is "0" and "1" when the input signals IN1 and IN2 are the same with each other and different from each other, respectively.

As shown in FIG. 69(A), the two-input exclusive-or circuits 201 to 203, which consist of two stages, output an operational result of one bit based on the input data DQ01 to DQ04 of four bits. In this case, "1" is outputted when the number of data "1" in the four-bit input data DQ01 to DQ04 is odd, and "0" is outputted when it is even. Hereinafter, this operational result is referred to as write parity.

The data DQ01 to DQ04 are, for example, "0", "1", "0" and "0". In this case, the exclusive-or circuits 201 to 203 output "1", "0" and "1", respectively. "1" as the output of the exclusive-or circuit 203 is written into the block BLK5 as the write parity.

Figure 70A:
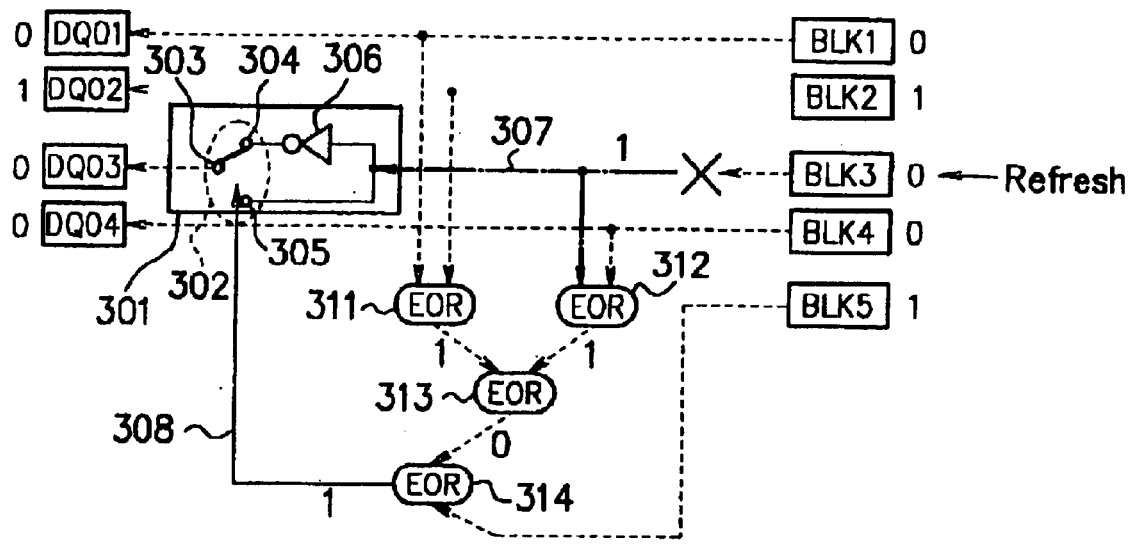
FIGS. 70(A) and (B) are views of a data correction sequence.

FIG. 70(A) shows a data correction sequence in reading the data.

The example of reading one-bit data DQ01 to DQ04 from the blocks BLK1 to BLK4, respectively, and correcting these will be explained. Two inputs of an exclusive-or circuit 311 are connected to a data line (bit line) of the block BLK1 and a data line of the block BLK2. Two inputs of an exclusive-or circuit 312 are connected to a data line of the block BLK3 and a data line of the block BLK4. Two inputs of an exclusive-or circuit 313 are connected to an output of the exclusive-or circuit 311 and an output of the exclusive-or circuit 312. Two inputs of an exclusive-or circuit 314 are connected to an output of the exclusive-or circuit 313 and a data line of the block BLK5. Hereinafter, the output from the exclusive-or circuit 313 is referred to as read parity. The exclusive-or circuit 314 compares the read parity and the write parity. Both of the read parity and the write parity are determined by similar operations by using the exclusive-or circuits. The exclusive-or circuits 311, 312, and 313 operate as a second operational circuit, and the exclusive-or circuit 314 operates as a comparator.

A data correction circuit 301 will be explained. A data line 307 of the block BLK3 is connected to an input of an inverter 306. A three-node switch 302 includes a common terminal 303, a first terminal 305 and a second terminal 304. The first terminal 305 is connected to the data line 307 of the block BLK3. The second terminal 304 is connected to an output of the inverter 306. The inverter 306 is the inverting circuit which inverts the logic of the input data. The common terminal 303 outputs the one-bit data DQ03. The switch 302 connects the common terminal 303 to either the first terminal 305 or the second terminal 304 according to an output signal 308 of the exclusive-or circuit 314.

When, for example, the block BLK3 is in refresh, the read operation is performed on the blocks BLK1, BLK2, BLK4 and BLK5. In this case, the read data is not outputted from the block BLK3, and the data line 307 holds the level of the previous access. Therefore, only one bit at a single address is uncertain. Hence, the write parity at the same address, which is previously written into the block BLK5 in the write operation, is read at the same time. The exclusive-or circuit 314 compares the read parity and the write parity. When the read parity and the write parity are consistent with each other, the data on the data line 307 is outputted as the data DQ03 to the external. When these are inconsistent with each other, one bit of the data of the blocks BLK1 to BLK4 is lacking (uncertain). The bit should be the bit of the block BLK3 which is in refresh operation. Hence, the bit data on the data line 307 of the block BLK3 is inverted by the data correction circuit 301, subjected to data correction, and outputted to the external as the data DQ03. The other data DQ01, DQ02, and DQ04 are data read from the blocks BLK1, BLK2, and BLK4.

Suppose that "0", "1", "0" and "0", for example, are written into the blocks BLK1 to BLK4, respectively. Since the number of "1" in the data is odd, "1" is written into the block BLK5 as the write parity. Suppose that the data line 307 of the block BLK3 keeps uncertain data "1". In this case, since the number of the data "1" of the four data lines is odd, the exclusive-or circuit 313 outputs "0" as the read parity. Since the read parity and the write parity are different from each other, the exclusive-or circuit 314 outputs "1" as the output signal 308. Thereby, the switch 302 connects the common terminal 303 and the second terminal 304. As a result of this, the logic of the data "1" of the data line 307 is inverted by the inverter 306, and the data "0" is outputted as the data DQ03.

As described above, although the block BLK3 is in refresh and the data cannot be read from the block BLK3, the correct data DQ01 to DQ04 can be outputted by reading the write parity from the block BLK5 and correcting the data DQ03 of the block BLK3 as necessary. Thereby, even when the block BLK3 is in refresh, the read data can be quickly outputted to the external, without waiting for the read operation.

It should be noted that, when the block BLK5 into which the write parity is written is in refresh operation, the data correction circuit 301 does not perform the data correction. The data DQ01 to DQ04 become data read from the blocks BLK1 to BLK4.

Figure 70B:
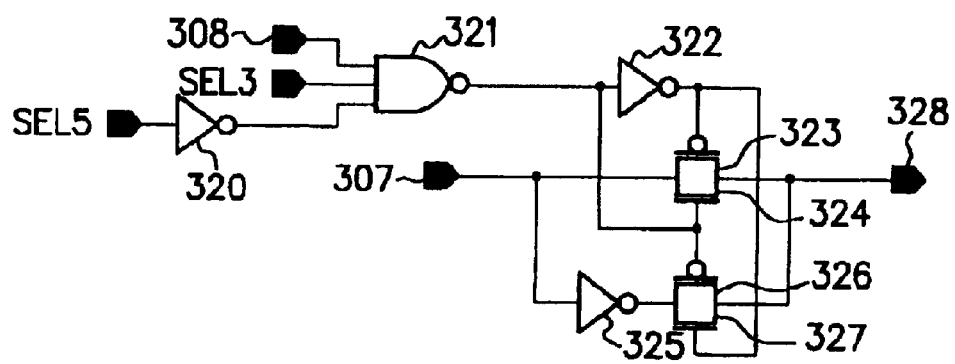

FIG. 70(B) is a circuit diagram showing a structure of the data correction circuit 301. An inverter 320 outputs a logic-inverted signal of the selecting signal SEL5. The signal 308, the selecting signal SEL3 and an output of the inverter 320 are inputted to a NAND circuit 321, from which a NAND is outputted. An inverter 322 outputs a logic-inverted signal of the NAND circuit 321. An input of an inverter 325 is connected to the data line 307. A gate of a p-channel MOS transistor 323 is connected to an output of the inverter 322, a source thereof is connected to the data line 307, and a drain thereof is connected to an output data line 328. A gate of an n-channel MOS transistor 324 is connected to an output of the NAND circuit 321, a drain thereof is connected to the data line 307, and a source thereof is connected to the output data line 328. A gate of a p-channel MOS transistor 326 is connected to the output of the NAND circuit 321, a source thereof is connected to an output of the inverter 325, and a drain thereof is connected to the output data line 328. A gate of an n-channel MOS transistor 327 is connected to the output of the inverter 322, a drain thereof is connected to the output of the inverter 325, and a source thereof is connected to the output data line 328. The output data line 328 outputs the data DQ03 (FIG. 70(A)).

Figure 71:
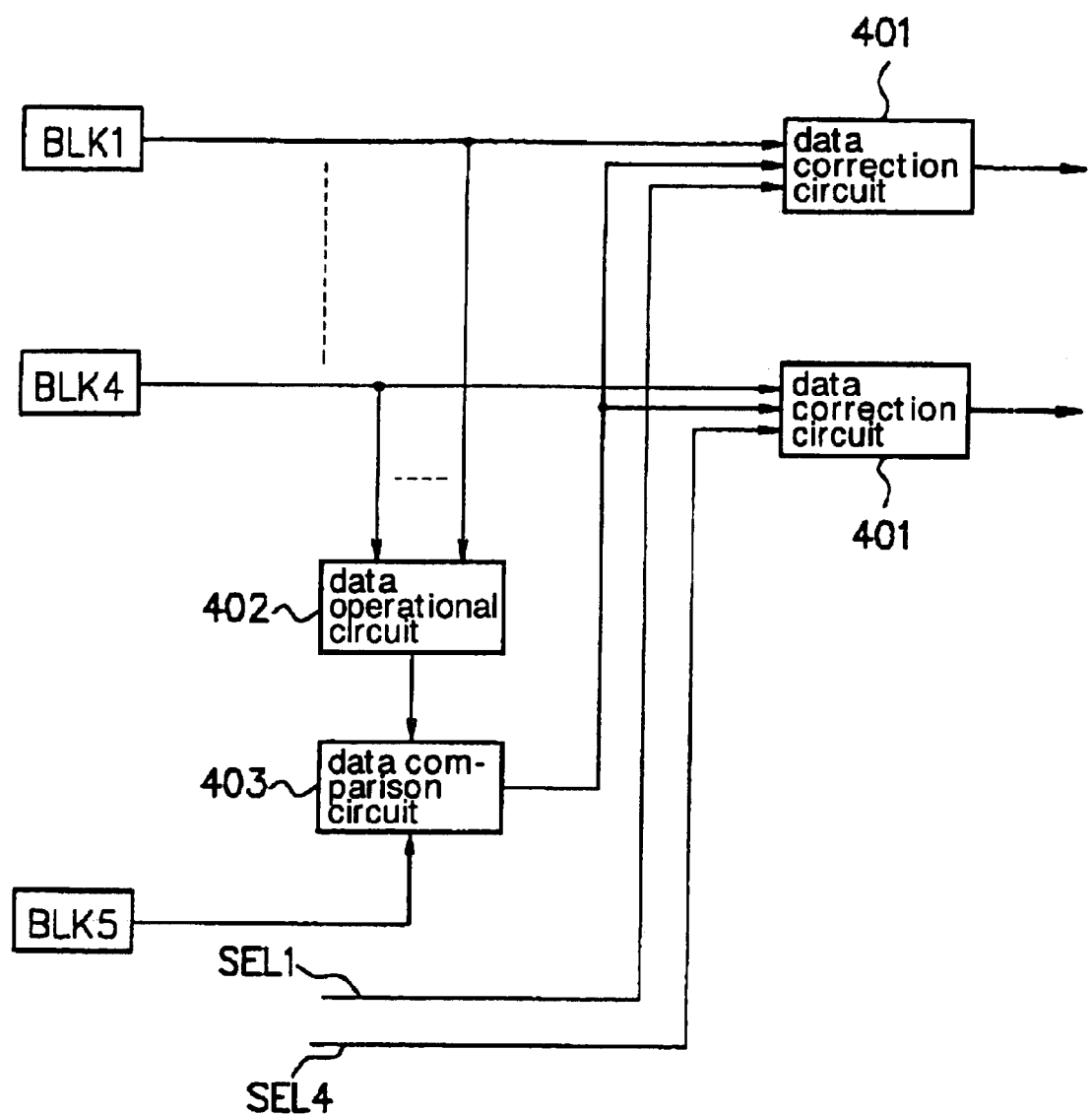
FIG. 71 is a block diagram of a control signal generator concerning an output from the memory core.

FIG. 71 is a block diagram of a control signal generator concerning the output from the memory core. This control signal generator is connected to the left of the memory core shown in FIG. 68. Data correction circuits 401 are connected to the respective blocks BLK1 to BLK4. The data correction circuit 401 corresponds to the data correction circuit 301 in FIG. 70(A). A second data operational circuit 402 corresponds to the exclusive-or circuits 311 to 313 in FIG. 70(A). A data comparison circuit 403 corresponds to the exclusive-or circuit 314 in FIG. 70(A). The data correction circuits 401 of the respective blocks BLK1 to BLK4 correct the data on the data lines of the respective blocks BLK1 to BLK4, according to the selecting signals SEL1 to SEL4. The block, out of the blocks BLK1 to BLK4, which corresponds to the selecting signal at the high level, out of the selecting signals SEL1 to SEL4, is in refresh. Therefore, when the inputted selecting signal is at the high level, the signal is subjected to the data correction of the data correction circuit 401, and when a comparison result from the data comparison circuit 403 indicates the write parity and the read parity are inconsistent with each other, the data correction circuit 401 performs the data correction and outputs the read data to the exterior.

Figure 72A:
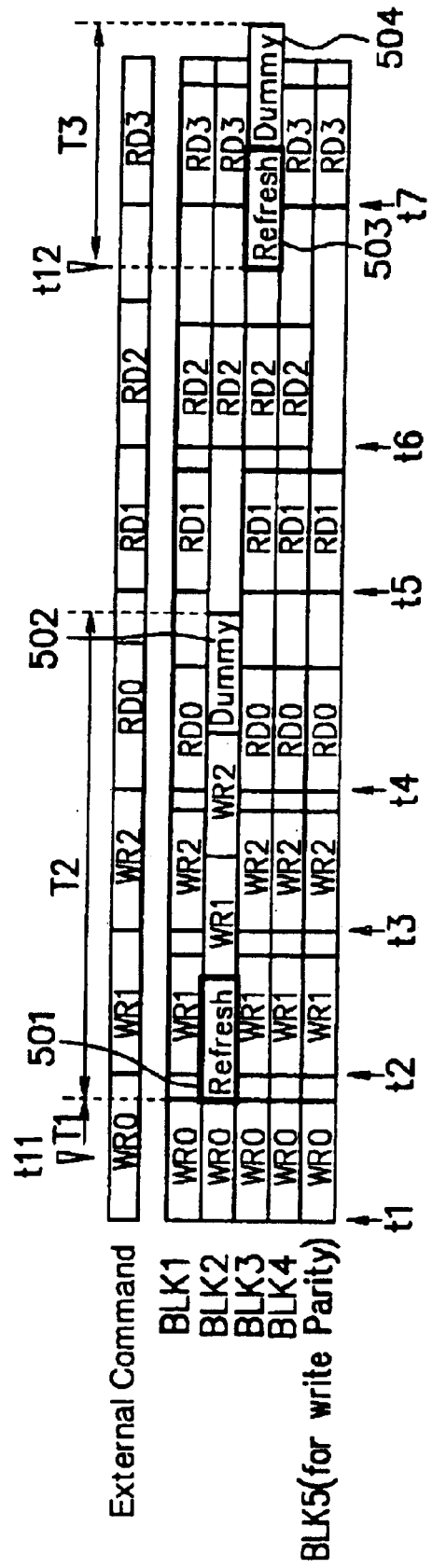
FIGS. 72(A) and (B) are schematic views showing the overall operation of the semiconductor memory.

FIG. 72(A) is a schematic view showing the operation of the semiconductor memory. The case where an external write command WR0 is inputted at a timing t1, and an internal refresh request signal is generated at a timing t11 will be explained. Since the write command WR0 comes earlier than the refresh request, the data are written into the blocks BLK1 to BLK4 according to the write command WR0. The write parity is written into the block BLK5. During a period T1 after the timing t11, the refresh request is held. This write operation is controlled by the control signals SIG1 in FIG. 68. In the block BLK2, refresh operation 501 starts when the operation of the write command WR0 ends.

Thereafter, external write commands WR1 and WR2 and an external read command RD0 are inputted at timings t2, t3 and t4, respectively. The blocks BLK1, BLK3 to BLK5 perform the operations of the external commands WR1, WR2 and RD0. After the completion of the refresh operation 501, the block BLK2 performs the operations of the external commands WR1 and WR2. Incidentally, when the read command RD0 is inputted, the block BLK2 is in operation of the write command WR2. Hence, the write parity is read from the block BLK5 and, when the write parity and the read parity are inconsistent with each other, the data on the data line of the block BLK2 is corrected. Hereinafter, the read operation using the write parity and the read parity is referred to as the pseudo read operation.

In the block BLK2, a dummy read 502 is performed after performing the operation of the write command WR2. The dummy read 502 is the dummy operation which is performed in a later-described control signal generator in FIG. 73, and the block BLK2 does not perform the read operation. The details will be explained later. During a period T2 from the above-described refresh operation 501 to the dummy read 502, only the block BLK2 is controlled by the second control signals SIG2, and other blocks are controlled by the first control signals SIG1.

Next, the case where an external read command RD1 is inputted at a timing t5 will be explained. In the block BLK2, the preceding dummy read 502 is being performed by the second control signals SIG2. In this case, when the start of the read command RD1 is detected and the second control signals 2 are switched to the first control signals SIG1 at the timing t5, a malfunction and an operation delay may occur in the block BLK2. Hence, the read operation of the block BLK2 is not performed in response to the read command RD1, but the pseudo read operation is performed. Then, the completion of the operation of the read command RD1 is detected, and the second control signals SIG2 are switched to the first control signals SIG1. Thereby, the read operation from the blocks BLK1 to BLK4 can be quickly and properly performed in response to a read command RD2 at the next timing t6. The details thereof will be explained later with reference to FIG. 76 to FIG. 77. When the read operation and the refresh operation do not conflict with each other, the block BLK5 for storing operational result is inactivated, and the read operation is performed from the other memory blocks.

Next, an internal refresh request is generated at a timing t12, and refresh operation 503 is performed by the block BLK3. The case where, during the refresh operation 503, an external read command RD3 is inputted at a timing t7 will be explained. In this case, the pseudo read operation is performed and the data on the data line of the block BLK3 is corrected as necessary. In the block BLK3, a dummy read 504 is performed after the refresh operation 503. During a period T3 from the refresh operation 503 to the dummy read 504, only the block BLK3 is controlled by the second control signals SIG2.

It should be noted that, when the write request signal to the BLK3 is inputted during the pseudo read operation, the write request signal is held and the operation corresponding to the held write request signal is performed after the completion of the pseudo read operation.

Figure 72B:
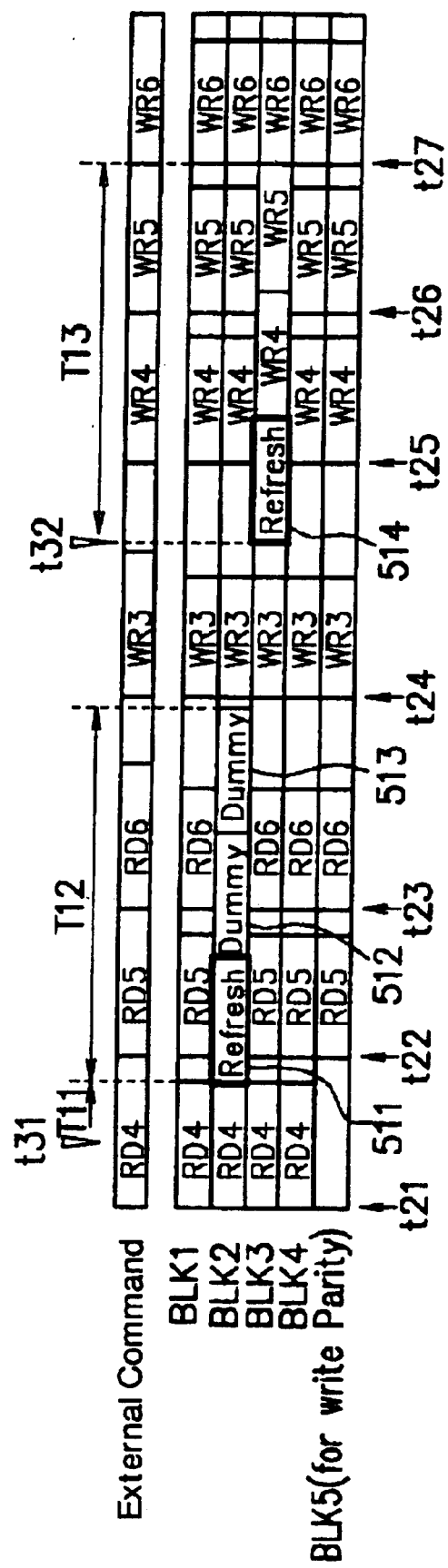

FIG. 72(B) is a schematic view showing another operation of the semiconductor memory. The case where an external read command RD4 is inputted at a timing t21 and thereafter, an internal refresh request is generated at a timing t31 will be explained. Since the read command RD4 comes earlier than the refresh request, the data are read from the blocks BLK1 to BLK4 according to the read command RD4. During a period T11 after the timing t31, the refresh request is held. In the block BLK2, refresh operation 511 starts when the operation of the read command RD4 ends.

Thereafter, external read commands RD5 and RD6 are inputted at timings t22 and t23, respectively. The blocks BLK1 and BLK3 to BLK5 perform the pseudo read operation in response to the external commands RD5 and RD6. After the completion of the refresh operation 511, the block BLK2 performs two dummy reads 512 and 513. During a period T12, only the block BLK2 is controlled by the second control signals SIG2.

Next, the case where an external write command WR3 is inputted at a timing t24 will be explained. The data are written into the blocks BLK1 to BLK4, and the write parity is written into the block BLK5.

Next, an internal refresh request is generated at a timing t32, and refresh operation 514 is performed on the block BLK3. The case where, during the refresh operation 514, an external write command WR4 is inputted at a timing t25, and thereafter, the external write commands WR5 and WR6 are inputted at timings t26 and t27 will be explained. In this case, the data are written into the blocks BLK1, BLK2 and BLK4, and the write parity is written into the block BLK5, in response to the commands WR4, WR5 and WR6. After the completion of the refresh operation 514, the write operations corresponding to the write commands WR4 to WR6 are performed in the block BLK3. Generation cycle times of the external write commands WR4 to WR6 are longer than performance cycle times of the corresponding blocks BLK1 to BLK5. Therefore, in the block BLK3, the operations of the commands WR4 and WR5 delay from the operations of the other blocks, but the operation of the command WR6 catches up with the operations of the other blocks. Even when the refresh operation 514 is performed, it is possible to write quickly without delaying from the external command. During a period T13, only the block BLK3 is controlled by the second control signals SIG2.

Figure 73:
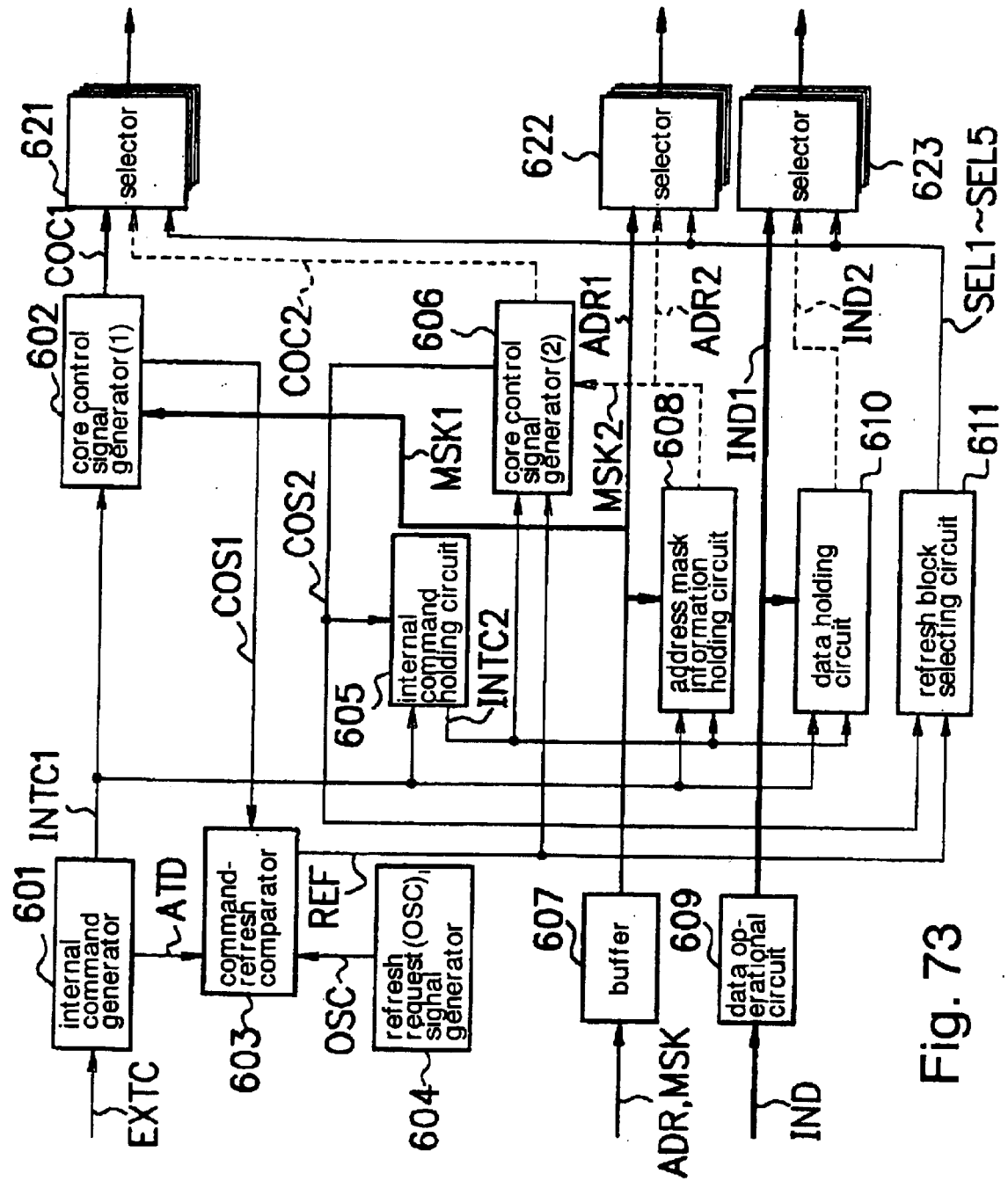
FIG. 73 is a block diagram of the control signal generator concerning an input to the memory core.

FIG. 73 is a block diagram of a control signal generator concerning the input to the memory core. This control signal generator is assumed to be an asynchronous SRAM interface, and it is connected to the left of the memory core shown in FIG. 68. An internal refresh request (OSC) signal generator 604 automatically generates the refresh requests at regular intervals by using a ring oscillator.

In the normal write operation, an external command EXTC, an address ADR, mask information MSK and write data IND are inputted from the exterior. The mask information MSK is information for instructing to write an upper byte and/or a lower byte selectively. The external command EXTC is inputted to an internal command generator 601. The internal command generator 601 generates a first internal command INTC1, and outputs it to a first core control signal generator 602. The first core control signal generator 602 generates first core control signals COC1 (which correspond to the first control signals SIG1 in FIG. 68), output these to a selector 621 (which is identical to the selector 101 in FIG. 68), and controls the memory core.

At this point, all of the selectors 621 of the respective blocks select the first core control signals COC1, as explained with reference to FIG. 68. In this case, the first core control signal generator 602 outputs a first core activation state signal COS1 while the core is activated by the first core control signals COC1. The mask information MSK has a function of disabling the write operation, and is supplied to a buffer 607 and the first core control signal generator 602 as first mask information MSK1. According to the internal command INTC1 and the mask information MSK1, the first core control signal generator 602 outputs the core control signals COC1 and the core activation state signal COS1. The address ADR is supplied through the buffer 607 to a selector 622 as a first address ADR1. The first address ADR1 corresponds to the first core control signals COC1, and designates the address in the write operation. The input data IND are inputted to a data operational circuit 609, in which the write parity (refer to FIG. 69(A)) is operated, and first input data IND1 is supplied to a selector 623. The first input data IND1 is written into the memory cells of the first address ADR1. In this case, the data operational circuit 609 operates the write parity based on the input data IND, and writes the resultant to the memory block BLK5 for operation.

The selector 621 selects the first core control signals COC1 or second core control signals COC2 according to the selecting signals SEL1 to SEL5, and outputs these to the memory core. The selector 622 selects the first address ADR1 or a second address ADR2 according to the selecting signals SEL1 to SEL5, and outputs it to the memory core. The selector 623 select the first data IND1 or second data IND2 according to the selecting signals SEL1 to SEL5, and output these to the memory core. The three selectors 621 to 623 correspond to one selector 101 in FIG. 68. There are as many groups of the three selectors 621 to 623 as the number of the blocks BLK1 to BLK5.

Next, the refresh operation will be explained. The refresh request (OSC) signal generator 604 regularly outputs a pulse of a refresh request signal OSC. The internal command generator 601 outputs a signal ATD when the external command EXTC is inputted. With a case where the refresh request signal OSC and the external command EXTC overlap each other taken into consideration, a command-refresh comparator 603 always determines which of the signal ATD and the signal OSC arrives earlier.

When it is determined that the refresh request signal OSC arrives earlier, the command-refresh comparator 603 generates a refresh request signal REF. When the refresh request signal REF is inputted, a second core control signal generator 606 outputs a second core activation state signal COS2, and outputs the second core control signals COC2 (which correspond to the second control signals SIG2 in FIG. 68) to the selector 621. Simultaneously, the refresh request signal REF is inputted to a refresh block selector 611. The refresh block selector 611 turns one of the selecting signals SEL1 to SEL5 supplied to the selectors 621, 622 and 623 to the high level. The refresh operation is performed on only one of the blocks BLK1 to BLK5 which is thus selected by the selecting signals SEL1 to SEL5. The refresh is performed, for example, on the blocks BLK1 to BLK5 in sequence. When it is determined that the refresh request signal OSC comes later than the external command EXTC, the command-refresh comparator 603 suspends the output of the refresh request signal REF until the first core activation state signal COS1 is reset.

Next, the case where the write request command EXTC is supplied from the exterior during the refresh will be explained. Similarly to the first core control signal generator 602, during the refresh operation, the second core control signal generator 606 outputs the second core activation state signal COS2. The second core activation state signal COS2 is inputted to an internal command holding circuit 605. While the second core activation state signal COS2 is outputted, the internal command holding circuit 605 holds the first internal command INTC1 which is generated during the refresh. When the refresh operation ends and the second core activation state signal COS2 is reset, the internal command holding circuit 605 outputs the held command as a second internal command INTC2.

In outputting the held internal command INTC2, there is a case where the next external command EXTC is generated and the internal command holding circuit 605 needs to hold the corresponding internal command INTC1. Since one holding circuit cannot output one command and hold another command at the same time, the two holding circuits are used. A counter counts the number of commands to be held, and selects which of the two holding circuits holds the commands. Another counter counts the number of output signals, and selects which of the two holding circuits outputs the signals.

Figure 74:
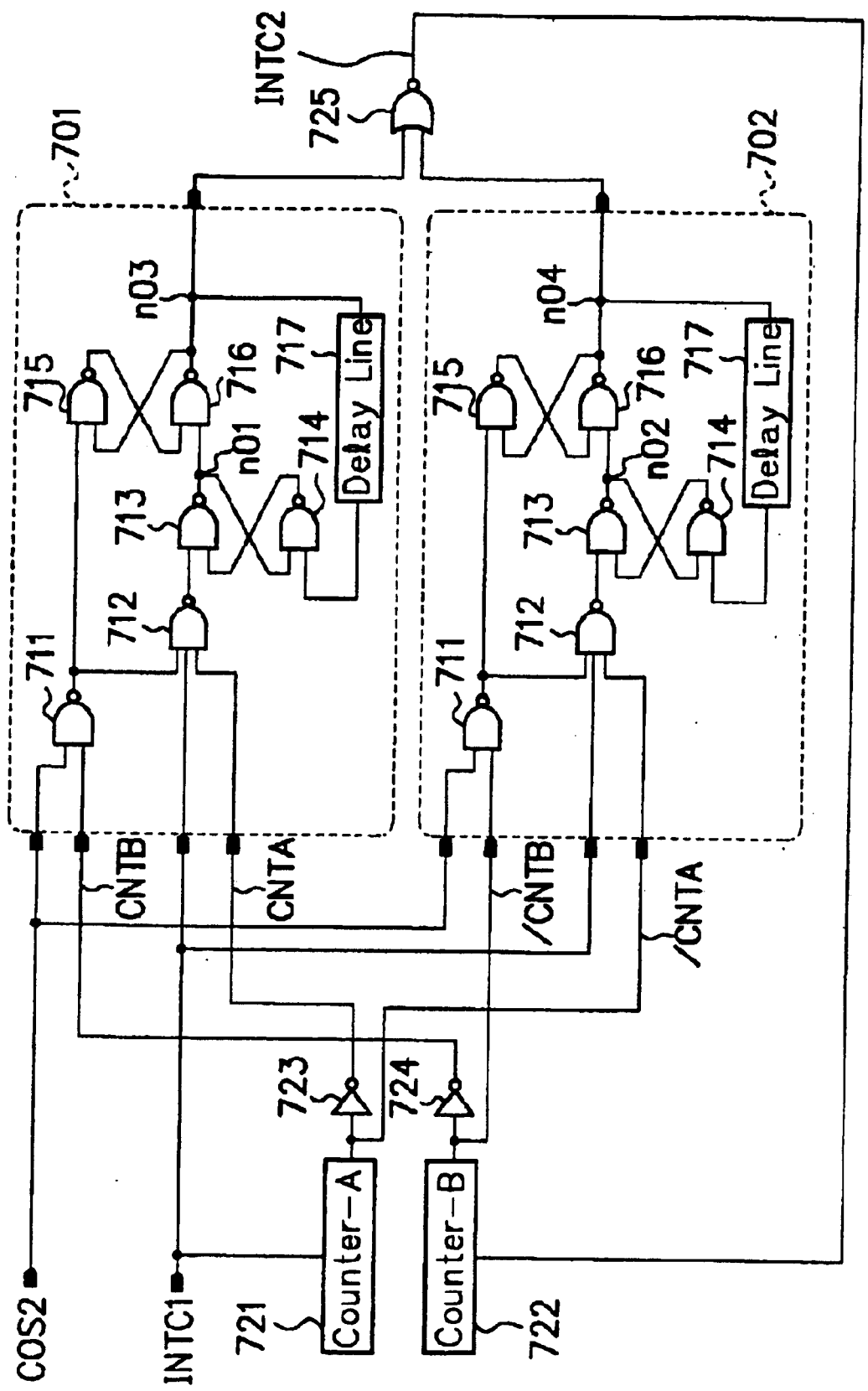
FIG. 74 is a circuit diagram of an internal command holding circuit.
Figure 75:
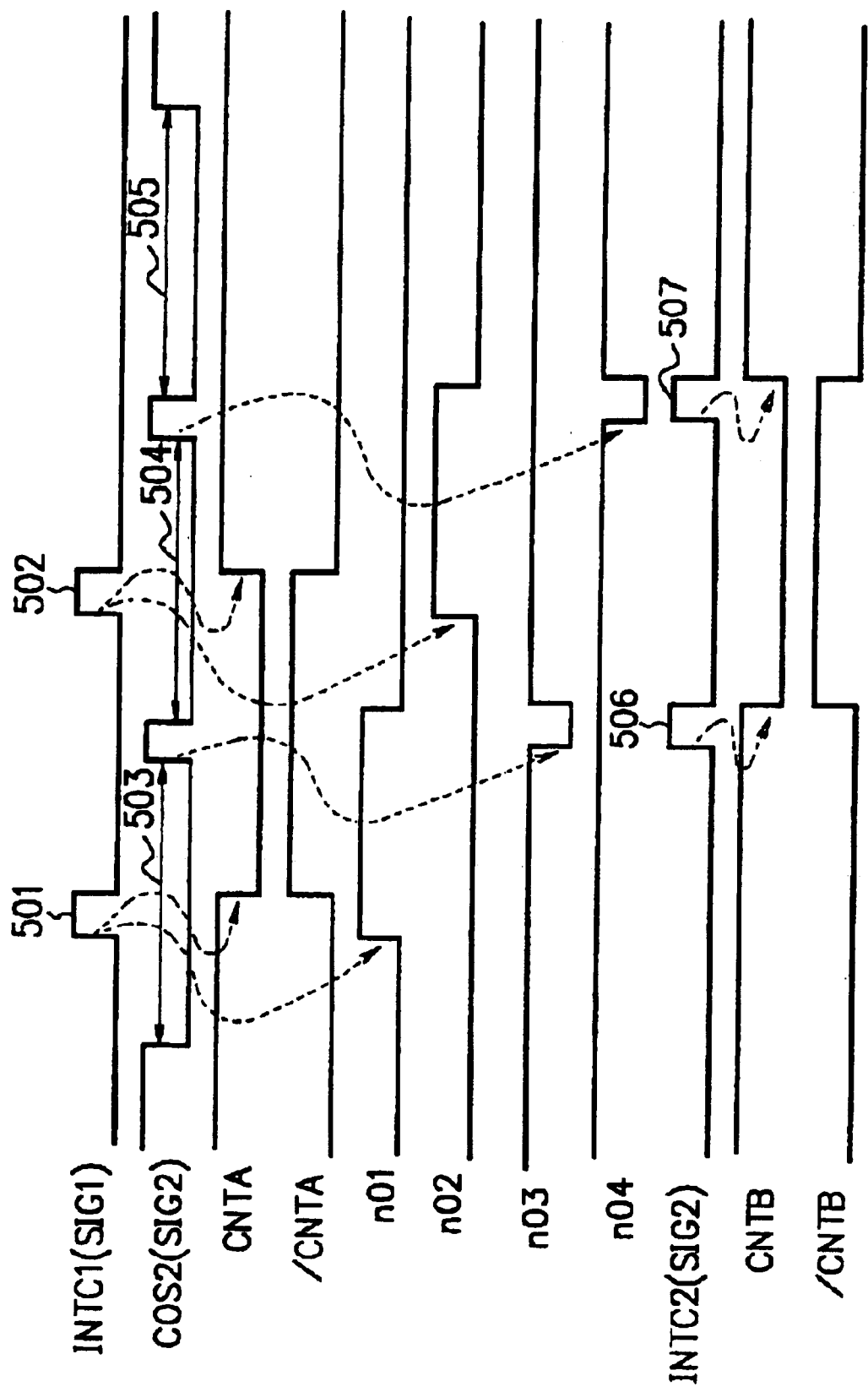
FIG. 75 is a view showing operation waveform of the internal command holding circuit.

FIG. 74 is a circuit diagram of the internal command holding circuit 605 including the two holding circuits, and FIG. 75 shows its operation waveform. The internal command holding circuit 605 includes two holding circuits 701 and 702. A counter 721 outputs a signal /CNTA whose state is inverted every time each of pulses 501 and 502 of the first internal command INTC1 is inputted. An inverter 723 outputs a signal CNTA which is obtained by logically inverting the signal /CNTA. A counter 722 outputs a signal /CNTB whose state is inverted every time each of pulses 506 and 507 of the second internal command INTC2 is inputted. An inverter 724 outputs a signal CNTB which is the signal /CNTB whose logic is inverted.

First, the holding circuit 701 will be explained. The second core activation state signal COS2 and the signal CNTB are inputted to a NAND circuit 711, from which a NAND is outputted. The first internal command INTC1, the signal CNTA and an output of the NAND circuit 711 are inputted to a NAND circuit 712, from which a NAND is outputted. An output of the NAND circuit 712 and an output of a NAND circuit 714 are inputted to a NAND circuit 713, from which a signal n01 is outputted. A delay line 717 delays a signal n03 and outputs it to the NAND circuit 714. The signal n01 and an output of the delay line 717 are inputted to the NAND circuit 714, from which a NAND is outputted. The output of the NAND circuit 711 and the output signal n03 of the NAND circuit 716 are inputted to a NAND circuit 715, from which a NAND is outputted. The signal n01 and an output of the NAND circuit 715 are inputted to the NAND circuit 716, from which the signal n03 is outputted.

Next, the holding circuit 702 will be explained. The structure of the holding circuit 702 is similar to that of the holding circuit 701. Differences between the holding circuit 702 and the holding circuit 701 will be explained. The second core activation state signal COS2 and the signal /CNTB are inputted to a NAND circuit 711. The first internal command INTC1, the signal /CNTA and an output from the NAND circuit 711 are inputted to a NAND circuit 712. An output signal of a NAND circuit 713 is n02 and an output signal of a NAND circuit 716 is n04.

The signal n03 and the signal n04 are inputted to a Nor circuit 725, from which the second internal command INTC2 is outputted. The counter 721 controls timings when the holding circuits 701 and 702 hold the command alternately. The counter 722 controls timings when the holding circuits 701 and 702 output the command alternately.

In FIG. 75, the pulses 501 and 502 of the first internal command INTC1 are both, for example, write commands. As to the second core activation state signal COS2, the refresh is performed during a period 503, the write operation corresponding to the write command 501 is performed during a period 504, and the write operation corresponding to the write command 502 is performed during a period 505.

The operation will be explained with reference to FIG. 74 and FIG. 75. The first internal command INTC1 and the second core activation state signal COS2 are inputted to the internal command holding circuit 605 of FIG. 73. The signals CNTA and /CNTA are the outputs from the counter 72l, which are counted by the first internal command INTC1. The signals n03 and n04 are the outputs from the two holding circuits 701 and 702, respectively. The second internal command INTC2 is the signals n03 and n04 being synthesized in the Nor circuit 725. The signals CNTB and /CNTB are the outputs from the counter 722, which are counted by the second internal command INTC2. The second core activation state signal COS2 is at the low level during an activated period. When the first internal command INTC1 is generated while the signal is at the low level, either the signal CNTA or the signal /CNTA turns to the high level. Either the holding circuit 701 or 702 whose level goes high holds the first internal command INTC1, and either the signal n01 or n02 turns to the high level. When the second core activation state signal COS2 turns to the high level in this state, the held command becomes the signal n03 or n04, and becomes the second internal command INTC2. The second internal command INTC2 inverts the signals CNTB and /CNTB.

Next, explanation is made with reference to FIG. 73. While the second core activation state signal COS2 is outputted, an address/mask information holding circuit 608 holds the address ADR and the mask information MSK used by the first internal command INTC1, and a data holding circuit 610 holds the input data IND. In response to the output of the second internal command INTC2, the address/mask information holding circuit 608 and the data holding circuit 610 output the information held by the address/mask information holding circuit 608 and the data holding circuit 610 as the second address ADR2, second mask information MSK2 and the second data IND2, respectively. In response to the second internal command INTC2 and second mask information MSK2, the second core control signal generator 606 outputs the second core control signals COC2 and the second core activation state signal COS2. While the second core activation state signal COS2 is outputted, the refresh block selector 611 continues to output the selecting signals SEL1 to SEL5. One of the blocks BLK1 to BLK5 which is selected by the selecting signal SEL1 to SEL5 performs the operation of the second internal command INTC2 by using the second address ADR2, second mask information MSK and second data IND2, after the refresh operation.

When the next external write command EXTC is generated during the operation of the second internal command INTC2, each information is held and the held second internal command INTC2 is performed after the completion of the operation, similarly to the above. Hence, as long as the external command EXTC is generated while the second core activation state signal COS2 is outputted, each of the blocks BLK1 to BLK5 which is selected by the selecting signals SEL1 to SEL5 keeps on performing the second internal command INTC2 asynchronously with the first internal command INTC1. When performance cycle of the second internal command INTC2 is shorter than generation cycle of the external command EXTC, the performance of the second internal command INTC2 will end sooner or later (refer to FIG. 72(B)).

The read operation will be explained. The operation until the control signals are inputted to the memory core is almost the same as that of the write operation. The difference is in that, the signals corresponding to the second core control signals COC2 in the write operation are not outputted except during the refresh operation. In this case, the second core control signal generator 606 is operating. The state here is called dummy read (refer to FIGS. 72(A) and (B)). Further, during a period when the second core activation state signal COS2 is not outputted, the refresh block selector 611 places the selecting signal SEL5, which corresponds to the block for writing operational result BLK5, into a non-selection state.

Next, the operation of FIG. 72(A) will be explained. In the block BLK2, the write operation by the second core control signals COC2 is performed after the refresh operation 501. Supposing that the signals for controlling the block BLK2 are changed from the second core control signals COC2 to the first core control signals COC1 after the write operation. The switching between the core control signals may not be timely performed for the generation of the read command RD1 from the exterior at the timing t5, if the generation occurs immediately after the write operation, because access by the read command to the memory core needs to be made at the highest speed in general.

Figure 76:
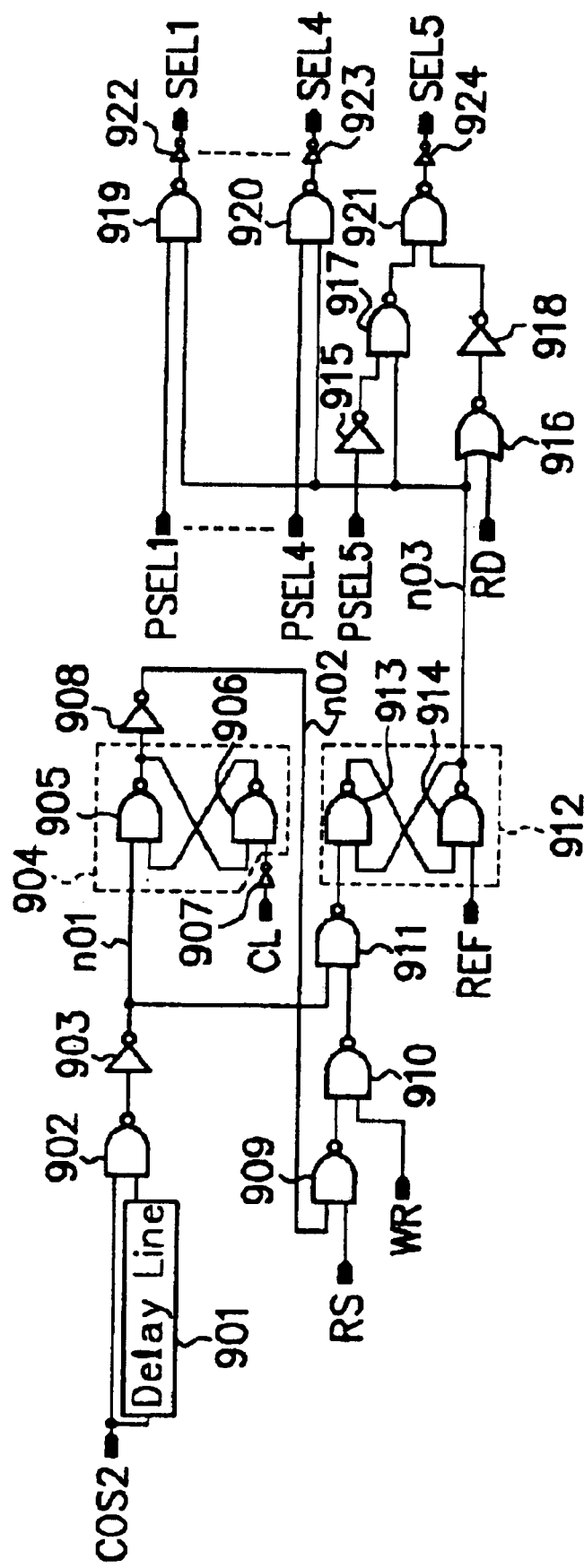
FIG. 76 is a circuit diagram of a refresh block selector.

Hence, the refresh block selector 611 in FIG. 73 is structured as shown in FIG. 76. According to this structure, the block BLK2 is controlled by the second core control signals COC2 until the next one read command RD1 ends.

Figure 77:
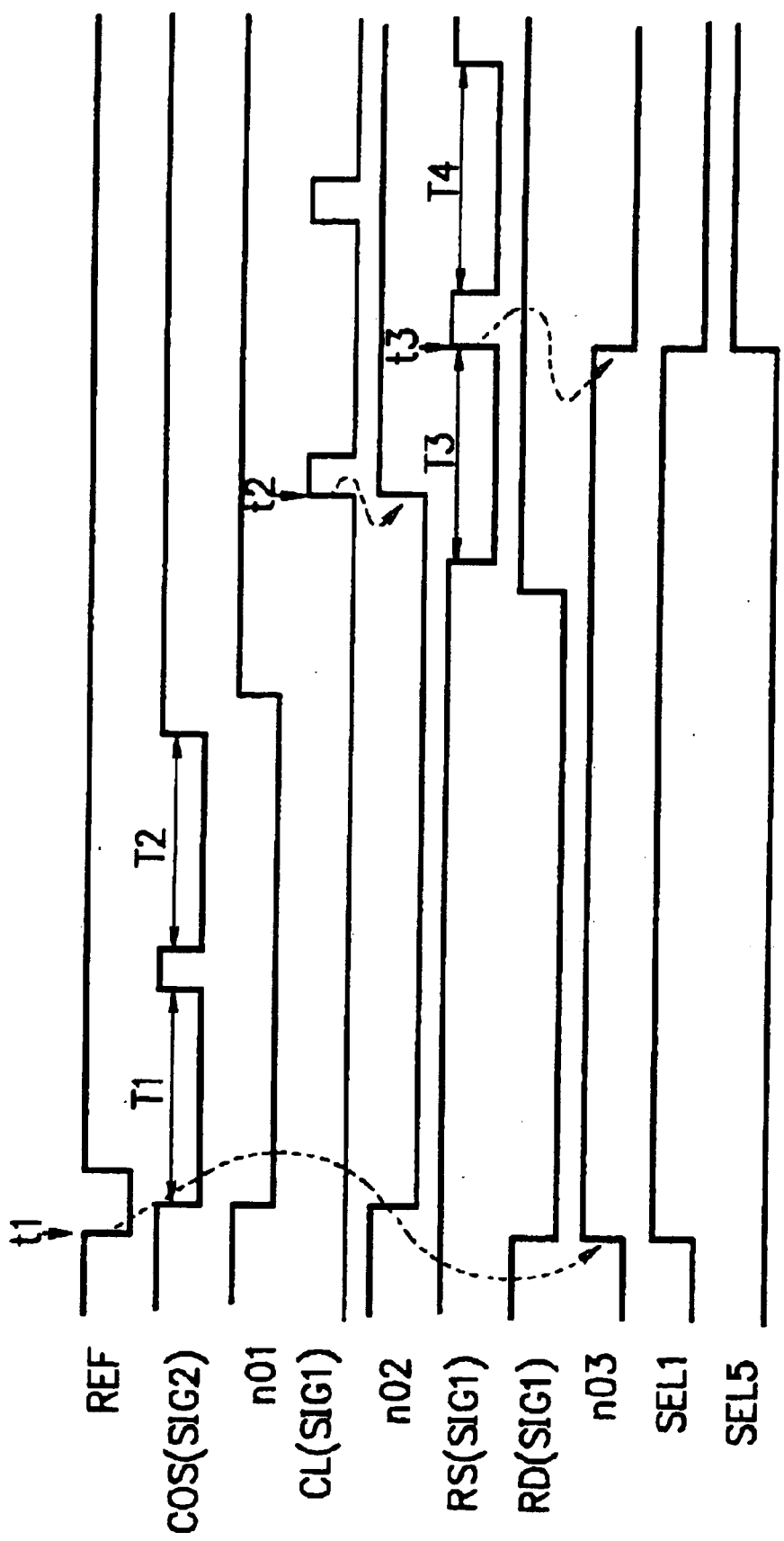
FIG. 77 is a view showing operation waveform of the refresh block selector.

FIG. 76 is a circuit diagram of the refresh block selector 611, and FIG. 77 shows its operation waveform. The circuit structure will be explained with reference to FIG. 76. A delay line 901 delays the second core activation state signal COS2. The second core activation state signal COS2 and an output of the delay line 901 are inputted to a NAND circuit 902, from which a NAND is outputted. An inverter 903 inverts the logic of the output from the NAND circuit 902, and outputs a signal n01.

An RS flip-flop 904 is structured by NAND circuits 905 and 906. An inverter 907 inverts the logic of a signal CL. The signal n01 and an output of the NAND circuit 906 are inputted to the NAND circuit 905, from which a NAND is outputted. An output of the NAND circuit 905 and an output of the inverter 907 are inputted to the NAND circuit 906, from which a NAND is outputted. The output of the NAND circuit 905 is inputted to an inverter 908, from which a signal n02 is outputted.

A signal RS and the signal n02 are inputted to a NAND circuit 909, from which a NAND is outputted. A signal WR and an output of the NAND circuit 909 are inputted to a NAND circuit 910, from which a NAND is outputted. The signal n01 and an output of the NAND circuit 910 are inputted to a NAND circuit 911, from which a NAND is outputted.

An RS flip-flop 912 is structured by NAND circuits 913 and 914. A signal n03 and an output of the NAND circuit 911 are inputted to the NAND circuit 913, from which a NAND is outputted. A signal REF and an output of the NAND circuit 913 are inputted to the NAND circuit 914, from which the signal n03 is outputted.

The signal n03 and a signal PSEL1 are inputted to a NAND circuit 919, and are outputted to an inverter 922. The inverter 922 outputs the selecting signal SEL1. The signal n03 and a signal PSEL4 are inputted to a NAND circuit 920, and are outputted to an inverter 923. The inverter 923 outputs the selecting signal SEL4.

An inverter 915 outputs a logic-inverted signal of a signal PSEL5. The signal n03 and an output of the inverter 915 are inputted to a NAND circuit 917, from which a NAND is outputted. The signal n03 and a signal RD are inputted to a Nor circuit 916, and are outputted to an inverter 918. An output of the NAND circuit 917 and an output of the inverter 918 are inputted to a NAND circuit 921, and are outputted to an inverter 924. The inverter 924 outputs the selecting signal SEL5.

Next, the operation of the circuit will be explained. The signal RS is the core reset signal of the first core control signals COC1, and resets the memory core when turning to the high level. The signal RS is at the low level when the core is operating. The signal WR is the state signal which is at the low level during the write operation of the first core control signals COC1. The signal CL is the CL signal of the first core control signals COC1 (pulse which reads data of the memory cell, amplifies it in the sense amplifier and thereafter takes out the data from the sense amplifier). The signal REF is the refresh request signal. The signal RD is the state signal which is at the high level during the read operation of the first core control signals COC1, and holds the state until the write request is generated. The signals PSEL1 to PSEL5 are the signals indicating the blocks to be refreshed, and are outputted from internal counters and decoders. The signals which are inputted to the selectors in the end are the selecting signals SEL1 to SEL5.

Suppose that the signal PSEL1 is at the high level and the signals PSEL2 to PSEL5 are at the low level. When the refresh operation starts by the refresh request signal REF at a timing t1, the signal n03 turns to the high level and the selecting signal SEL1 turns to the high level, and hence the control signal of the block BLK1 is switched to the second core control signals COC2. As to the second core activation state signal COS2, supposing that the refresh is performed during a period T1, and the write operation is performed during a period T2. When the write request is generated from the exterior during the refresh period T1, the held write operation is performed on the block BLK1 after the refresh operation.

The second core activation state signals COS2 are synthesized to one state signal like the signal n01 by the delay line 901. The signal n01 sets the RS flip-flop 904, and further, holds the state of the RS flip-flop 912 before the refresh request signal REF turns to the high level.

As to the signal RS, suppose that the read operations are performed during periods T3 and T4, respectively. The output signal n02 of the flip-flop 904 holds the state until the signal CL of the first core control signals COC1 of the next read operation is outputted at a timing t2. The timing of the signal CL is set so that it is surely outputted while the signal RS is at the low level. After the signal n02 turns to the high level in response to the signal CL, the signal n03 turns to the low level and the selecting signal SEL1 turns to the low level, in response to a transition of the signal RS to the high level at a timing t3. When the write request is not generated after that, the signal RD is at the high level and hence the selecting signal SEL5 is at the high level and the write parity block BLK5 is inactivated. Thus, after the operation of the second core control signals COC2 ends, the data correction by using the operational result is performed for the next one read operation. When the write request is generated after the completion of the operation of the second core control signals COC2, the selecting signal SEL1 turns to the low level by the signal WR without waiting for a single operation. This is possible under the condition that the write operation does not need to be performed as fast as the read operation. In order to speed up the write operation, the write operation may be performed without switching between the groups of the control signals, similarly to the read operation.

Figure 78:
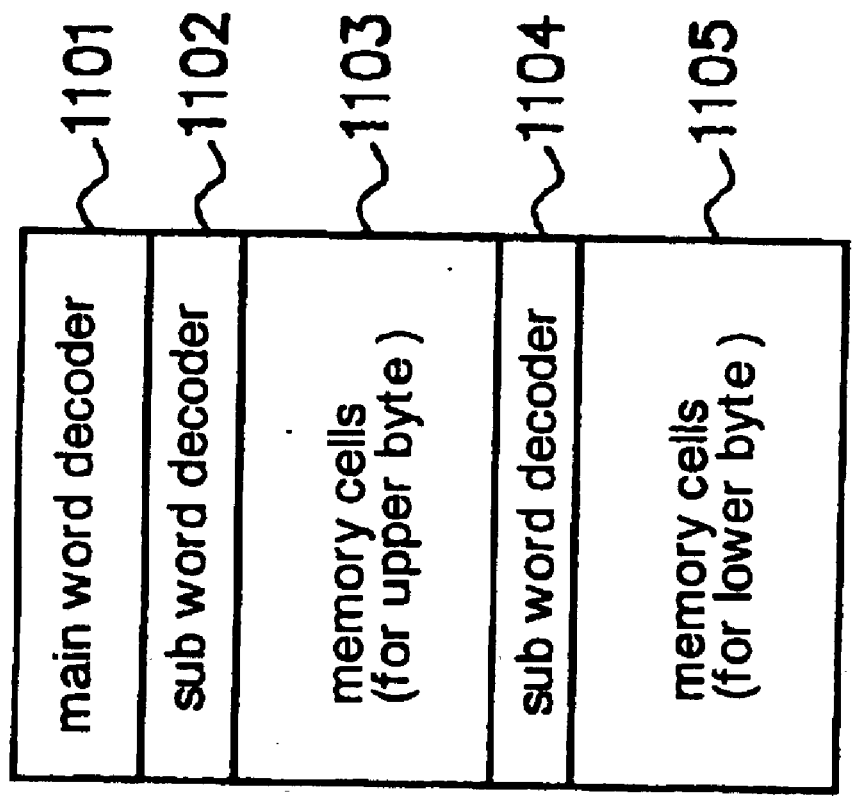
FIG. 78 is a view showing the structure of a block of the memory core.

FIG. 78 is another structural example of the word decoders 103 and the memory cells 104 which constitute one block of FIG. 68. When the mask information MSK in FIG. 73 is used, it is possible to access selectively to the upper byte and/or the lower byte. One block includes a main word decoder 1101, a sub word decoder 1102, memory cells for upper byte 1103, a sub word decoder 1104 and memory cells for lower byte 1105.

Suppose that there are four blocks BLK1 to BLK4 for storing the data of the sixteen bits at the same address. The four-bit data of the same address are stored in one block. At the same address, the upper byte is the upper eight bits and the lower byte is the lower eight bits. The memory cells 1103 store two bits of the upper byte. The memory cells 1105 store two bits of the lower byte.

The main word decoder 1101 decodes according to the row address supplied from the exterior. According to an output from the main word decoder 1101, the sub word decoder 1102 identifies the row address of the memory cell 1103. According to the output from the main word decoder 1101, the sub word decoder 1104 identifies the row address of the memory cell 1105. The read operation and the write operation of the upper byte and the lower byte can be performed by separate control. The refresh operations can be performed simultaneously on the memory cell 1103 and on the memory cell 1105 in one block.

Providing the main word decoders respectively for the memory cells 1103 and the memory cells 1105 increases the layout area. Word lines have a hierarchical structure of the main word decoder 1101 and the sub word decoders 1102 and 1104, and main word lines of the main word decoder 1102 are shared, thereby reducing the size of the main word decoder 1101.

As described above, according to this embodiment, it is possible to process the access request from the exterior and the internal refresh operation at the same time, and, in an SRAM interface or the like to which the refresh request is not inputted from the exterior, to realize the read operation in a high-speed access time taken for one operation of the memory core.

Moreover, the activation area of the memory core is divided to limit the area where one refresh is performed. A plurality of the groups of the control signals of the memory core are prepared so that different groups of the control signals are used in the refresh block and the other blocks. Thereby, the bits of the same address can be controlled differently according to the blocks in which the bits exist. The read operation can be performed in the access time taken for one operation of the memory core.

Incidentally, a plurality of the blocks in the memory core may be divided in the row address direction, the column address direction or both address directions.

The invention is not limited to the above embodiments and various modifications may be made without departing from the spirit and the scope of the invention. Any improvement may be made in part or all of the components.

What is claimed is:

1. A semiconductor memory comprising:
a plurality of first memory blocks for storing data;
a second memory block for storing data to reproduce the data stored in said first memory blocks;
a first command generator for receiving a command and generating a read command or a write command for accessing said first memory blocks;
a second command generator for generating a second command for accessing said first memory blocks;
a read control circuit for reproducing, when the read command and the second command access the same first memory block, read data from the accessed first memory block by using the data stored in said second memory block; and
a write control circuit for performing operations according to the write command and the second command in sequential order when the write command and the second command access the same said first memory block.

2. The semiconductor memory according to claim 1, wherein
the data stored in said second memory block is a parity bit of said first memory blocks.

3. The semiconductor memory according to claim 1, wherein:
said first memory blocks and said second memory block are composed of volatile memory cells whose data disappears over time; and
the second command is a refresh command which occurs periodically for performing refresh operation of the memory cells.

4. The semiconductor memory according to claim 3, wherein
an external write cycle is set to be longer than an internal write cycle, the external write cycle being a minimum interval between supplies of the write command, the internal write cycle being an actual write operation time to said first and second memory blocks.

5. The semiconductor memory according to claim 4, further comprising:
a clock generator for receiving an external clock, and generating an internal clock as a synchronizing signal of an internal circuit, and wherein
the external write cycle is set to n clock cycles (n is an integer equal to or greater than 1), and the internal write cycle is set to n−0.5 clock cycles.

6. The semiconductor memory according to claim 5, further comprising:
a first cycle generator for generating a first timing signal to perform the internal operation cycle in synchronization with a first edge of the external clock;
a second cycle generator for generating a second timing signal to perform the internal operation cycle in synchronization with a second edge of the external clock; and
a cycle switching circuit for alternately operating said first and second cycle generators, every time the write command or the refresh command is supplied.

7. The semiconductor memory according to claim 4, wherein
said write control circuit comprises a state control circuit for sequentially holding next write commands supplied during write operation, and performing the next write operation according to one of the supplied write commands which is held after completion of the write operation.

8. The semiconductor memory according to claim 4, wherein
when the read command is supplied to one of said first memory blocks being in write operation or refresh operation, said read control circuit reproduces read data by using the data stored in said first memory blocks except for the one operating first memory block, and said second memory block.

9. The semiconductor memory according to claim 8, wherein
said read control circuit directly outputs the data stored in said first memory blocks as read data instead of performing reproduction operation, when the read command is supplied during refresh operation of said second memory block.

10. The semiconductor memory according to claim 3, wherein
only one of said first memory blocks and said second memory block is refreshed in response to the refresh command.

11. The semiconductor memory according to claim 10, further comprising:
a refresh counter for indicating memory cells on which a refresh operation is to be performed, and counting up with every refresh request, and wherein:
said refresh counter includes bit(s) for selecting one of said first memory blocks and said second memory block; and when the read command is supplied to one of said first memory blocks indicated by said refresh counter, said read control circuit reproduces read data by using the data stored in said second memory block, even when a refresh operation is not performed on the indicated memory block.

12. The semiconductor memory according to claim 10, further comprising:
a refresh counter for indicating memory cells on which a refresh operation is to be performed, and counting up with every refresh request, and wherein:
said refresh counter includes bit(s) for selecting one of said first memory blocks and said second memory block; and
upon the supply of the read command to one of said first memory blocks indicated by said refresh counter, said read control circuit reproduces read data by using the data stored in said second memory block, only when a refresh operation and a read operation on the indicated memory block conflict with each other.

13. The semiconductor memory according to claim 10, further comprising:
a plurality of data input/output terminals for inputting/outputting data, and wherein
said first memory blocks are formed respectively corresponding to said data input/output terminals which are different from each other.

14. The semiconductor memory according to claim 10, wherein
when the write command and the refresh command to said first memory blocks conflict with each other, said write control circuit performs operations only on one of said first memory blocks being in refresh operation, according to the write command and the refresh command in sequential order, and performs write operations on the other first memory blocks in response to the write command.

15. The semiconductor memory according to claim 10, further comprising:
a plurality of memory groups composed of said first memory blocks and said second memory block, and wherein
the refresh operation in response to the refresh command is performed on one of said first memory blocks and said second memory block in said memory groups.

16. The semiconductor memory according to claim 15, wherein:
said first memory blocks and said second memory block are arranged in a first direction in each of said memory groups;
said memory groups are arranged in a second direction orthogonal to the first direction; and
the refresh operation is performed on a plurality of the first memory blocks or said second memory block aligned in the second direction.

17. The semiconductor memory according to claim 16, further comprising:
bit lines wired in the second direction for transmitting data to the memory cells in said first memory blocks and a plurality of the second memory blocks, respectively;
word lines for connecting storage nodes of the memory cells and said bit lines; and
sense amplifiers arranged in the first direction for amplifying data on said bit lines, wherein
said sense amplifiers are arranged between said memory groups which are adjacent to each other, and shared by the adjacent memory groups.

18. The semiconductor memory according to claim 17, further comprising:
a plurality of column selecting switches for connecting said bit lines to a data bus line;
a plurality of column decoders for generating column selecting signals for selecting said column selecting switches; and
a plurality of word decoders for generating word line signals for selecting said word lines, wherein:
said column selecting switches, said column decoders, said word decoders, and said sense amplifiers are arranged in the first direction;
column selecting lines for transmitting the column selecting signals are wired from said column decoders onto said memory groups in a first wiring layer in the second direction; and
said word lines are wired from said word decoders onto said memory groups in the first wiring layer in the second direction, and are wired on said first and second memory blocks in a second wiring layer in the first direction.

19. The semiconductor memory according to claim 16, further comprising:
word lines for connecting storage nodes of the memory cells and bit lines;
sense amplifiers for amplifying data on said bit lines;
a plurality of column selecting switches for connecting said bit lines to a data bus line;
a plurality of column decoders for generating column selecting signals for selecting said column selecting switches; and
a plurality of word decoders for generating word line signals for selecting said word lines, wherein:
said column decoders and said word decoders are arranged in the first direction;
said column selecting switches and said sense amplifiers are arranged in the second direction;
column selecting lines for transmitting the column selecting signals are wired on said memory groups in a first wiring layer in the second direction, and are further wired on said first and second memory blocks in a second wiring layer in the first direction; and
said word lines are wired on said memory groups in the first wiring layer in the second direction.

20. The semiconductor memory according to claim 3, further comprising:
a clock generator for receiving an external clock, and generating an internal clock as a synchronizing signal of an internal circuit;
a first command receiver circuit for receiving the write command in synchronization with a first edge of the external clock;
a second command receiver circuit for receiving the refresh command in synchronization with a second edge of the external clock; and
an arbiter for determining an order in which the write command and the refresh command received in said first and second command receiver circuits are to be performed.

21. The semiconductor memory according to claim 1, further comprising:
a clock generator for receiving an external clock, and generating an internal clock as a synchronizing signal of an internal circuit, and wherein said first command generator receives the commands in synchronization with a first edge and a second edge of the external clock, respectively, and generates the read command or the write command according to the received commands.

22. The semiconductor memory according to claim 21, wherein
the first and second edges are successive.

23. The semiconductor memory according to claim 22, wherein
the first edge is an up edge and the second edge is a down edge subsequent to the up edge.

24. The semiconductor memory according to claim 1, further comprising:
a clock generator for receiving an external clock, and generating an internal clock as a synchronizing signal of an internal circuit; and
a data input circuit for successively inputting write data in synchronization with the external clock, in response to the single write command, and wherein
a length of time for said first command generator to start receiving data from receiving the write command changes according to a burst length which is a number of times of receiving the write data corresponding to the single write command.

25. The semiconductor memory according to claim 1, further comprising:
a clock generator for receiving an external clock, and generating an internal clock as a synchronizing signal of an internal circuit;
a data output circuit for successively outputting read data in synchronization with the external clock, in response to the single read command;
a data input circuit for successively inputting write data in synchronization with the external clock, in response to the single write command; and
a plurality of banks including said first memory blocks and said second memory block, and operating independently, wherein
in sequentially accessing said banks which are different from each other, a minimum interval between supplies of the read and write commands changes according to a burst length which is a number of times of outputting the read data corresponding to the single read command, and a number of times of receiving the write data corresponding to the single write command.

26. The semiconductor memory according to claim 25, further comprising:
2m read data bus lines (m is an integer equal to or greater than 1) formed respectively corresponding to data input/output terminals;
a data switching circuit for selecting, from said read data bus lines, read data bus line(s) to which read data from said first and second memory blocks is transmitted; and
a parallel/serial conversion circuit for converting parallel read data transmitted through the selected read data bus line(s) into serial data, and wherein:
the burst length is set to one of m and 2m; and
said data switching circuit transmits the read data to said parallel/serial conversion circuit by using all of said 2m read data bus lines when the burst length is set to 2m, and transmits m pieces of the read data to said parallel/serial conversion circuit by alternately using the m read data bus line(s) when the burst length is set to m.

27. The semiconductor memory according to claim 25, further comprising:
2m write data bus lines (m is an integer equal to or greater than 1) formed respectively corresponding to data input/output terminals;
a data switching circuit for selecting, from said write data bus lines, write data bus line(s) to which the write data is transmitted; and
a serial/parallel conversion circuit for converting serial write data into parallel data to be output to the selected write data bus line(s), and wherein
said serial/parallel conversion circuit simultaneously outputs 2m pieces of the converted parallel write data to said 2m write data bus lines when the burst length is set to 2m, and alternately outputs m pieces of the converted parallel write data to the m write data bus line(s) when the burst length is set to m.

28. The semiconductor memory according to claim 1, further comprising:
a clock generator for receiving an external clock, and generating an internal clock as a synchronizing signal of an internal circuit;
a data input circuit for successively inputting write data in synchronization with the external clock, in response to the single write command; and
a data masking control circuit for masking write operation on said first and second memory blocks, for every write data inputted in synchronization with the external clock.

29. The semiconductor memory according to claim 28, further comprising:
a data output circuit for outputting the read data from said first and second memory blocks in synchronization with an internal data strobe signal generated from the internal clock;
a data input circuit for receiving the write data in synchronization with an external data strobe signal; and
a mode register for setting a mode to one of a mode in which the external and internal data strobe signals are to be inputted/outputted through a single terminal, and a mode in which the external and internal data strobe signals are to be inputted/outputted respectively through different terminals.

30. The semiconductor memory according to claim 1, further comprising:
a refresh counter for indicating memory cells on which a refresh operation is to be performed, and counting up with every refresh request, and wherein
lower bit(s) of said refresh counter corresponds to a bank address for selecting banks.

31. A semiconductor memory comprising:
a memory core including a plurality of memory blocks for distributing and storing a plurality of bit data corresponding the same address, respectively, the plurality of memory blocks each having a same address map with each other; and
a control circuit for performing refresh operation on said memory blocks at respective different timings.

32. The semiconductor memory according to claim 31, wherein
said control circuit is allowed to perform a refresh operation on one of said memory blocks, and a write or a read operation on the other memory blocks at the same timing.

33. The semiconductor memory according to claim 31, wherein:
said memory core stores data whose bit number Is larger than a bit number inputted from the exterior of the memory to the same address; and
said control circuit writes a plurality of bit data inputted from the exterior to said memory core, performs logical operation of the inputted bit data, and writes a result of the operation to said memory core.

34. The semiconductor memory according to claim 31, wherein:
each of said memory blocks is divided according to at least one of a row address and a column address, and a plurality of bits corresponding to the same address are distributed and allocated to the memory blocks; and
said control circuit operates each of said memory blocks independently.

35. The semiconductor memory according to claim 31, wherein
said control circuit accesses said memory blocks by the same row address.

36. The semiconductor memory according to claim 31, further comprising:
a selector for selecting, for each of said memory blocks, any of a plurality of groups of control signals outputted from said control circuit in order to operate said memory blocks, the control signals in each of the plurality of groups including a read request signal, a write request signal, and an address.

37. The semiconductor memory according to claim 36, wherein
said control circuit outputs all of said control signals supplied respectively to said memory blocks at the same timing.

38. The semiconductor memory according to claim 36, wherein
said control circuit outputs at least a part of said control signals supplied respectively to said memory blocks at different timings.

39. The semiconductor memory according to claim 31, wherein
said control circuit outputs control signals for activating said memory blocks at either of the same timing and different timings so that at least either of activation timings of said memory blocks and activation periods of said memory blocks are differentiated from one another.

40. The semiconductor memory according to claim 31, wherein
said memory blocks include first memory blocks and a second memory block for storing a first operational result data representing that a number of high levels or low levels of the bit data corresponding to the same address, is even or odd, the bit data being written into said respective first memory blocks, and wherein
said control circuit comprises a first operational circuit for operating the number of high levels or low levels of the bit data corresponding to the same address, and outputting the resultant as the first operational result data, the bit data being written into said respective first memory blocks.

41. The semiconductor memory according to claim 40, wherein
said control circuit comprises:
a second operational circuit for operating, during read operation, that a number of read data from said first memory blocks is even or odd, and for outputting the resultant as second operational result data; and
a comparator for comparing the second operational result data and the first operational result data read from said second memory block.

42. The semiconductor memory according to claim 31, wherein
when a refresh request for a part of said first memory blocks being in read or write operation occurs, said control circuit preferentially performs a refresh operation before the next read or write operation.

43. The semiconductor memory according to claim 41, wherein
said control circuit comprises an inverting circuit for inverting, upon said control circuit's receipt of a read request signal for one of said first memory blocks being in refresh operation, data on a data line of one of said first memory blocks which is in refresh operation when a comparison result from said comparator is inconsistent.

44. The semiconductor memory according to claim 43, wherein,
upon receipt of a write request signal for one of said first memory blocks being in refresh operation, said control circuit holds the write request signal, and performs a write operation corresponding to the write request signal after completion of the refresh operation.

45. The semiconductor memory according to claim 44, wherein,
upon receipt of the next write request signal during the write operation corresponding to the held write request signal, said control circuit newly holds said next write request signal.

46. The semiconductor memory according to claim 45, wherein
said control circuit starts a write operation corresponding to the newly held write request signal, when an activation signal outputted during the prior write operation is reset.

47. The semiconductor memory according to claim 44, further comprising:
a selector for selecting, for each of said first and second memory blocks, any of a plurality of groups of control signals outputted from said control circuit in order to operate said memory blocks, and wherein,
unless the next write request signal for said first memory blocks is inputted during the write operation corresponding to the write request signal held in said control circuit, said selector selects, upon completion of the write operation, the group of control signals which has been selected before the refresh operation.

48. The semiconductor memory according to claim 43, wherein:
upon receipt of a write request signal for one of said first memory blocks being in refresh operation, said control circuit holds the write request signal, and performs a write operation corresponding to the write request signal after completion of the refresh operation; and
when a read request signal for said first memory blocks is inputted during the write operation, said inverting circuit inverts data according to a comparison result from said comparator during a read operation corresponding to the read request signal.

49. The semiconductor memory according to claim 44, wherein
when a read request signal is inputted during refresh operation, said inverting circuit inverts data according to a comparison result from said comparator, and said control circuit holds the read request signal, and performs, after completion of the refresh operation, a pseudo read operation by the data inversion of said inverting circuit according to a comparison result from said comparator, instead of reading data from one of said first memory blocks which has been in the refresh operation.

50. The semiconductor memory according to claim 49, wherein upon receipt of a write request signal for one of said first memory blocks being in the pseudo read operation, said control circuit holds the write request signal, and performs a write operation corresponding to the write request signal after completion of the pseudo read operation.

51. The semiconductor memory according to claim 49, wherein upon receipt of a read request signal for one of said first memory blocks being in the pseudo read operation, said control circuit holds the read request signal, and performs, after completion of the pseudo read operation, the next pseudo read operation by the data inversion of said inverting circuit according to a comparison result from said comparator, instead of performing a read operation on said first memory blocks corresponding to the read request signal.

52. The semiconductor memory according to claim 44, further comprising:

a selector for selecting, for each of said first and second memory blocks, any of a plurality of groups of control signals outputted from said control circuit in order to operate said memory blocks, and wherein:

even when the next write request signal is not inputted to said first memory block during a write operation corresponding to the write request signal held in said control circuit, next one read operation to be performed becomes a pseudo read operation by the data inversion of said inverting circuit according to a comparison result from said comparator; and said selector selects the group of control signals which has been selected before the refresh operation, when the pseudo read operation is completed.

53. The semiconductor memory according to claim 31, wherein each of said memory blocks includes word lines having a hierarchical structure of an upper byte and a lower byte of data and selects the upper byte and the lower byte at the same time by a main word line of said word lines.

54. The semiconductor memory according to claim 53, wherein refresh operation is performed concurrently on memory areas of each of said memory blocks, the memory areas being allocated to the upper byte and the lower byte.

55. The semiconductor memory according to claim 40, wherein said control circuit inactivates said second memory block and reads data from said first memory blocks when read operation and refresh operation do not conflict with each other.

56. The semiconductor memory according to claim 31, wherein each of said memory blocks includes a word decoder.

* * * * *